US007356774B2

(12) United States Patent
Shah et al.

(10) Patent No.: US 7,356,774 B2
(45) Date of Patent: Apr. 8, 2008

(54) GROUPING COMPONENTS OF A MEASUREMENT SYSTEM

(75) Inventors: Mohammed Kamran Shah, Austin, TX (US); Jeffrey N. Correll, Cedar Park, TX (US)

(73) Assignee: National Instruments Corporation, Austin, TX (US)

( * ) Notice: Subject to any disclaimer, the term of this patent is extended or adjusted under 35 U.S.C. 154(b) by 771 days.

(21) Appl. No.: 10/328,678

(22) Filed: Dec. 23, 2002

(65) Prior Publication Data

US 2004/0034498 A1 Feb. 19, 2004

Related U.S. Application Data

(60) Provisional application No. 60/403,822, filed on Aug. 15, 2002, provisional application No. 60/403,135, filed on Aug. 13, 2002.

(51) Int. Cl.
*G06F 3/00* (2006.01)
*G06F 9/00* (2006.01)
*G06F 17/00* (2006.01)

(52) U.S. Cl. ...................... 715/771; 715/964; 715/744; 715/763; 715/835; 715/837

(58) Field of Classification Search ................ 702/127; 715/771–773, 853–855, 964, 835–837
See application file for complete search history.

(56) References Cited

U.S. PATENT DOCUMENTS 4,812,996 A 3/1989 Stubbs
4,868,785 A 9/1989 Jordan et al.
4,884,228 A 11/1989 Stanley et al.
4,901,221 A 2/1990 Kodosky et al.
5,136,705 A 8/1992 Stubbs et al.
5,155,836 A 10/1992 Jordan et al.
5,309,352 A 5/1994 Stubbs
5,481,741 A 1/1996 McKaskle et al.
5,630,164 A 5/1997 Williams et al.
5,801,942 A 9/1998 Nixon et al.
5,812,394 A 9/1998 Lewis et al.
5,828,851 A 10/1998 Nixon et al.
5,838,563 A 11/1998 Dove et al.
5,841,959 A * 11/1998 Guiremand ................. 345/440

(Continued)

*Primary Examiner*—David A. Wiley
*Assistant Examiner*—Boris Pesin
(74) *Attorney, Agent, or Firm*—Meyertons Hood Kivlin Kowert & Goetzel, P.C.; Jeffrey C. Hood; Jason L. Burgess

(57) ABSTRACT

One embodiment of the invention comprises a system and method method for creating a sub-system in a measurement system. A user may group together various components of the measurement system into a sub-system. Grouping a subset of components together in the sub-system may enable the subset of components to be treated as an atomic unit in various ways. In particular, the subset of components may be displayed as a single unit. For example, in one embodiment the user may be able to request the sub-system to be collapsed into a single icon. In response the individual components within the sub-system may be hidden from view, and a single sub-system icon representing the entire sub-system may be displayed. Another embodiment of the present invention comprises a method for grouping together a plurality of measurement components into a single icon, where each measurement component represents a measurement to be acquired by the measurement system.

20 Claims, 133 Drawing Sheets

U.S. PATENT DOCUMENTS

| | | | | |
|---|---|---|---|---|
| 5,861,882 | A * | 1/1999 | Sprenger et al. | 715/700 |
| 5,991,537 | A | 11/1999 | McKeon et al. | |
| 6,064,816 | A | 5/2000 | Parthasarathy et al. | |
| 6,078,320 | A | 6/2000 | Dove et al. | |
| 6,098,028 | A | 8/2000 | Zwan et al. | |
| 6,112,015 | A * | 8/2000 | Planas et al. | 709/223 |
| 6,469,723 | B1 * | 10/2002 | Gould et al. | 715/837 |
| 6,868,526 | B2 * | 3/2005 | Singh | 715/763 |
| 2004/0030675 | A1 * | 2/2004 | Could | 707/1 |
| 2005/0232256 | A1 * | 10/2005 | White et al. | 370/360 |

* cited by examiner

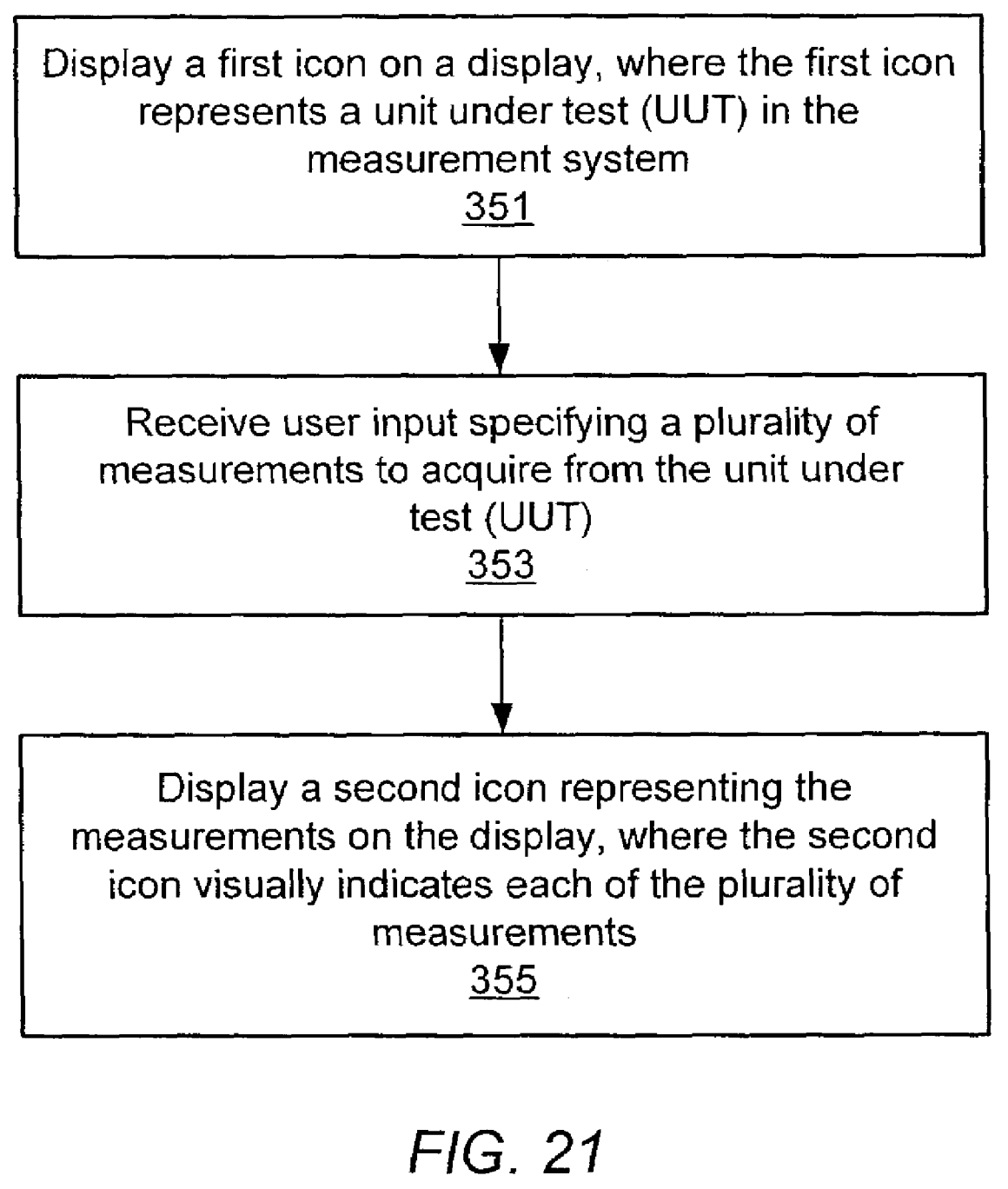

Display a first icon on a display, where the first icon represents a unit under test (UUT) in the measurement system
351

↓

Receive user input specifying a plurality of measurements to acquire from the unit under test (UUT)
353

↓

Display a second icon representing the measurements on the display, where the second icon visually indicates each of the plurality of measurements
355

*FIG. 21*

GROUPING COMPONENTS OF A MEASUREMENT SYSTEM

PRIORITY INFORMATION

This application claims the benefit of priority of U.S. Provisional Application No. 60/403,135, titled "Icon to Represent Unspecified Component in a Measurement System," whose inventors were Kamran Shah, Jeffrey L. Kodosky and David W Fuller III, filed on Aug. 13, 2002.

This application also claims the benefit of priority of U.S. Provisional Application No. 60/403,822 titled "Icon to Represent Unspecified Component in a Measurement System," whose inventors were Kamran Shah, Jeffrey L. Kodosky, David W Fuller, Brian Sierer and Jeff Correll, filed on Aug. 15, 2002.

FIELD OF THE INVENTION

The present invention relates to the field of measurement systems, and more particularly to a software application that guides a user through a process of creating a measurement system.

DESCRIPTION OF THE RELATED ART

Scientists and engineers often use test, measurement or automation systems to perform a variety of functions, including measurement of a physical phenomena or unit under test (UUT), test and analysis of physical phenomena, simulation, hardware-in-the-loop testing, process monitoring and control, control of mechanical or electrical machinery, data logging, and laboratory research, to name a few examples. The test, measurement or automation systems that perform such functions are collectively referred to herein as "measurement systems".

Measurement systems are moving toward computer-based systems wherein a computer system performs much of the processing, analysis, or control for the application. Measurement systems are also moving toward network-based or distributed systems, wherein a plurality of network-based devices operate together to perform a desired function.

A typical measurement system includes a computer system coupled to a measurement device or measurement hardware. The measurement device may be or may include a computer-based instrument, a data acquisition device or board, a programmable logic device (PLD), a sensor, an actuator, or other type of device for acquiring or generating data. The measurement device may be a card or board plugged into an I/O slot of the computer system, a card or board plugged into a chassis, or a standalone external device. For example, in a common measurement system configuration, the measurement hardware is coupled to the computer system via other means such as through a VXI (VME extensions for Instrumentation) bus, a PXI (PCI extensions for Instrumentation) bus, a GPIB (General Purpose Interface Bus), a serial port, or parallel port of the computer system. Optionally, the measurement system includes signal conditioning devices which receive the field signals and condition the signals to be acquired.

A measurement system may also typically include transducers, sensors, actuators or other detecting (or generating) means for providing "field" electrical signals representing a process, physical phenomena, equipment being monitored or measured, etc. The field signals are provided to the measurement hardware.

The measurement hardware may be configured and controlled by measurement software executing on the computer system. In addition, various new intelligent devices are also starting to appear in measurement systems, such as smart sensors, smart cameras, smart motion control devices, smart distributed data acquisition devices, computer based instrument cards, PXI and VXI systems, which may include intelligent controllers or reconfigurable devices, programmable logic controllers (PLCs), FPGAs, etc. Computer-based measurement systems which employ intelligent devices have become increasingly desirable in view of the increasing complexity of measurement and automation tasks, and the variety of intelligent or programmable instruments and devices available for use.

Scientists and engineers in a wide variety of disciplines are often required to develop a measurement system to accomplish a certain objective. However, due to the wide variety of possible testing and control situations and environments, and also the wide array of instruments or devices available, designing a measurement system to meet the objective can be a difficult task. Often, scientists and engineers are not highly trained in the art of designing a computer based measurement system. As a result, in many cases it is difficult to efficiently design and implement a measurement system, and the process of doing so may detract time and attention away from the central objective which the measurement system is intended to accomplish.

In addition, it is often necessary to develop custom software programs to control the measurement system. Often, scientists and engineers are not highly trained in the art of computer programming, making this a difficult and error-prone task. Distributing or deploying software programs among various components in a distributed measurement system adds yet another layer of complexity to the task of implementing a measurement system. Thus, it would be desirable to provide a system which aids a user in designing and implementing a measurement system.

SUMMARY OF THE INVENTION

One embodiment of the present invention comprises a method for creating a sub-system in a measurement system. It may be desirable to allow users to group together various components of the measurement system into a sub-system. For example, a sub-system may be used to represent a plurality of components that operate together to perform a particular task in the measurement system.

In one embodiment, the method may be used in conjunction with a software application operable to assist a user in designing and/or implementing the measurement system. One embodiment of such a software application is referred to herein as the Measurement System Designer (MSD) environment. The MSD environment may assist the user in designing or creating a measurement system in various ways. For example, the MSD environment may enable the user to create a diagram graphically depicting the measurement system. The MSD environment may also provide various tools and graphical user interfaces (GUIs) to guide the user in selecting various components of the measurement system or to experiment with various components.

According to one embodiment of the method, a diagram visually indicating a plurality of components in the measurement system may be displayed. User input requesting to create a sub-system that includes a subset of components from the plurality of components may be received. For example, the user may first select the subset of components to be included in the sub-system and may then request to create a sub-system that includes the subset of components. In various embodiments, the subset of components may be selected in any of various ways. For example, in one embodiment selecting the subset of components may comprise receiving user input from a pointing device (e.g., a mouse, pen device, etc.) to select each component to be included in the sub-system. For example, the user may click on each desired component, may draw a box or border around the desired components, etc. In another embodiment, the user may invoke a graphical user interface specialized for specifying components of a sub-system and may interact with the graphical user interface to select the subset of components to include in the sub-system.

In response to the user input requesting to create the sub-system, a sub-system including the specified subset of components may be created. For example, the measurement system may be represented using one or more data structures. Data representing the plurality of components in the measurement system may be stored in the one or more data structures. Thus, creating the sub-system may comprise storing data in the one or more data structures to represent the sub-system.

The diagram may be updated to visually indicate that the subset of components are grouped together in the sub-system. In various embodiments, the diagram may visually indicate that the subset of components are grouped together in the sub-system in any of various ways. For example, in one embodiment a border may be drawn around the subset of components. For example, the subset of components may be displayed together within a box. In another embodiment the diagram may visually indicate that the subset of components are grouped together in the sub-system by changing an appearance of one or more of the components in the subset of components. For example, appearances of the one or more of the components may be changed by changing color information of the displayed components, highlighting the components, or otherwise altering the visual appearances of the components. In another embodiment the diagram may display text information indicating that the subset of components are grouped together in the subsystem.

Grouping the subset of components together in the sub-system may enable the subset of components to be treated as an atomic unit in various ways. In particular, the subset of components may be displayed as a single unit. For example, in one embodiment the user may be able to request the sub-system to be collapsed into a single icon. In response the individual components within the sub-system may be hidden from view, and a single sub-system icon representing the entire sub-system may be displayed. Thus, the readability of a complex measurement system diagram may be enhanced by grouping various components into logical sub-systems. In one embodiment sub-systems may be nested so that the complexity of a diagram may be reduced to any degree desired.

For example, multiple sub-systems may be grouped into a single sub-system which may then be collapsed into a single icon similarly as described above.

In one embodiment, the single sub-system icon which represents a sub-system may visually indicate the sub-system, e.g., by displaying a name of the sub-system, but may not visually indicate the individual components within the sub-system. In another embodiment, the single sub-system icon may display limited information regarding the individual components within the sub-system, such as names of the components.

In one embodiment connections between various components in the diagram of the measurement system may be displayed. The diagram may display multiple connections or wires to or from one or more components in the sub-system before the sub-system is collapsed. In response to collapsing the sub-system into a single icon, the diagram may be updated to illustrate a single wire to or from the sub-system icon.

In one embodiment, the user may be able to add a new component to the subsystem after the sub-system has been created. In response, the diagram may be updated to visually indicate that the new component was added to the sub-system. Similarly, the user may be able to remove a component from the sub-system, and the diagram may be updated to visually indicate that the component was removed from the sub-system.

In one embodiment, the method may further comprise displaying a plurality of text items corresponding to components of the measurement system, in addition to displaying the diagram. For example, as described above, the text items may be displayed in a tree view, e.g., a hierarchical view to indicate a hierarchical relationship among components of the measurement system. For example, an MSD environment such as described herein may display both a diagram of the measurement system and a tree view of the measurement system. In response to the sub-system being created, a text item corresponding to the sub-system may be added to the tree view. Also, the tree view may display text items corresponding to the components in the sub-system in a hierarchical manner to indicate that these components are encompassed by the sub-system. In one embodiment, the user may interact with the tree view to change the sub-system, e.g., may utilize a context menu associated with the tree view to add or remove components to or from the sub-system.

In one embodiment, the method may further comprise saving configuration information for the sub-system, e.g., in response to a user request to save configuration information for the sub-system. Saving the configuration information for the sub-system may comprise storing configuration information for each component in the sub-system. For example, as the user designs the measurement system, the user may set various properties associated with the components, specify connections among the components, or otherwise configure the components. Thus, the configuration information stored for each component in the sub-system may specify the respective component's current state at the time the configuration information is saved.

In one embodiment, saving the configuration information for the sub-system may comprise storing the configuration information for components in the sub-system as a single configuration unit. For example, the user may be prompted for a name for the configuration information for the sub-system, and the specified name may be associated with the configuration unit. Storing the configuration unit may comprise persistently storing the configuration unit. In various embodiments, the configuration unit may be stored in any of various ways, e.g., as one or more files or data portions within files, database entries, etc.

The configuration unit may then be used to configure the sub-system at a later time, i.e., to configure each component in the sub-system. For example, the configuration unit may be retrieved, and the configuration information for each component may be used to configure the respective component. Configuration of components of a measurement system is discussed in further detail below.

In one embodiment, the user may also be able to request a copy of the sub-system to be made. For example, a new sub-system icon representing the copy of the sub-system may be displayed on the diagram. The user may then expand the new sub-system icon to view components within the new sub-system, which may be copies of the components in the original sub-system.

The creation of sub-systems such as described above is one way on which components of a measurement system may be grouped together. In various embodiments, components may also be grouped together in other ways. For example, in one embodiment, components of the same type may be grouped together or displayed by a single icon. Another embodiment of the present invention comprises a method for grouping together a plurality of measurement components into a single icon, where each measurement component represents a measurement to be acquired by the measurement system.

According to one embodiment of the method, a first icon may be displayed, where the first icon represents a unit under test (UUT) in a measurement system. For example, the first icon may be displayed in a diagram of the measurement system, such as described above. In one embodiment, the first icon may illustrate the physical appearance of the UUT.

User input specifying a plurality of measurements to acquire from the unit under test (UUT) may be received. In various embodiments, various information regarding the measurements may be specified. For example, information regarding a sensor which obtains the measurement data may be specified. Also, a name for each measurement may be specified. A second icon may be displayed, where the second icon visually indicates each of the plurality of measurements. In one embodiment, displaying the second icon may include displaying a plurality of rows within the second icon, where each row visually indicates information regarding one of the measurements. For example, each row may display the name of one of the measurements.

In one embodiment, the method may further comprise displaying one or more connections from the first icon to the second icon. For example, a plurality of connections may be displayed, where each connection corresponds to one of the measurements. Each connection may visually indicate that the respective measurement is associated with a particular measurement point on the UUT. For example, where the first icon graphically indicates the physical appearance of the UUT, each connection may have an endpoint on the first icon which visually indicates a physical location on the UUT from which the respective measurement is acquired.

In one embodiment, the method may further comprise displaying a third icon, where the third icon represents a hardware device for acquiring the measurements from the UUT. One or more connections may be displayed from the second icon to the third icon. For example, a plurality of connections may be displayed, where each connection corresponds to one of the measurements. Each connection may visually indicate which channel on the hardware device acquires the respective measurement.

The user may also specify a new measurement to acquire from the UUT. In response, the new measurement may be added to the second icon. For example, where the second icon includes a plurality of rows, a new row representing the new measurement may be added, and information regarding the new measurement may be displayed in the new row. In another embodiment, the user may first request to add a new row or field to the second icon, and may then specify the information regarding the new measurement. For example, the user may be able to expand the second icon by dragging a corner or edge of the second icon, e.g., using a mouse.

Similarly as described above, the user may also be able to collapse the second icon to provide less detail regarding the plurality of measurements. For example, where the second icon includes a plurality of rows, the rows may be hidden from view in response to the second icon being collapsed. In one embodiment, when the second icon has been collapsed, the names of the measurements may no longer be visible, but information, e.g., a number, may be displayed on the second icon to indicate the number of measurements in the plurality of measurements.

Also, where a plurality of wires is displayed connected to the second icon before the second icon is collapsed, the wires may be bundled into a single wire which replaces the plurality of wires after the second icon is collapsed. However, the user may still be able to temporarily view information regarding each of the plurality of measurements without having to re-expand the second icon. For example, the user may hover a pointer (e.g., a mouse cursor) over the second icon or over the wire connected to the second icon, and information regarding each of the plurality of measurements may be temporarily displayed until the pointer is moved away.

BRIEF DESCRIPTION OF THE DRAWINGS

A better understanding of the present invention can be obtained when the following detailed description of the preferred embodiment is considered in conjunction with the following drawings, in which:

FIG. 21 is a flowchart diagram illustrating one embodiment of a method for grouping a plurality of measurements together into a single icon in a measurement system diagram;

Figure 1:
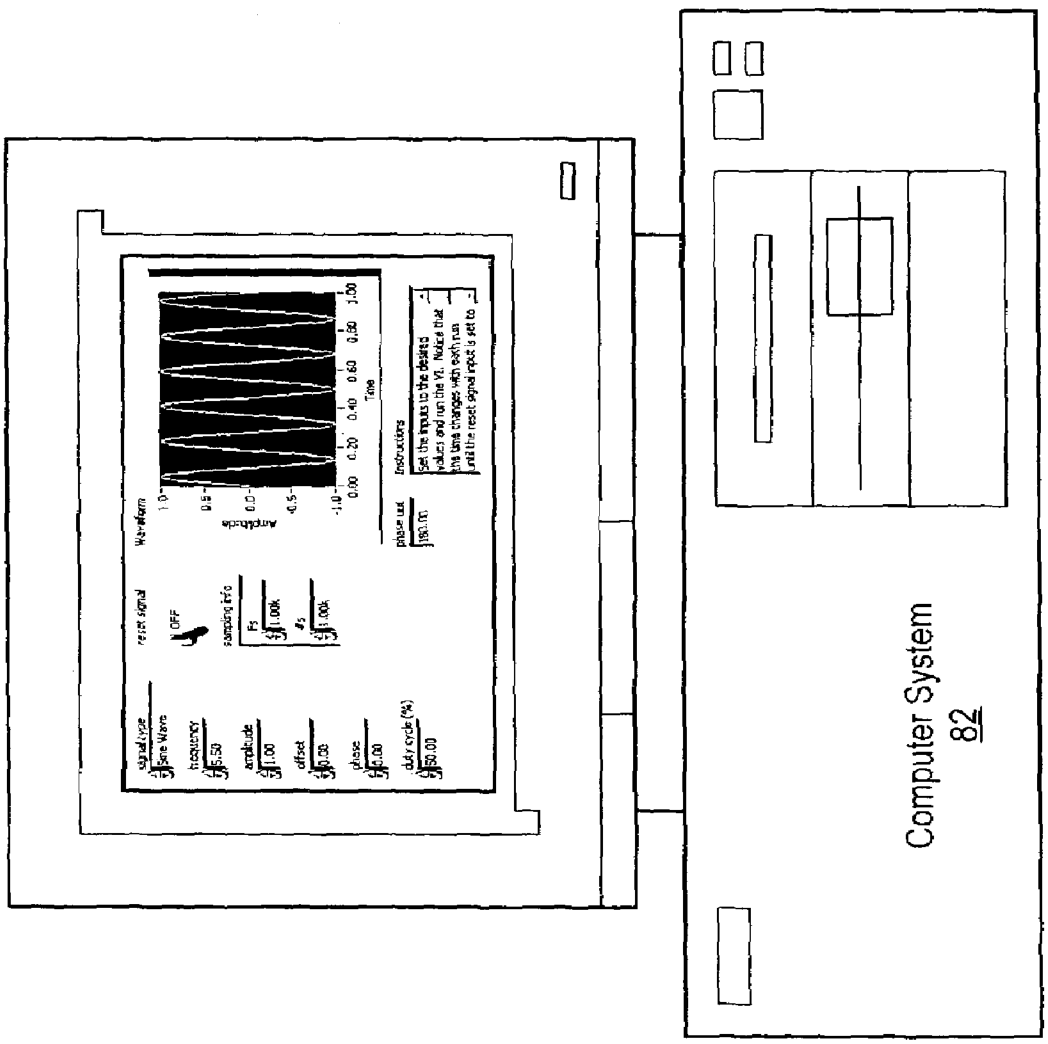
FIG. 1 illustrates a computer system operable to execute a software application operable to assist a user in designing and/or implementing a measurement system.

While the invention is susceptible to various modifications and alternative forms, specific embodiments thereof are shown by way of example in the drawings and are herein described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE PREFERRED EMBODIMENTS

Incorporation by Reference

The following references are hereby incorporated by reference in their entirety as though fully and completely set forth herein:

U.S. Pat. No. 4,914,568 titled "Graphical System for Modeling a Process and Associated Method," issued on Apr. 3, 1990.

U.S. Pat. No. 5,481,741 titled "Method and Apparatus for Providing Attribute Nodes in a Graphical Data Flow Environment".

U.S. Pat. No. 6,173,438 titled "Embedded Graphical Programming System" filed Aug. 18, 1997.

U.S. Pat. No. 6,219,628 titled "System and Method for Configuring an Instrument to Perform Measurement Functions Utilizing Conversion of Graphical Programs into Hardware Implementations," filed Aug. 18, 1997.

U.S. patent application Ser. No. 09/617,600 titled "Graphical Programming System with Distributed Block Diagram Execution and Front Panel Display," filed Jun. 13, 2000.

U.S. patent application Ser. No. 09/518,492 titled "System and Method for Programmatically Creating a Graphical Program," filed Mar. 3, 2000.

U.S. patent application Ser. No. 09/745,023 titled "System and Method for Programmatically Generating a Graphical Program in Response to Program Information," filed Dec. 20, 2000.

U.S. patent application Ser. No. 10/101,512 titled "Network-based System for Configuring a Measurement System using Configuration Information Generated based on a User Specification," filed Mar. 19, 2002.

U.S. patent application Ser. No. 10/123,570 titled "Creation of a Graphical Program Through Graphical Association of a Data Point Element with the Graphical Program," filed Apr. 16, 2002.

The LabVIEW and BridgeVIEW graphical programming manuals, including the "G Programming Reference Manual", available from National Instruments Corporation, are also hereby incorporated by reference in their entirety.

FIG. 1—Computer System

FIG. 1 illustrates a computer system 82 operable to execute a software application for assisting a user in designing and/or implementing a measurement system. One embodiment of such a software application is referred to herein as a Measurement System Designer (MSD) environment. The MSD environment may be operable to assist the user in designing or implementing a measurement system that includes any of various kinds of components and performs any of various functions.

As used herein, the term "measurement system" is intended to include a system comprising two or more interconnected or coupled devices, i.e., two or more devices that are coupled together in some fashion. The measurement system may be utilized to perform any of a variety of functions, including measurement of a physical phenomena or unit under test (UUT), test and analysis of physical phenomena, simulation, hardware-in-the-loop testing, process monitoring and control, control of mechanical or electrical machinery, data logging, and laboratory research, to name a few examples.

The two or more devices in the measurement system may be coupled together in any way. For example, the devices may be connected via a network, such as a local area network (LAN) and/or a wide area network (WAN), such as the Internet, a computer bus, an I/O slot, a serial or parallel bus, or other wired communication methods. Example local area networks include Ethernet networks, Token Ring networks, and various industrial communication networks such as Foundation Fieldbus, DeviceNet, and CAN (Controller Area Network) networks. Example parallel buses include the PCI bus, PXI bus, GPIB, and VXI bus, among others. Example serial buses include USB (Universal Serial Bus), IEEE 1394, RS-242, and RS-485, among others. Devices in the measurement system may also be connected using wireless communication means, such as wireless protocols including IEEE 802.11 (wireless Ethernet), Bluetooth, and other types of wireless communication.

Devices in the measurement system may also be connected using other types of physical relationships or connections as appropriate for the particular devices, such as direct electrical connections, optical or visual connections, hydraulic connections, or connections based on other physical phenomena. For example, a sensor may be connected to a unit under test (UUT) based on any of various kinds of physical phenomena.

In various embodiments, a measurement system may include components of any kind. As used herein, the term "component" is intended to include any of various physical devices or instruments. For example, a measurement system may include components such as computer systems, units under test (UUTs), measurement devices or instruments (such as the devices illustrated in FIGS. 2A and 2B), chassis, wires, cables, connector blocks, sensors, transducers, actuators, etc. Other possible physical components for a measurement system include network devices (e.g., network interface cards, routers, bridges, switches, hubs, etc.), personal digital assistants (PDAs), television systems, video devices (e.g., digital cameras, digital video cameras, etc.), audio devices, computer peripherals, telephones, appliances, other processor-based or programmable hardware-based devices, or other measurement devices including instruments, industrial automation devices, process control devices, smart data acquisition devices, smart sensors (including smart cameras), smart actuators, etc.

The term "component" may also include various logical or virtual elements. For example, in various embodiments a measurement system may include components such as measurements, software programs, documentation, annotations, named I/O channels (virtual channels), etc.

The MSD environment may assist the user in designing or creating a measurement system in various ways. For example, in one embodiment the MSD environment may enable the user to create a system diagram graphically depicting the measurement system. For example, the system diagram may include various icons representing components of the measurement system, such as a computer system that controls the measurement system, a unit under test (UUT), one or more measurements to be acquired from the UUT, one or more hardware devices to acquire the measurements, sensors, actuators, chassis, controllers, I/O modules, network devices, databases, etc. In various measurement systems any kind of component may be represented on the system diagram. Each icon may comprise a picture or graphical information to intuitively depict the component that it represents. As one example, where an icon represents a hardware device, the icon may comprise a picture, illustration, or CAD drawing of that particular hardware device or type of hardware device.

The system diagram may also illustrate relationships or connections among the components, such as network connections, serial connections, I/O slot connections, bus connections, or other cabled or wireless connections. The system diagram may also illustrate logical relationships among the components. For example, the diagram may include one or more measurement icons to represent measurements made by the measurement system and may include lines or wires from measurement icons to a hardware device icon. These lines or wires may indicate that the hardware device functions to acquire the respective measurements. As another example, lines or wires may be drawn from measurement icons to various points on a LUT icon, relating each measurement to a particular point or sub-component on the UUT.

In one embodiment, the MSD environment may also be operable to display a wiring schematic diagram of the measurement system. The wiring schematic diagram may present a lower-level view of the measurement system illustrating the physical wiring of the system. In many cases, the MSD environment may be able to automatically determine physical wiring relationships so that the user need only connect the physical components as indicated in the wiring schematic diagram. The user may also be able to interact with the wiring schematic diagram to change the wiring configuration as desired.

In one embodiment, the MSD environment may also provide various features which document the measurement system and aid the user (or another person) in understanding the measurement system. The system diagram and/or wiring schematic diagrams themselves may substantially document the measurement system. In one embodiment, the MSD environment may be operable to alter the visual appearance of various component icons in the diagram to indicate status information regarding the components. For example, the altered appearances may indicate which hardware components are actually present and which hardware components do not actually exist or need to be purchased. As another example, an appearance of an intelligent device operable to execute measurement software may be altered to indicate whether or not software programs have been deployed on the device, indicate whether a software program is currently being executed by the device, etc. In various embodiments, the appearance of icons in the system or wiring schematic diagrams may be altered in any of various ways to indicate any of various types of information. For example, an icon may be altered with special coloring or highlighting, drawing a box or shading around the icon, superimposing text or a graphical glyph over the icon, etc.

As another example, the MSD environment may help the user in understanding the measurement system through the use of various informational messages. For example, as the user moves a cursor around the system or wiring schematic diagram, the MSD environment may temporarily display various informational messages regarding the portion of the measurement system on which the cursor is currently located. As another example, the MSD environment may flexibly allow the user to view the measurement system at various levels of granularity, e.g., by expanding or collapsing icons in the diagram to view more or less detail for each of the components.

The MSD environment may also provide various tools and graphical user interfaces (GUIs) to guide the user in selecting various components of the measurement system or to experiment with various components. For example, the MSD environment may provide various templates for different kinds of measurement systems. One or more components may be undefined or placeholder components and may be represented in the diagram using a special icon, e.g., a "puffy cloud" icon such as described below. A guidance mechanism may be associated with an undefined component to aid the user in defining the component. For example, in one embodiment when the user clicks on the special icon a series of graphical user interface screens, referred to herein as a wizard, may appear to aid the user in defining the component.

When aiding a user in selecting or defining a particular component for the measurement system, the MSD environment may intelligently use information determined from the portions of the measurement system that the user has already specified. As one example, the user may define one or more measurements and specify electrical characteristics required to make the measurements. The user may then invoke a guidance mechanism for selecting particular hardware to make the measurements. In this guidance mechanism, the MSD environment may constrain the hardware choices presented to the user to hardware that is appropriate given what the user has already defined, e.g., by only presenting hardware that conforms to the electrical characteristics required to make the measurements.

In addition to assisting the user in designing hardware aspects of the measurement system, in one embodiment the MSD environment may also assist the user in designing or implementing software aspects of the measurement system. For example, in one embodiment, the MSD environment may include a programming development environment in which the user can create software programs, e.g., to control or interact with hardware devices in the measurement system. In one embodiment, the programming development environment may enable the user to create text-based programs, such as C, C++, Java, Visual Basic, or Visual C++ programs, or programs written in other text-based programming languages. In another embodiment, the programming development environment may enable the user to create graphical programs, such as LabVIEW, VEE, Simulink, or other graphical programs.

The programming development environment may be integrated with the rest of the MSD environment, enabling the user to seamlessly design hardware aspects of the measurement system and develop software for the measurement system using a single software application. The MSD environment and its programming development environment may also intelligently use information determined from the measurement system specified by the user to assist the user in creating a software program. As one example, where the user has defined one or more measurements, the MSD environment may automatically create a programmatic entity, such as a virtual channel, for each measurement. The programming development environment may allow the user to include these programmatic entities (e.g., virtual channels) in the software program to reference the respective measurements. In addition, where the software program is associated with a particular hardware device, e.g., where the user specified that the software program is intended for deployment on the hardware device, the programming development environment may constrain the available virtual channels shown to the user to only those virtual channels associated with that particular hardware device. Thus, the programming development environment may simplify the software development task by eliminating superfluous information and helping the user develop a correct program.

In one embodiment, the MSD environment may also be operable to automatically or programmatically generate at least a portion of the software program(s) for the measurement system. For example, the MSD environment may programmatically generate program code to perform at least a portion of a measurement function.

In many cases the user may design a measurement system that includes a plurality of network-based devices which operate together to perform a desired measurement function. In one embodiment, the MSD environment may assist the user in deploying software programs on various devices in a distributed measurement system. For example, the measurement system may include one or more devices that include intelligent controllers or reconfigurable devices, programmable logic controllers (PLCs), FPGAs, etc.

In one embodiment, the MSD environment may also provide a hierarchical tree view that indicates the current state of the measurement system under design from various perspectives. The tree view may include text items corresponding to components of the measurement system. These items may be organized to display a compact hierarchical representation of the measurement system. As various components are added to the measurement system, the tree view may be updated to reflect the new components.

In various embodiments, the user may interact with the tree view to perform various tasks. In one embodiment, the user may utilize the tree view to navigate through the system diagram or wiring schematic diagram. For example, in response to the user selecting a component in the tree view, the component may be highlighted on the diagram and the diagram may be scrolled if necessary to bring the component into view. The user may also utilize the tree view in various other ways, e.g., to deploy software programs on distributed hardware devices. Other possible uses of the tree view are described below.

In one embodiment, the MSD environment may also be operable to aid the user not only in designing a measurement system but also purchasing various components needed for the measurement system or performing other business management tasks related to the measurement system. For example, after the user designs the measurement system by creating a diagram such as described above, the MSD environment may provide an option allowing the user to order one or more components for the measurement system electronically. For example, the MSD environment may communicate with one or more remote computer servers for one or more vendors to electronically order the components. The MSD environment may also be operable to integrate with computer servers for one or more vendors to provide the user with information such as which components are in inventory, which components the user has ordered, which components are in route to the user, which components still need to be ordered to complete the measurement system, etc. Also, in one embodiment, the component icons displayed on the measurement system diagram may be visually altered in various ways to indicate this type of information.

Thus, in various embodiments the MSD environment may integrate various aspects of the process of designing and implementing a measurement system.

Referring again to FIG. 1, the computer system 82 which executes the MSD environment application may be any type of computer system, including a personal computer system, mainframe computer system, workstation, network appliance, Internet appliance, personal digital assistant (PDA), television system or other device. In general, the term "computer system" can be broadly defined to encompass any device having at least one processor that executes instructions from a memory medium.

The computer system 82 may include a display device operable to display a graphical user interface of the MSD environment. For example, the graphical user interface may include a workspace that displays a diagram of the measurement system as the measurement system is being designed. The computer system 82 may also include a memory medium(s) on which one or more computer programs or software components according to one embodiment of the present invention may be stored, e.g., one or more computer programs or software components implementing the MSD environment. Also, the memory medium may store information representing one or more measurement systems designed using the MSD environment. The memory medium may also store operating system software, as well as other software for operation of the computer system.

The term "memory medium" is intended to include an installation medium, e.g., a CD-ROM, floppy disks 104, or tape device; a computer system memory or random access memory such as DRAM, SRAM, EDO RAM, Rambus RAM, etc.; or a non-volatile memory such as a magnetic media, e.g., a hard drive, or optical storage. The memory medium may comprise other types of memory as well, or combinations thereof. In addition, the memory medium may be located in a first computer in which the programs are executed, or may be located in a second different computer which connects to the first computer over a network, such as the Internet. In the latter instance, the second computer may provide program instructions to the first computer for execution.

Various embodiments further include receiving or storing instructions and/or data implemented in accordance with the foregoing description upon a carrier medium. Suitable carrier media include a memory medium as described above, as well as signals such as electrical, electromagnetic, or digital signals, conveyed via a communication medium such as networks and/or a wireless link.

Creating a Measurement System Diagram

As described above, in one embodiment the MSD environment may enable the user to create a system diagram graphically depicting the measurement system. In one embodiment, the user may base the system diagram on a template provided by the MSD environment. Each template may provide a framework for a particular type of measurement system. In various embodiments, the templates may represent any of various kinds of measurement systems for any of various applications. In one embodiment, the available templates may include templates representing measurement systems operable to perform various functions such as motion control, machine vision, data acquisition, process control, etc. In another embodiment, the available templates may represent measurement systems for implementing specialized solutions for particular industries, such as aerospace, automotive, biomedical, communications, electronics, semiconductor, etc.

In response to the user selecting a template, an initial system diagram defined by the template may be displayed. The initial system diagram may include icons representing one or more measurement system components. The user may then extend the initial system diagram, e.g., by adding icons representing additional components and/or defining connections among the components. The user may also change or replace the components in the initial system diagram to use different components. Also, as described in detail below, one or more components in the initial system diagram may be represented by special icons, e.g., puffy cloud icons, indicating that the user needs to provide additional information to further specify a portion of the measurement system.

In another embodiment, the user may not begin the system diagram from a template, but may begin designing the measurement system from a blank diagram. The user may then add icons to the system diagram to indicate the desired components of the measurement system. Also, as described below, in one embodiment at least a portion of the system diagram may be automatically created based on an automatic detection of devices, programs, or other components coupled to or present on the user's computer system.

In various embodiments, the user may add new icons to the system diagram in any of various ways. In one embodiment, the user may add icons to the system diagram by directly selecting each desired icon (or directly selecting each of the respective components that the icons represent). For example, the MSD environment may provide one or more palettes allowing the user to select the desired icons (or components) for inclusion on the system diagram or may allow the user to select the desired icons (or components) in other ways, such as using menu items, toolbars, speech recognition techniques, etc.

In another embodiment, the user may add icons to the system diagram indirectly. For example, the MSD environment may display one or more dialog boxes or windows to obtain information from the user and may then include one or more icons on the system diagram based on the information specified by the user. For example, the MSD environment may display a series of dialogs or graphical user interface panels, e.g., a wizard, which allows the user to specify desired functionality of the measurement system (or desired functionality for a portion of the measurement system). The MSD environment may then determine one or more components to include in the measurement system to achieve the specified functionality and may add the respective icons to the system diagram.

Icons may be arranged on the system diagram in various ways. For example, the user may provide input to manually arrange the icons on the system diagram as desired. In one embodiment, the user may also be able to invoke an "auto-arrange" feature which automatically arranges the icons to improve the appearance of the system diagram.

Thus, in one embodiment, the system diagram may at least partly be created in response to or based on manual user input. In addition to directly or indirectly specifying icons (components), the user may also provide direct or indirect input specifying connections among the icons (components). In various embodiments, connections may represent any kind of relationship between the respective components, e.g., depending on the types of the components which the icons represent. As one example, a connection may represent a physical connection or relationship between two devices, such as a network connection, bus connection, etc. As another example, a connection may represent a logical relationship between the components. For example, where a first icon represents a hardware device and a second icon represents a measurement, the connection may indicate that the hardware device functions to acquire the measurement. As described below, a connection that is displayed between two icons on the measurement system diagram may be context sensitive. In other words, the connection that is displayed or created on the display may have a context or appearance that is associated with the types of components that are being connected, the type of physical connection between the respective components, and/or the type of data or material flow between the components, etc.

In various embodiments, connections may be manually specified using any of various techniques. For example, in one embodiment, the user may use a pointing device (e.g., a mouse), and may possibly use a "wiring tool", to connect a first icon to a second icon, e.g., similar to the wiring tool used in the LabVIEW graphical programming development environment to connect graphical program icons in a block diagram. This may cause a connection, e.g., a wire, to appear between the icons to indicate a coupling relationship between the two (or more) icons. In other embodiments, connections may be specified using other techniques. As one example, the user may associate a first icon with a second icon by dragging and dropping the first icon onto the second icon. In another embodiment, the user may indirectly specify a connection, e.g., by providing input to a dialog or graphical user interface panel, where the MSD environment is operable to create the connection based on this input.

In another embodiment, the measurement system diagram may at least partly be automatically or programmatically created by the MSD environment with no user input required. For example, the MSD environment may be operable to automatically or programmatically add one or more icons to the system diagram and/or add one or more connections between icons with no user input required. In one embodiment, icons or connections may be added based on an automatic detection of devices, programs, or other components coupled to or present on the user's computer system. For example, Plug & Play software or other detection software may detect devices present, their interconnections or couplings, information associated with the various devices, and programs resident in the various devices. Based on this detection, the MSD environment may automatically display a portion or all of a measurement system diagram. For example, the system diagram may include various icons corresponding to detected devices and connections (e.g., "connection icons" or "wires") between respective device icons corresponding to the couplings between devices automatically detected in the system. The connections between device icons that are automatically displayed may be displayed with an appearance indicating the type of detected connection.

In one embodiment, detection software may also automatically detect programs present in the user's computer system (or present on devices coupled to the user's computer system) and may display corresponding program icons on the system diagram or may otherwise alter the measurement system diagram to indicate the programs. In a similar manner, software may also detect a relationship (e.g., an invocation relationship) among programs resident in the various devices in the system. Connections between the program icons may be displayed to visually indicate the determined relationship.

The MSD environment may also detect other components coupled to, present on, or defined on the user's computer system (possibly including virtual or logical components) and may display corresponding icons in the measurement system diagram. For example, other components may include data points, I/O channels or aliases, databases, networked computer systems, etc.

The user may extend or change an automatically created system diagram by providing user input such as described above. For example, the user may extend the system diagram by adding new icons to represent existing components that could not be detected through automatic means and/or virtual components that are not physically present or do not correspond to a physical device. The user may also extend the system diagram by adding new icons to represent desired components which do not yet exist, such as physical components that are not physically present or virtual components that have not yet been created or defined. In one embodiment, icons which represent physical components that are not physically present or virtual components that have not yet been created or defined may be graphically depicted differently from other icons on the system diagram. For example, these icons may be visually altered using different coloring, shading, or other visual techniques to indicate to the user that the icons represent components that are not actually present or defined.

The MSD environment may be operable to store a measurement system diagram created as described above. For example, the system diagram may be stored in memory as one or more data structures and/or may be persistently stored as one or more files. Stored data representing a measurement system is also referred to herein as "measurement system data". In addition to specifying the measurement system diagram, measurement system data may also specify other aspects of a measurement system which are not explicitly indicated on the diagram.

In one embodiment, measurement system data may be transferred for use on other computer systems. As one example, measurement system data may be reloaded on another computer system to allow another user to view or further design the measurement system. In one embodiment, the MSD environment may include coordination features allowing multiple users on multiple computer systems to work on the same measurement system design. As another example, measurement system data may be transmitted to a vendor's remote computer server, e.g., for technical support or electronic commerce purposes.

Connecting Component Icons

As noted above, in one embodiment a connection that is displayed between two icons on a measurement system diagram may be context sensitive. In other words, the connection that is displayed or created on the display may have a context or appearance that is associated with the types of components being connected, the type of physical interface (e.g., network or bus type) between the components, the type of data or information flow between the components, and/or the type of logical relationship between the components.

For example, where a connection indicates a physical interface between two devices, the MSD environment may display a wire or other connection icon between the two respective device icons to indicate the type of physical interface. For example, different kinds of interface types, bus types, or network types may be visually indicated using different kinds of wires or connection icons. In one embodiment, the MSD environment may be operable to automatically determine the type of physical interface between the devices in response to receiving user input to connect the devices and may automatically display the appropriate kind of wire or connection icon. Alternatively, the user may select a link or connection from a palette based on the type of devices that the user desires to connect.

As another example, the user may desire to connect a first icon representing a laser device to a second icon representing a mirror or other optical device. When the user associates the first icon with the second icon (e.g., by clicking on the first icon and dragging the cursor to the second icon to create the connection or performing another connection technique), the MSD environment may automatically display a laser beam connection between the two icons, i.e., a connection icon which has the appearance of a laser beam or optical signal. This visually indicates to the user the type of signals that are being passed between the devices. As another example, when the user connects a tank icon representing a tank device to, for example, a valve icon representing a valve, the MSD environment may automatically display the connection with the appearance of a pipe to visually indicate to the user the type of signals or material being transferred between the devices. Other types of connection icons may be used to indicate other types of signal, material, data, or information propagation between other types of devices or components.

In one embodiment, the MSD environment may be operable to perform type checking of connections between component icons. For example, if the user attempts to connect a PCI device to a USB device, the MSD environment may determine that the devices are incompatible and generate an error indication, e.g., by displaying a broken connection and/or an error message. As another example, if the user attempts to connect a tank icon to a laser icon, the MSD environment may perform type checking and determine that the two device icons are incompatible types that cannot share the same physical phenomena.

Figure 1A:
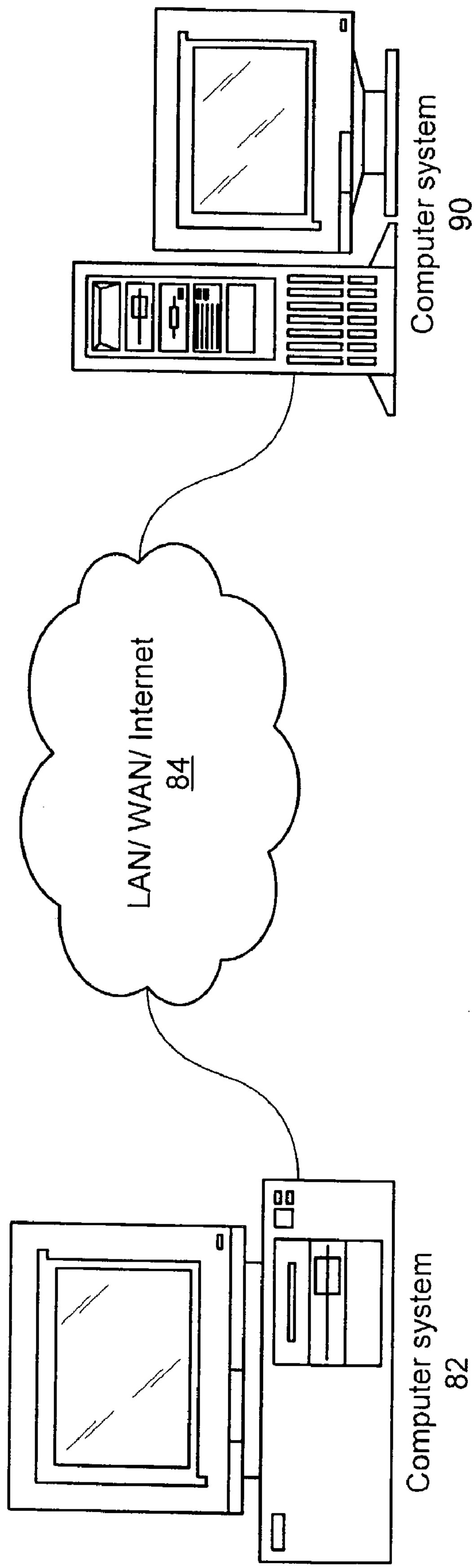
FIG. 1A illustrates an exemplary computer network including the computer system of FIG. 1.

FIG. 1A—Computer Network

FIG. 1A illustrates a system including a first computer system 82 that executes at least a portion of the MSD environment application and a second computer system 90. The first computer system 82 may be connected through a network 84 (or a computer bus) to the second computer system 90. The computer systems 82 and 90 may each be any of various types, as desired. Also, the network 84 can also be any of various types, including a LAN (local area network), WAN (wide area network), the Internet, an Intranet, or a wireless network, among others.

In various embodiments, the first computer system 82 may connect to the second computer system 90 for any of various reasons. For example, as described below, in one embodiment the second computer system 90 may be a remote computer server to which the first computer system 82 connects to download information for use in the MSD environment, to electronically place an e-commerce order, to request online technical support, etc.

In another embodiment, at least a portion of the MSD environment may execute on the second computer system 90 as well as the first computer system 82. For example, one or more wizards or guidance mechanisms (or other functionality) associated with the MSD application may execute on the second computer system 90 in response to the user interacting with a graphical user interface displayed on the first computer system 82. Information generated by the wizards or guidance mechanisms which execute on the second computer system 90 may be displayed on the first computer system 82, or the wizards or guidance mechanisms may otherwise affect the state of the portion of the MSD application which executes on the first computer system 82. In one embodiment, the user may interact with a browser or browser-like program on the first computer system 82, and the first computer system 82 may communicate with the second computer system 90 (e.g., a web server or other remote computer server) in response to the user's input to the browser interface.

Figure 2A:
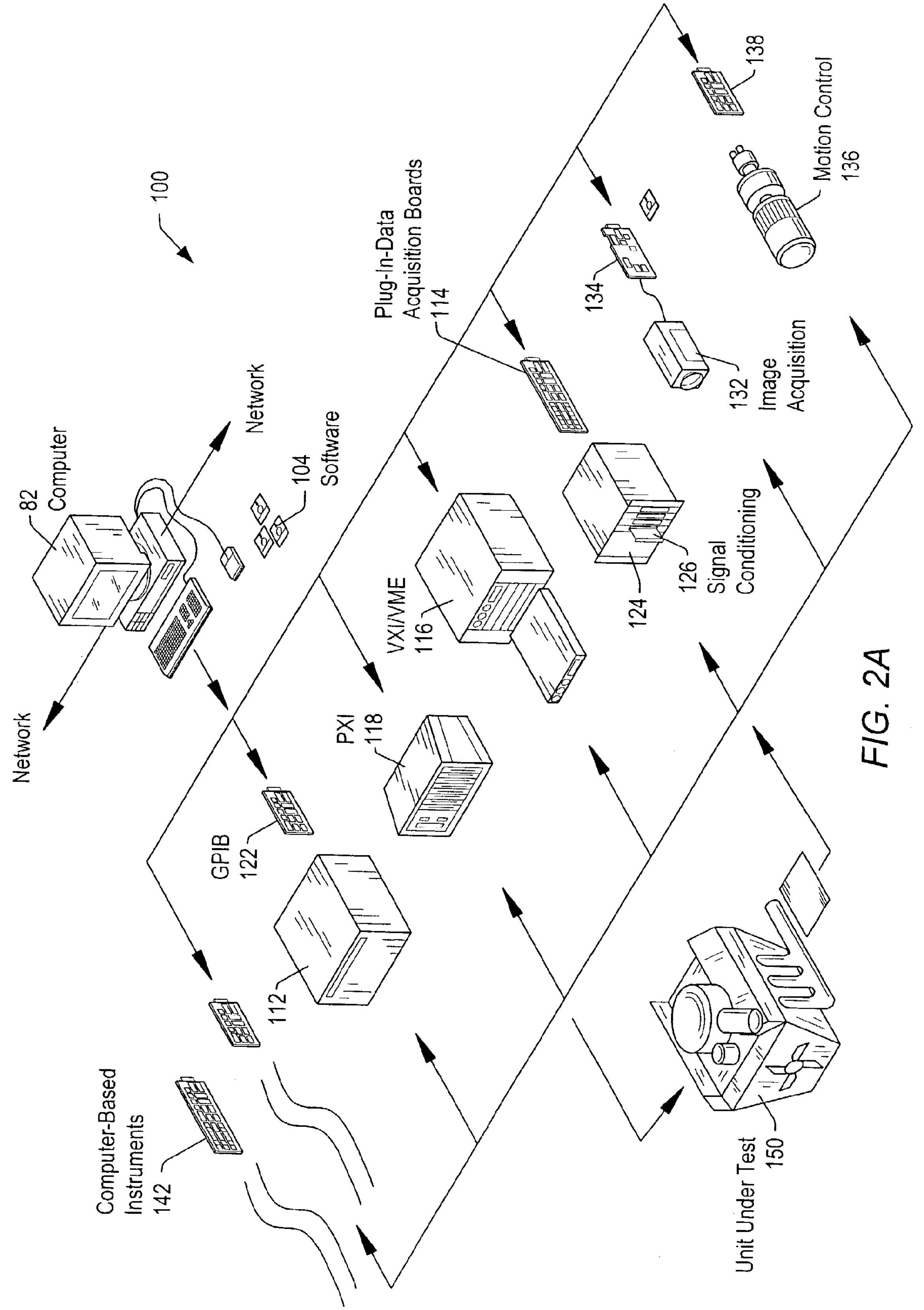
FIG. 2A illustrates an exemplary instrumentation control system.
Figure 2B:
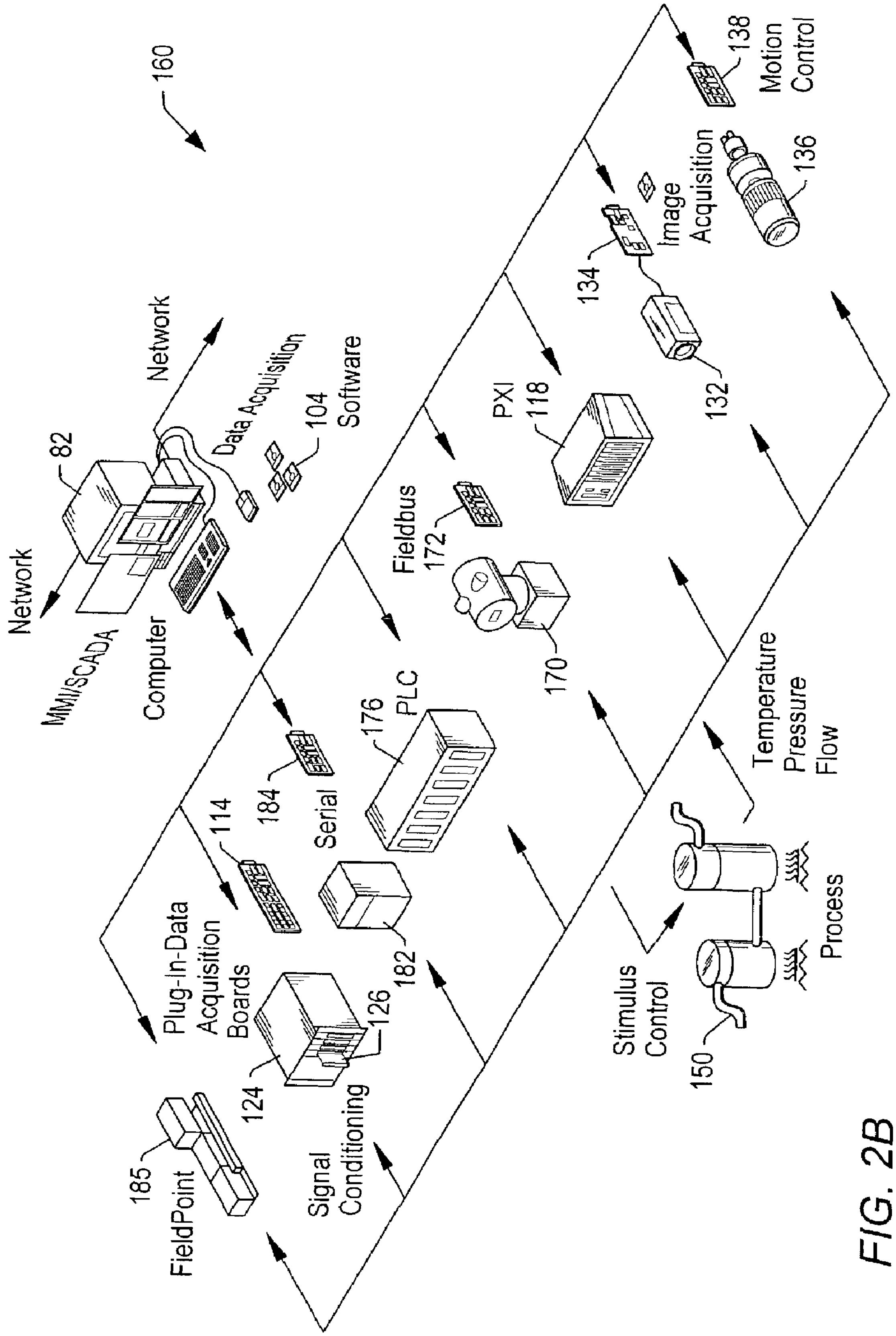
FIG. 2B illustrates an exemplary industrial automation system.

FIGS. 2A and 2B—Instrumentation and Industrial Automation Systems

FIG. 2A illustrates an exemplary instrumentation control system 100. According to one embodiment of the invention, the MSD environment may assist the user in configuring the instrumentation control system 100. The system 100 comprises a host computer 82 which connects to one or more instruments. The host computer 82 may comprise a CPU, a display screen, memory, and one or more input devices such as a mouse or keyboard as shown. The computer 82 may operate with the one or more instruments to analyze, measure or control a unit under test UUT) or process 150.

The one or more instruments may include a GPIB instrument 112 and associated GPIB interface card 122, a data acquisition board 114 and associated signal conditioning circuitry 124, a VXI instrument 116, a PXI instrument 118, a video device or camera 132 and associated image acquisition (or machine vision) card 134, a motion control device 136 and associated motion control interface card 138, and/or one or more computer based instrument cards 142, among other types of devices.

The GPIB instrument 112 may be coupled to the computer 82 via the GPIB interface card 122 provided by the computer 82. In a similar manner, the video device 132 may be coupled to the computer 82 via the image acquisition card 134, and the motion control device 136 may be coupled to the computer 82 through the motion control interface card 138. The data acquisition board 114 may be coupled to the computer 82, and may interface through signal conditioning circuitry 124 to the UUT. The signal conditioning circuitry 124 may comprise an SCXI (Signal Conditioning eXtensions for Instrumentation) chassis comprising one or more SCXI modules 126.

The GPIB card 122, the image acquisition card 134, the motion control interface card 138, and the DAQ card 114 are typically plugged in to an I/O slot in the computer 82, such as a PCI bus slot, a PC Card slot, or an ISA, EISA or MicroChannel bus slot provided by the computer 82. However, these cards 122, 134, 138 and 114 are shown external to computer 82 for illustrative purposes. These devices may also be connected to the computer 82 through a serial bus or through other means.

The VXI chassis or instrument 116 may be coupled to the computer 82 via a VXI bus, MXI bus, or other serial or parallel bus provided by the computer 82. The computer 82 may include VXI interface logic, such as a VXI, MXI or GPIB interface card (not shown), which interfaces to the VXI chassis 116. The PXI chassis or instrument may be coupled to the computer 82 through the computer's PCI bus.

A serial instrument (not shown) may also be coupled to the computer 82 through a serial port, such as an RS-232 port, USB (Universal Serial bus) or IEEE 1394 or 1394.2 bus, provided by the computer 82. In typical instrumentation control systems an instrument will not be present of each interface type, and in fact many systems may only have one or more instruments of a single interface type, such as only GPIB instruments.

In one embodiment, various ones of the instruments or various combinations of the instruments shown in FIG. 2A (or other devices) may be coupled to the computer 82 via an Ethernet or other network connection, including a wired and/or wireless network connection.

The instruments may be coupled to a unit under test (UUT) or process 150, or may be coupled to receive field signals, typically generated by transducers. The system 100 may be used in a data acquisition and control application, in a test and measurement application, an image processing or machine vision application, a process control application, a man-machine interface application, a simulation application, or a hardware-in-the-loop validation application.

FIG. 2B illustrates an exemplary industrial automation system 160. According to one embodiment of the invention, the MSD environment may assist the user in configuring the industrial automation system 160. The industrial automation system 160 is similar to the instrumentation or test and measurement system 100 shown in FIG. 2A. Elements which are similar or identical to elements in FIG. 2A have the same reference numerals for convenience. The system 160 may comprise a computer 82 which connects to one or more devices or instruments. The computer 82 may comprise a CPU, a display screen, memory, and one or more input devices such as a mouse or keyboard as shown. The computer 82 may operate with the one or more devices to a process or device 150 to perform an automation function, such as MMI (Man Machine Interface), SCADA (Supervisory Control and Data Acquisition), portable or distributed data acquisition, process control, advanced analysis, or other control.

The one or more devices may include a data acquisition board 114 and associated signal conditioning circuitry 124, a PXI instrument 118, a video device 132 and associated image acquisition card 134, a motion control device 136 and associated motion control interface card 138, a fieldbus device 170 and associated fieldbus interface card 172, a PLC (Programmable Logic Controller) 176, a serial instrument 182 and associated serial interface card 184, or a distributed data acquisition system, such as the FieldPoint system 185 available from National Instruments, among other types of devices.

The DAQ card 114, the PXI chassis 118, the video device 132, and the image acquisition card 134 may be connected to the computer 82 as described above. The serial instrument 182 may be coupled to the computer 82 through a serial interface card 184, or through a serial port, such as an RS-232 port, provided by the computer 82. The PLC 176 may couple to the computer 82 through a serial port, Ethernet port, or a proprietary interface. The fieldbus interface card 172 may be comprised in the computer 82 and may interface through a fieldbus network to one or more fieldbus devices. Each of the DAQ card 114, the serial card 184, the fieldbus card 172, the image acquisition card 134, and the motion control card 138 are typically plugged in to an I/O slot in the computer 82 as described above. However, these cards 114, 184, 172, 134, and 138 are shown external to computer 82 for illustrative purposes. In typical industrial automation systems a device will not be present of each interface type, and in fact many systems may only have one or more devices of a single interface type, such as only PLCs. The devices may be coupled to the device or process 150.

In one embodiment, various ones of the devices or various combinations of the devices shown in FIG. 2B (or other devices) may be coupled to the computer 82 via an Ethernet or other network connection, including a wired and/or wireless network connection.

As used herein, the term "instrument" is intended to include any of the devices that are adapted to be connected to a computer system as shown in FIGS. 2A and 2B, traditional "stand-alone" instruments, as well as other types of measurement and control devices. The term "measurement function" may include any type of data acquisition, measurement or control function, such as that implemented by the instruments shown in FIGS. 2A and 2B. For example, the term "measurement function" includes acquisition and/or processing of an image.

In the embodiments of FIGS. 2A and 2B above, one or more of the various instruments may couple to the computer 82 over a network, such as the Internet. In one embodiment, the user operates to select a target instrument or device from a plurality of possible target devices for programming or configuration. Thus the user may create or deploy a program on a computer and use the program in conjunction with a target device or instrument that is remotely located from the computer and coupled to the computer through a network. In one embodiment, the program may be a graphical program.

Graphical software programs which perform data acquisition, analysis and/or presentation, e.g., for measurement, instrumentation control, industrial automation, or simulation, such as in the applications shown in FIGS. 2A and 2B, may be referred to as virtual instruments.

Figure 3:
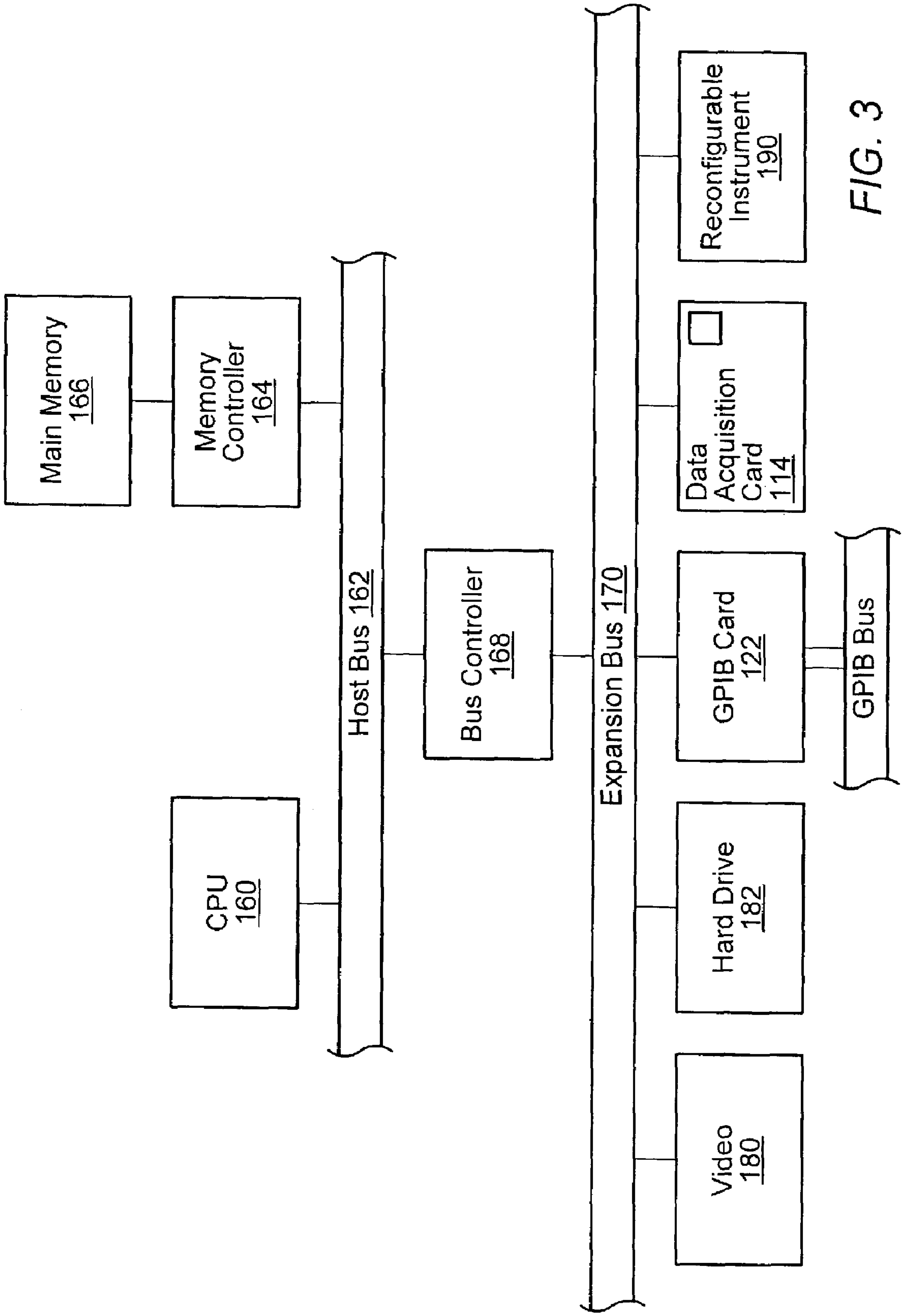
FIG. 3 is a block diagram representing one embodiment of the computer system 82 illustrated in FIGS. 1, 1A, 2A and 2B.

FIG. 3—Computer System Block Diagram

FIG. 3 is a block diagram representing one embodiment of the computer system 82 illustrated in FIGS. 1, 1A, 2A and 2B. It is noted that any type of computer system configuration or architecture can be used as desired, and FIG. 3 illustrates a representative PC embodiment. It is also noted that the computer system may be a general purpose computer system, a computer implemented on a VXI card installed in a VXI chassis, a computer implemented on a PXI card installed in a PXI chassis, or other types of embodiments. Elements of a computer not necessary to understand the present description have been omitted for simplicity.

The computer may include at least one central processing unit or CPU 160 which is coupled to a processor or host bus 162. The CPU 160 may be any of various types, including an ×86 processor, e.g., a Pentium class, a PowerPC processor, a CPU from the SPARC family of RISC processors, as well as others. Main memory 166 is coupled to the host bus 162 by means of memory controller 164. The main memory 166 may store software implementing the MSD environment. The main memory may also store operating system software, as well as other software for operation of the computer system.

The host bus 162 may be coupled to an expansion or input/output bus 170 by means of a bus controller 168 or bus bridge logic. The expansion bus 170 may be the PCI (Peripheral Component Interconnect) expansion bus, although other bus types can be used. The expansion bus 170 includes slots for various devices such as a data acquisition board 114 and a GPIB interface card 122 which provides a GPIB bus interface to a GPIB instrument. The computer 82 further comprises a video display subsystem 180 and hard drive 182 coupled to the expansion bus 170.

As shown, a reconfigurable instrument 190 may also be connected to the computer. The reconfigurable instrument 190 may include configurable logic, such as a programmable logic device, e.g., an FPGA, or a processor and memory, which may execute a real time operating system. In various embodiments, the configurable logic may be comprised on an instrument or device connected to the computer through means other than an expansion slot, e.g., the instrument or device may be connected via an IEEE 1394 bus, USB, or other type of port, or may be connected via a network. Also, the configurable logic may be comprised on a device such as the data acquisition board 114 or another device shown in FIG. 2A or 2B.

Figure 4:
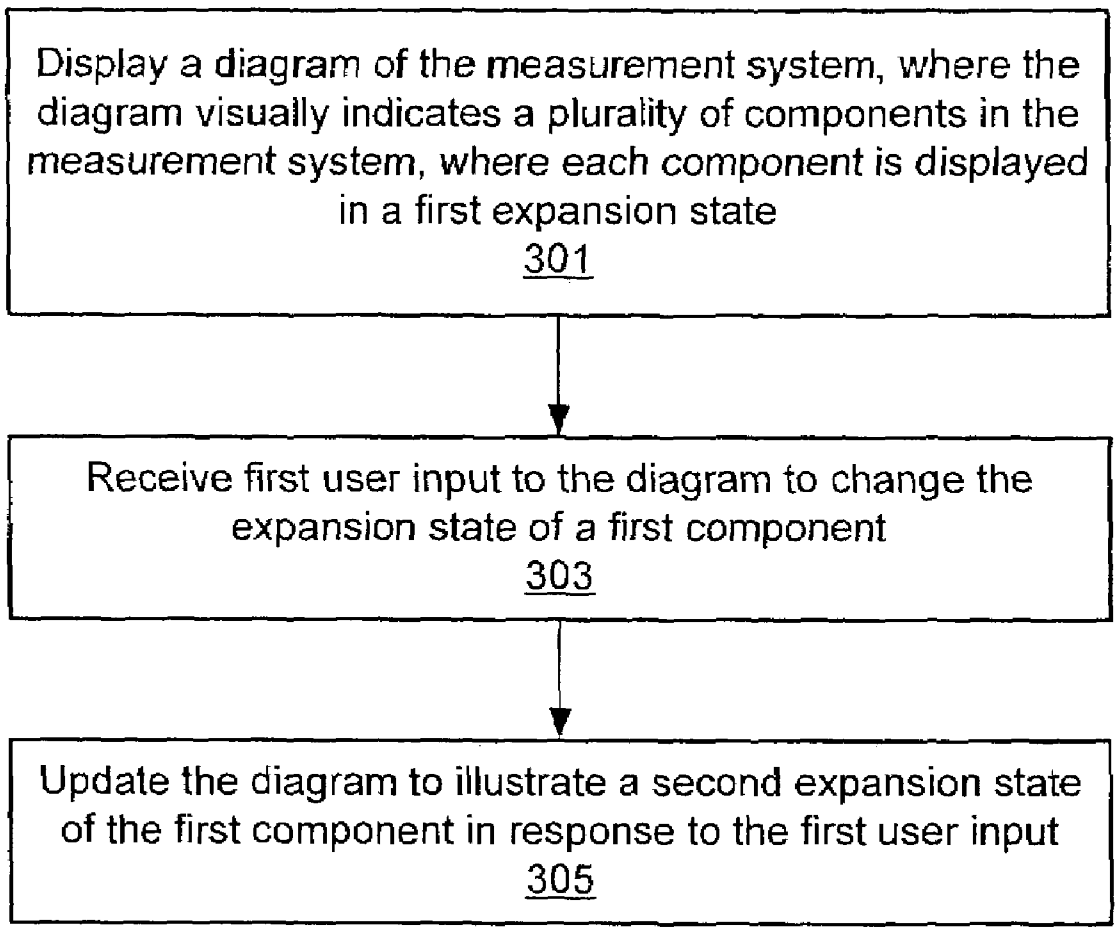
FIG. 4 is a flowchart diagram illustrating one embodiment of a method for displaying a diagram of a measurement system, in which various components in the diagram may be expanded or collapsed as desired.

FIG. 4—Expanding and Collapsing Components in a Measurement System Diagram

It may be desirable to allow the user to view various aspects of a measurement system at various levels of granularity. For example, the user may desire to view details regarding one or more components in the measurement system but may not want to see details for other components. FIG. 4 is a flowchart diagram illustrating one embodiment of a method for displaying a diagram of a measurement system, in which various components in the diagram may be expanded or collapsed as desired. This may allow the user to view a compact diagram illustrating the measurement system from a high level, or to expand various components in the diagram to "drill down" into particular sub-systems or components to view details regarding those sub-systems or components. It is noted that FIG. 4 illustrates a representative embodiment, and alternative embodiments are contemplated. Also, various elements may be combined, omitted, or performed in different orders. In one embodiment, an MSD environment application such as described herein may implement the method of FIG. 4.

In 301, a diagram of the measurement system may be displayed, where the diagram illustrates a plurality of components in the measurement system. In various embodiments, the diagram may illustrate any kind of measurement system including any kind of component, similarly as described above. Components illustrated in the diagram may correspond to physical components or devices in the measurement system. In one embodiment, one or more components in the diagram may also comprise virtual or logical components. In one embodiment, components which correspond to physical components or devices may be represented using icons which visually resemble the respective physical components or devices. Also, as described below, the illustration of a component in the diagram may change depending on the current expansion state of the component. The diagram may also visually indicate coupling relationships between components of the measurement system, e.g., using wires, lines, or other representations.

In one embodiment, the diagram of the measurement system may be displayed in a software application (such as the MSD environment described herein) which allows the user to edit the diagram, e.g., to design the measurement system. Thus, in one embodiment the diagram may be displayed as the diagram is being edited. In another embodiment, the diagram may be displayed only for the purpose of viewing the diagram. For example, the software application may not allow the user to edit the diagram, or the user may not want to edit the diagram.

In one embodiment, the plurality of components in the measurement system may be illustrated in the diagram by a plurality of component icons. As used herein, an "icon" may comprise a portion of graphical information displayed on a display. The icon may have any appearance, shape, or size. Each component icon may correspond to a component in the measurement system.

Each component (or at least a subset of the components) displayed in the diagram may have a plurality of possible expansion states. For example, each component may have a minimum expansion state and a maximum expansion state and possibly one or more expansion states in between. In the minimum expansion state, the component may be fully collapsed, i.e., may be displayed at a highest or most abstract level. In the maximum expansion state, the component may be fully expanded, i.e., may be displayed at a lowest or most detailed level. In 301, each component may be displayed in a first expansion state, which may be any of the expansion states for the respective component.

In 303, first user input may be received to the diagram to change the expansion state of a first component in the diagram. The user input may be input for either increasing the expansion state of the first component relative to the first expansion state of the first component or decreasing the expansion state of the first component relative to the first expansion state of the first component.

In various embodiments, the first user input to the diagram to change the expansion state of the first component may be received to any portion of the diagram and may be received in any of various ways. In one embodiment, the first user input may be received to the first component itself. For example, the user may provide input to the first component using a mouse, pen device, or other pointing device. In one embodiment, the user may invoke a context menu associated with the first component to change its expansion state, e.g., by clicking on the first component to pop up the context menu. In another embodiment, displaying the first component may include displaying a region within the component for changing the expansion state of the component. Thus, the first user input may be received to this region. For example, in one embodiment, the region may include a first portion for increasing the expansion state of the component and a second portion for decreasing the expansion state of the component, and the user may click on or otherwise provide input to the desired portion to increase or decrease the expansion state. The region or portions in the region may be visually indicated in any way, e.g., using arrows, plus or minus signs, etc.

In 305, the diagram may be updated to illustrate a second expansion state of the first component in response to the first user input received in 303, i.e., either an increased or decreased expansion state relative to the first expansion state of the first component. Updating the diagram to illustrate the second expansion state of the first component may include changing the appearance of the first component or re-displaying the first component. Where the first component is represented in the diagram by a first icon, the diagram may be updated by changing the first icon or replacing the first icon with a second icon representing the first component, where the second icon (or the changed first icon) illustrates the second expansion state of the first component.

Where, the first user input in 303 is user input requesting to increase the expansion state of the first component, the appearance of the first component may be altered in any way to visually indicate the increased expansion state. For example, displaying the first component in its first expansion state may indicate first information regarding the first component. Visually indicating the increased expansion state may comprise changing the appearance of the first component to indicate second information regarding the first component. For example, the second information may include more information or more details regarding the first component than the first information.

Similarly, displaying the first component in its first expansion state may comprise displaying first visual information representing the first component. Visually indicating the increased expansion state may comprise displaying second visual information representing the first component. For example, the second visual information may provide more visual detail regarding the first component than the first visual information. As one example, the first component may comprise a physical component, such as a hardware device, a unit under test (UUT), etc. Visually indicating the increased expansion state may comprise re-displaying the first component to more accurately indicate the physical appearance of the first component. For example, in its first expansion state, the first component may be abstractly represented by a first icon, such as a simple box indicating the name or type of the first component. In its increased expansion state, the first component may be visually indicated by a more accurate or more detailed second icon, such as an illustration, photograph, or detailed CAD drawing of the physical component itself.

In various embodiments, the increased expansion state may visually indicate any of various kinds of additional or more detailed information regarding the first component, and the information may be presented in any way, e.g., as text or graphical information, or both. The type of information displayed may vary depending on the type of component. As one example, the first component may comprise a hardware device having one or more channels or other connection points. The channels or connection points may not be visible when the first component is displayed in its first expansion state. When the expansion state of the first component is increased, the channels or connection points may then be displayed.

In one embodiment, the first component may have one or more child components which are not visible when the first component is displayed in its first expansion state. When the expansion state of the first component is increased, the one or more child components may then be displayed. For example, the first component may comprise a component which includes the one or more child components in a hierarchical manner. As one example, the first component may comprise a hardware chassis, and the one or more child components may comprise one or more modules installed in the hardware chassis. As described above, the hardware chassis may first be abstractly represented by a simple first icon. The hardware chassis or first icon may then be expanded, causing the first icon to be changed or replaced by a second icon illustrating the physical appearance of the hardware chassis. When this occurs, the one or more modules may be displayed by or within the second icon. For example, the one or more modules themselves may be illustrated either abstractly or using their real physical appearances.

In one embodiment the child components of the first component may also have multiple possible expansion states. Thus, once the child components become visible, the user may also change the expansion states of the child components to view more or less information regarding the child components, as desired. The display of the child components may be changed similarly as for the first component.

In one embodiment, indicating the increased expansion state of the first component may include increasing the display size of the first component. In other words, in the increased expansion state the first component may be displayed over a larger area than in the first expansion state. In one embodiment, the first component may be expanded vertically. The first component may also or alternatively be expanded horizontally.

In one embodiment, increasing the expansion state of the first component may not only allow the user to view additional information regarding the first component but may also allow the user to perform additional actions involving the first component. For example, where the user is currently editing the diagram, the user may desire to connect a first channel of the first component to a second component in the diagram. As described above, channels of the first component may not be visible when the first component is displayed in its first expansion state. By increasing the expansion state of the first component, the user may access the first channel, e.g., by connecting a wire to the first channel from the second component.

Where, the first user input in 303 is user input requesting to decrease the expansion state of the first component, the appearance of the first component may be altered in any way to visually indicate the decreased expansion state. For example, displaying the first component in its first expansion state may indicate first information regarding the first component. Visually indicating the decreased expansion state may comprise changing the appearance of the first component to indicate second information regarding the first component. For example, the second information may include less information or less details regarding the first component than the first information. For example, the second information may include less information regarding elements, functionality, or other details of the first component. Also, the first component may be re-displayed to more abstractly illustrate the first component or to illustrate the first component in less visual detail. If the first component has child components that are visible when the first component is displayed in its first expansion state, these child components may be removed from view when the expansion state of the first component is decreased.

In one embodiment, indicating the decreased expansion state of the first component may include decreasing the display size of the first component. In other words, in the decreased expansion state the first component may be displayed over a smaller area than in the first expansion state. In one embodiment, the first component may be collapsed vertically. The first component may also or alternatively be collapsed horizontally.

As described above, connections or couplings between components in the measurement system may be illustrated on the diagram. In one embodiment, multiple channels or connection points of the first component may be connected to one or more other components in the measurement system. The method may operate to change the display of these multiple connections depending on the expansion state of the first component. For example, when the first component is in a collapsed expansion state, multiple connections to channels of the first component may be illustrated as a single wire connected to the first component. When the first component is then expanded to illustrate channels of the first component, the single wire may be replaced by a plurality of individual wires, where each individual wire is shown connected to its corresponding channel on the first component. Similarly, if the first component is then collapsed again, the plurality of wires may be replaced by the single wire.

For other types of couplings, the diagram may be updated in other ways in response to increasing or decreasing the expansion state of the first component to illustrate more or less detail regarding the coupling. For example, the first component may comprise a first tank, and the first tank may be coupled to a second tank component in the measurement system. When the first component is in an expanded state, a coupling between the first tank and the second tank may be illustrated as a three-dimensional pipe. If the first tank component and/or the second tank component is then collapsed, the pipe may be replaced on the diagram by a simple line.

Updating the diagram to illustrate the second expansion state of the first component may not affect the expansion states of the components other than the first component. This may allow the user to expand or collapse components independently of each other to view each component at a desired level of detail.

In one embodiment updating the diagram may include adjusting the locations of other components relative to the first component, e.g., to accommodate or reflect an increase or decrease in the display size of the first component. Also, in one embodiment, the display of one or more of the other components may be changed in response to changing the expansion state of the first component. For example, if a second component is displayed within the first component and the first component is completely collapsed, the second component may be entirely hidden from view.

In one embodiment, information may be displayed on the components in the diagram to indicate the current expansion states of the components, e.g., to indicate whether each component is at its minimum expansion state, maximum expansion state, or in between. This information may indicate to the user whether each component can be further expanded or collapsed. Thus, in one embodiment, this information may be updated on the first component in response to changing the expansion state of the first component.

The discussion above pertains to a single expansion state change for a single component. It is noted that expansion state of the first component may be changed multiple times as desired, and the diagram may be updated accordingly each time. Also, expansion states of any of the other components in the diagram may be changed as desired as well, and may be changed in any order. Thus, a diagram with many components may have many possible display states as expansion states for the various components are changed with respect to each other. In one embodiment, a feature to change expansion states for multiple components at once may be provided. For example, the user may be able to completely collapse each component in the diagram as a single operation, completely expand each component in the diagram as a single operation, change the expansion state of each component in the diagram up or down one level (or a specified number of levels) as a single operation, etc.

Figure 5:
FIGS. 5-10 illustrate examples of measurement system components shown in different states of expansion.
Figure 6:
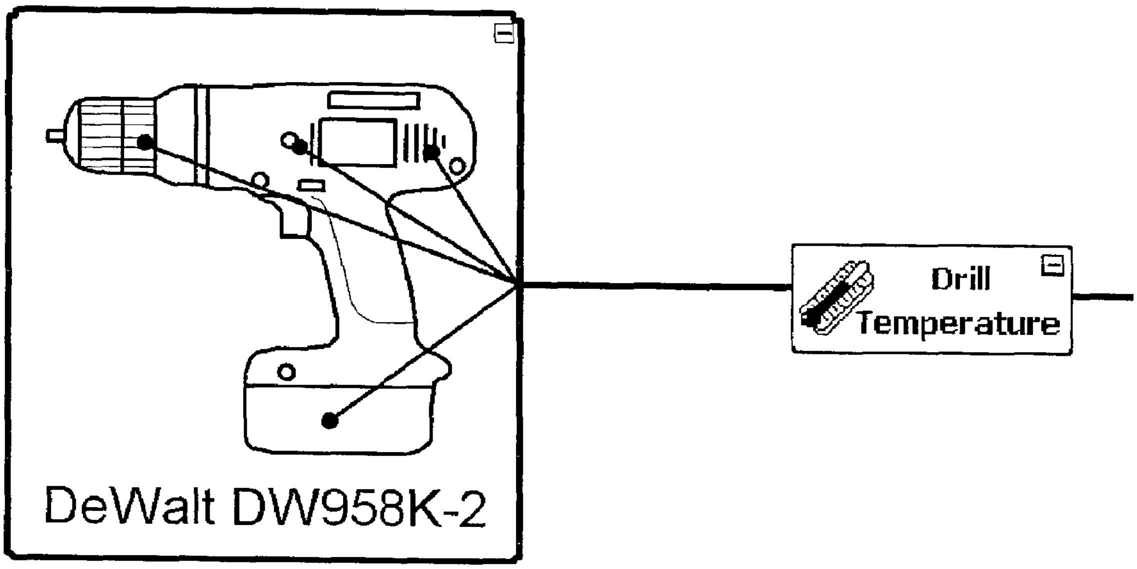
Figure 7:
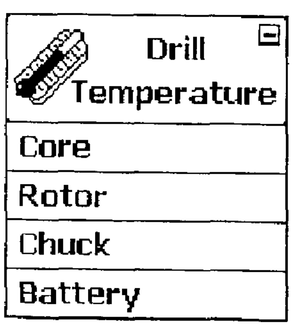

FIGS. 5-10 illustrate examples of components shown in different states of expansion. FIG. 5 illustrates a portion of a measurement system diagram including a first component representing a unit under test (UUT) (the left hand side icon) coupled to a second component representing a plurality of measurements to acquire from a UUT (the right hand side icon). In this case, the first component corresponds to a physical device, i.e., the unit under test, which is a power drill in this case, and the second component comprises a virtual component, i.e., the measurements to be acquired. FIG. 6 illustrates the diagram portion after the first component has been expanded. As shown, the first component is now displayed over a larger area and illustrates more detail regarding the UUT. The line connecting the first icon and the second icon has also been expanded into multiple lines, where each line is connected to a point on the drill from which one of the measurements is acquired. FIG. 7 illustrates the second component by itself after it has been expanded. In the increased expansion state, the individual measurements represented by the second component are displayed, whereas they are not displayed in the collapsed expansion state.

Figure 8:
Figure 9:
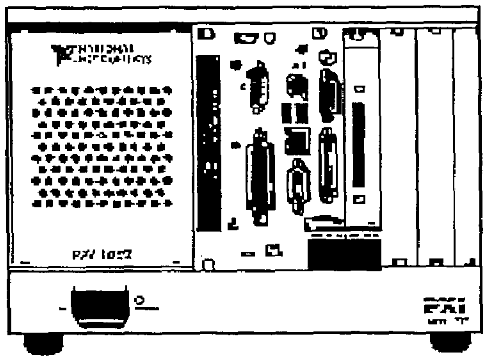

FIG. 8 illustrates another example of a component displayed in a collapsed expansion state. In this case, the component comprises a PXI chassis. FIG. 9 illustrates the result of expanding the component. In this example, an I/O module is installed in the PXI chassis, as illustrated in FIG. 9. As described above, once the I/O module is visible, the user can also expand the I/O module. As described in detail below, when the I/O module is expanded another icon displaying details of the I/O module may be displayed, as shown in FIG. 10.

Figure 138:
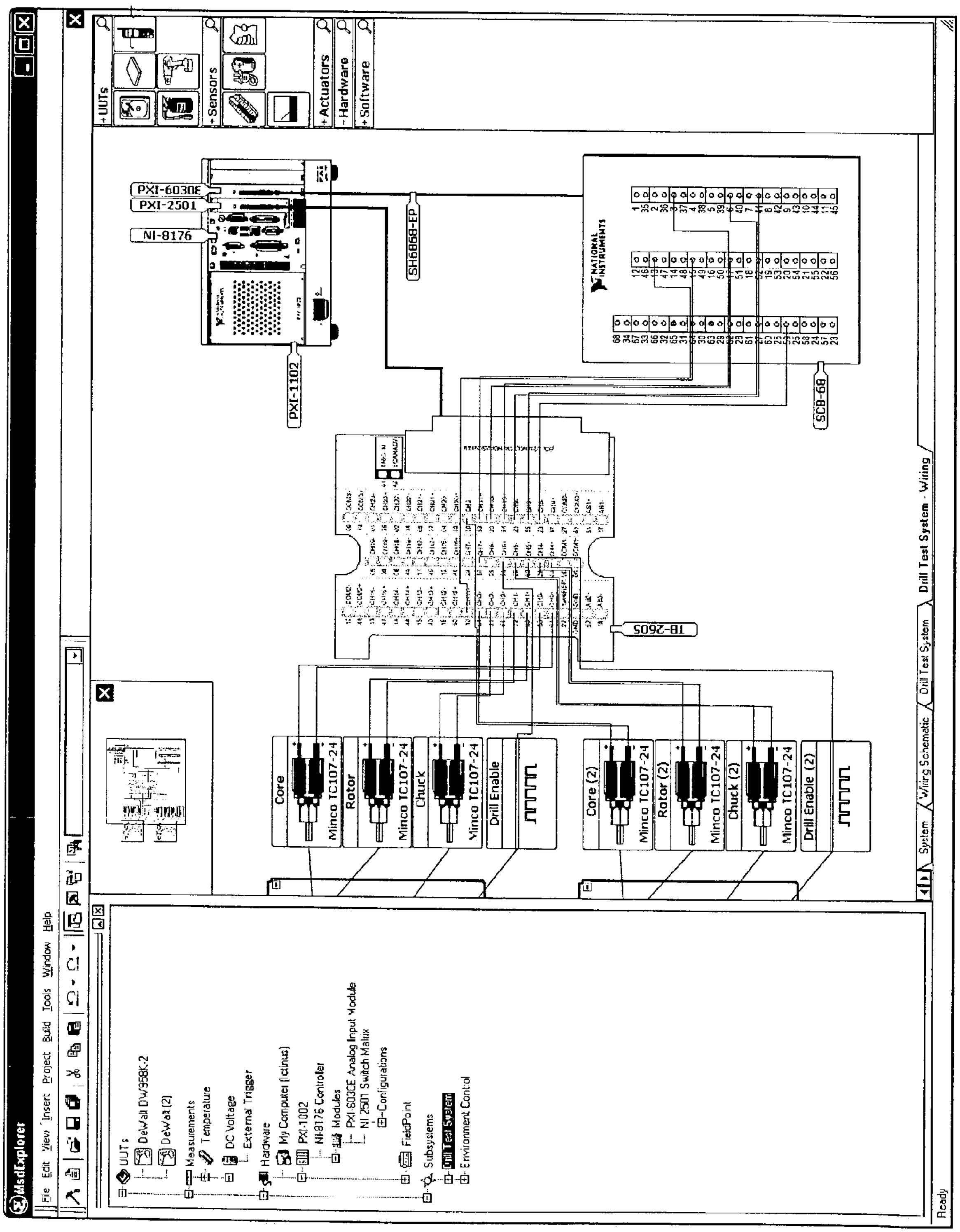

Additional examples of changing component expansion states are described below with reference to FIGS. 29-138. It is noted that these examples and the examples shown in FIGS. 5-10 are exemplary only, and in various embodiments the above-described method may be implemented in any of various ways.

Figure 11:
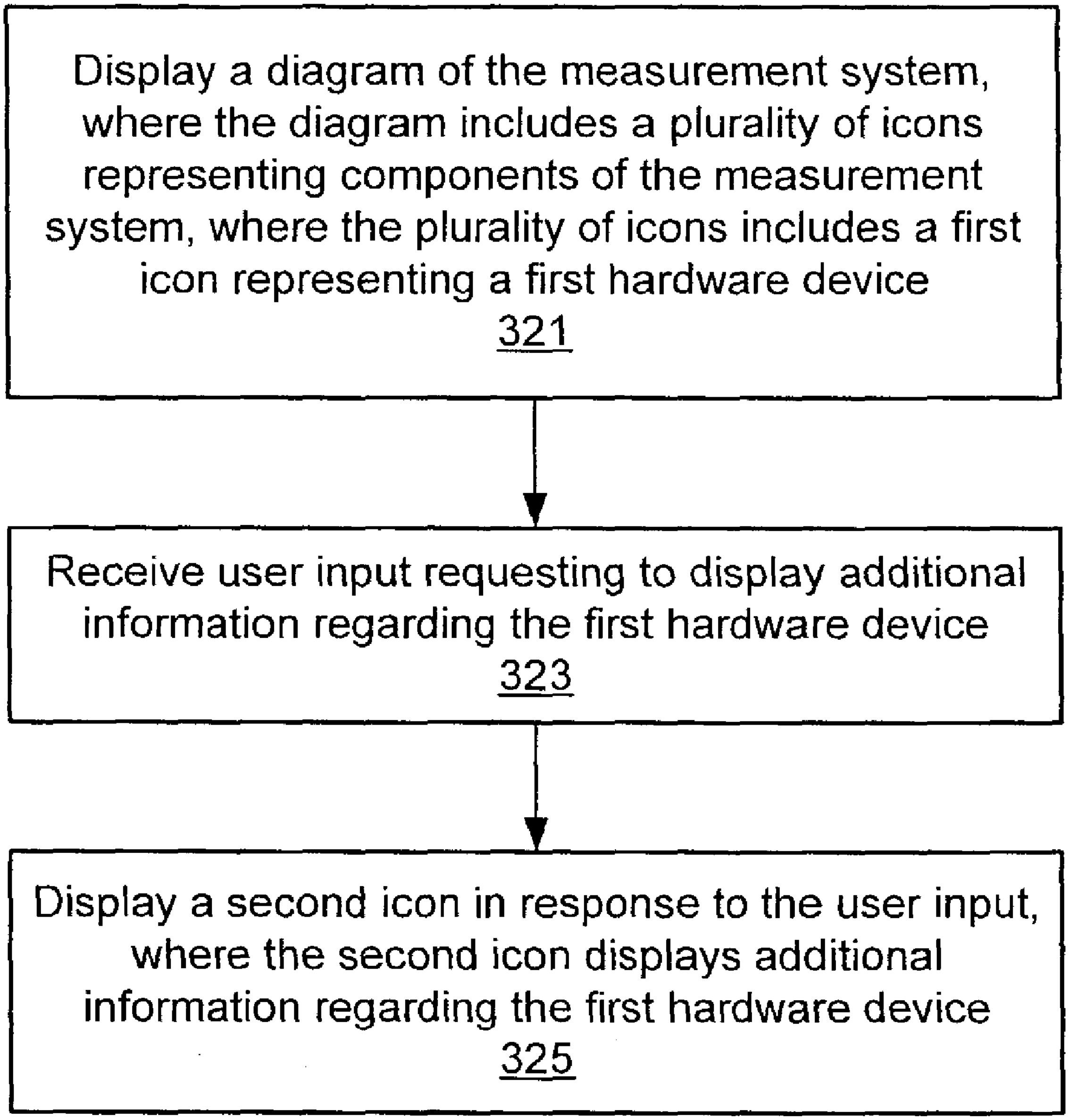
FIG. 11 is a flowchart diagram illustrating one embodiment of a method for displaying a hardware functionality icon to visually indicate information regarding a hardware device component in a diagram.

FIG. 11—Icon Representing Functionality of a Hardware Device

Figure 10:
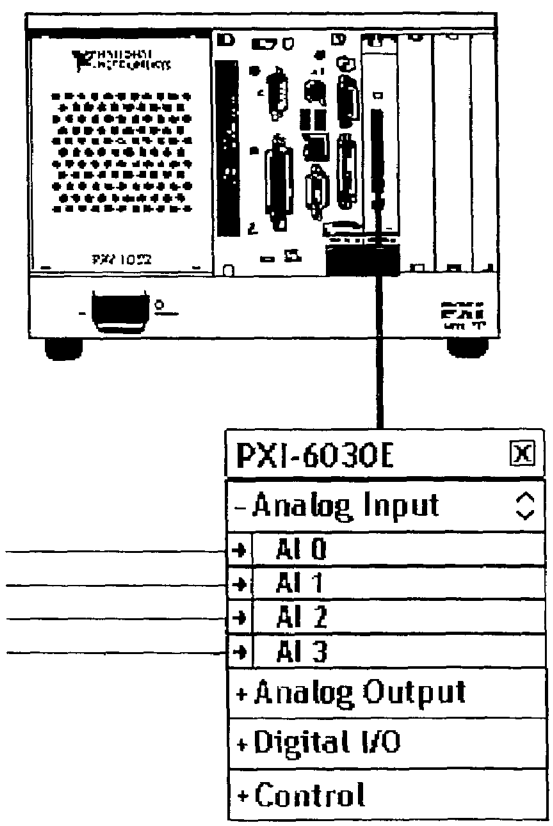

As illustrated by FIG. 10, in one embodiment expanding a component may result in an additional icon being displayed, where the additional icon visually indicates additional information regarding the component. FIG. 11 is a flowchart diagram illustrating one embodiment of a method for displaying an additional icon to visually indicate information regarding a hardware device component. It is noted that FIG. 11 illustrates a representative embodiment, and alternative embodiments are contemplated. Also, various elements may be combined, omitted, or performed in different orders.

In 321, a diagram of the measurement system may be displayed, similarly as described above with reference to 301 of FIG. 4. The diagram may include a plurality of icons representing components of the measurement system. The plurality of icons may include a first icon representing a first hardware device. As described above, in one embodiment the first icon may comprise an illustration of the physical appearance of the first hardware device. The first hardware device may comprise any type of hardware device, including devices or instruments such as described above and illustrated in FIGS. 2A and 2B. The first hardware device may be a standalone hardware device or a device included or installed in another hardware device, e.g., installed as a board or module.

In 323, user input requesting to display additional information regarding the first hardware device may be received. In one embodiment, this user input may comprise user input requesting to increase an expansion state of the first hardware device, as described above. In another embodiment, this user input may comprise user input requesting to display the additional information regarding the first hardware device independently of or without affecting the expansion state of the first hardware device.

In one embodiment receiving the user input requesting to display additional information regarding the first hardware device may comprise receiving user input to the diagram. For example, the user input may be received to the first icon, e.g., by clicking on the first icon, invoking a context menu associated with the first icon, etc. In one embodiment, the first icon may include a region for requesting to change the amount of information displayed regarding the first hardware device, and the user may click on this region.

In 325, a second icon may be displayed in response to the user input received in 323, where the second icon displays additional information regarding the first hardware device. In the preferred embodiment, the second icon is displayed on the diagram. For example, the second icon may be displayed near to or proximal to the first icon. In one embodiment, the second icon may be displayed below the first icon. A connection such as a line may also be displayed between the first icon and the second icon. This connection may indicate to the user that the information displayed by the second icon pertains to the first hardware device.

In various embodiments the additional information regarding the first hardware device may comprise any kind of information and may be displayed by the second icon in any of various ways. The type of information and the manner in which it is displayed may differ for different kinds of hardware devices. In one embodiment, the additional information regarding the first hardware device may include text information. The additional information regarding the first hardware device may also or may alternatively include graphical information.

In one embodiment, the second icon may display information indicating functionality of the first hardware device. The second icon may also display information indicating hardware resources of the first hardware device. The second icon may also display information indicating connectable resources, such as channels or other resources, of the first hardware device. For example, as described below, the user may utilize the display of the connectable resources to connect the first hardware device to one or more other components in the diagram.

As one example, where the first hardware device comprises a measurement device, the second icon may display information indicating or pertaining to measurement functionality of the measurement device. For example, displaying information indicating measurement functionality of the measurement device may include displaying information indicating analog input functionality of the measurement device, analog output functionality of the measurement device, digital input functionality of the measurement device, digital output functionality of the measurement device, control functionality of the measurement device, triggering, sampling rate, gain, etc.

In another embodiment, the first hardware device may include communication functionality for communicating with other devices, and the second icon may display information indicating or pertaining to communication functionality of the first hardware device. For example, displaying information indicating communication functionality of the first hardware device may include displaying information indicating network communication functionality of the first hardware device (e.g., Ethernet communication functionality, TCP/IP communication functionality, etc.), serial communication functionality of the first hardware device, bus communication functionality of the first hardware device, etc.

As noted above, in various embodiments the additional information regarding the first hardware device may be displayed by the second icon in any of various ways. In one embodiment, the second icon may include a plurality of fields, and each field may display text and/or graphical information indicating functionality or characteristics of the first hardware device. For example, different fields may be used to display different types of functionality or characteristics of the first hardware device. In one embodiment, one or more of the fields may be expandable/collapsible. For example, when the second icon is first displayed, a first field may be displayed at a most collapsed level. The user may then expand the first field one or more times to display additional information in the first field. Each time a field is expanded, more information may be displayed in the field.

In one embodiment, when a field is expanded, one or more rows or columns may be displayed within the field. As one example, the first hardware device may include a plurality of channels. One of the fields in the second icon, referred to as a channel field, may be used to visually indicate the channels. For example, when the channel field is expanded, each channel may be displayed as a row within the channel field. In one embodiment, only a subset of the channels may initially be displayed as rows within the channel field when the channel field is initially expanded. The user may then expand the channel field again to view additional channels. For example, in one embodiment, when the channel field is initially displayed, only channels which are currently connected to other components in the measurement system may be displayed. The user may expand the channel field again to view unused channels. As another example, the first hardware device may include a plurality of physical connector pins, and each connector pin or a subset of the connector pins may be displayed within a field in the second icon.

In one embodiment, user input may be received to the second icon to configure the first hardware device. As one example, the second icon may be used to specify a connection from the first hardware device to another component of the measurement system. For example, a network connection, channel connection, or other type of connection may be specified using the second icon. For example, a connection may be specified by connecting a wire to the second icon in response to user input. The wire may also be connected to another component of the measurement system and may visually indicate a connection from the first hardware device to the other component. In an embodiment in which connectable resources are indicated as rows within the second icon as described above, wires may be connected to one or more of the rows to specify connections to or from the desired connectable resources.

In one embodiment, one or more software programs may be associated with the first hardware device. For example, the one or more software programs may be deployed on the first hardware device or may be marked for future deployment on the first hardware device. For example, the first hardware device may comprise a hardware device operable to execute software programs, e.g., a device which includes a processor or configurable logic such as an FPGA. In one embodiment the one or more software programs associated with the first hardware device may be visually indicated by the second icon. For example, where the second icon includes a plurality of fields, one of the fields may be a software field which can be expanded or collapsed as desired to view the software programs, e.g., to view names of the software programs. In one embodiment, the user may be able to launch the software programs in an editor simply by clicking on the names of the programs or otherwise interacting with the second icon, e.g., using a context menu. In one embodiment, one or more of the software programs associated with the first hardware device may be graphical programs.

In one embodiment, information displayed by the second icon regarding functionality or hardware resources of the first hardware device may be influenced by one or more software programs associated with the first hardware device. For example, the second icon may visually indicate particular hardware resources or a subset of hardware functionality which is used, required, or referenced by one or more of the software programs. The user may be able to configure the second icon to display only these particular hardware resources or to display all hardware resources or all hardware functionality of the first hardware device.

In one embodiment, hardware functionality of the first hardware device may change in response to deploying a software program on the first hardware device. For example, deploying a software program on a first hardware device which includes an FPGA or other reconfigurable hardware element may cause functionality or resources of the first hardware device to change. Thus, the changed functionality or hardware resources may be visually indicated by the second icon.

The user may also remove the second icon from view if desired. For example, the user may click on a region in the first icon or the second icon to hide the second icon or may provide other types of pointing device, menu, or keyboard input to hide the second icon.

Figure 12:
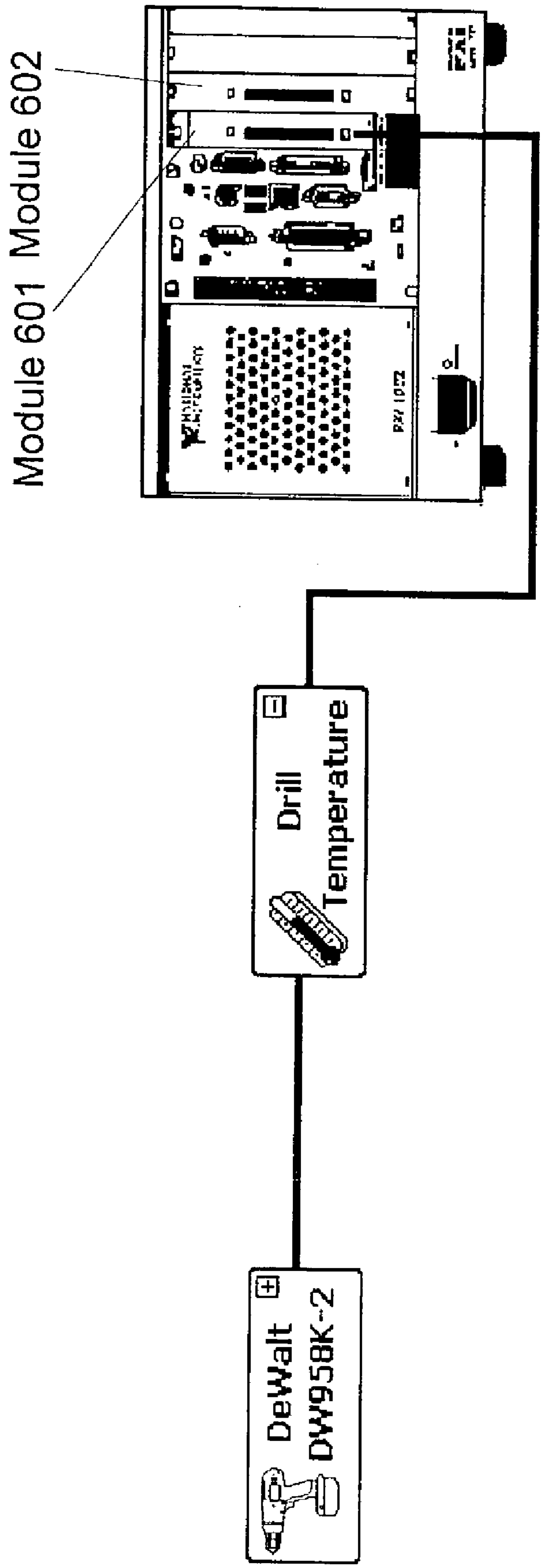
FIGS. 12-19 illustrate examples of displaying hardware functionality icons.
Figure 13:
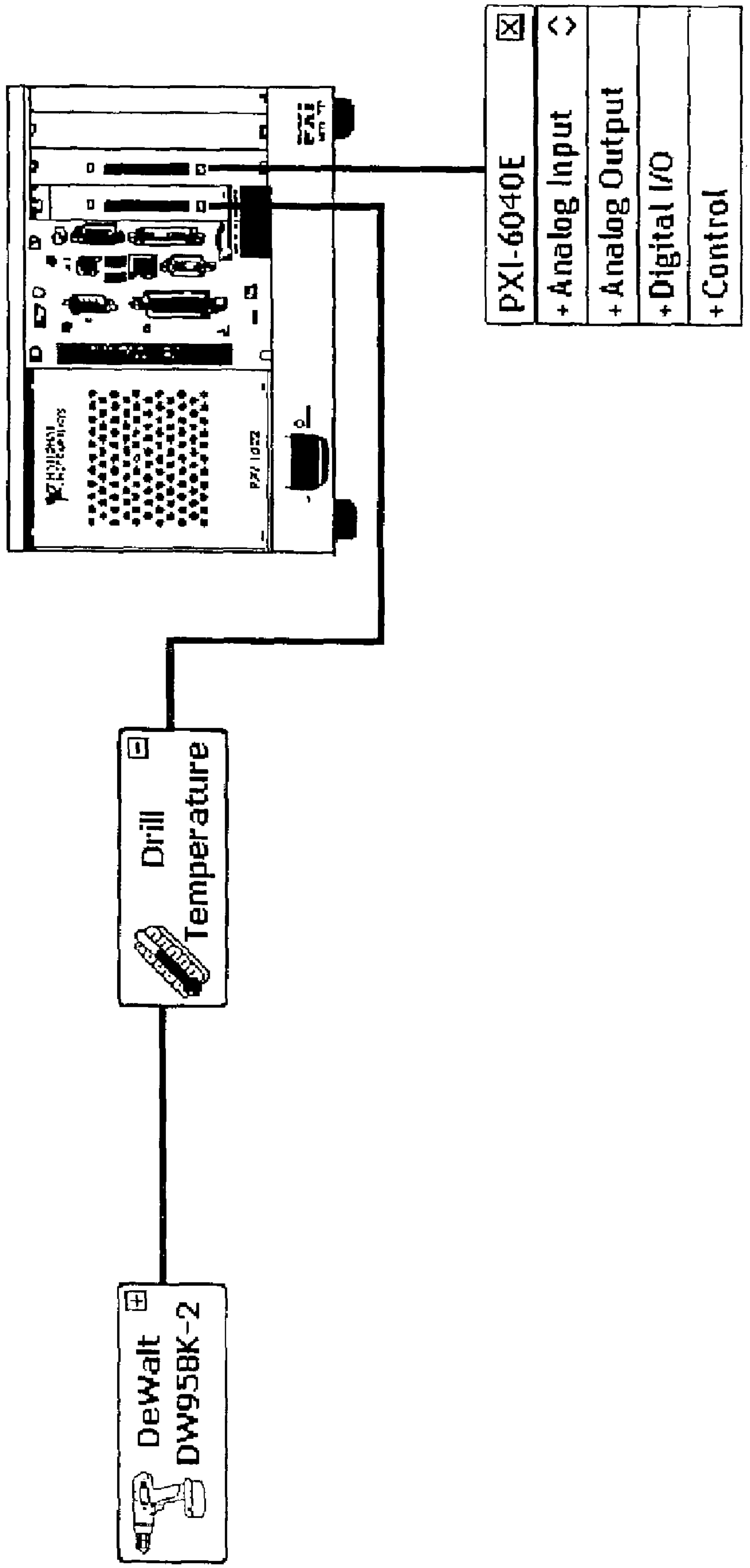
Figure 14:
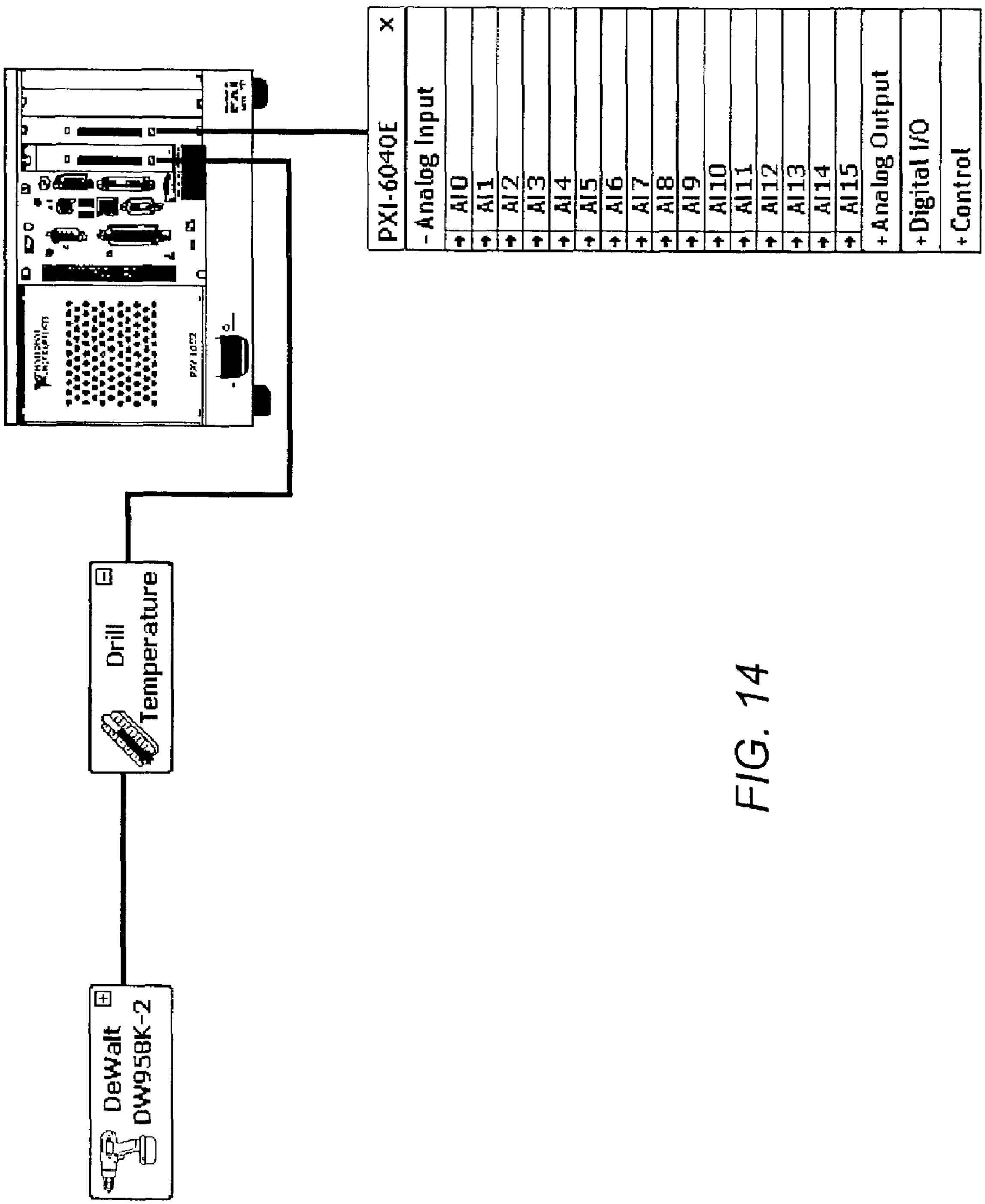

A second icon such as described above is also referred to herein as a hardware functionality icon. FIGS. 12-19 illustrate examples of displaying hardware functionality icons such as described above. FIG. 12 illustrates a portion of a measurement system diagram which includes a PXI chassis, which is represented by the icon on the right hand side (the first icon). Two modules 601 and 602 are installed within the PXI chassis, and the user may request to view additional information regarding either or both of these modules. FIG. 13 illustrates the diagram after the user has requested to view additional information regarding the module 602. As shown, a hardware functionality icon has been displayed below the first icon. The hardware functionality icon includes four expandable fields labeled, “Analog Input”, “Analog Output”, “Digital I/O”, and “Control”. FIG. 14 illustrates the diagram after the user has requested to expand the “Analog Input” field. As shown, the hardware functionality icon now includes a plurality of rows visually indicating analog input channels of the module 602.

Figure 15:
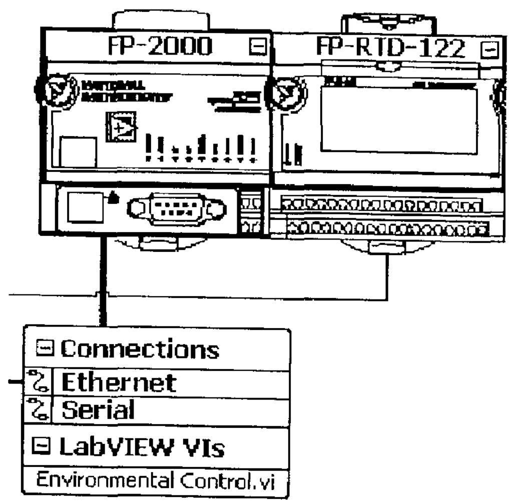

FIG. 15 illustrates another example of a hardware functionality icon displayed below a first icon. In this case the first icon represents a Fieldpoint hardware device, and the hardware functionality icon visually indicates network functionality of the device. The hardware functionality icon also includes a field which lists a software program (“Environmental Control.vi”) associated with the Fieldpoint hardware device.

Figure 16:
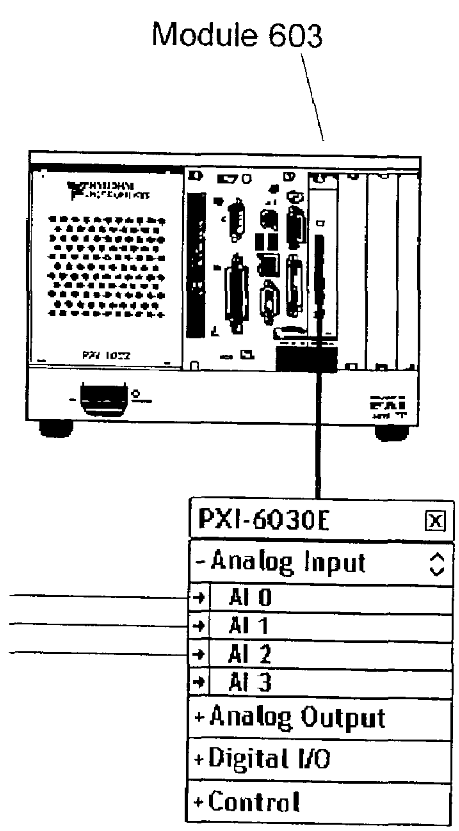
Figure 17:
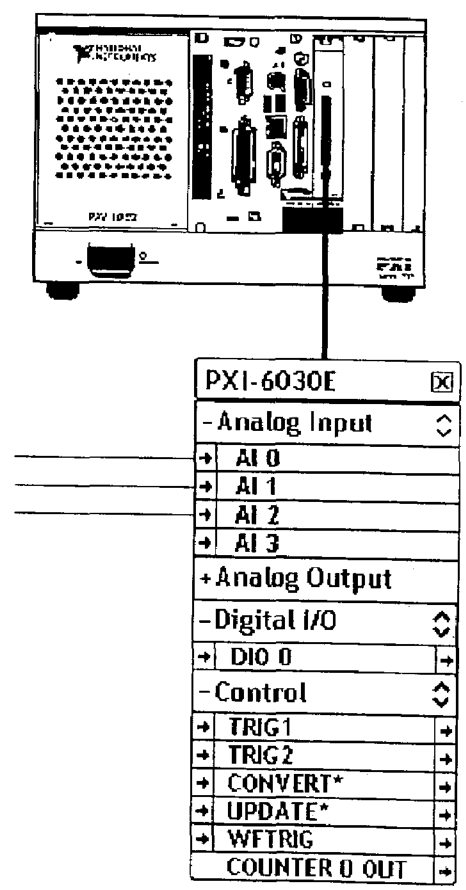

FIG. 16 illustrates a hardware functionality icon for a module 603, similar to the one shown in FIG. 14. However, in FIG. 16, only a subset of the analog input channels are shown. The channels shown are those that have been connected to other components in the measurement system. A wire is shown connected to each of the channels. FIG. 17 illustrates the hardware functionality icon of FIG. 16 after the "Digital I/O" and "Control" fields have also been expanded.

Figure 19:
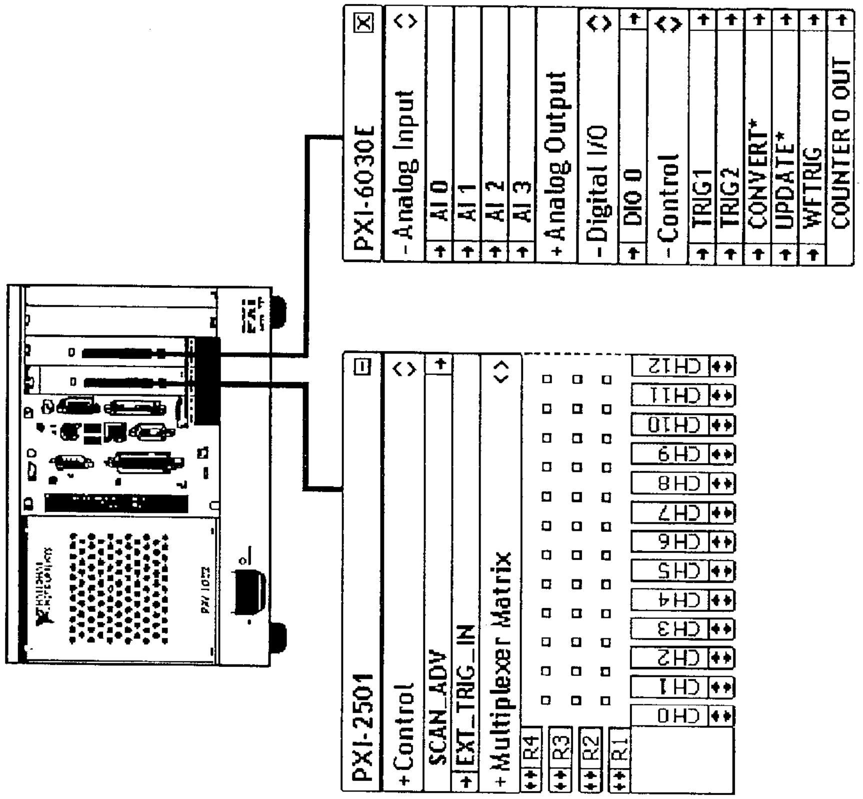
Figure 18:
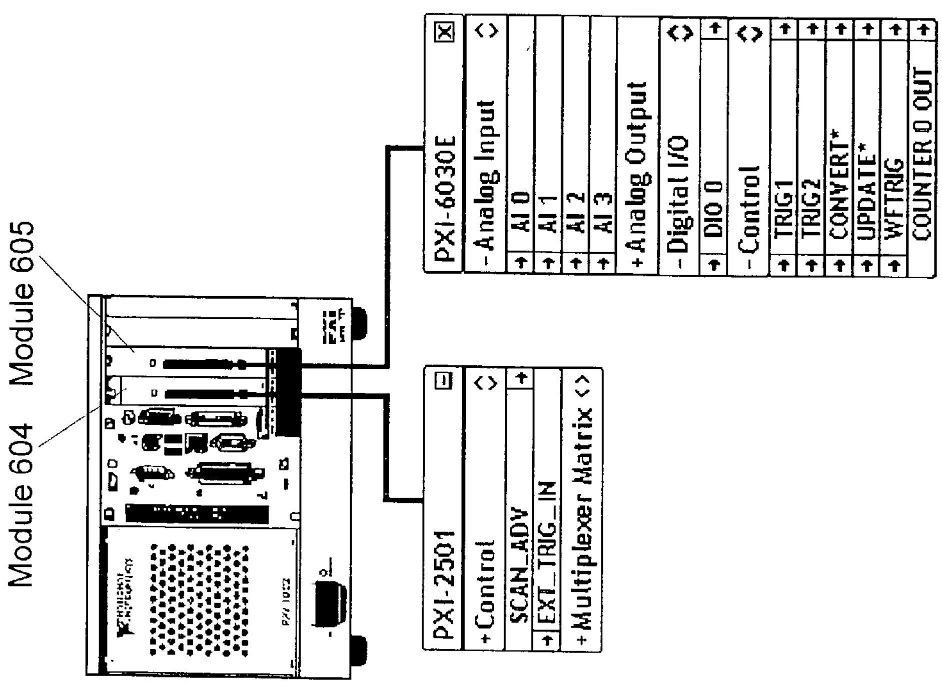

FIG. 18 illustrates another example, in which two different hardware functionality icons are displayed, corresponding to the two modules 604 and 605. In this example, the module 604 is a switch device. As shown in FIG. 19, the "Multiplexer Matrix" field in its hardware functionality icon may be expanded to display a matrix. The user may interact with this matrix to configure the switch device module 604.

Additional examples are described below with reference to FIGS. 29-138. It is noted that these examples and the examples shown in FIGS. 12-19 are exemplary only, and in various embodiments the above-described method may be implemented in any of various ways.

Figure 20:
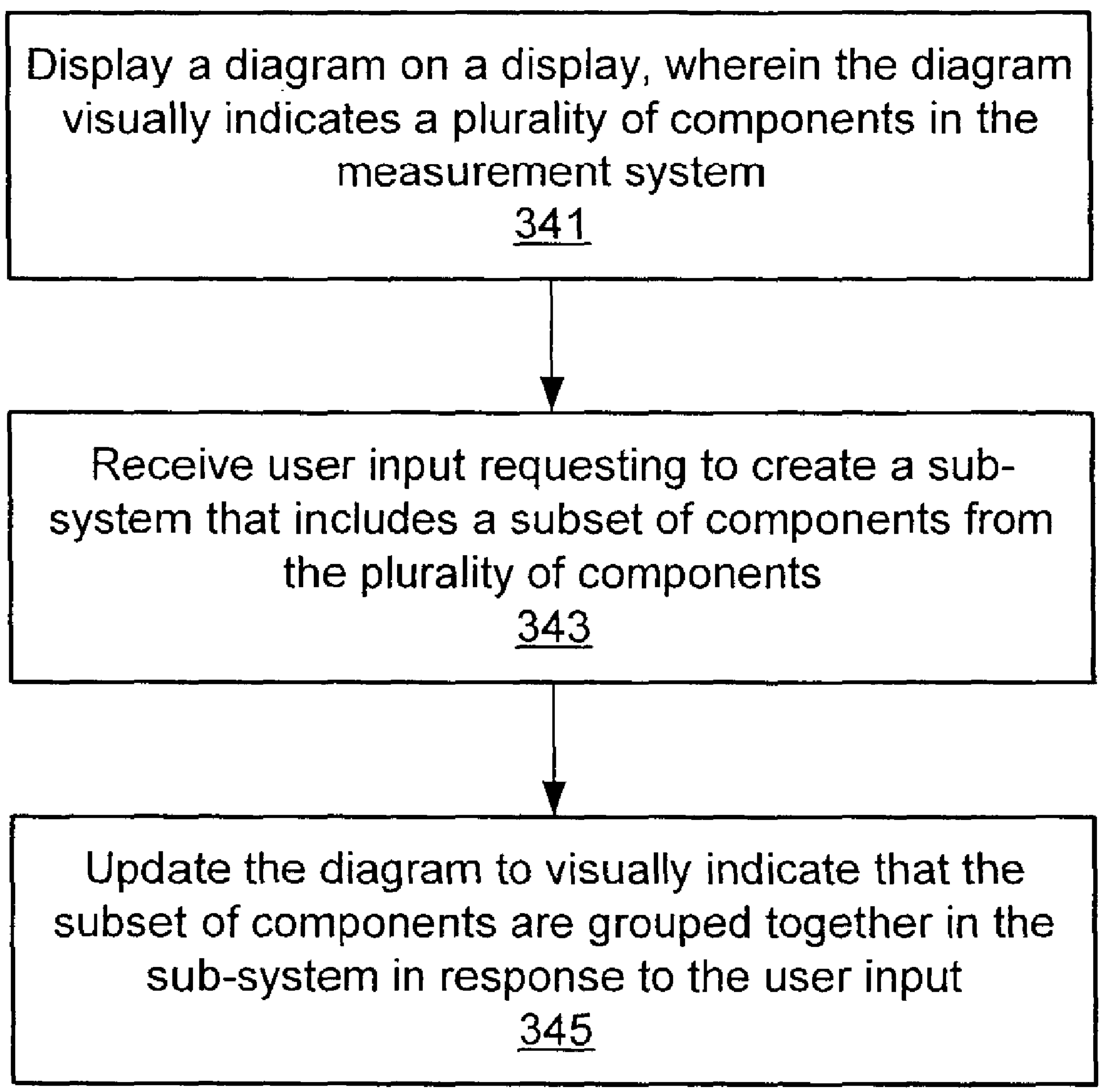
FIG. 20 is a flowchart diagram illustrating one embodiment of a method for creating a sub-system in a measurement system.

FIG. 20—Creating a Sub-system

It may be desirable to allow users to group together various components of the measurement system into a sub-system. For example, a sub-system may be used to represent a plurality of components that operate together to perform a particular task in the measurement system. As one simple example, the measurement system may include the following components: a unit under test (UUT), one or more measurements to be acquired from the UUT, and a hardware device to acquire the measurements from the UUT. If these components are part of a complex measurement system, it may be desirable to group the components together in a sub-system that more abstractly represents their function in the measurement system.

FIG. 20 is a flowchart diagram illustrating one embodiment of a method for creating a sub-system. It is noted that FIG. 20 illustrates a representative embodiment, and alternative embodiments are contemplated. Also, various elements may be combined, omitted, or performed in different orders.

In 341, a diagram visually indicating a plurality of components in the measurement system may be displayed, similarly as described above with reference to 301 of FIG. 4.

In 343, user input requesting to create a sub-system that includes a subset of components from the plurality of components may be received. For example, the user may first select the subset of components to be included in the sub-system and may then request to create a sub-system that includes the subset of components. In various embodiments, the subset of components may be selected in any of various ways. For example, in one embodiment selecting the subset of components may comprise receiving user input from a pointing device (e.g., a mouse, pen device, etc.) to select each component to be included in the sub-system. For example, the user may click on each desired component, may draw a box or border around the desired components, etc. In another embodiment, the user may invoke a graphical user interface specialized for specifying components of a sub-system and may interact with the graphical user interface to select the subset of components to include in the sub-system.

In response to the user input received in 343, a sub-system including the specified subset of components may be created. For example, the measurement system may be represented using one or more data structures. Data representing the plurality of components in the measurement system may be stored in the one or more data structures. Thus, creating the sub-system may comprise storing data in the one or more data structures to represent the sub-system.

In 345, the diagram may be updated to visually indicate that the subset of components are grouped together in the sub-system, in response to the user input received in 343. In various embodiments, the diagram may visually indicate that the subset of components are grouped together in the sub-system in any of various ways. For example, in one embodiment a border may be drawn around the subset of components. For example, the subset of components may be displayed together within a box. In another embodiment the diagram may visually indicate that the subset of components are grouped together in the sub-system by changing an appearance of one or more of the components in the subset of components. For example, appearances of the one or more of the components may be changed by changing color information of the displayed components, highlighting the components, or otherwise altering the visual appearances of the components. In another embodiment the diagram may display text information indicating that the subset of components are grouped together in the sub-system.

Grouping the subset of components together in the sub-system may enable the subset of components to be treated as an atomic unit in various ways. In particular, the subset of components may be displayed as a single unit. For example, in one embodiment the user may be able to request the sub-system to be collapsed into a single icon. In response the individual components within the sub-system may be hidden from view, and a single sub-system icon representing the entire sub-system may be displayed. Thus, the readability of a complex measurement system diagram may be enhanced by grouping various components into logical sub-systems. In one embodiment sub-systems may be nested so that the complexity of a diagram may be reduced to any degree desired. For example, a first sub-system may be included in a second sub-system, and the second sub-system may then be collapsed into a single icon similarly as described above. Also, multiple sub-systems may be grouped into a single sub-system.

In one embodiment, the single sub-system icon which represents a sub-system may visually indicate the sub-system, e.g., by displaying a name of the sub-system, but may not visually indicate the individual components within the sub-system. In another embodiment, the single sub-system icon may display limited information regarding the individual components within the sub-system, such as names of the components.

As described above, in one embodiment connections between various components in the diagram of the measurement system may be displayed. The diagram may display multiple connections or wires to or from one or more components in the sub-system before the sub-system is collapsed. In response to collapsing the sub-system into a single icon, the diagram may be updated to illustrate a single wire to or from the sub-system icon.

In one embodiment, the user may be able to add a new component to the sub-system after the sub-system has been created. In response, the diagram may be updated to visually indicate that the new component was added to the sub-system. Similarly, the user may be able to remove a component from the sub-system, and the diagram may be updated to visually indicate that the component was removed from the sub-system.

In one embodiment, the method may further comprise displaying a plurality of text items corresponding to components of the measurement system, in addition to displaying the diagram. For example, as described above, the text items may be displayed in a tree view, e.g., a hierarchical view to indicate a hierarchical relationship among components of the measurement system. For example, an MSD environment such as described herein may display both a diagram of the measurement system and a tree view of the measurement system. In response to the sub-system being created, a text item corresponding to the sub-system may be added to the tree view. Also, the tree view may display text items corresponding to the components in the sub-system in a hierarchical manner to indicate that these components are encompassed by the sub-system. In one embodiment, the user may interact with the tree view to change the sub-system, e.g., may utilize a context menu associated with the tree view to add or remove components to or from the sub-system.

In one embodiment, the method may further comprise saving configuration information for the sub-system, e.g., in response to a user request to save configuration information for the sub-system. Saving the configuration information for the sub-system may comprise storing configuration information for each component in the sub-system. For example, as the user designs the measurement system, the user may set various properties associated with the components, specify connections among the components, or otherwise configure the components. Thus, the configuration information stored for each component in the sub-system may specify the respective component's current state at the time the configuration information is saved.

In one embodiment, saving the configuration information for the sub-system may comprise storing the configuration information for components in the sub-system as a single configuration unit. For example, the user may be prompted for a name for the configuration information for the sub-system, and the specified name may be associated with the configuration unit. Storing the configuration unit may comprise persistently storing the configuration unit. In various embodiments, the configuration unit may be stored in any of various ways, e.g., as one or more files or data portions within files, database entries, etc.

The configuration unit may then be used to configure the sub-system at a later time, i.e., to configure each component in the sub-system. For example, the configuration unit may be retrieved, and the configuration information for each component may be used to configure the respective component. Configuration of components of a measurement system is discussed in further detail below.

In one embodiment, the user may also be able to request a copy of the sub-system to be made. For example, a new sub-system icon representing the copy of the sub-system may be displayed on the diagram. The user may then expand the new sub-system icon to view components within the new sub-system, which may be copies of the components in the original sub-system.

FIG. 21—Grouping Measurements Together

The creation of sub-systems such as described above is one way on which components of a measurement system may be grouped together. In various embodiments, components may also be grouped together in other ways. For example, in one embodiment, components of the same type may be grouped together or displayed by a single icon. In particular, a plurality of measurement components may be grouped together into a single icon, where each measurement component represents a measurement to be acquired by the measurement system.

FIG. 21 is a flowchart diagram illustrating one embodiment of a method for grouping a plurality of measurements together into a single icon. It is noted that FIG. 21 illustrates a representative embodiment, and alternative embodiments are contemplated.

In 351, a first icon may be displayed, where the first icon represents a unit under test (UUT) in a measurement system. For example, the first icon may be displayed in a diagram of the measurement system, such as described above. In one embodiment, the first icon may illustrate the physical appearance of the UUT.

In 353, user input specifying a plurality of measurements to acquire from the unit under test (UUT) may be received. In various embodiments, various information regarding the measurements may be specified. For example, information regarding a sensor which obtains the measurement data may be specified. Also, a name for each measurement may be specified. In 355, a second icon may be displayed, where the second icon visually indicates each of the plurality of measurements. In one embodiment, displaying the second icon may include displaying a plurality of rows within the second icon, where each row visually indicates information regarding one of the measurements. For example, each row may display the name of one of the measurements.

In one embodiment, the method may further comprise displaying one or more connections from the first icon to the second icon. For example, a plurality of connections may be displayed, where each connection corresponds to one of the measurements. Each connection may visually indicate that the respective measurement is associated with a particular measurement point on the UUT. For example, where the first icon graphically indicates the physical appearance of the UUT, each connection may have an endpoint on the first icon which visually indicates a physical location on the UUT from which the respective measurement is acquired.

In one embodiment, the method may further comprise displaying a third icon, where the third icon represents a hardware device for acquiring the measurements from the UUT. One or more connections may be displayed from the second icon to the third icon. For example, a plurality of connections may be displayed, where each connection corresponds to one of the measurements. Each connection may visually indicate which channel on the hardware device acquires the respective measurement.

The user may also specify a new measurement to acquire from the UUT. In response, the new measurement may be added to the second icon. For example, where the second icon includes a plurality of rows, a new row representing the new measurement may be added, and information regarding the new measurement may be displayed in the new row. In another embodiment, the user may first request to add a new row or field to the second icon, and may then specify the information regarding the new measurement. For example, the user may be able to expand the second icon by dragging a corner or edge of the second icon, e.g., using a mouse.

Similarly as described above, the user may also be able to collapse the second icon to provide less detail regarding the plurality of measurements. For example, where the second icon includes a plurality of rows, the rows may be hidden from view in response to the second icon being collapsed. In one embodiment, when the second icon has been collapsed, the names of the measurements may no longer be visible, but information, e.g., a number, may be displayed on the second icon to indicate the number of measurements in the plurality of measurements.

Also, where a plurality of wires is displayed connected to the second icon before the second icon is collapsed, the wires may be bundled into a single wire which replaces the plurality of wires after the second icon is collapsed. However, the user may still be able to temporarily view information regarding each of the plurality of measurements without having to re-expand the second icon. For example, the user may hover a pointer (e.g., a mouse cursor) over the second icon or over the wire connected to the second icon, and information regarding each of the plurality of measurements may be temporarily displayed until the pointer is moved away.

Figure 22:
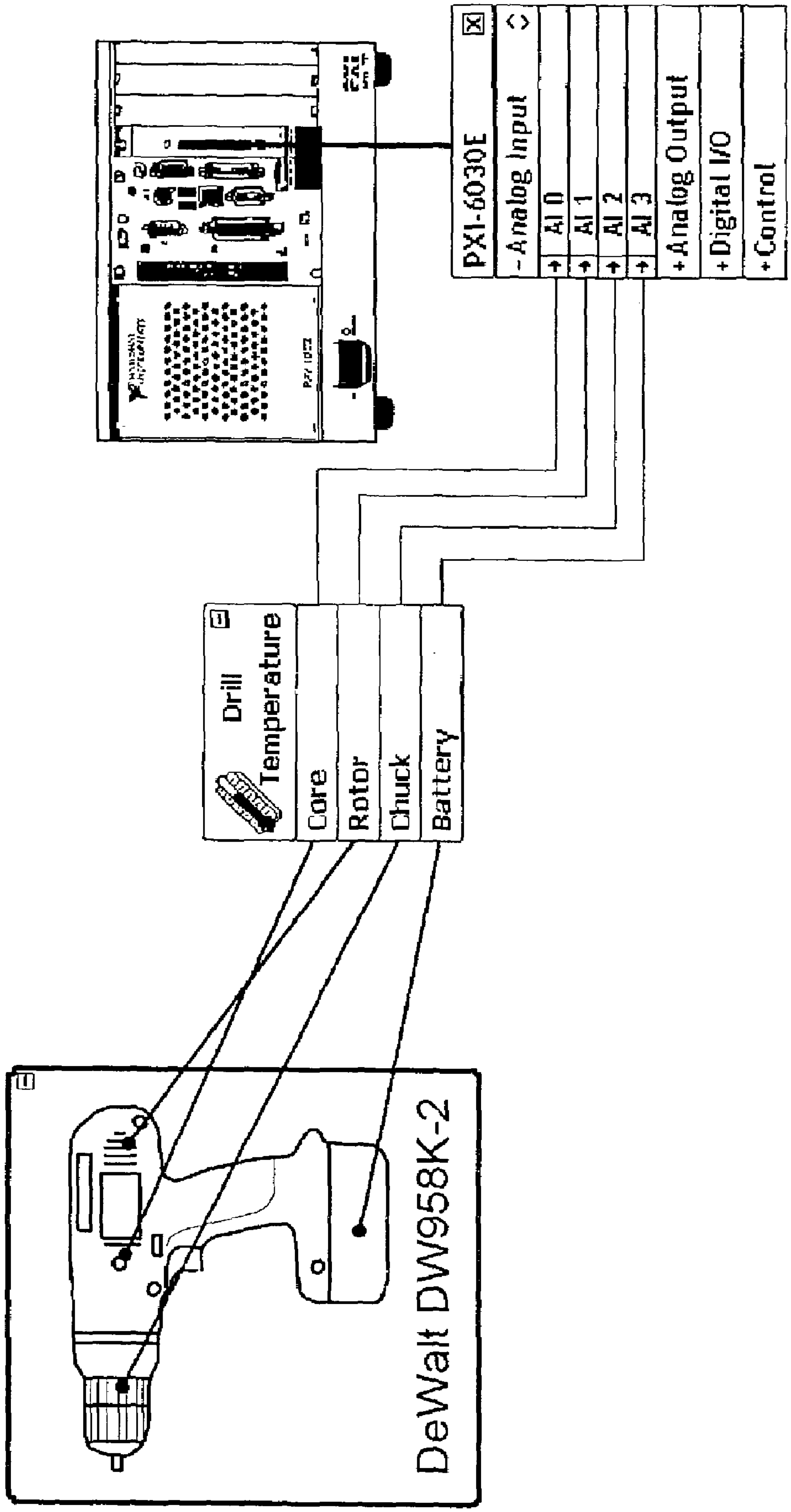
FIG. 22 illustrates an exemplary diagram of a measurement system in which a plurality of measurements are displayed in a single icon.

FIG. 22 illustrates an exemplary diagram of a measurement system in which a plurality of measurements are displayed in a single icon (the "Drill Temperature" icon). In this example, the single icon displays the name of each measurement, i.e., "Core", "Rotor", "Chuck", and "Battery". The diagram illustrates a plurality of connections from the measurements to points on a drill device from which each respective measurement is acquired. The diagram also illustrates a plurality of connections from the measurements to channels of a hardware device which acquire each respective measurement.

Figure 23:
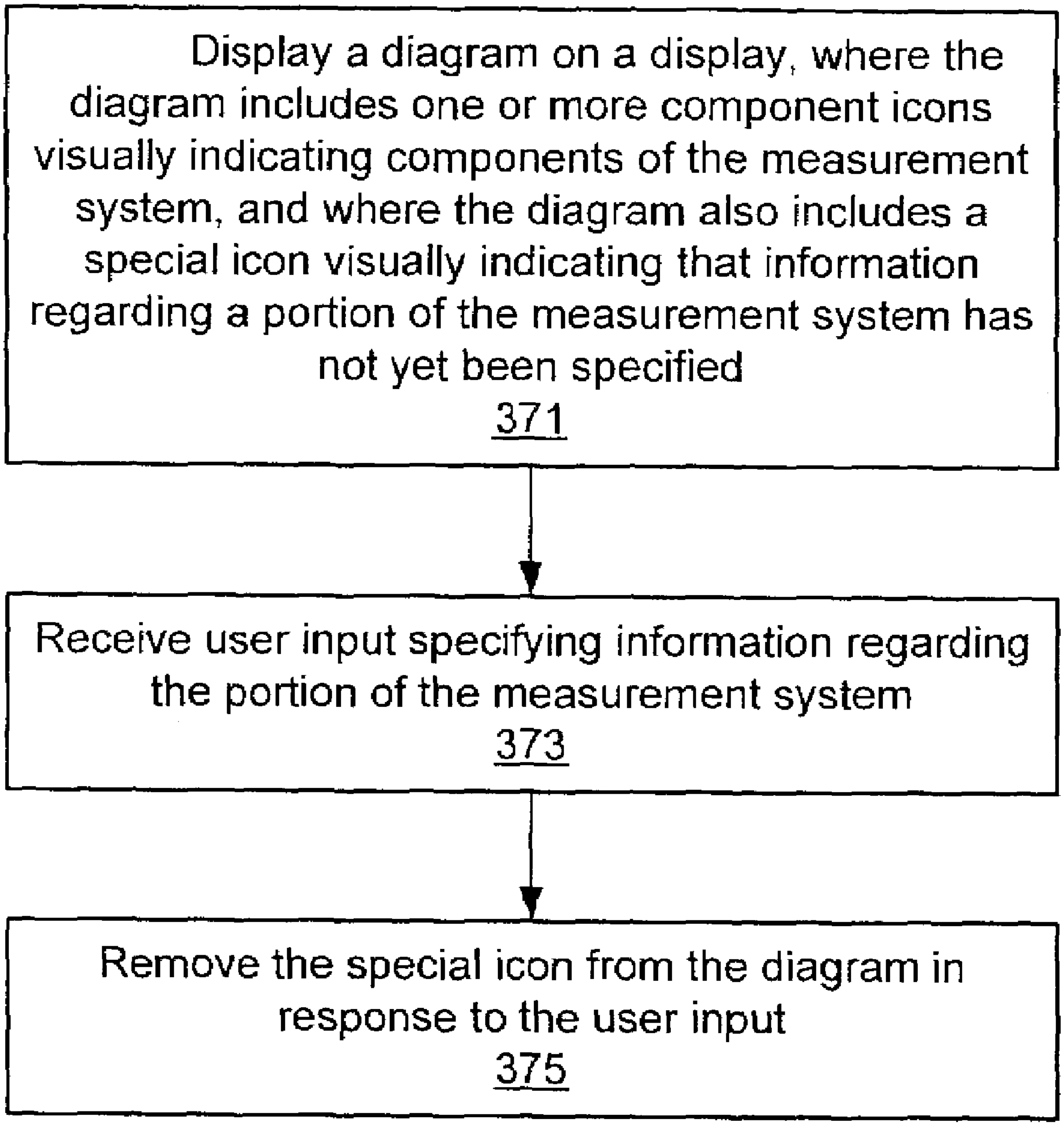
FIG. 23 is a flowchart diagram illustrating one embodiment of a method for representing an unspecified portion of a measurement system or visually indicating an action required of the user in designing the measurement system.

FIG. 23—Representing an Unspecified Portion of a Measurement System

Designing a measurement system may be a gradual process where the user progressively specifies more information regarding components in the measurement system. At any given point in the design process, one or more portions of the measurement system may not yet be specified. FIG. 23 is a flowchart diagram illustrating one embodiment of a method for representing an unspecified portion of a measurement system or visually indicating an action required of the user in designing the measurement system. It is noted that FIG. 23 illustrates a representative embodiment, and alternative embodiments are contemplated. Also, various elements may be combined, omitted, or performed in different orders.

In 371, a diagram of the measurement system may be displayed, similarly as described above with reference to 301 of FIG. 4. The diagram may include one or more component icons visually indicating components of the measurement system. The diagram may also include a special icon visually indicating that information regarding a portion of the measurement system has not yet been specified. This special icon may alert the user that the portion of the measurement system needs to be specified or information regarding the portion of the measurement system needs to be specified.

In various embodiments, the special icon may have any appearance. The special icon preferably has a special appearance that allows the user to easily notice the special icon in the diagram or visually distinguishes the special icon from other icons in the diagram. In one embodiment, the special icon may have the appearance of a cloud. For example, the special icon may have the appearance of a puffy cloud or three-dimensional cloud. Exemplary puffy cloud icons are shown in the drawings described below.

In 373, user input specifying information regarding the portion of the measurement system may be received.

In 375, the special icon may be removed from the diagram in response to the user input received in 373.

In various embodiments, the special icon may visually indicate that any aspect of the measurement system has not yet been specified. For example, in one embodiment the special icon may visually indicate that one or more components for the portion of the measurement system have not yet been specified. Thus, receiving the user input in 373 may comprise receiving user input regarding one or more components for the portion of the measurement system. For example, in one embodiment the user input may specify one or more components to be included in the portion of the measurement system. In another embodiment, the user input may not directly specify the components for the portion of the measurement system, but one or more components may be determined based on the user input. For example, the user input may include information specifying desired functionality for the portion of the measurement system. Determining the one or more components for the portion of the measurement system may then comprise determining one or more components that are able to perform the specified functionality. Similarly, the user input may include information specifying desired characteristics for the portion of the measurement system. Determining the one or more components for the portion of the measurement system may then comprise determining one or more components that have the specified characteristics.

The method may further comprise displaying one or more component icons in place of the special icon, where the one or more component icons visually indicate the one or more components specified or determined for the portion of the measurement system. The displayed component icons may visually indicate physical components or devices and/or virtual components for the portion of the measurement system. As one simple example, where the special icon initially represents a yet-to-be-specified unit under test (UUT), the user may then specify a particular UUT in 373, such as a power drill or other device. The special icon may then be replaced with a component icon depicting the power drill.

In another embodiment, components for the portion of the measurement system may have already been specified, but the special icon may indicate the other information regarding the portion of the measurement system has not yet been specified. For example, the special icon may visually indicate that one or more properties for the portion of the measurement system have not yet been specified. Thus, the user input received in 373 may comprise user input specifying the one or more properties for the portion of the measurement system. In one embodiment the special icon may visually indicate that one or more properties for one or more components in the portion of the measurement system have not yet been specified. Thus, the user input may comprise user input specifying the one or more properties for the one or more components in the portion of the measurement system.

In another embodiment, the special icon may visually indicate that connectivity information for coupling the portion of the measurement system to other components in the measurement system has not yet been specified. Thus, the user input received in 373 may specify information regarding connection of the portion of the measurement system to one or more other components in the measurement system, e.g., may specify information regarding connection of a first component in the portion of the measurement system to the one or more other components. The method may further comprise displaying one or more connections from the first component to the one or more other components in response to the user input.

In various embodiments, the user input in 373 may be received in any of various ways. In one embodiment, the user may interact with the diagram of the measurement system to provide the user input. For example, the user input may be received to the special icon itself. User input may be received to the special icon in any of various ways. For example, the user may click on the special icon, e.g., to invoke a popup context menu associated with the special icon, where the context menu allows the user to specify information regarding the portion of the measurement system.

In another embodiment, the user may provide input to the special icon, e.g., may click on the special icon, to invoke a dialog, window, or other graphical user interface associated with the special icon. This graphical user interface may allow the user to specify information regarding the portion of the measurement system. As one example, the graphical user interface may enable the user to specify information indicating desired functionality or characteristics for the portion of the measurement system or to set various configuration properties for the portion of the measurement system or one or more components in the portion of the measurement system. In one embodiment the graphical user interface may comprise a plurality or series of GUI panels, also referred to as a wizard, allowing the user to specify information regarding the portion of the measurement system.

In another embodiment, the user may provide input to the special icon by dragging and dropping information onto the special icon. As one example, where the special icon indicates that a first component in the portion of the measurement system needs to be connected to another component in the measurement system, the user may drag and drop a component icon from elsewhere in the diagram onto the special icon, thus specifying the component to which to connect the first component in the portion of the measurement system. In another embodiment, one or more palettes may be displayed, e.g., may be displayed alongside or separately from the diagram, and the user may drag an element from a palette onto the special icon. For example, the special icon may act as a placeholder icon indicating that a particular device has not been defined or specified in the portion of the measurement system. The palette may display a plurality of different devices. Thus, the user may select an item from the palette representing the desired device to use and may drag and drop the item onto the special icon.

In another embodiment, the user input in 373 may be received to one or more elements in the diagram other than the special icon, e.g., to one or more of the component icons. For example, the user may interact with a component icon to configure the respective component represented by the component icon, which may have the effect of also specifying information regarding the portion of the measurement system represented by the special icon. As one example, the special icon may indicate that a first component in the portion of the measurement system has not yet been connected to another component in the measurement system. In this case, the user may interact with a component icon to connect the respective component to the first component in the portion of the measurement system, which may cause the special icon to be removed.

In another embodiment, the user input in 373 may not be received to the diagram or to an icon in the diagram. For example, the user may invoke a dialog box or other graphical user interface by selecting a menu option or performing a keyboard command. The user input specifying the information regarding the portion of the measurement system may then be received to this graphical user interface, without interacting with the diagram. In another embodiment, the user may provide input to the special icon to invoke the graphical user interface, as described above.

As described above, in one embodiment a special icon displayed in a measurement system diagram may visually indicate that information regarding a portion of the measurement system has not yet been specified. In another embodiment the special icon may visually indicate an action required of the user in designing the measurement system. Thus, 373 may comprise receiving user input to perform the action required of the user. In 375, the special icon may be removed from the diagram in response to this user input. In various embodiments, the special icon may indicate that any kind of action is required of the user.

It is noted that in one embodiment the user may be able to dismiss or hide the special icon without first specifying the information regarding the portion of the measurement system or without performing the action indicated by the special icon. In another embodiment, the user may be required to specify the information or perform the action and may not be allowed to dismiss the special icon. In another embodiment, the special icon may not be removed from the diagram, but its appearance may be changed to indicate that the user has requested to dismiss or ignore the special icon.

The discussion above refers to a single special icon displayed in the diagram. It is noted that in one embodiment multiple special icons may be displayed in the diagram. As described above, each special icon may visually indicate that information regarding a portion of the measurement system has not yet been specified or may visually indicate an action required of the user in designing the measurement system.

In one embodiment, the MSD environment may provide various templates for designing a measurement system. Each template may specify various components or placeholder components within the measurement system. For example, one simple template may specify that the measurement system includes a unit under test (UUT), one or more measurements to acquire from the UUT, and one or more measurement hardware devices to acquire the measurements. However, the template may not specify the particular UUT to be used in the measurement system, the particular measurements to acquire, or the specific measurement hardware devices. Thus, when the template is first loaded, each of these components may be represented by a special icon, such as a puffy cloud icon. The puffy cloud icons may be replaced by specific component icons as the user specifies information regarding the respective UUT, measurements, and measurement hardware devices.

As noted above, in one embodiment, a special icon may have the appearance of a puffy cloud. Various puffy cloud icon examples are illustrated in and described with reference to FIGS. 29-138. It is noted that the examples illustrated in these drawings are exemplary only, and in various embodiments a puffy or three-dimensional cloud may be illustrated differently.

In one embodiment, the MSD environment may define a framework to which new special icons may be added as they become available. For example, special icons may be packaged as software components that can be plugged into the MSD environment for use in measurement system diagrams. For example, a third party vendor may develop his own specialized puffy cloud software component that may represent one or more elements in a measurement system. The puffy cloud software component may be packaged in such a way that specific actions or behavioral characteristics are associated with or defined by the puffy cloud software component. For example, in response to the user clicking on the puffy cloud icon, the puffy cloud software component may be operable to display a graphical user interface allowing the user to enter information regarding one or more measurement system elements represented by the puffy cloud icon.

Similarly, third party vendors may define their own templates representing specific types of measurement systems, where the templates may include various custom-developed puffy cloud software components. As one example, a third party vendor may create a template representing a dynamometer test system. This template may include a puffy cloud representing the sensors for the dynamometer test system. This puffy cloud may have an associated wizard to guide the user in selecting appropriate sensors and to connect the selected sensors to the other components in the dynamometer test system.

Figure 24:
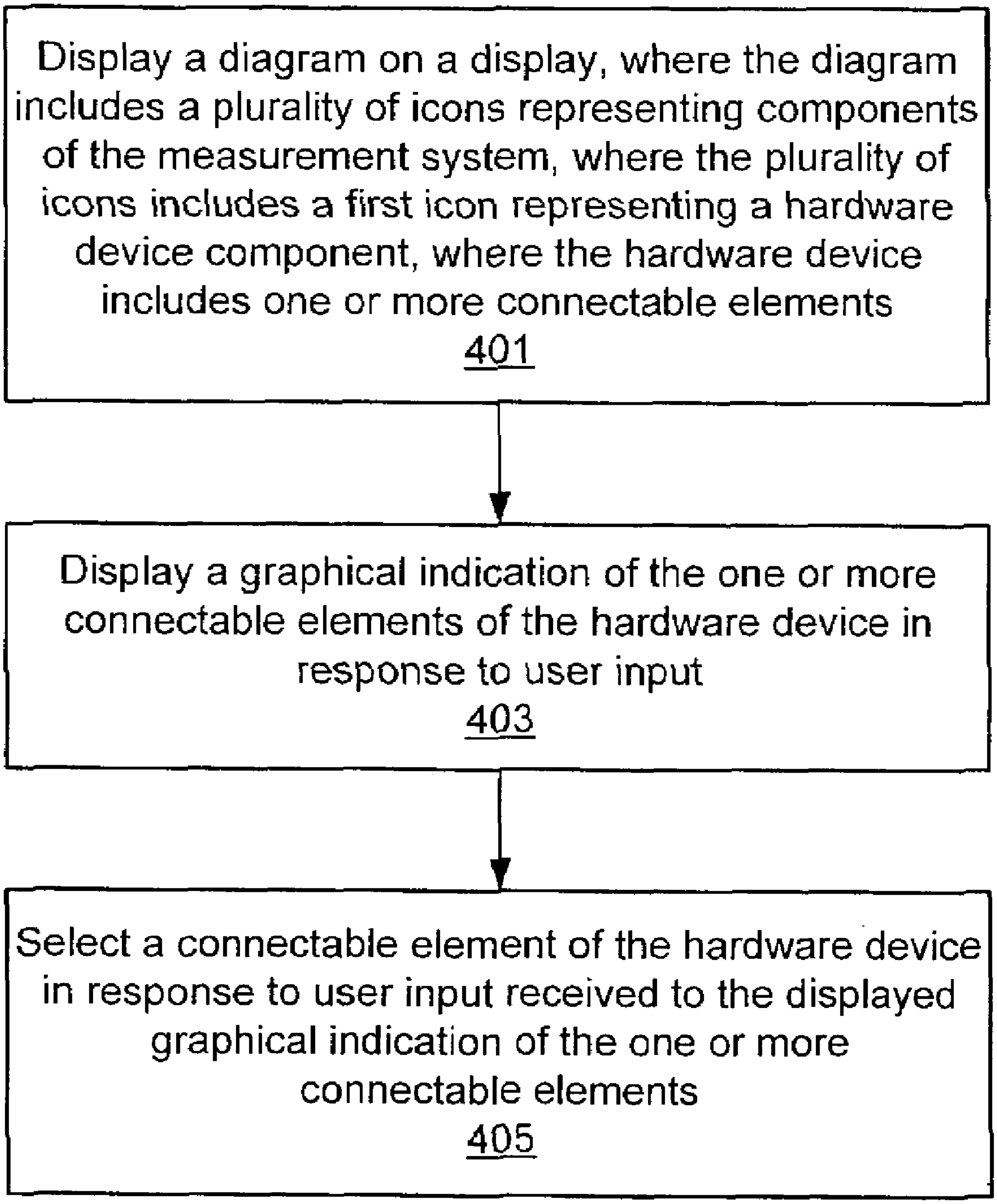
FIG. 24 is a flowchart diagram illustrating one embodiment of a method for selecting a connectable element of a hardware device.

FIG. 24—Selecting a Connectable Element of a Hardware Device

As described above, in many cases a hardware device may be connected to one or more other components in a measurement system. In one embodiment, connections among components in the measurement system may be indicated by displaying lines or wires in the measurement system diagram, where each line or wire visually indicates a connection or coupling between two components. For a hardware device with multiple connectable elements, it may be necessary to specify which of the connectable elements to connect the wire to. However, in some cases the connectable elements of the hardware device may not be visible in the measurement system diagram. For example, as described above, a hardware device component may currently be displayed in a collapsed state in which the connectable elements are not displayed. It may be desirable to enable the user to specify a particular connectable element without having to first expand the hardware device component.

FIG. 24 is a flowchart diagram illustrating one embodiment of a method for selecting a connectable element of a hardware device. It is noted that FIG. 24 illustrates a representative embodiment, and alternative embodiments are contemplated.

In 401, a diagram of a measurement system may be displayed, similarly as described above with reference to 301 of FIG. 4. The diagram may include a plurality of icons representing components of the measurement system. The plurality of icons may include a first icon representing a hardware device component of the measurement system. The hardware device may include one or more connectable elements. In various embodiments, the hardware device may be any type of hardware device having any type of connectable elements. For example, in one embodiment the hardware device may comprise a measurement device having a plurality of channels, such as analog input/output channels, digital input/output channels, etc. As another example, the hardware device may comprise a network-enabled device that includes one or more network connection elements, e.g., one or more network cards. In various embodiments, the connectable elements of the hardware device may comprise physical or virtual elements.

In 403, a graphical indication of the one or more connectable elements of the hardware device may be displayed in response to user input. The first icon representing the hardware device may not visually indicate the connectable elements. For example, as described above, the first icon may currently be in a collapsed state in which the connectable elements are not shown. Thus, displaying the graphical indication of the one or more connectable elements of the hardware device in 403 may enable a user to specify a desired connectable element of the hardware device.

In various embodiments, the graphical indication of the one or more connectable elements may be displayed in response to any kind of user input. In one embodiment, the user may hover a pointer, e.g., a mouse cursor, over the first icon or may hover the pointer in a vicinity of the first icon to cause the graphical indication to be displayed. In one embodiment, the user may need to hover the pointer over a particular region within the first icon, referred to as a wiring region, in order to cause the graphical indication to be displayed. In one embodiment, the software environment in which the diagram is displayed, e.g., the MSD environment, may allow the user to select from different tools to perform different tasks in editing the measurement system diagram. A wiring tool may be provided for specifying connections among components. Thus, the user may first activate the wiring tool. The graphical indication may be displayed in response to the pointer hovering over the first icon when the wiring tool is active, but may not be displayed when the wiring tool is not active.

The graphical indication of the one or more connectable elements may have any appearance, and the one or more connectable elements may be visually indicated in any way. The graphical indication may include text and/or graphical information. For example, the graphical indication may include a list of the connectable elements, e.g., where each connectable element is shown in a separate row of the list. In the preferred embodiment, the graphical indication may be displayed within the diagram. For example, the graphical indication may be displayed proximal to or on top of the first icon. In another embodiment, the graphical indication may be displayed separately away from the first icon or outside of the diagram, e.g., in a separate window.

In 405, a first connectable element of the hardware device may be selected in response to user input received to the displayed graphical indication of the one or more connectable elements. The user may interact with the graphical indication in any way to select the first connectable element. For example, where the graphical indication includes a list of the connectable elements, the user may simply click on the desired connectable element.

In one embodiment, selecting the first connectable element may comprise coupling the first connectable element to another component (a second component) in the measurement system. For example, the user may first connect a first endpoint of a wire to the second component (e.g., to a connectable element of the second component). The user may then interact with the displayed graphical indication to connect a second endpoint of the wire to a desired connectable element of the hardware device, e.g., by clicking on the appropriate connectable element in the graphical indication. In another embodiment, the user may first select the first connectable element of the hardware device and may then select another component in the diagram to which to connect the first connectable element.

Once the user has specified the endpoints of the connection, a wire connecting the hardware device to the second component may be illustrated in the diagram. As one example, the wire may indicate a connection between a measurement represented by the second component and a selected channel on the hardware device to acquire the measurement. As another example, the wire may indicate a network connection connecting the second component to the hardware device. (It is noted that other types of connections may also be displayed besides lines or wires, e.g., depending on the types of devices or components being connected, as described above.) In one embodiment, the wire may be shown connected to the displayed graphical indication. For example, the wire may be connected to the selected connectable element within the displayed graphical indication. In another embodiment, the wire may be shown connected to the first icon representing the hardware device. For example, in response to the desired connectable element being selected, the graphical indication may be removed from view.

In one embodiment, displaying the graphical indication of the one or more connectable elements may comprise temporarily displaying the graphical indication. For example, as noted above, once a connectable element has been selected, the graphical indication may be removed. Also, the graphical indication may be removed from the diagram without a connectable element being selected. For example, if the graphical indication was displayed in response to the user hovering a pointer over the first icon, the user may move the pointer away from the first icon to cause the graphical indication to disappear.

Temporarily displaying the graphical indication may enable the user to specify a connectable element of the hardware device without the one or more connectable elements of the hardware device having to be displayed constantly on the diagram. This may help to simplify the measurement system diagram and enhance its readability. If desired, the user may request the one or more connectable elements to be displayed constantly, e.g., by increasing the expansion state of the first icon one or more times.

Figure 25:
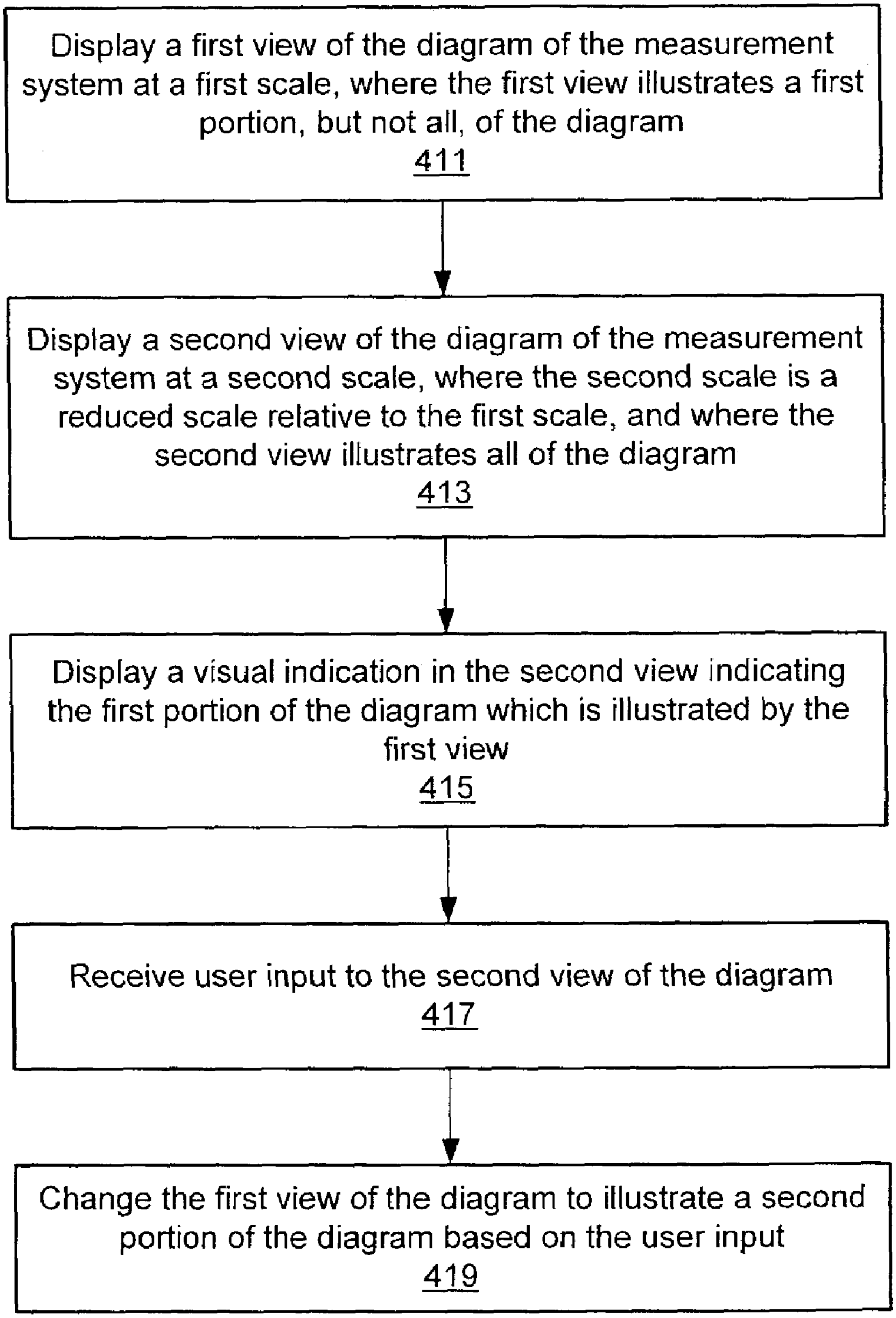
FIG. 25 is a flowchart diagram illustrating one embodiment of a method for displaying multiple views of a measurement system diagram.

FIG. 25—Navigating through a Measurement System Diagram

If the user is viewing or editing a large diagram of a measurement system, only a portion of the diagram at a time may fit on the display of the computer system. In one embodiment, it may be desirable to provide an overview of the entire diagram. This overview may enable the user to easily ascertain where the currently displayed portion of the diagram is located in relation to the rest of the diagram. Also, in one embodiment it may be desirable to enable the user to easily and quickly navigate through a large measurement system diagram. FIG. 25 is a flowchart diagram illustrating one embodiment of a method for displaying multiple views of a measurement system diagram, where the multiple views of the diagram may achieve one or both of these aims. It is noted that FIG. 25 illustrates a representative embodiment, and alternative embodiments are contemplated. Also, various elements may be combined, omitted, or performed in different orders.

In 411, a first view of the diagram of the measurement system may be displayed at a first scale. The first view may illustrate a first portion, but not all, of the diagram.

In 413, a second view of the diagram of the measurement system may be displayed at a second scale, where the second scale is a reduced scale relative to the first scale. The second view may illustrate all of the diagram, e.g., may provide an overview of the entire measurement system. Thus, the second view of the diagram is also referred to herein as a "radar view".

The second view of the diagram and the first view of the diagram may be displayed simultaneously on a display of the computer system. However, the second view or radar view of the diagram may be displayed on a smaller area of the display than the first view of the diagram, which in one embodiment may be a substantially smaller area relative to the area on which the first view of the diagram is displayed. For example, in the first view of the diagram, components of the measurement system may be displayed at a scale large enough to enable the user to interact with the components, e.g., to configure or expand the components, or otherwise edit the diagram as described above. On the other hand, the second view of the diagram may not be intended for editing the diagram, and components of the measurement system may be displayed at a small scale in the second view.

In 415, a visual indication may be displayed within the second view to indicate the first portion of the diagram which is illustrated by the first view. The visual indication in the second view of the diagram may enable a user to see which portion of the diagram is currently illustrated by the first view of the diagram. In various embodiments, the visual indication may indicate the first portion of the diagram in any way. For example, the visual indication within the second view may include one or more of altered coloring, altered shading, etc. As one example, the second view of the diagram may include a highlighted portion which corresponds to the first portion of the diagram which is illustrated by the first view of the diagram. As another example, the second view of the diagram may include a shaded portion which corresponds to the first portion of the diagram which is illustrated by the first view of the diagram. For example, a shaded background may be displayed behind the first portion of the diagram. As another example, the second view of the diagram may include a border around an area which corresponds to the first portion of the diagram which is illustrated by the first view of the diagram.

In one embodiment, the second view of the diagram may enable the user to navigate through the diagram, i.e., to change the portion of the diagram illustrated by the first view. Thus, as shown in 417, user input to the second view of the diagram may be received. In 419, the first view of the diagram may be changed to illustrate a second portion of the diagram based on the user input. The visual indication displayed within the second view may also be changed to reflect the change in the first view.

In various embodiments, the user input to change the portion of the diagram illustrated by the first view may be received to the second view in any way. For example, receiving the user input to the second view of the diagram in 417 may comprise receiving user input specifying a location in the diagram. In 419, the first view of the diagram may be changed to illustrate the second portion of the diagram based on the specified location. As one example, specifying the location in the diagram may include specifying a point in the second view, e.g., by clicking with a mouse or other pointing device. The first view of the diagram may then be changed to illustrate an area surrounding the specified point.

In another embodiment, receiving the user input to the second view of the diagram in 417 may comprise receiving user input specifying the second portion or area of the diagram. In 419, the first view of the diagram may be changed to illustrate the specified second portion or area of the diagram. As one example, specifying the second portion may include selecting a portion of the second view, e.g., by drawing a box around the portion using a mouse. The selected portion of the diagram may then be displayed at a larger scale, i.e., the first scale, in the first view.

In one embodiment, one or more details or features of the diagram of the measurement system may be omitted from the second view of the diagram. This may result in a less-cluttered appearance for the second view of the diagram, providing a more readable or understandable overview of the measurement system. As one example, where the components in the diagram are represented by icons, a simplified version of the icons may be displayed in the second view. In other words, the icons may not only be reduced in size relative to the icons displayed in the first view, but may also include less visual detail. As another example, where the diagram includes a plurality of connections interconnecting components of the measurement system, one or more of the connections may not be displayed on the second view of the diagram. As another example, one or more components of the measurement system may not be displayed in the second view of the diagram. For example, the method may operate to determine which components are most important and may omit less important components or may omit components that have a small display size relative to other components.

In various embodiments, the second view may be displayed anywhere on the display relative to the first view. In one embodiment, the second view may be displayed in a corner of the first view. The user may also be able to move the second view of the diagram relative to the first view. In one embodiment, the first view and the second view may be displayed in the same window. In another embodiment, the first view and the second view may be displayed in two separate windows.

The user may also be able to re-size one or both of the first and second views of the diagram. In one embodiment, re-sizing a view of the diagram may cause the display of components in the view to be re-scaled to reflect the new size. The user may also request to remove the second view of the diagram from view if desired. For example, the second view may be turned on or off as desired. In one embodiment the second view may be automatically displayed only when the diagram is too large to be seen in its entirety in the first view.

Figure 26:
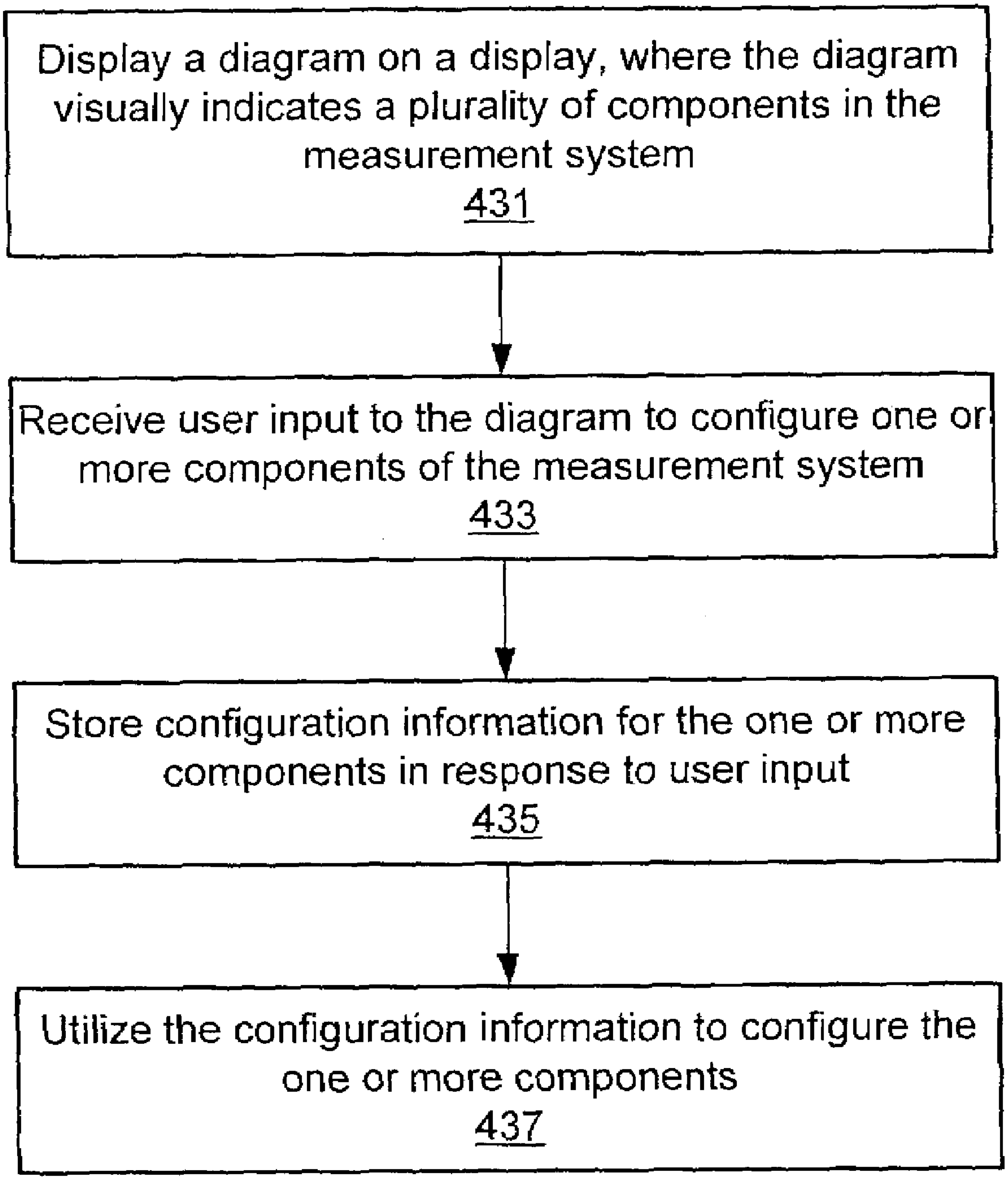
FIG. 26 is a flowchart diagram illustrating one embodiment of a method for storing configuration information for one or more components in a measurement system.

FIG. 26—Storing Configuration Information

In many cases it may be desirable to store configuration information for one or more components in a measurement system. In one embodiment, configuration information may be stored in varying levels of granularity. For example, the user may be able to request to save configuration information for a single component in the measurement system, a subset of components in the measurement system, and/or the entire measurement system. FIG. 26 is a flowchart diagram illustrating one embodiment of a method for storing configuration information for one or more components in a measurement system. It is noted that FIG. 26 illustrates a representative embodiment, and alternative embodiments are contemplated. Also, various elements may be combined, omitted, or performed in different orders.

In 431, a diagram may be displayed, where the diagram visually indicates a plurality of components in the measurement system, similarly as described above with reference to 301 of FIG. 4.

In 433, user input may be received to the diagram to configure one or more components of the measurement system. In various embodiments, the one or more components of the measurement system may be configured in any way. In one embodiment, configuring a component may comprise receiving user input specifying one or more properties or configuration settings for the component. For example, the properties or configuration settings may pertain to or affect operation or functionality of the component. In another embodiment, configuring a component may comprise receiving user input specifying one or more connections coupling the component to one or more other components of the measurement system.

The type of configuration performed for a component may depend on the kind of component. As one example, a measurement hardware device component may be configured by specifying various properties of the device related to acquisition of measurement data. As one simple example, a measurement device including a plurality of channels may be configured to be either in a single-ended mode or a differential mode (where in differential mode, two wires are required for each measurement). As another simple example, a switch device may be configured with one or more routes defining paths through the switch device.

In various embodiments, the user input to configure the one or more components may be received to the diagram in any of various ways. In other words, the user may perform any of various kinds of actions to edit the diagram or specify information regarding components in the diagram which may affect their configurations. In one embodiment, the user input may be received to the one or more components themselves, e.g., may be received to one or more icons representing the one or more components in the diagram. As one example, the user may be able to expand a component representing a switch device to display a matrix, as described above with reference to FIG. 19. The user may interact with the displayed matrix to define one or more routes for the switch device component. As another example, the user may invoke a context menu associated with a component to select various options to configure the component.

In another embodiment, a separate graphical user interface may be utilized to configure a component. For example, the user may invoke a dialog box, wizard, or other graphical user interface to configure one or more components. In one embodiment, one or more configuration settings for the component may be automatically selected based on user input specifying desired functionality or operation of the component.

In 435, configuration information for the one or more components may be stored in response to user input. For example, the user may invoke a menu, keyboard, voice, or other type of command to request the configuration information to be stored or saved. In one embodiment, the configuration information may comprise configuration information for multiple components, and the configuration information for each component may be stored together or associated as a single configuration unit. For example, the method may operate to prompt the user for a name for the configuration unit. Storing the configuration information may include storing the configuration information for each component in association with the specified name. Storing the configuration information may comprise persistently storing the configuration information. In various embodiments, the configuration information may be stored or represented in any of various ways, e.g., as one or more files or data portions within files, one or more database entries, etc.

In 437, the configuration information may be utilized to configure the one or more components. For example, when the configuration information is stored in 435, each of the one or more components may be in a first configuration state. Thus, utilizing the configuration information to configure the one or more components may comprise setting each of the one or more components to its respective first configuration state.

As described in detail below, in one embodiment, the configuration information may be utilized to configure the actual components of the measurement system. For example, where a component represents a physical device that is currently coupled to the computer system, the configuration information may be utilized to configure the actual physical device. In another embodiment, the configuration information may be utilized to configure a virtual representation of the one or more components.

The configuration information may first need to be retrieved before it is used to configure the one or more components. For example, the configuration information may be retrieved or read from one or more files, databases, or data structures. The retrieval and use of the configuration information may occur at a later time. As one example, the configuration information may be used to change the diagram or the components in the diagram back to a previous state. For example, the user may save the configuration information for the one or more components and may then re-configure one or more of the components, e.g., by continuing to edit the diagram or providing additional user input to the diagram to change the configuration states of one or more of the components. The user may then desire to return the one or more components to their previous configuration states and may thus request the previously saved configuration information to be applied. In response, the appearance of the diagram may be updated to reflect the application of the configuration information to the one or more components. For example, one or more of the components may be re-displayed to appear as they were when the configuration information was stored. In another embodiment, the components may not appear exactly as they were when the configuration information was stored. For example, if the user subsequently connected one or more wires to a component after its configuration information was stored or made other changes to the component which do not conflict with the stored configuration information, then applying the configuration information to the component may not result in these changes being lost. In one embodiment, the user may save multiple units of configuration information for a component. For example, each configuration unit may be given a different name. The user may then apply the various configuration units to change the configuration state of the component as desired.

In another embodiment, the retrieval and use of the configuration information may be performed by a software program other than the program which stored the configuration information. For example, as described below, the MSD environment may include an integrated application development environment in which the user can create software applications. Thus, the user may create a program which is operable to programmatically retrieve the configuration information and use the configuration information to programmatically configure the one or more components. For example, the software program may perform one or more programmatic calls to retrieve the configuration information. Where the user specified a name to associate with the configuration information when the configuration information was stored, the name may be used as a reference or parameter to retrieve the configuration information. The software program may also perform one or more programmatic calls to configure the one or more components. In this case, configuring the one or more components may comprise configuring one or more physical devices in the measurement system. In one embodiment, the software program may be a graphical program. Thus, the graphical program may include one or more nodes operable to configure the physical device(s) using the configuration information.

In various embodiments, the method of FIG. 26 may be utilized to store configuration information at any desired level of granularity. As one example, the user may be able to request configuration information to be stored for a single component, e.g., a single device in the measurement system. Where the measurement system includes hierarchical components, the single component may be included in another component. For example, the single component may comprise a device such as a module or board installed in a hardware chassis. As one example, the device may comprise an I/O module operable to acquire measurement data. In this example, the hardware chassis may also include a second module. Configuration information for the second module may be saved independently of the configuration information for the first module. Thus, the user may be able to save separate units of configuration information corresponding to individual components to allow the measurement system to be configured at a very low or detailed level.

In another embodiment, the user may be able to request configuration information to be stored for a plurality of components. For example, as described above, a plurality of components may be grouped together as a sub-system. Configuration information for each of the components in the sub-system may be stored together as a single configuration unit. This configuration unit may then be used to configure each of the components in the sub-system together. As one example, a software program may pass a name of the configuration unit as a parameter in a function or method, and the function or method may execute to configure each component in the sub-system according to the configuration information for the respective component.

In another embodiment, the user may be able to request configuration information to be stored for the entire measurement system. For example, configuration information for each component in the measurement system may be stored together as a single configuration unit. This configuration unit may then be used to configure each of the components in the measurement system together. As one example, a software program may pass a name of the configuration unit as a parameter in a function or method, and the function or method may execute to configure each component in the measurement system according to the configuration information for the respective component.

Figure 27:
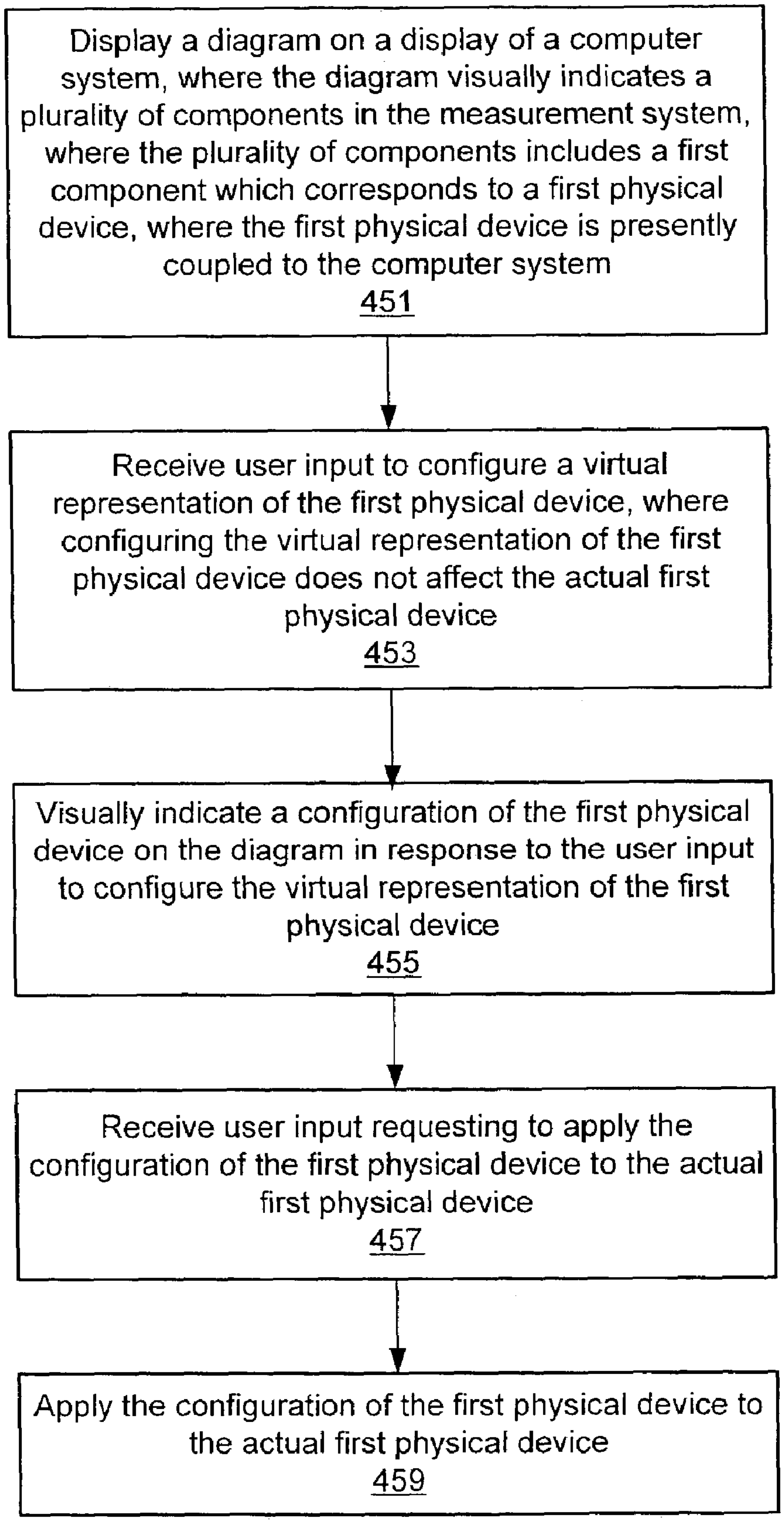
FIG. 27 is a flowchart diagram illustrating one embodiment of a method for virtually configuring a component that is actually present, i.e., is presently coupled to the computer system on which the measurement system diagram is being edited or displayed.
Figure 28:
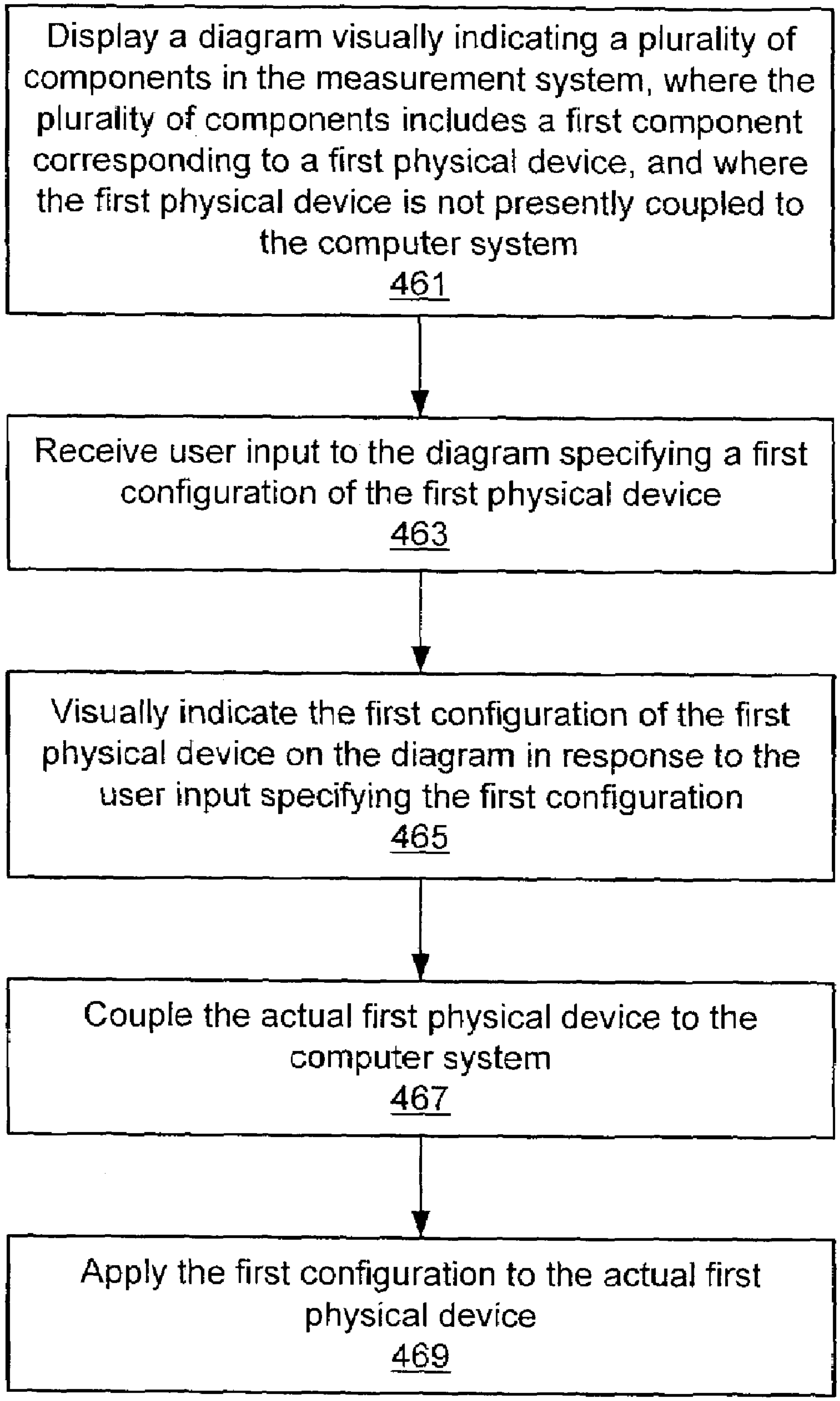
FIG. 28 is a flowchart diagram illustrating one embodiment of a method for virtually configuring a component that is not actually present, i.e., is not presently coupled to the computer system on which the measurement system diagram is being edited or displayed.

FIGS. 27 and 28—Virtual Configuration of Components in a Measurement System In various embodiments, components illustrated in a measurement system diagram may or may not actually be present, e.g., may or may not currently be coupled to the computer system on which the diagram is edited or displayed. It may be desirable to allow the user to create or edit a measurement system diagram that includes components which are not actually present. For example, the user may wish to design a measurement system that accomplishes his needs before deciding whether to purchase one or more of the components in the measurement system diagram. As another example, the user may wish to design the measurement system "offline" from one or more components in the measurement system. For example, one or more devices may be located on a factory floor or in a laboratory, and the user may wish to design the measurement system using a computer system in an office, where the computer system is not connected to the devices.

Thus, in one embodiment, configuring a measurement system component which is not actually present may comprise configuring a virtual representation of the component rather than the actual or physical component itself. The user may also desire to configure a virtual representation of the component rather than the actual component even if the actual component is in fact present. For example, the user may wish to experiment with various configurations of components in the measurement system without actually applying the configurations to the physical components. In another embodiment, the user may want to apply the configurations to the physical components. Thus, in one embodiment, the MSD environment may allow the user to perform actual and/or virtual configuration of components in the measurement system as desired.

FIG. 27 is a flowchart diagram illustrating one embodiment of a method for virtually configuring a component that is actually present, i.e., is presently coupled to the computer system on which the measurement system diagram is being edited or displayed. It is noted that FIG. 27 illustrates a representative embodiment, and alternative embodiments are contemplated. Also, various elements may be combined, omitted, or performed in different orders.

In 451, a diagram may be displayed on a display of a computer system. The diagram may visually indicate a plurality of components in the measurement system, similarly as described above with reference to 301 of FIG. 4. The plurality of components may include a first component which corresponds to a first physical device, where the first physical device is presently coupled to the computer system. In one embodiment, the diagram may visually indicate that the first physical device is presently coupled to the computer system. For example, devices which are presently coupled to the computer system may be displayed differently than devices that are not, or information indicating the status of the various devices may be displayed on the diagram.

In 453, user input to configure a virtual representation of the first physical device may be received. Configuring the virtual representation of the first physical device may not affect the actual first physical device. In one embodiment the virtual representation of the first physical device may simply comprise data stored in memory, where the data represents the first physical device, e.g., one or more data structures representing the first physical device. For example, the MSD environment may maintain data representing each component in the measurement system and representing the current configuration of each component. Thus, configuring the virtual representation of the first physical device may comprise changing the data representing the first physical device to specify a configuration of the first physical device, based on the user input.

In various embodiments, the user input received in 453 may comprise any type of user input and may serve to configure the virtual representation of the first physical device in any way. As one example, the first physical device may comprise a device operable to acquire measurement data, and the user input received in 453 may comprise user input specifying one or more properties affecting acquisition of measurement data by the first physical device. Various examples of user input to specify a configuration of a device are described above, such as user input to connect wires to the device in the diagram, user input to a context menu associated with the device, user input to a graphical user interface associated with the device, etc. Also, additional examples are described below with reference to FIGS. 29-138.

In 455, a configuration of the first physical device may be visually indicated on the diagram in response to the user input to configure the virtual representation of the first physical device. Various examples of visually indicating a configuration of a device on to the diagram are described above. Also, additional examples are illustrated below in FIGS. 29-138. In one embodiment, visually indicating the configuration of the first physical device may comprise changing an appearance of the first physical device in the diagram, e.g., changing or replacing an icon that illustrates the first physical device. In another embodiment, the configuration of the device may be visually indicated by a hardware functionality icon such as described above.

In 457, user input requesting to apply the configuration of the first physical device to the actual first physical device may be received. As one example, after the user has finalized the design of the measurement system, the user may wish to configure the actual physical devices as indicated by the measurement system diagram.

In 459, the configuration of the first physical device may be applied to the actual first physical device in response to the user input received in 457. For example, applying the configuration to the actual first physical device may include applying one or more configuration settings specified by the configuration to the actual first physical device. For example, the computer system may communicate with the actual first physical device to configure the actual first physical device.

In one embodiment, the configuration of the first physical device may be selectively applied to the actual first physical device without affecting the configurations of other physical devices. In another embodiment, each device illustrated in the diagram (or each device that is actually present) may be configured as shown in the diagram.

Similarly as described above, in one embodiment configuration information for the first physical device may be stored. Thus, the configuration information may first be retrieved before the configuration is applied to the first physical device. For example, the user may request to apply the configuration of the first physical device to the actual first physical device at a later time or on a different computer system which retrieves the configuration information.

In another embodiment, the MSD environment may allow the user to work in either a virtual configuration mode or an actual configuration mode. For example, configuring the virtual representation of the first physical device without affecting the actual first physical device as described above may be performed while in the virtual configuration mode. However, if the user chooses to work in the actual configuration mode, then the actual first physical device may be configured in response to configuration changes specified on the diagram, without the user having to explicitly request for the actual first physical device to be configured. The actual first physical device may be configured immediately in response to configuration changes specified on the diagram or the configuration changes may be applied at a later time.

As noted above, in another embodiment, the first physical device may not presently be coupled to the computer system. FIG. 28 is a flowchart diagram illustrating one embodiment of a method for virtually configuring a component that is not actually present, i.e., is not presently coupled to the computer system on which the measurement system diagram is being edited or displayed. It is noted that FIG. 28 illustrates a representative embodiment, and alternative embodiments are contemplated. Also, various elements may be combined, omitted, or performed in different orders.

In 461, a diagram visually indicating a plurality of components in the measurement system may be displayed. The plurality of components may include a first component corresponding to a first physical device, where the first physical device is not presently coupled to the computer system. In one embodiment, the diagram may visually indicate that the first physical device is not presently coupled to the computer system. For example, devices which are presently coupled to the computer system may be displayed differently than devices that are not, or information indicating the status of the various devices may be displayed on the diagram.

In 463, user input specifying a first configuration of the first physical device may be received to the diagram, similarly as described above.

In 465, the first configuration of the first physical device may be visually indicated on the diagram in response to the user input specifying the first configuration, similarly as described above.

In 467, the actual first physical device may be coupled to the computer system. For example, the device may be coupled via a network connection, serial connection, I/O slot connection, bus connection, or other cabled or wireless connection.

In 469, the first configuration may be applied to the actual first physical device, similarly as described above. In another embodiment, the actual first physical device may be coupled to another computer system, and the other computer system may apply the first configuration to the actual first physical device. For example, the measurement system may be designed on one system, and configuration information for the first physical device may be stored. The other computer system may retrieve the configuration information and use the configuration information to configure the first physical device.

It is noted that virtual and actual configuration methods may be combined. For example, virtual configuration may be used for a first component in the measurement system, while actual configuration may be used for a second component in the measurement system. However, if a component is not actually present, then only a virtual representation of the component may be configured.

Extensible Environment

In one embodiment, the MSD environment may provide an extensible framework in which new measurement system components can be added into the MSD environment and existing components can be updated. This may benefit the user by providing an up-to-date design environment that reflects currently available measurement system components and their capabilities. Also, in one embodiment, the extensible framework may be an open framework allowing third-party vendors to add their own measurement system products into the MSD environment.

In one embodiment each component available in the MSD environment may be described by a set of information referred to herein as a "schema". New components may be added into the MSD environment by adding new schemas, e.g., downloading the schemas from a computer server or installing them using an installation program. Similarly, existing components may be updated by updating their schemas. In various embodiments, a schema may comprise any kind of information regarding a component and may be structured or stored in any of various ways. In one embodiment, schemas may be implemented as XML descriptions.

Any of various components in a measurement system may be described using schemas. Schemas may be used to describe physical as well as conceptual or logical components. The following lists exemplary measurement system components which may have schemas: sensors; actuators; measurement hardware (e.g., chassis, modules, cables, connectors, etc.); signals; triggers; units under test (UUTs); documentation (e.g., manuals, application notes, etc.); software (e.g., application development environments, drivers, utilities, example programs, etc.).

The information in the schemas of the measurement system components may enable the MSD environment to intelligently automate various aspects of the measurement system design process. For example, when presenting the user with guidance mechanisms to assist the user in selecting a hardware component, the MSD environment may determine information regarding the specifications that the hardware component needs to meet from schemas of other components in the measurement system, e.g., the schemas for sensors with which the hardware component will interact. Similarly, the MSD environment may examine the schemas of available hardware components to determine which ones meet the required specifications.

In addition, the MSD environment may be extensible in various other ways. As one example, new templates may be added to the MSD environment. As described above, a template may provide a framework for a particular type of measurement system, and the user may design a measurement system based on this framework. Thus, new templates may be created representing new types of measurement systems and may be integrated into the MSD environment, allowing the user to utilize the new templates.

Exemplary MSD Environment

The remaining portion of the disclosure discusses an example of a simple measurement system created according to one particular embodiment of an MSD environment. In the following examples, the "first icon" discussed above with reference to FIG. 4 has the appearance of a puffy cloud. Various puffy cloud icon examples are discussed below.

Figure 29:
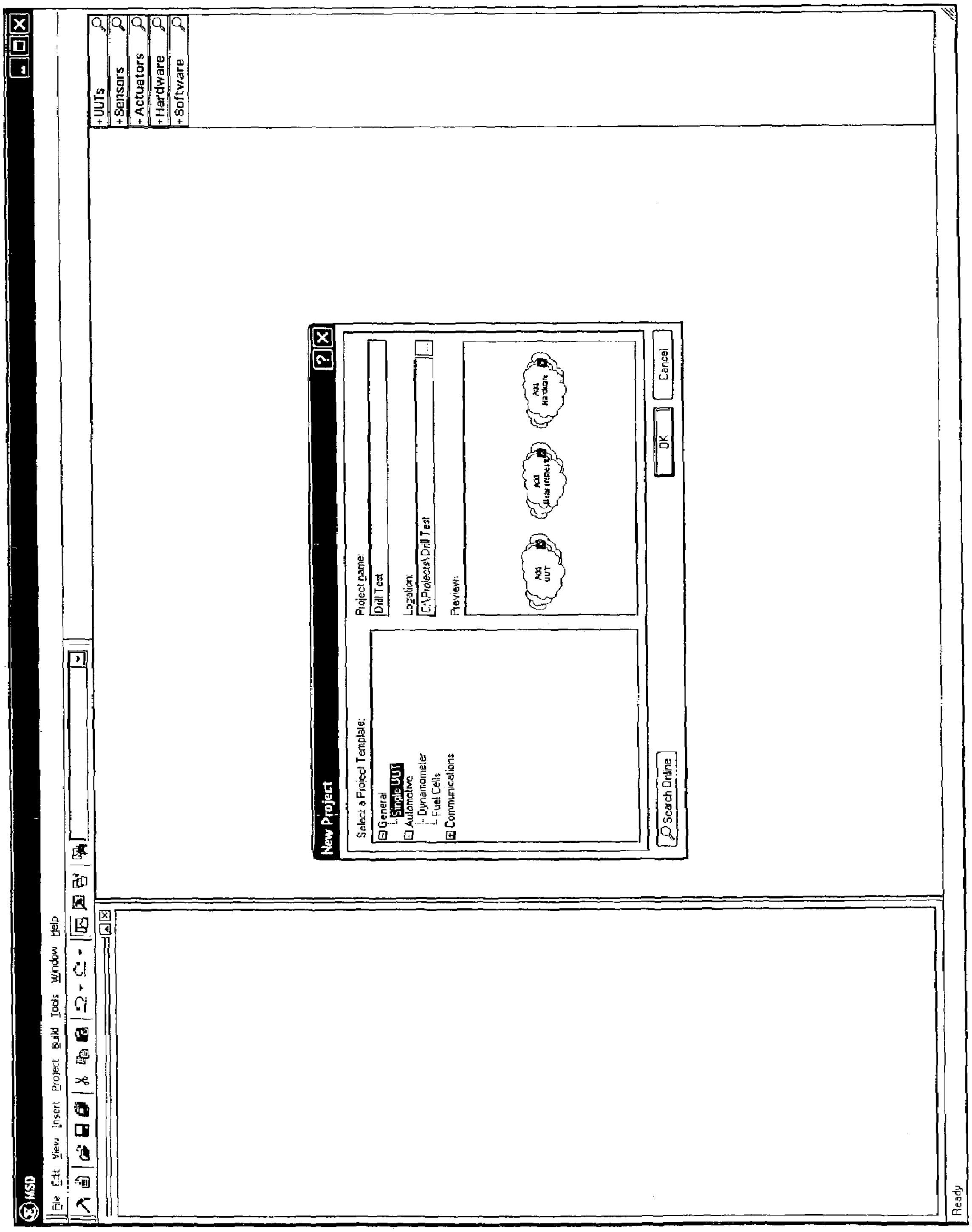
FIGS. 29-138 are exemplary screen shots illustrating one embodiment of a Measurement System Designer (MSD) environment.

As shown in FIG. 29, when the user first launches MSD, the user may be presented with a "New Project" window. The "New Project" window provides templates of measurement systems that the user can use in defining a system. These templates are listed in the list view on the left of the window.

Each template may provide a framework for a particular type of measurement system. In various embodiments, the templates may represent any of various kinds of measurement systems for any of various applications, and the templates may be organized or presented to the user in various ways. In one embodiment, the available templates may include templates representing measurement systems operable to perform various functions such as motion control, machine vision, data acquisition, etc. In another embodiment, the available templates may represent measurement systems for implementing specialized solutions for particular industries, such as aerospace, automotive, biomedical, communications, electronics, semiconductor, etc.

In one embodiment, the MSD environment may provide an interface allowing new templates to be added to the MSD environment. For example, third-party vendors may be able to create their own templates that can be used by end users to design measurement systems. For example, a new template may be downloaded to an end user's computer system and integrated into the MSD environment, e.g., may be displayed in a window such as that of FIG. 29. As another example, the MSD environment may be operable to connect to a remote computer system via a network to access a repository of templates.

Once the user has selected a template, the user may select specific devices to add to the measurement system framework defined by a template to complete the measurement system according to the user's specific requirements. For example, each template may include various pre-defined components for a particular type of measurement system, and may define a relationship among these components, such as how the components are connected to each other. Other components of the measurement system may not be pre-defined, and these components may be selected by the user. The user may also be able to change the pre-defined components if desired, e.g., to use different components.

As one example, a "Dynamometer" template representing a dynamometer test system is listed under the "Automotive" heading in FIG. 29. The Dynamometer template may pre-define common components for a dynamometer test system, while leaving other components undefined or user-selectable. For example, the sensor devices of the system may not be pre-defined, and the user may need to specify which particular sensor devices to use in the system. As another example, there may be a template representing a motion control system. A typical computer-based motion control system includes components such as the moving mechanical device(s), a motor with feedback and motion I/O, a motor drive unit, a motion controller, and software to interact with the motion controller. One or more of these components may be "unknown", i.e., may not be pre-defined in the template.

When the user selects a template to load, unknown or yet-to-be-specified components of the template may be visually represented using special icons such as puffy cloud icons, as described above. Each puffy cloud icon may visually indicate that the user is required to perform an action or provide information to specify the respective component.

The following example assumes that the user has chosen the "Single UUT" template, which is highlighted in FIG. 29. Once the user selects the "Single UUT" template from the New Project window, the New Project window is dismissed, and the "Single UUT" template diagram is displayed in the main workspace of the MSD application, as shown in FIG. 30.

The "Single UUT" template includes a Unit Under Test (UUT), the measurements being made, and hardware devices to make the measurements. In this example, three puffy cloud icons are used to represent each of the main components of the measurement system, i.e., the UUT, the measurements being made, and the hardware devices to make the measurements. As described above, these puffy cloud icons may be used to visually represent that the respective components are undefined within the measurement system. Clicking on a puffy cloud icon may launch a wizard allowing the user to select or define the respective component, or may cause any of various other actions to take place, as appropriate for a given component or system.

Figure 30:
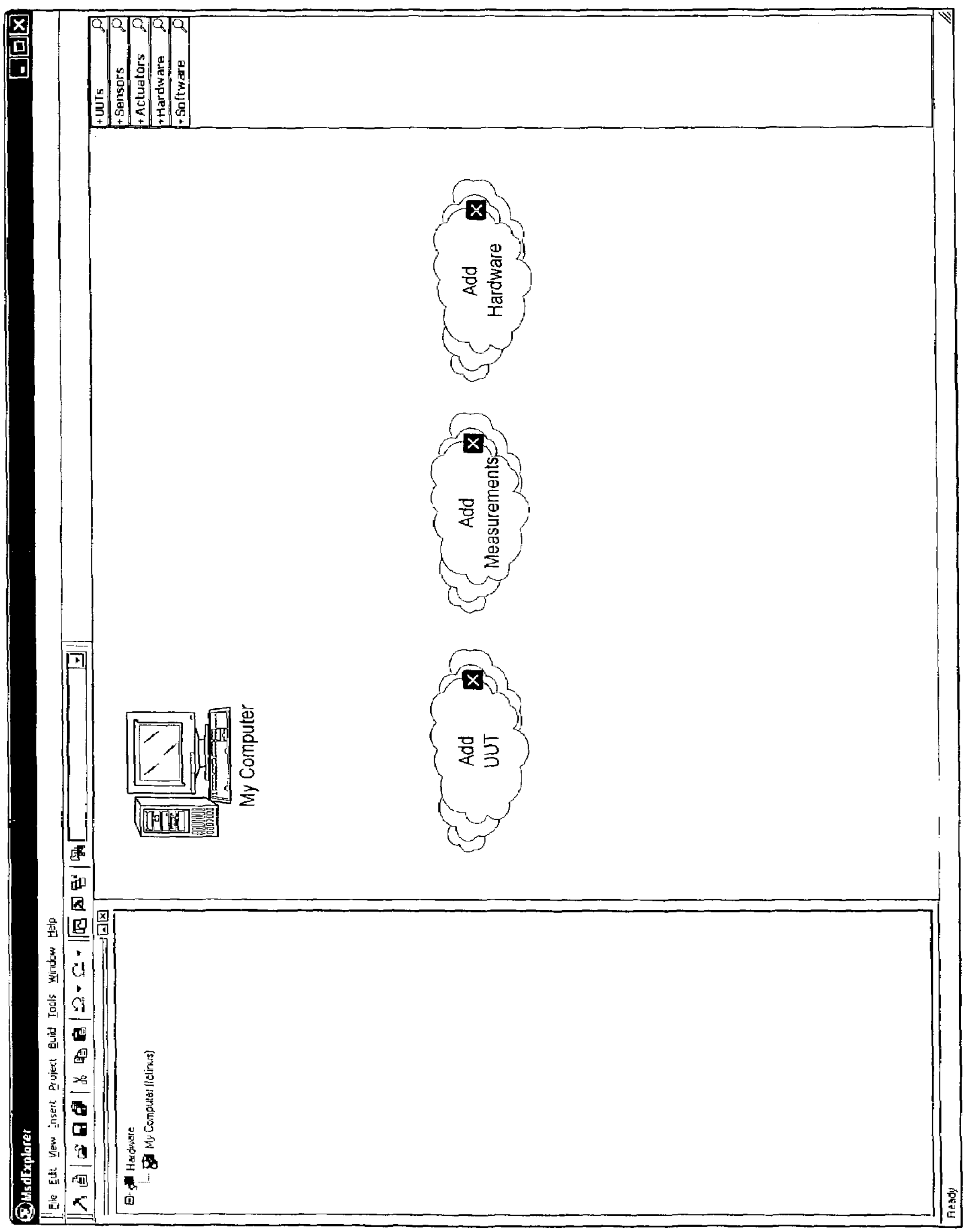
Figure 31:
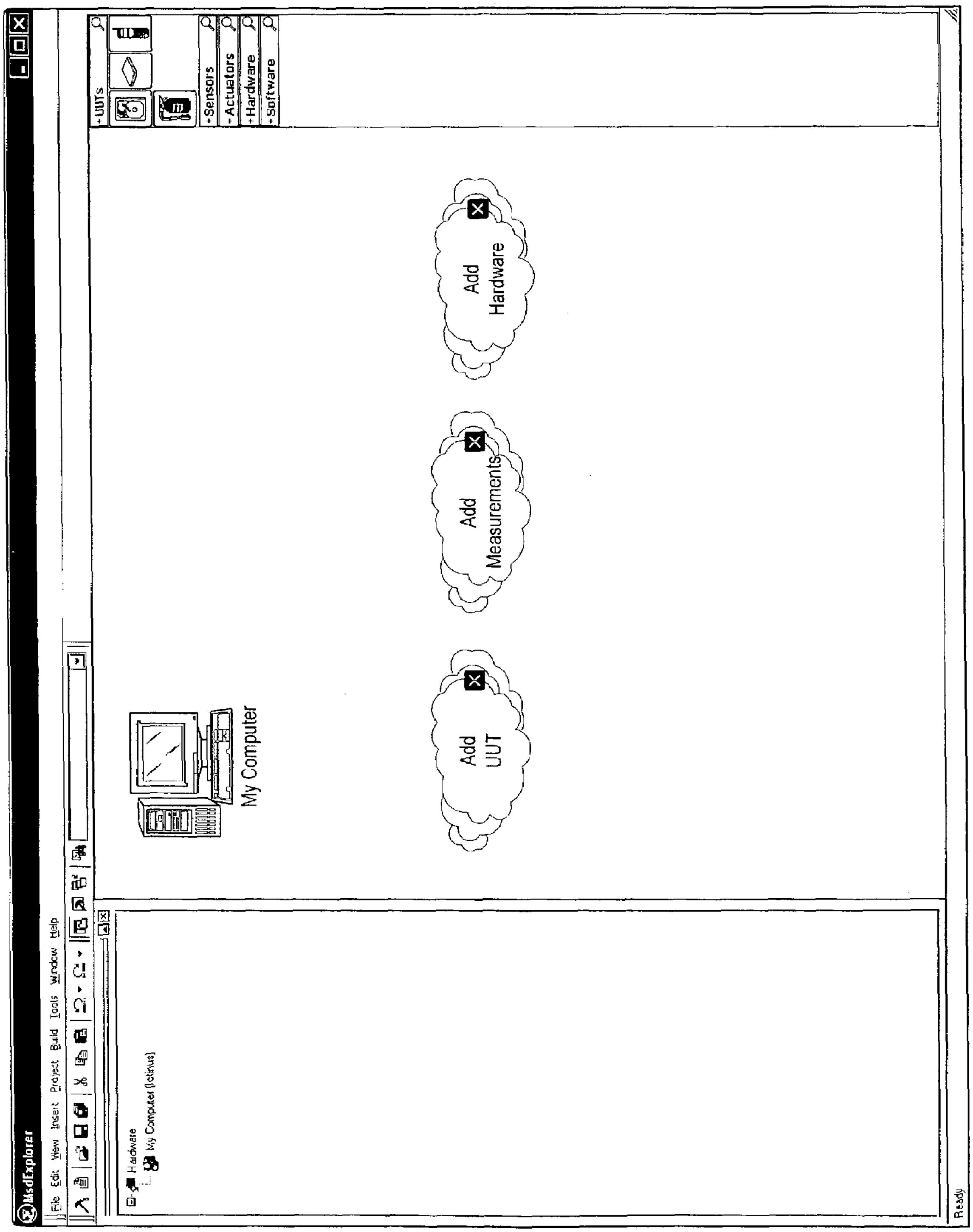

FIG. 30 also illustrates a palette located on the top right side of the MSD workspace. This palette allows the user to access various components which may be utilized in the measurement system. The user may expand various portions of the palette to view these components. For example, the user may click the "UUTs" heading to expand a UUTs sub-palette to see various UUTs that are available. FIG. 31 illustrates the MSD workspace after the UUTs sub-palette has been expanded.

In the example below, the user specifies a desired UUT for the measurement system by interacting with a "Select UUT" wizard. However, the UUTs sub-palette may provide an alternative means for specifying a UUT for the measurement system, e.g., by dragging and dropping a particular UUT from the UUTs sub-palette onto the "Add UUT" puffy cloud icon. In another embodiment, a combination of these approaches may be used. For example, the user may first click on a particular item within a sub-palette, and the MSD environment may in response launch a window or wizard to specify additional options regarding the selected item.

In this example, the user clicks on the "Add UUT" puffy cloud to launch a wizard guiding the user through a process of selecting a particular UUT for the measurement system.

Figure 32:
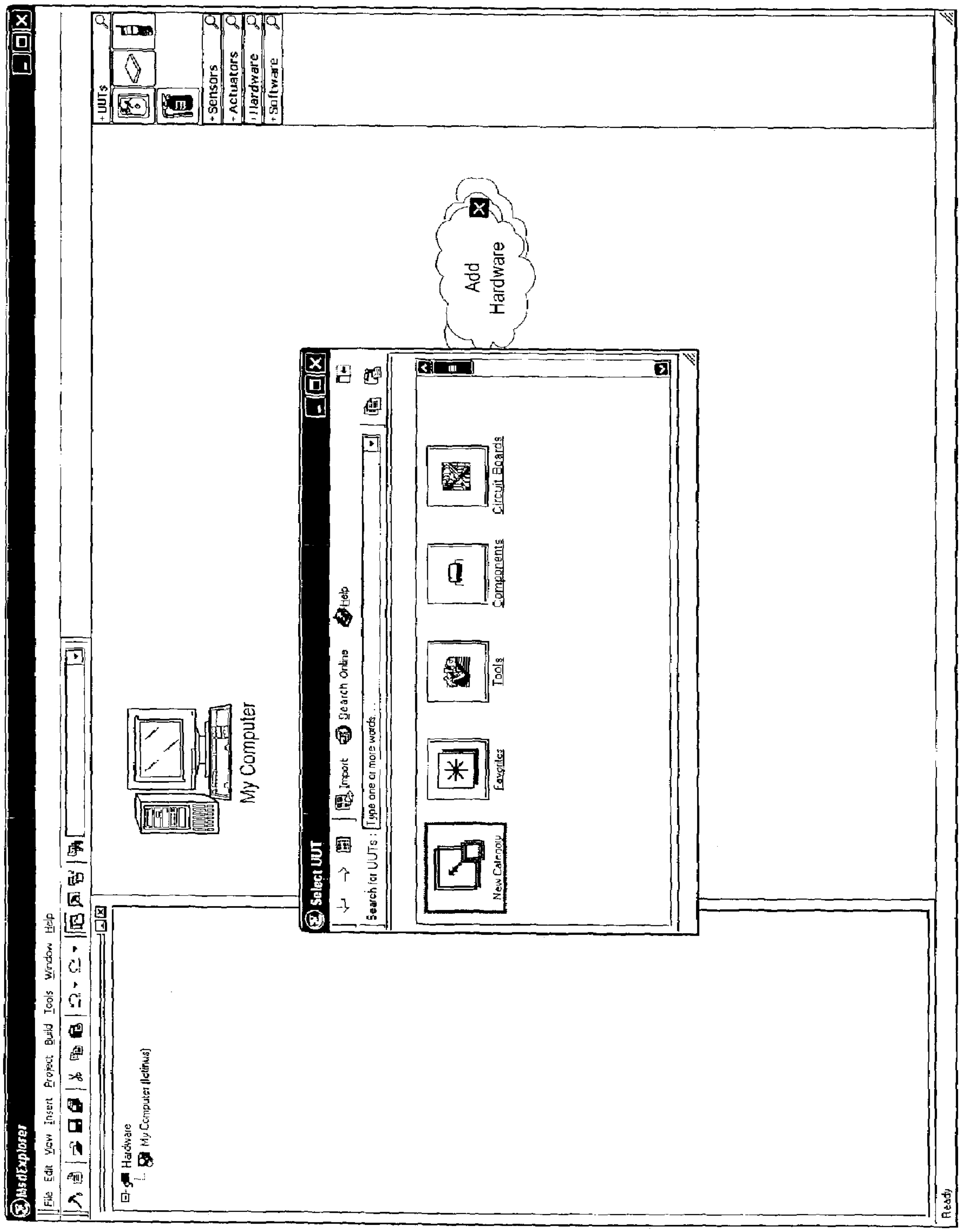

FIG. 32 illustrates a "Select UUT" wizard launched in response to the user clicking on the "Add UUT" puffy cloud. This wizard may allow the user to select from a number of different types of UUTs which have been categorized. In this example, the UUTs have been categorized as, "Tools", "Components", "Circuit Boards", and "Favorites". The wizard also illustrates a "Search Online" option which may allow the user to connect to a remote computer server to search for additional UUTs. These additional UUTs may be downloaded or integrated into the user's environment so that the user may utilize them in designing a measurement system.

Figure 33:
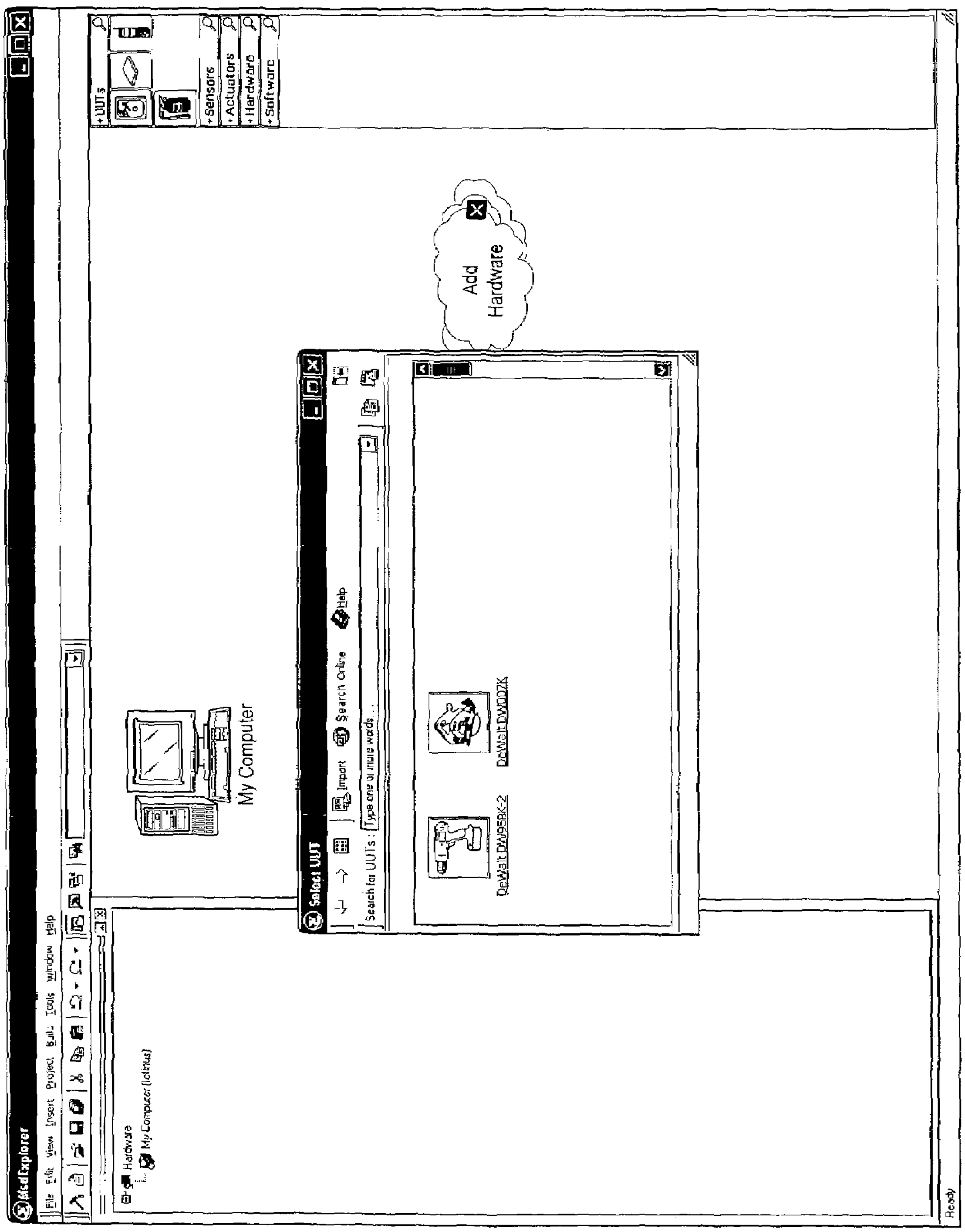

In this example, we assume that the user clicks on the "Tools" category to select a particular type of tool to be used as the unit under test (UUT). In response the wizard displays various tools that have been defined, as shown in FIG. 33. For example, these tools may be defined by information that was installed along with the MSD application or by information that was later downloaded from a remote computer server as described above. In this example, two tools are displayed, a drill and a power saw.

Figure 34:
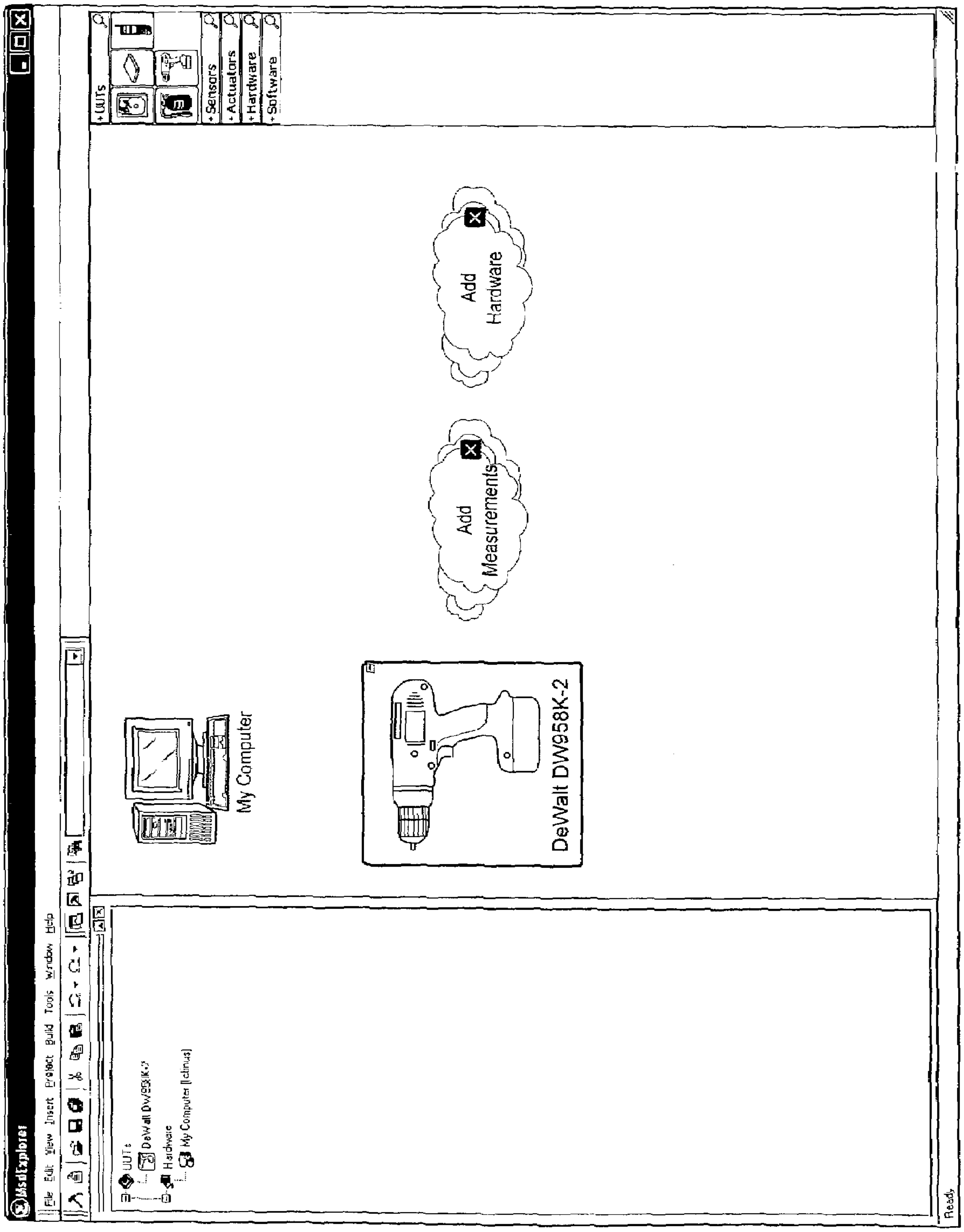

FIG. 34 illustrates the state of the MSD environment after the user has selected the drill tool. As shown, the "Select UUT" wizard window has been dismissed, and the "Add UTT" puffy cloud in the main diagram has been replaced by a drill icon illustrating the drill selected as the unit under test (UUT). In addition to visually indicating the UUT, in one embodiment various regions or points within the icon may be correlated to specific measurement points that can be used in designing the measurement system.

FIG. 34 also illustrates a tree view on the left side of the MSD workspace. This tree view illustrates the current state of the measurement system under design from various perspectives. At the current point in the example under discussion, two top-level categories are shown, "UUTs" and "Hardware". As the example progresses and the user adds additional components to the measurement system (or specifies components that are currently unspecified, as indicated by puffy cloud icons), the tree view is updated to reflect these additional components, as illustrated in drawings discussed below.

Figure 35:
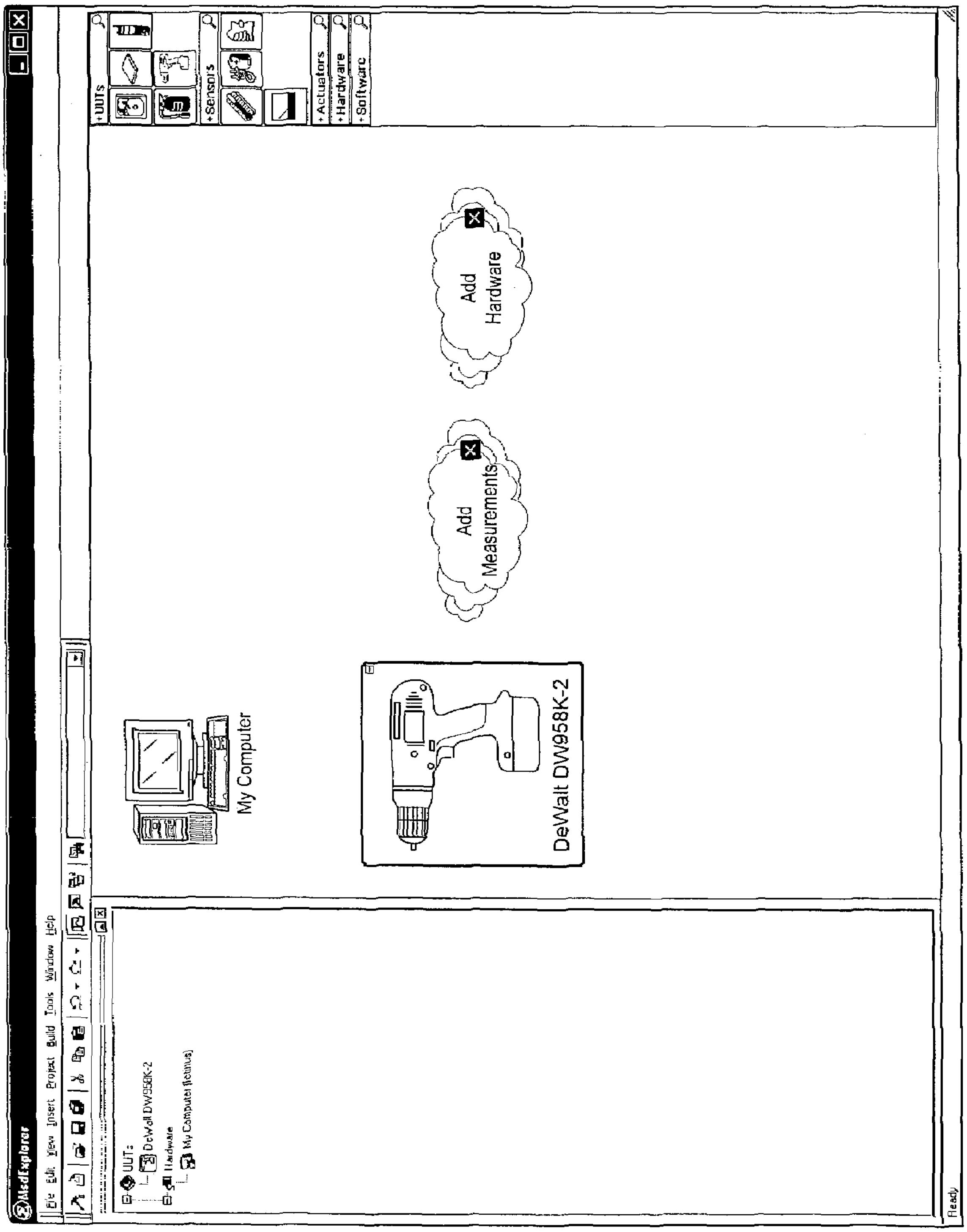

The user may next desire to add one or more sensors to the measurement system. FIG. 35 illustrates the MSD workspace after the user has expanded a "Sensors" sub-palette. The Sensors sub-palette illustrates various types of available sensors, including thermometers, electrical sensors, pressure gauges, etc. In this example, the user desires to measure temperature of the drill under test, and thus clicks on the thermometer icon in the Sensors sub-palette.

Figure 36:
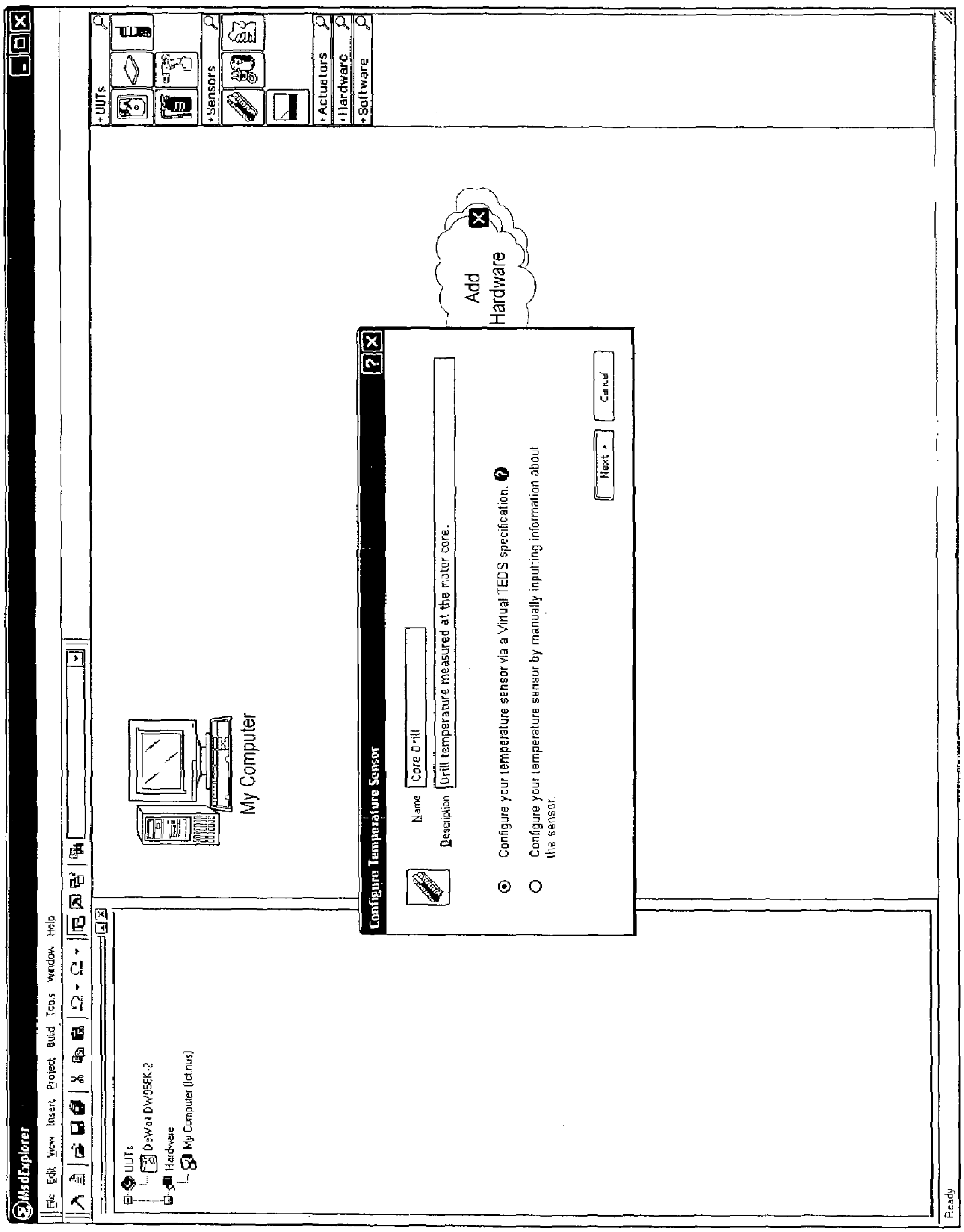

FIG. 36 illustrates a "Configure Temperature Sensor" wizard displayed in response to selection of the thermometer icon. As shown, the wizard may allow the user to specify a name and description for the temperature measurement made by the temperature sensor. The user is also presented with options to either configure the temperature sensor manually or configure the temperature sensor using a Virtual TEDS (Transducer Electronic Data Sheets) specification.

Figure 37:
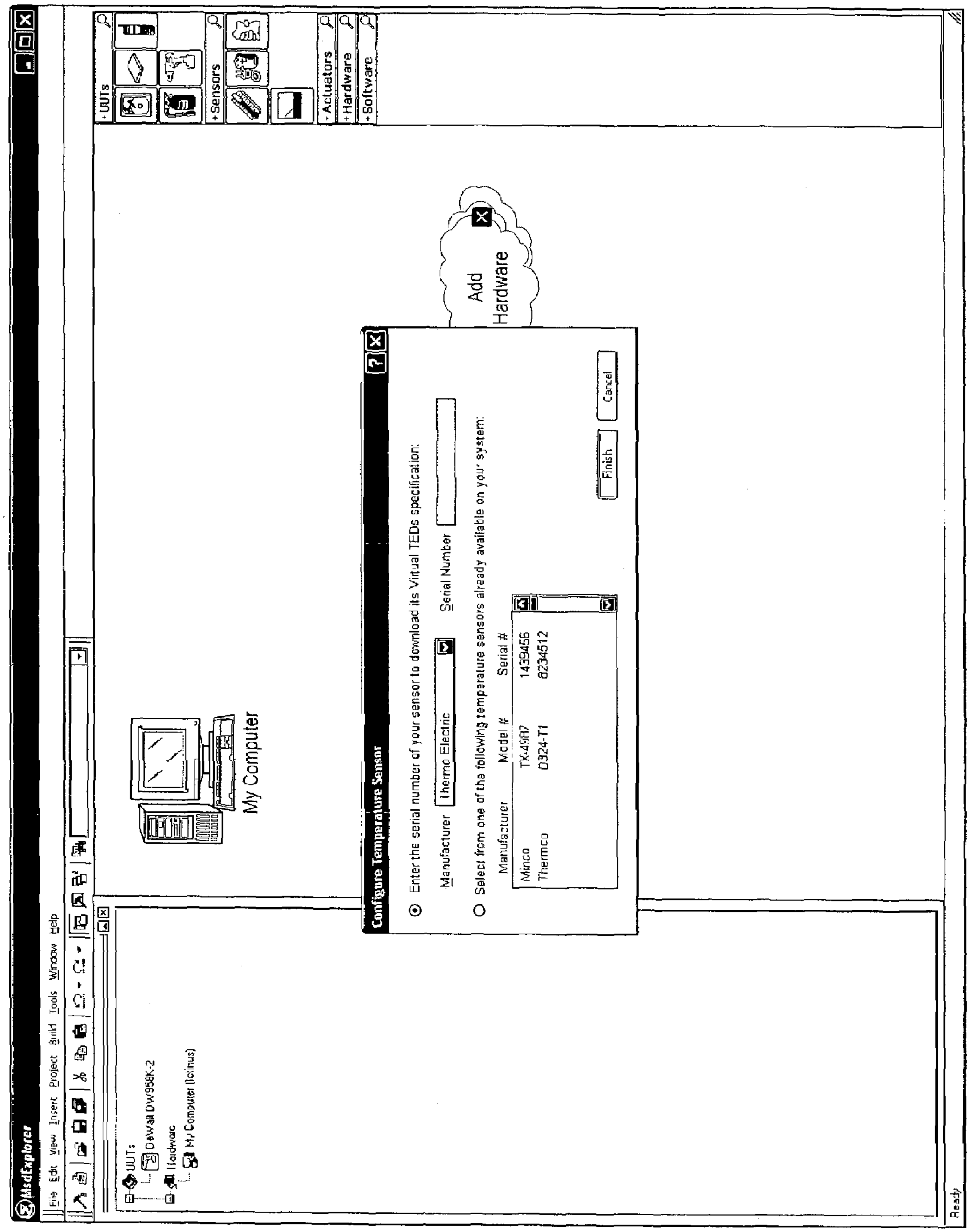

In this example, the user chooses to configure the temperature sensor using a Virtual TEDS specification. After clicking on the Next button in FIG. 36, the user is presented with options to specify the particular temperature sensor to use in the measurement system as shown in FIG. 37. For example, the user may specify the desired temperature sensor using Manufacturer/Serial Number information. The user may also select from particular temperature sensors already present on or connected to the user's computer system, or particular temperature sensors which the user previously used when designing a measurement system. The corresponding Virtual TEDS specification may then be identified for the selected temperature sensor. If the Virtual TEDS specification is not already present on the user's computer system, it may be automatically downloaded from a remote computer server.

Figure 38:
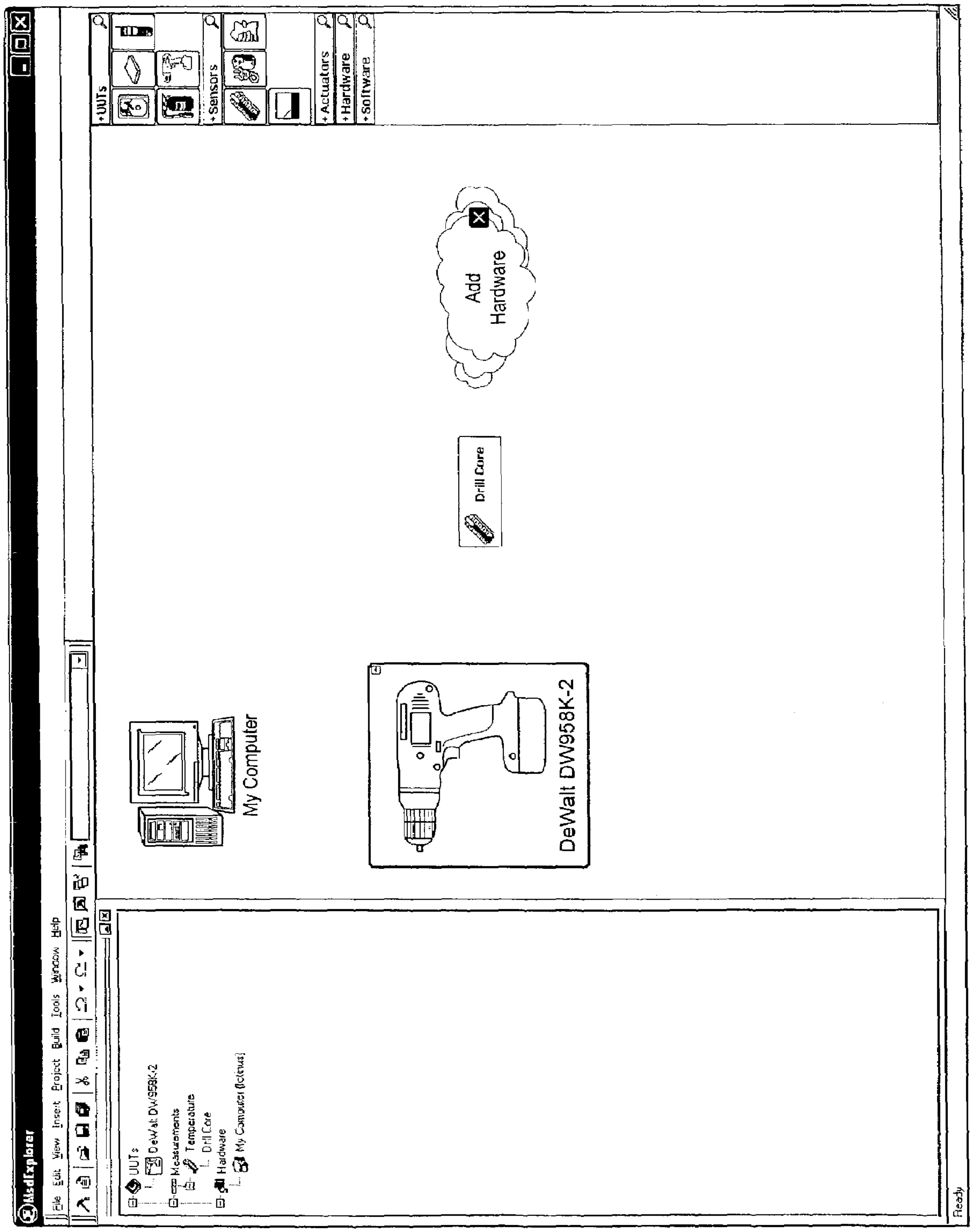

FIG. 38 illustrates the state of the MSD environment after the user has selected a particular temperature sensor. By specifying the temperature sensor, the user has also specified a measurement for the measurement system under design, i.e., the temperature measurement made by the temperature sensor. Thus, as shown in FIG. 38, the "Add Measurements" puffy cloud has been replaced by a "Drill Core" icon representing this temperature measurement. Also, as described above, FIG. 38 illustrates an updated tree view which lists the specified temperature measurement.

Many aspects of configuring the sensor may be performed automatically. For example, a virtual channel representing the temperature measurement may be automatically created and configured to acquire a measurement from the selected temperature sensor. Thus, a measurement may be represented by a virtual channel. From the user's point of view, the measurement system may perform or make a measurement. A virtual channel refers to a resource or programmatic entity through which the measurement or measurement data can be referenced programmatically, e.g., can be referenced in a computer program which interacts with the measurement system under design.

Figure 39:
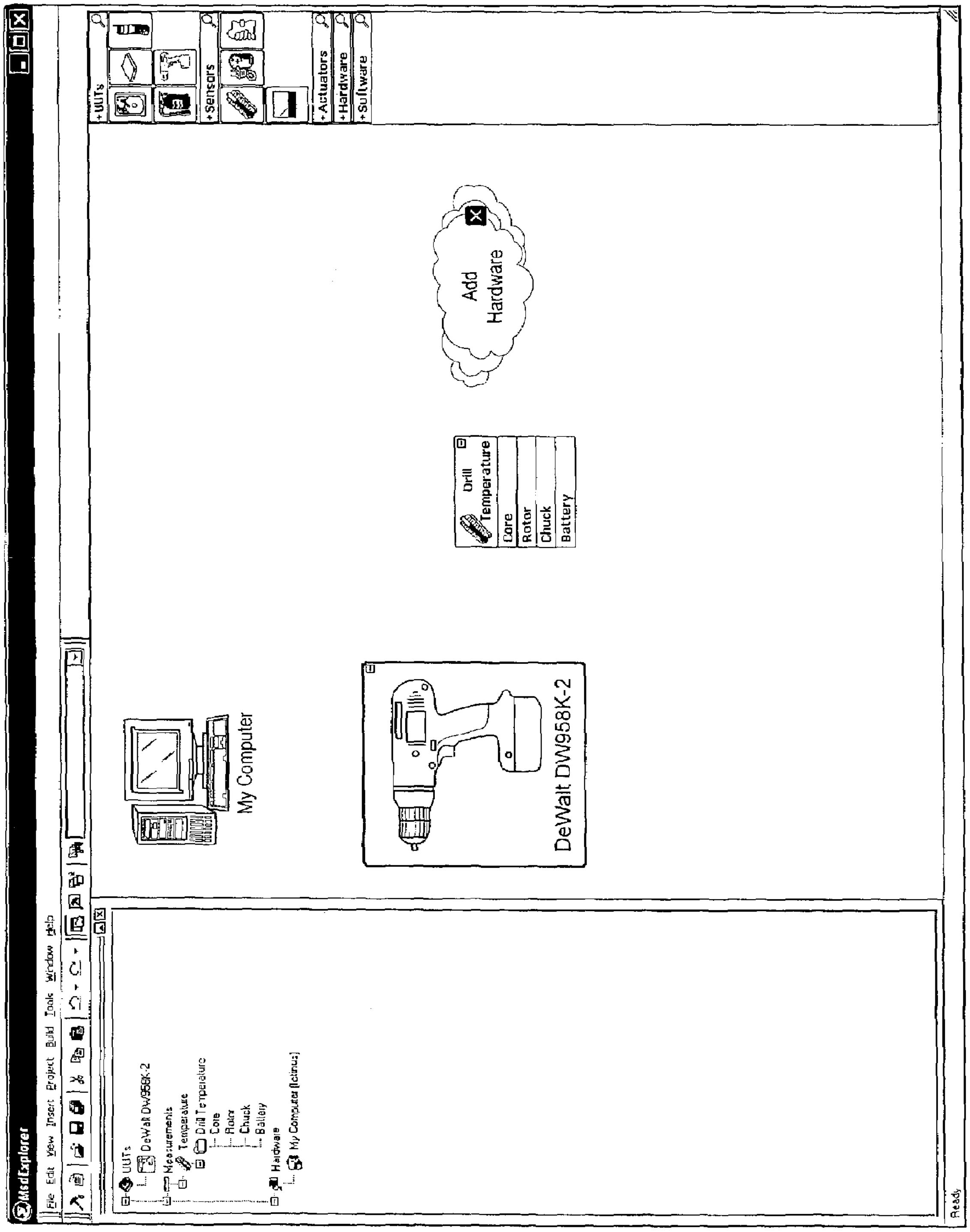

FIG. 39 illustrates the state of the MSD environment after the user has configured the measurement system to perform four different measurements to measure temperature of the core, rotor, chuck, and battery of the drill under test. Each of these four measurements may be represented by a different virtual channel. The user may configure the measurement system to perform these four measurements using the graphical user interface of the MSD environment similarly as described above, although the details of this process are not illustrated in the drawings.

Figure 40:
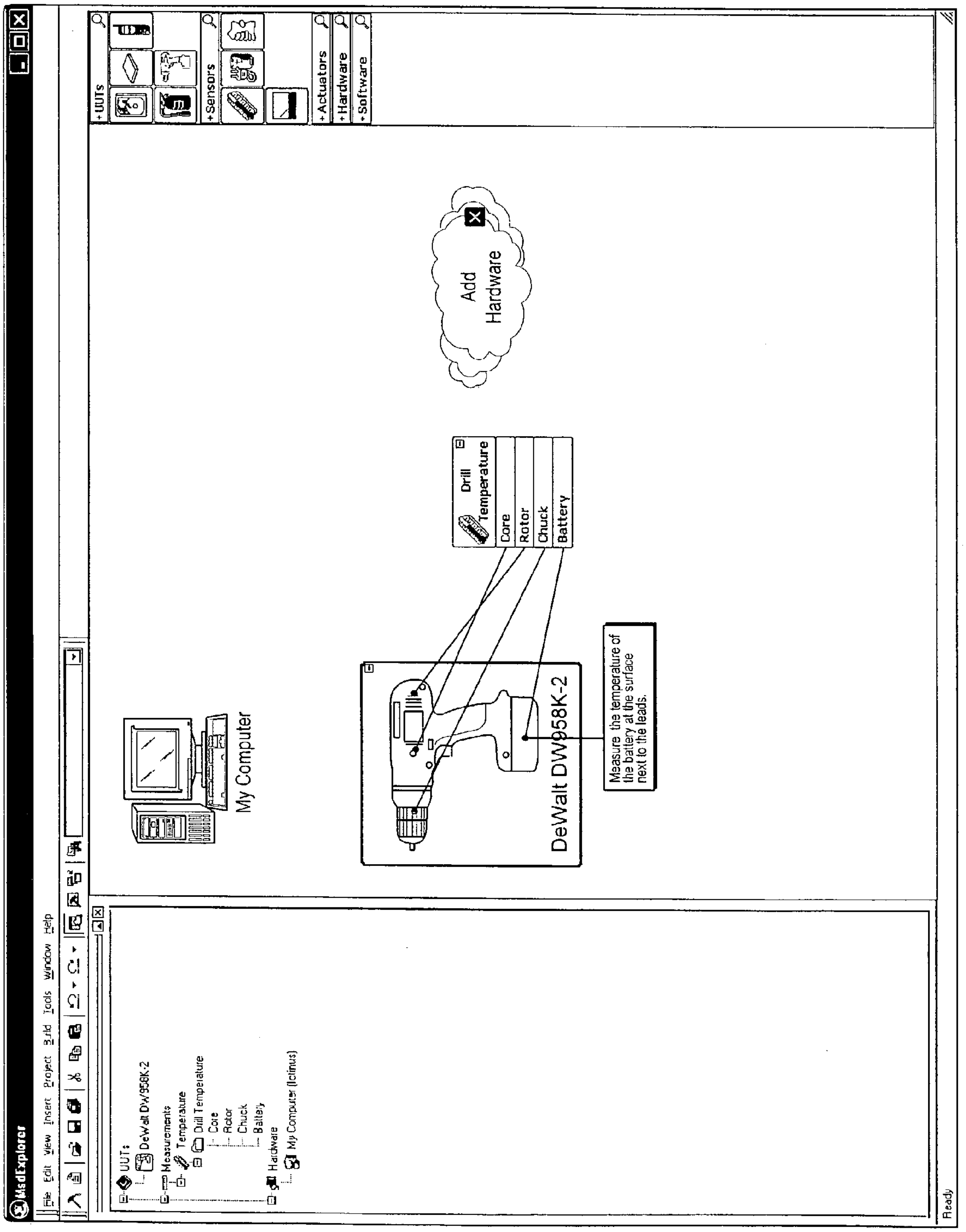

In one embodiment, the user may associate or wire each of the four measurements to a particular measurement point on the UUT, as shown in FIG. 40. This may enable both the user designing the measurement system and other persons to easily relate each measurement to where the measurement is made on the UUT. The user may also add an informational message for each measurement. For example, when a mouse cursor is placed over one of the measurements listed in the "Drill Temperature" icon or placed over a particular measurement point on the UUT icon, the corresponding informational message may be displayed. The user may also be able to manually display or hide the informational messages. In FIG. 40, an informational message for the "Battery" measurement is displayed.

In one embodiment, various measurement points on the UUT may be pre-defined, and each of the measurement points may be associated with pre-defined simulation data or measurement information. For example, simulation data associated with a measurement point may enable a realistic simulation of the measurement to be performed even if the actual sensor or the actual UUT is not connected to the user's computer system. Also, measurement information associated with a measurement point may be utilized in a software program. For example, as described above, each measurement may have a corresponding virtual channel through which the measurement can be referenced programmatically. Thus, when a particular virtual channel is used within or included in a software program, the measurement information for the measurement point with which the virtual channel is associated may be utilized. As one example, the measurement information may specify one or more parameter values for a function or method call.

Referring again to the example under discussion, the user has now configured four measurements. As described above, Virtual TEDS information for the measurements may include complete information regarding electrical characteristics of the measurements. Thus, the MSD application may now be able to assist the user in selecting appropriate hardware devices to acquire the measurements. In another embodiment, Virtual TEDS may not be used, and the user may manually provide additional information regarding electrical characteristics or other aspects of the measurements, e.g., may interact with one or more dialogs to provide this information.

Figure 41:
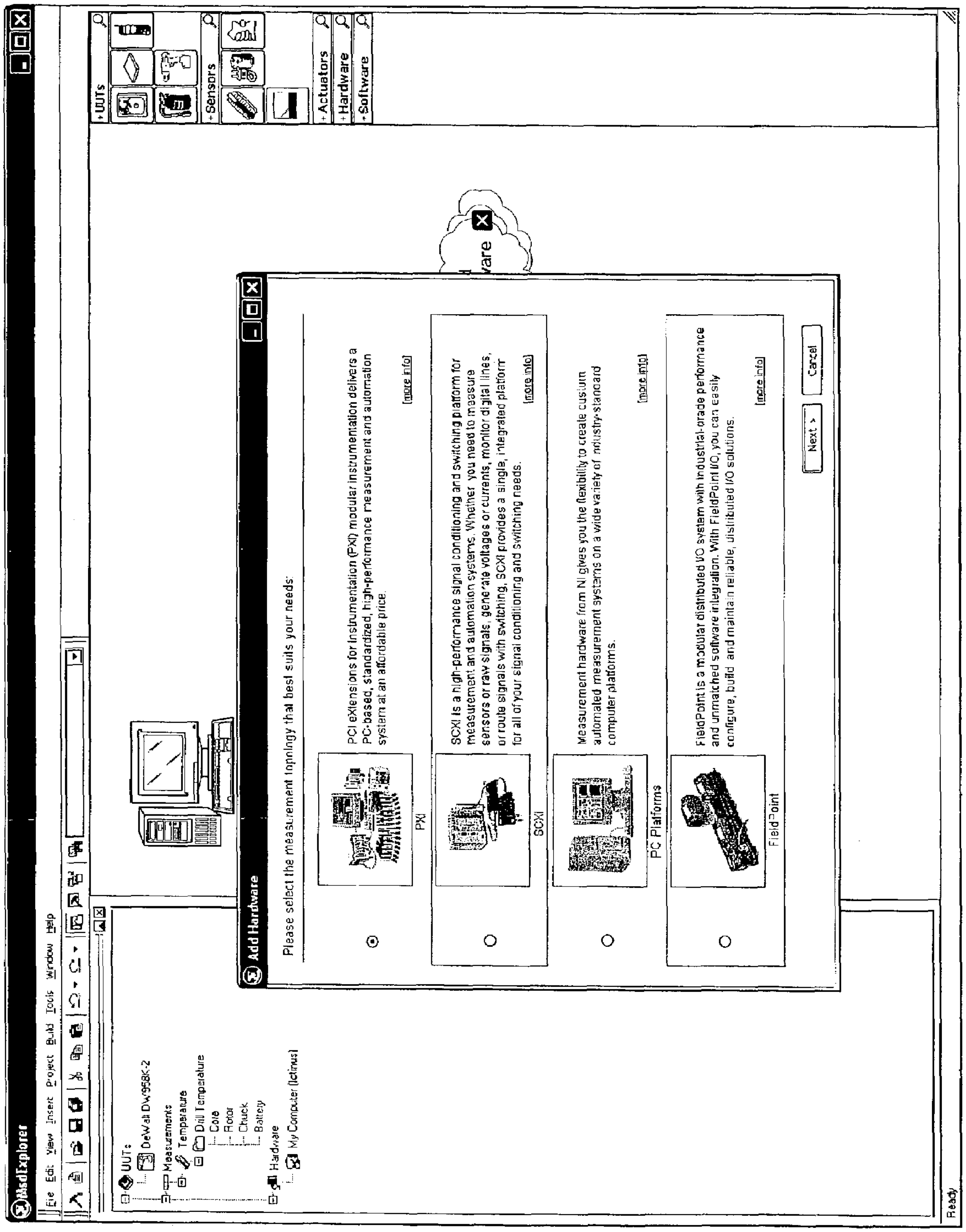

The user may begin the process of selecting these hardware devices for the measurement system by clicking on the "Add Hardware" puffy cloud. FIG. 41 illustrates an "Add Hardware" wizard launched in response to the user clicking on the "Add Hardware" puffy cloud. This wizard may allow the user to select from a number of different types of hardware devices which have been categorized. In this example, the user may select from hardware devices having various form factors, such as PXI, SCXI, PC platform devices, and FieldPoint devices. As described above with reference to FIG. 1A, in one embodiment, the "Add Hardware" wizard (as well as other wizards, guidance mechanisms, or other functionality of the MSD application described herein) may at least in part be executed on a remote computer system connected via a network to the computer system with which the user interacts.

In one embodiment, the MSD environment may be operable to automatically update itself with new hardware products as they become available. For example, the MSD environment may periodically communicate with one or more remote computer servers, e.g., a server associated with a hardware vendor, to receive information regarding new products, products which have become defunct, etc. Thus the hardware devices presented to the user may be kept updated so that the user can design his measurement system according to the current commercial environment. The product updates may be applied to update various aspects of the MSD environment, such as wizards or other guidance mechanisms, menus, palettes, etc.

Referring again to FIG. 41, in the preferred embodiment, the "Add Hardware" wizard displays only hardware devices or categories of devices that are valid based on the measurements already configured by the user. For example, if a particular measurement has an electrical characteristic which is out of range or invalid for a particular hardware device, then that hardware device may not be displayed. As one simple example, if a measurement is acquired as an analog signal, then hardware devices capable of acquiring only digital signals may not be displayed. Thus, the MSD environment may aid the user in designing the measurement system by analyzing the system requirements and presenting the user only with options that satisfy these requirements. In one embodiment, the MSD environment may access one or more databases to determine which hardware devices meet the system requirements. The database(s) may be located on the user's computer system or may be located remotely and accessed via a network.

Figure 42:
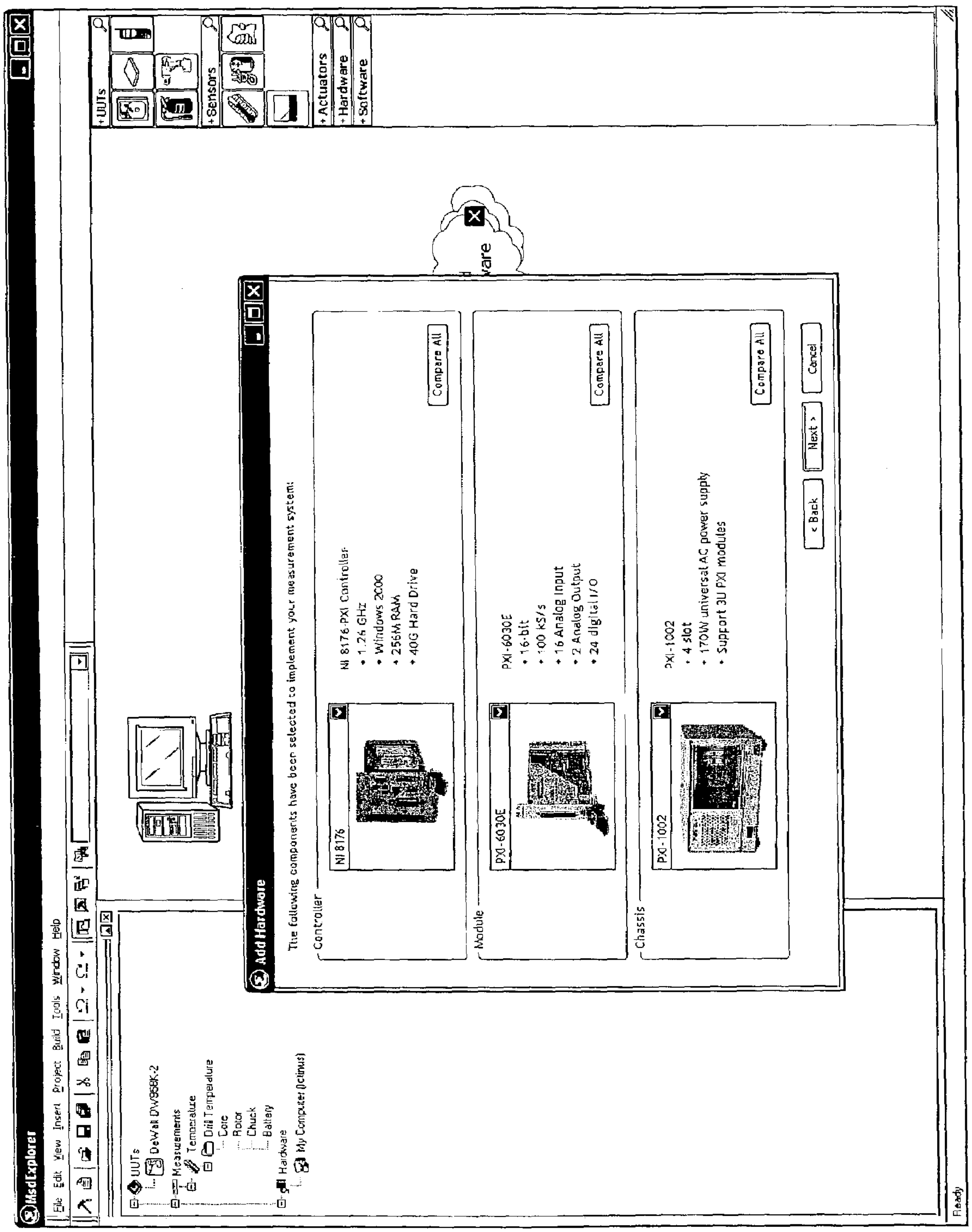

FIG. 42 illustrates the "Add Hardware" wizard after the user has selected the PXI category and clicked on the "Next" button. As shown in FIG. 42, the user may be presented initially with a suggested hardware configuration, including a suggested controller, module, and chassis. The user may modify this suggested configuration if desired by selecting other available (and valid) PXI hardware devices using the drop-down arrows for each component. FIG. 42 also illustrates a set of "Compare All" buttons that allow the user to compare various characteristics of each of the valid controllers, modules, and/or chassis.

The current example does not reflect any hardware devices already installed on or connected to the user's computer system. In a case where the user's computer system already had one or more hardware devices meeting the measurement system requirements, these hardware devices may be reflected in the suggested configuration presented to the user so that the user can use the hardware devices already available to implement the measurement system. In one embodiment, the user may choose to use new hardware even if existing hardware devices meeting the measurement system requirements are already present on the user's computer system. For example, the MSD environment may indicate that the hardware devices already present are sufficient but that the measurement system can obtain performance benefits, efficiency benefits, or other benefits by using different hardware devices. Also, in one embodiment, the MSD environment may inform the user of how to configure the existing hardware devices to best function in the measurement system or may automatically configure the existing devices for the user. Also, if the user has already included in the system diagram a hardware device that meets the requirements (e.g., by selecting the hardware device from a palette), then this hardware device may be suggested regardless of whether it is physically present or not.

Figure 43:
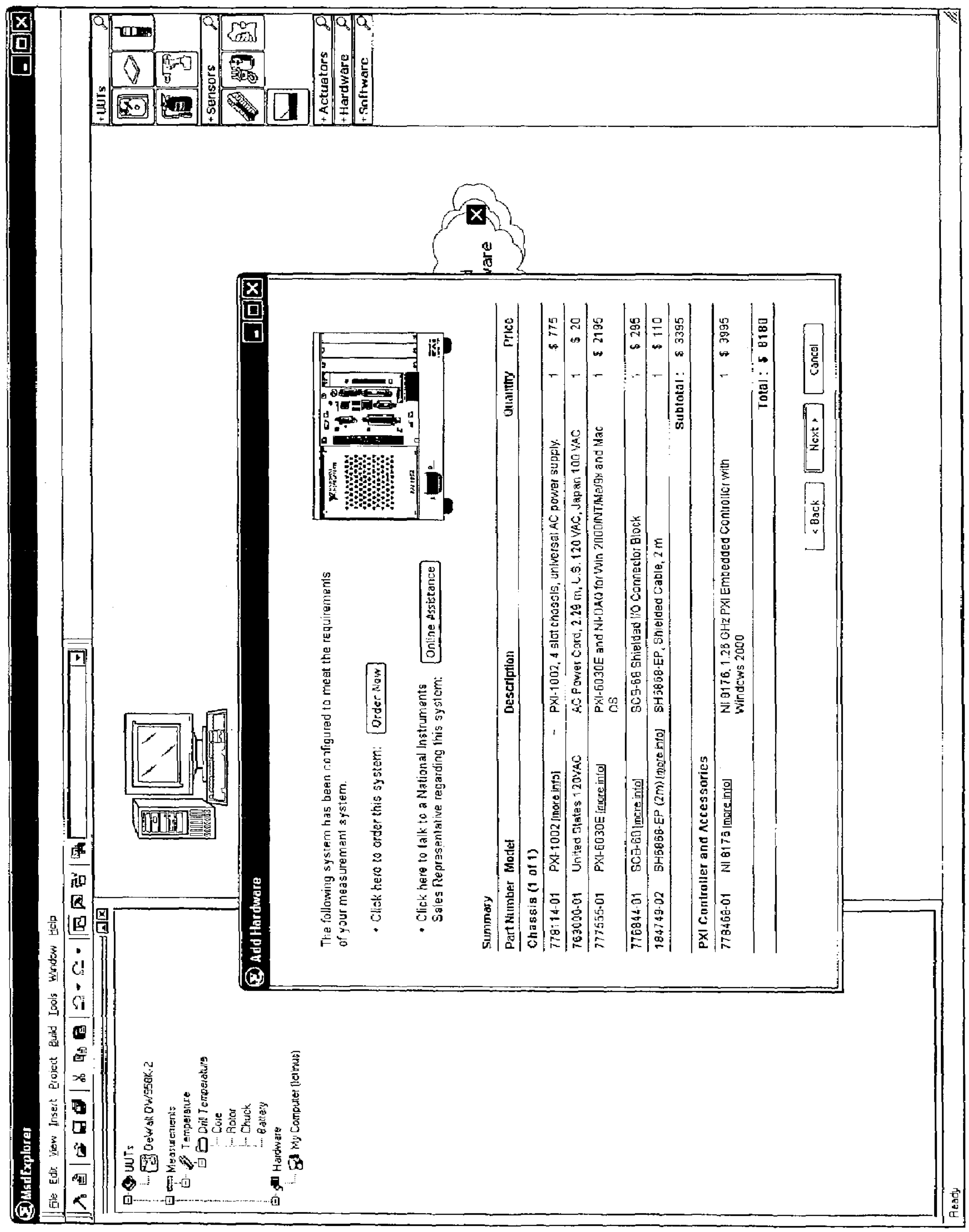

In one embodiment, the MSD environment may be operable to aid the user not only in designing a measurement system but also purchasing various components needed for the measurement system. For example, FIG. 43 illustrates the "Add Hardware" wizard after the user has accepted the suggested hardware configuration and clicked on the "Next" button. As shown, the user has an option to order the specified hardware devices electronically. Thus, an order for any hardware devices not already present in the user's computer system may be placed electronically, e.g., by interacting with a vendor's remote computer server. The user may also be able to save the current configuration and order devices at a later time. For example, the user may utilize the MSD environment to experiment with different options for implementing the measurement system, compare the costs of implementing each option, etc. The MSD environment may also be operable to integrate with computer servers for one or more vendors to provide the user with information such as which hardware devices are in inventory, which devices the user has ordered, which devices are in route to the user, which devices still need to be ordered to complete the measurement system, etc. Also, in one embodiment, the device icons displayed on the measurement system diagram may be visually altered in various ways to indicate this type of information.

The user may also have an option to request online assistance. For example, in response to the user clicking on the "Online Assistance" button in FIG. 43, information specifying the measurement system which the user has configured may be transmitted electronically to a support representative, enabling the support representative to view the user's measurement system and contact the user, e.g., by telephone or via the Internet.

Figure 44:
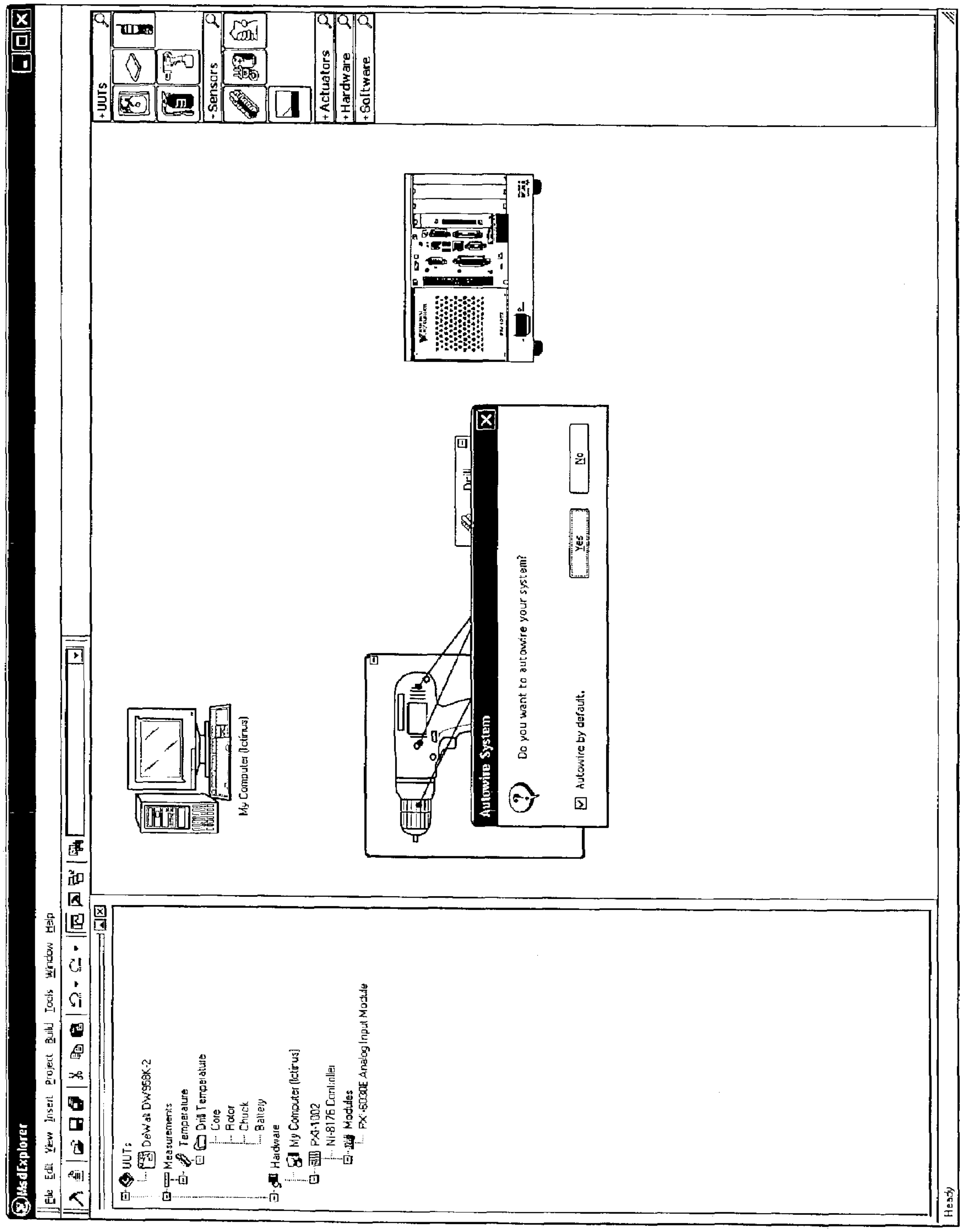

FIG. 44 illustrates the state of the MSD environment after the user has clicked on the "Finish" button in FIG. 43. As shown, the "Add Hardware" puffy cloud has been replaced on the diagram with the hardware devices selected by the user. Also, the tree view on the left of the MSD workspace has been updated to reflect the hardware devices that have now been added to the measurement system.

As indicated by the dialog box in FIG. 44, the user may also allow the MSD application to auto-wire the measurement system. In auto-wiring the measurement system, the MSD application may utilize the information it has regarding the electrical characteristics of the measurements and the characteristics of the selected hardware devices to automatically specify wiring connections for the measurement system. If the measurement system includes more than one hardware device that satisfies the measurement requirements, the MSD environment may prompt the user to select which device(s) to use.

Figure 45:
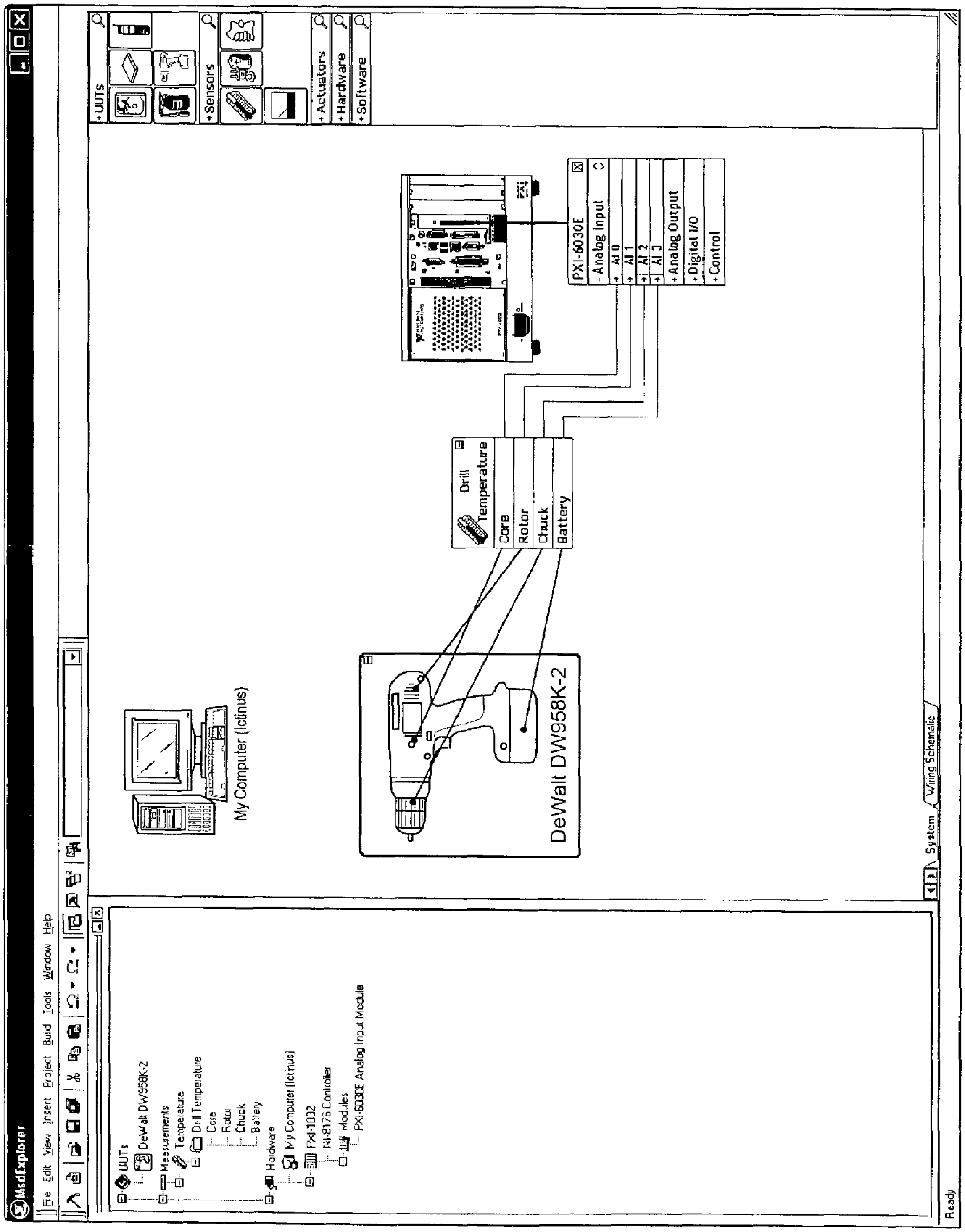

FIG. 45 illustrates the state of the MSD environment after the user has requested auto-wiring for the measurement system. As shown, each measurement has been automatically wired to an analog input line of the selected PXI hardware module. In this example, each measurement is represented on the diagram by a single wire, regardless of how many physical wires are actually used for the measurement. The MSD application may also be capable of displaying a lower level wiring schematic view which illustrates the actual physical wiring, which may require two or more wires, e.g., depending on the transducer used. The user may access this wiring schematic view by clicking on the "Wiring Schematic" tab shown at the bottom of the window.

The icon below the PXI hardware represents functionality of the hardware and includes various fields which the user may expand or collapse as desired to view the functionality at the desired level of granularity. This icon is also referred to herein as a "hardware dongle". The user may also hide the hardware dongle altogether if desired.

In FIG. 45 the "Analog Input" field of the hardware dongle is expanded to illustrate analog input lines of the PXI module used for the measurements, as described above. The user may also be able to expand the "Analog Input" field even further to view additional analog input lines which are available but are currently unused. The user may control this expansion of the "Analog Input" field using the arrows on the right side of the "Analog Input" field heading. In addition to analog input functionality, the user may also similarly view analog output, digital I/O, and control functionality of the PXI hardware by expanding or collapsing the fields using the respective headings.

Figure 46:
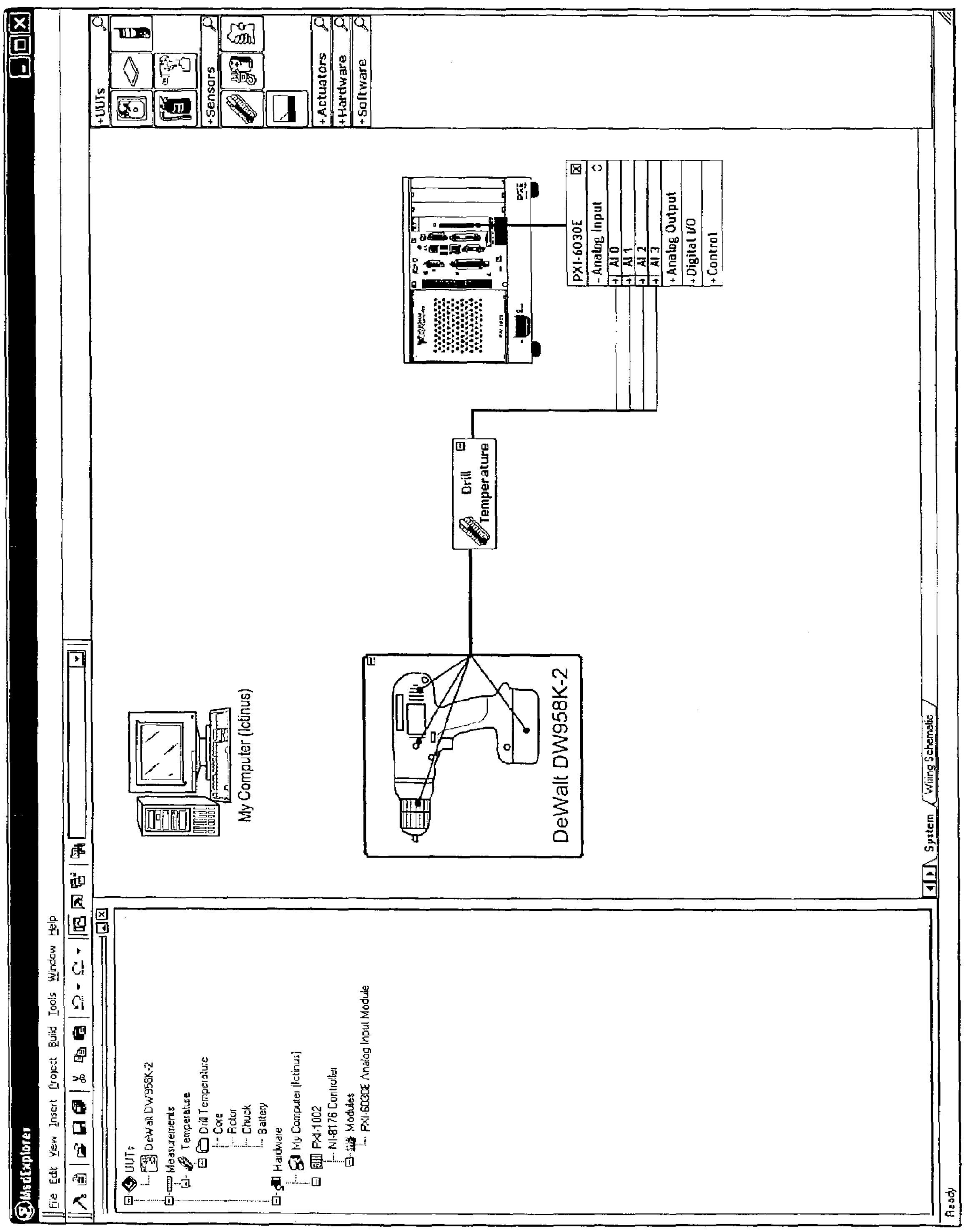

The user may also expand or collapse various other components in the diagram to view the measurement system at any desired level of detail. For example, FIG. 46 illustrates the diagram after the user has clicked on the "Drill Temperature" icon to collapse the icon, thus hiding the individual measurements. Most components may be capable of varying degrees of expansion, e.g., more detail of the component may be displayed with each expansion. Thus, the MSD environment may provide the user with an extremely flexible means to view various aspects of a measurement system at various levels of granularity. For example, the user may view a compact diagram illustrating the measurement system from a high level, or the user may expand various icons in the diagram to "drill down" into particular sub-systems or components to view details regarding those sub-systems or components. Also, as described below, the user may designate various components within the diagram to be associated with each other as a single sub-system, and the sub-system may be collapsed into a single sub-system icon to provide a more abstract representation of the measurement system. Thus, the MSD environment may display a diagram representing high-level or conceptual functionality of the measurement system, low-level physical connections of the measurement system, or various states of granularity in between, as desired by the user.

Figure 47:
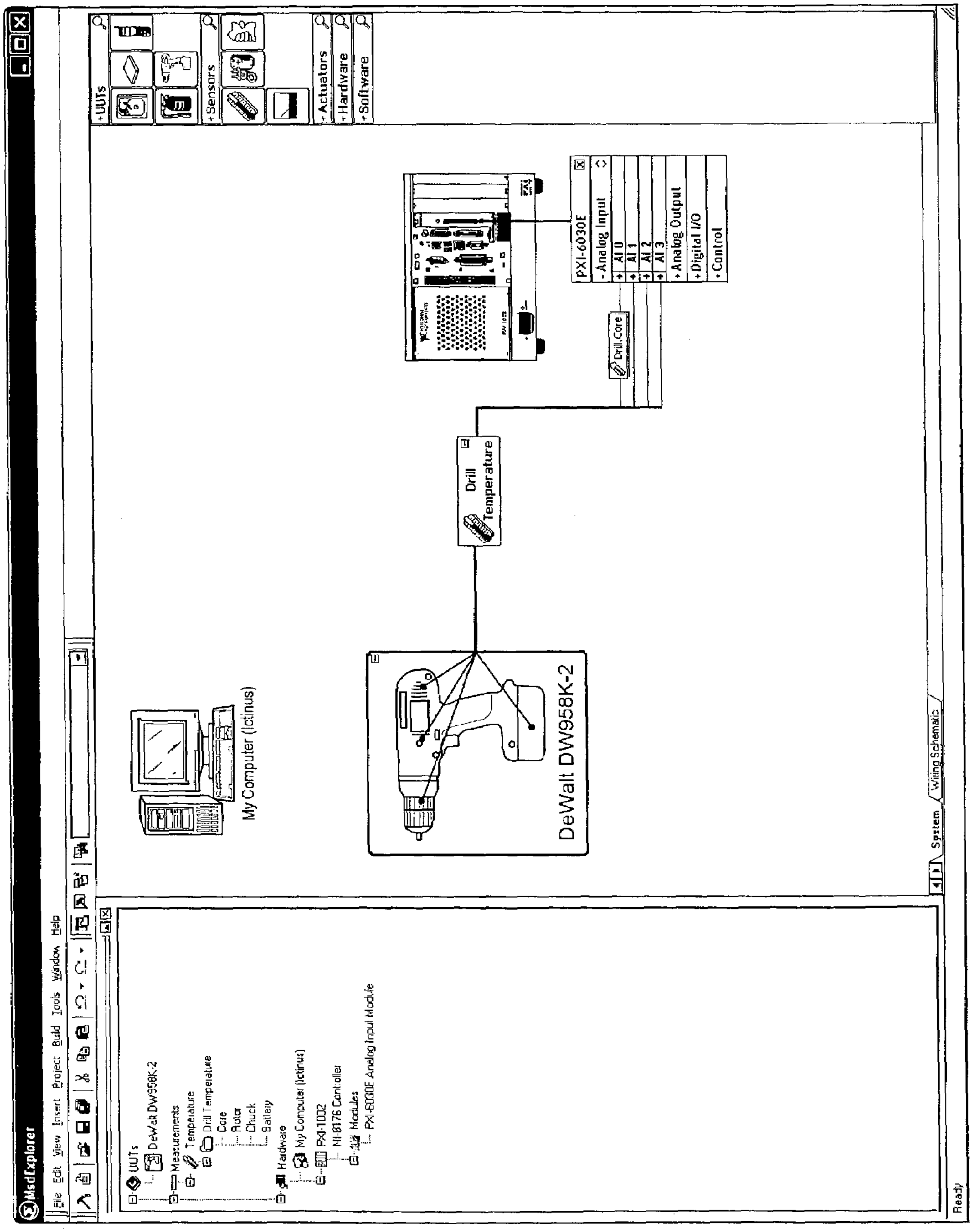
Figure 48:
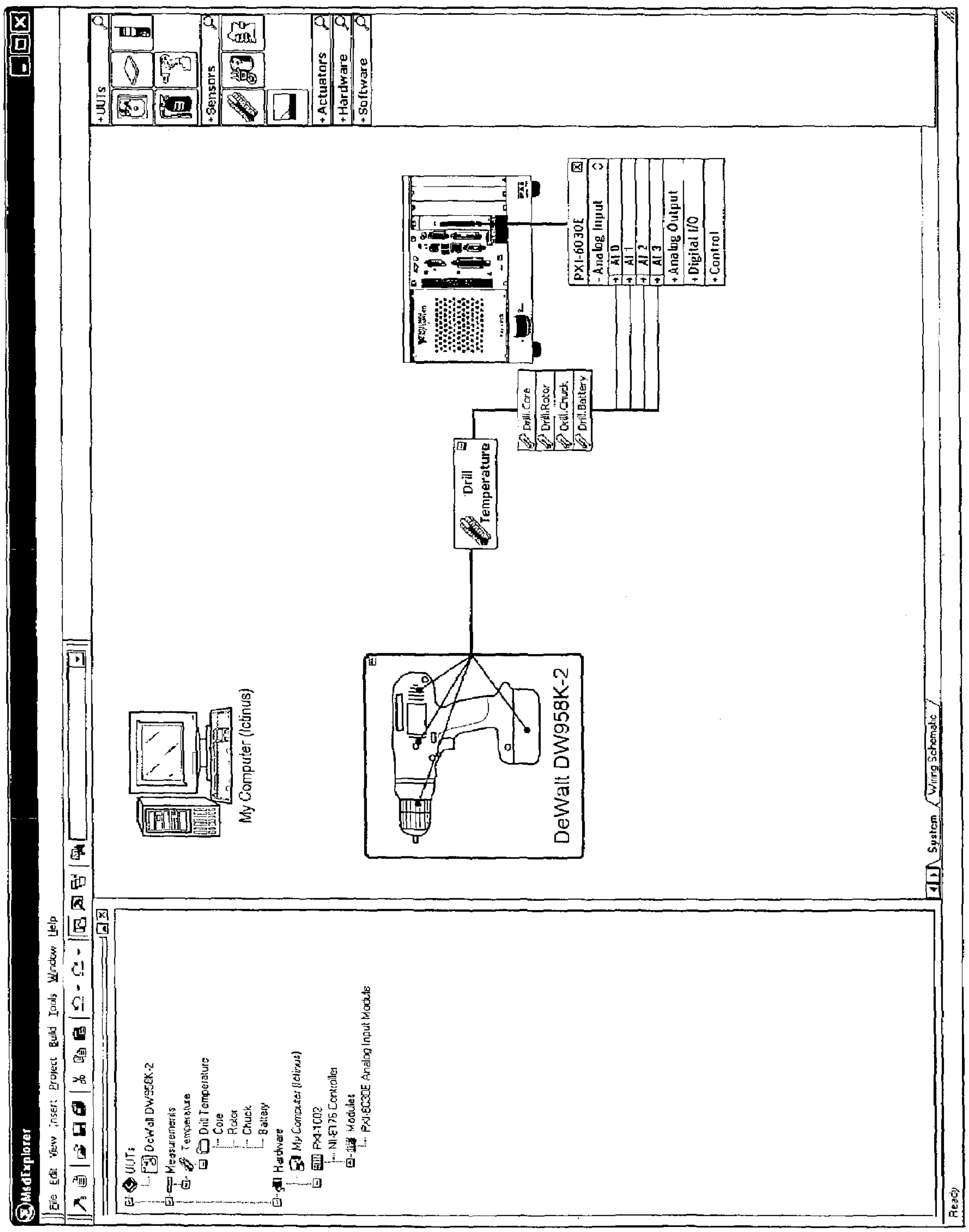

The MSD application may also pop-up or temporarily display information as the user moves a mouse cursor to different points within the diagram. For example, as shown in FIG. 47, when the user hovers the cursor over the wire connected to the "AI 0" analog input line, a "Drill Core" message may temporarily appear to indicate the measurement to which the "AI 0" analog input line corresponds. Similarly, when the user hovers over the bundle of wires emerging from the "Drill Temperature" icon, all of the measurements represented by the bundle of wires may be temporarily displayed, as shown in FIG. 48.

Figure 49:
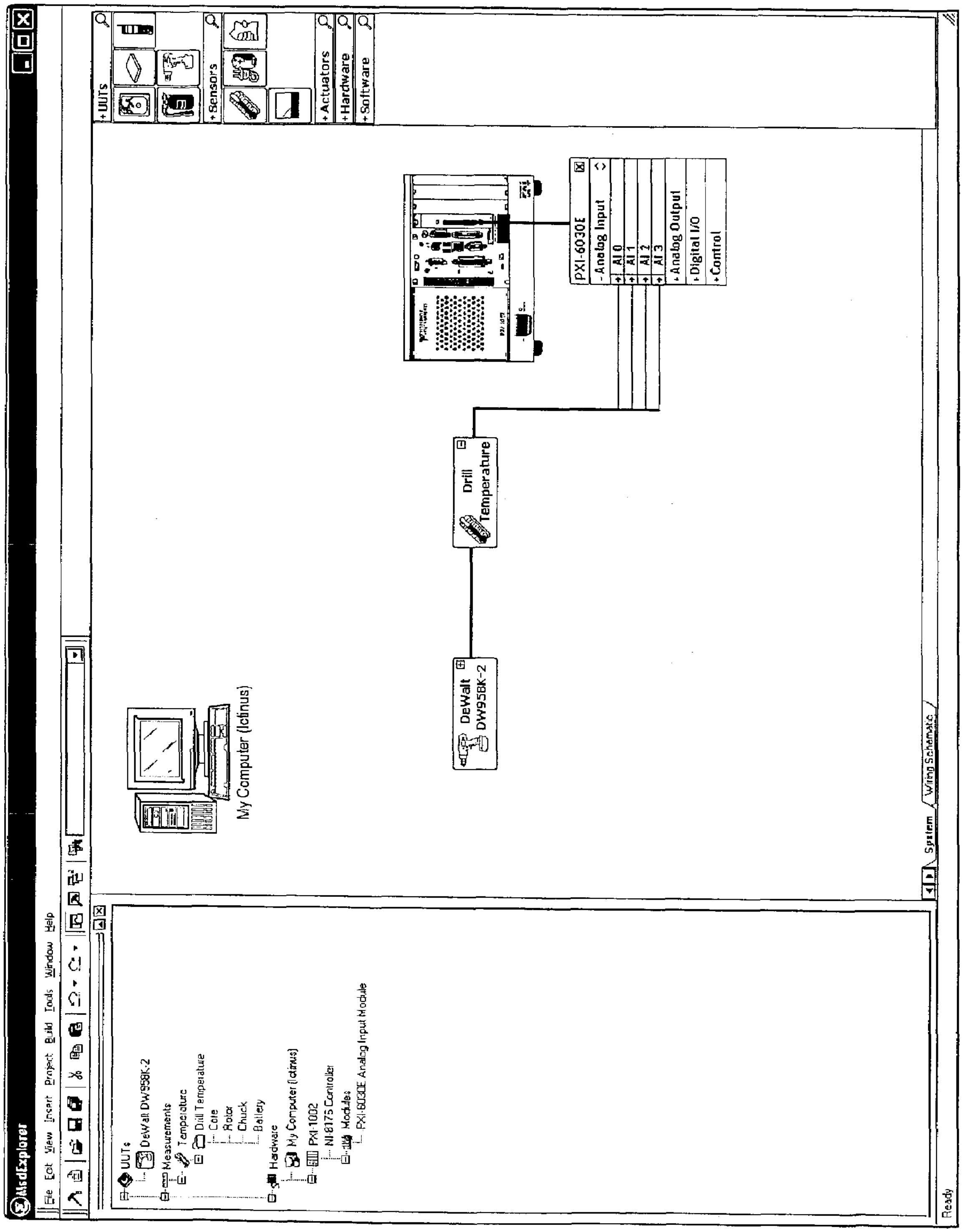
Figure 50:
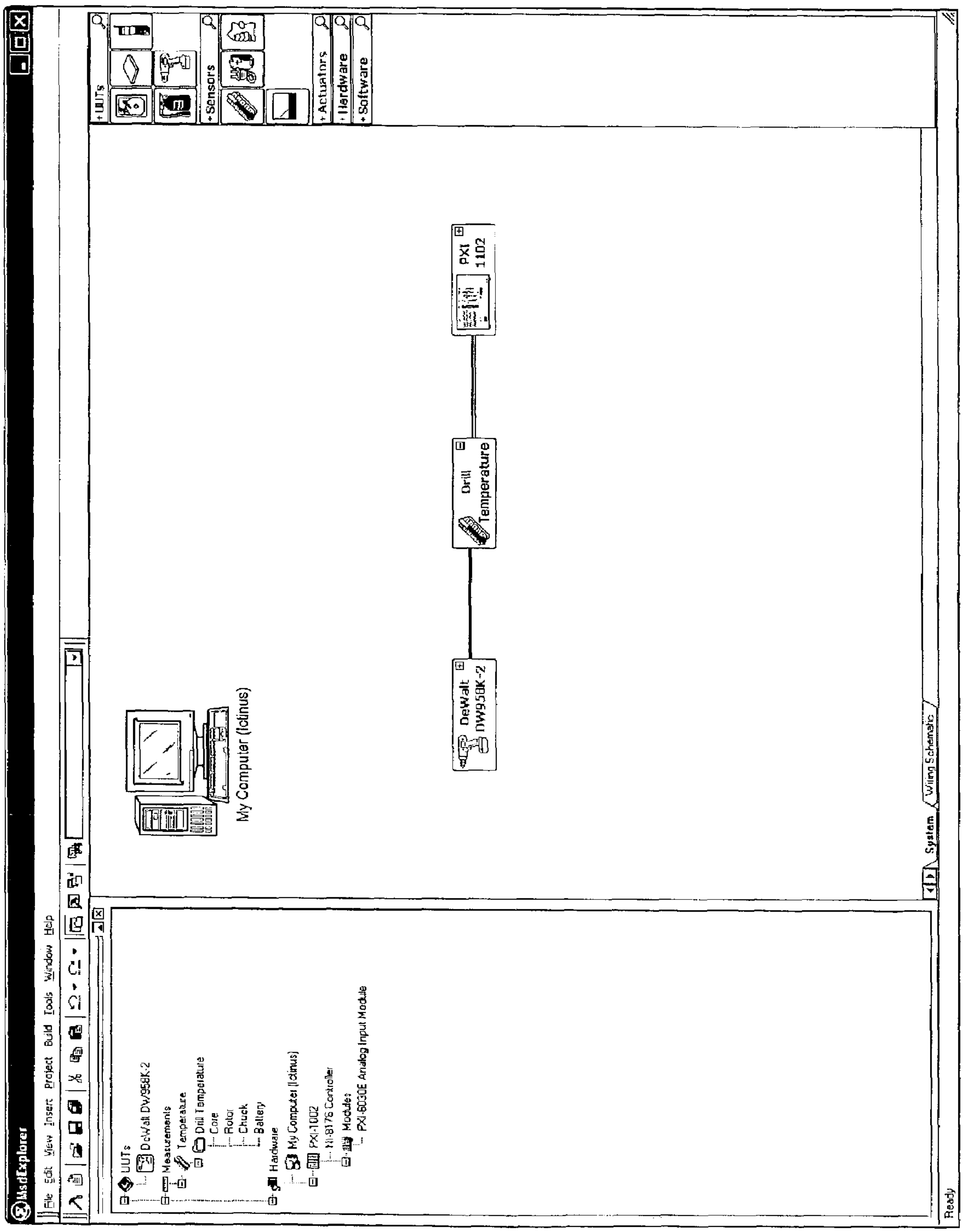
Figure 51:
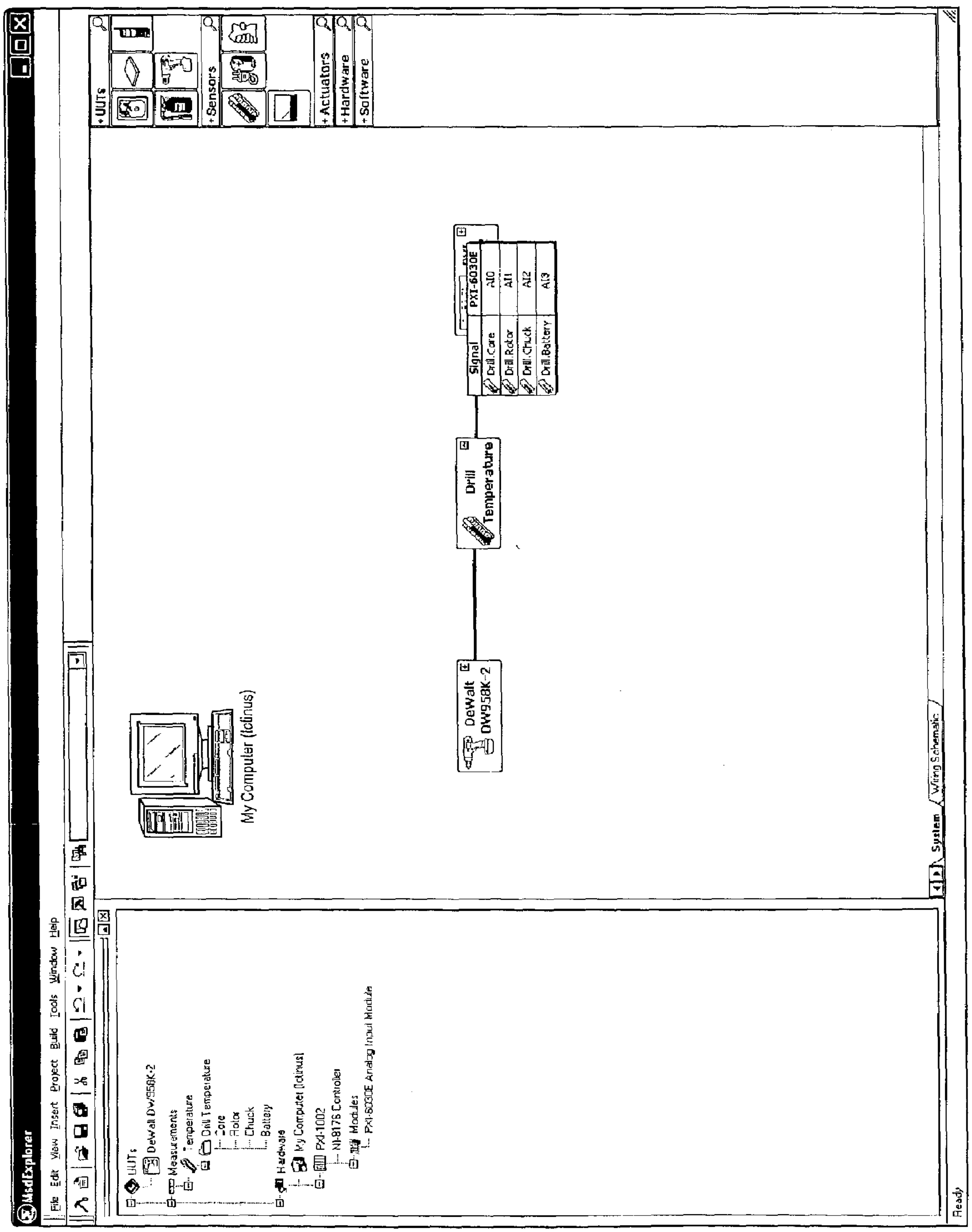

Similarly as described above, the user may also click on the drill UUT icon to collapse the icon, as shown in FIG. 49. Similarly, the user may click on the PXI chassis icon to collapse the icon, as shown in FIG. 50, thus providing a compact representation of the measurement system. FIG. 51 illustrates another example of information temporarily displayed as the user moves a mouse cursor within the diagram. In this case, as the cursor hovers over the bundle of wires between the Drill Temperature measurements icon and the PXI hardware icon, information indicating pairs of measurements and analog input lines are displayed.

Figure 52:
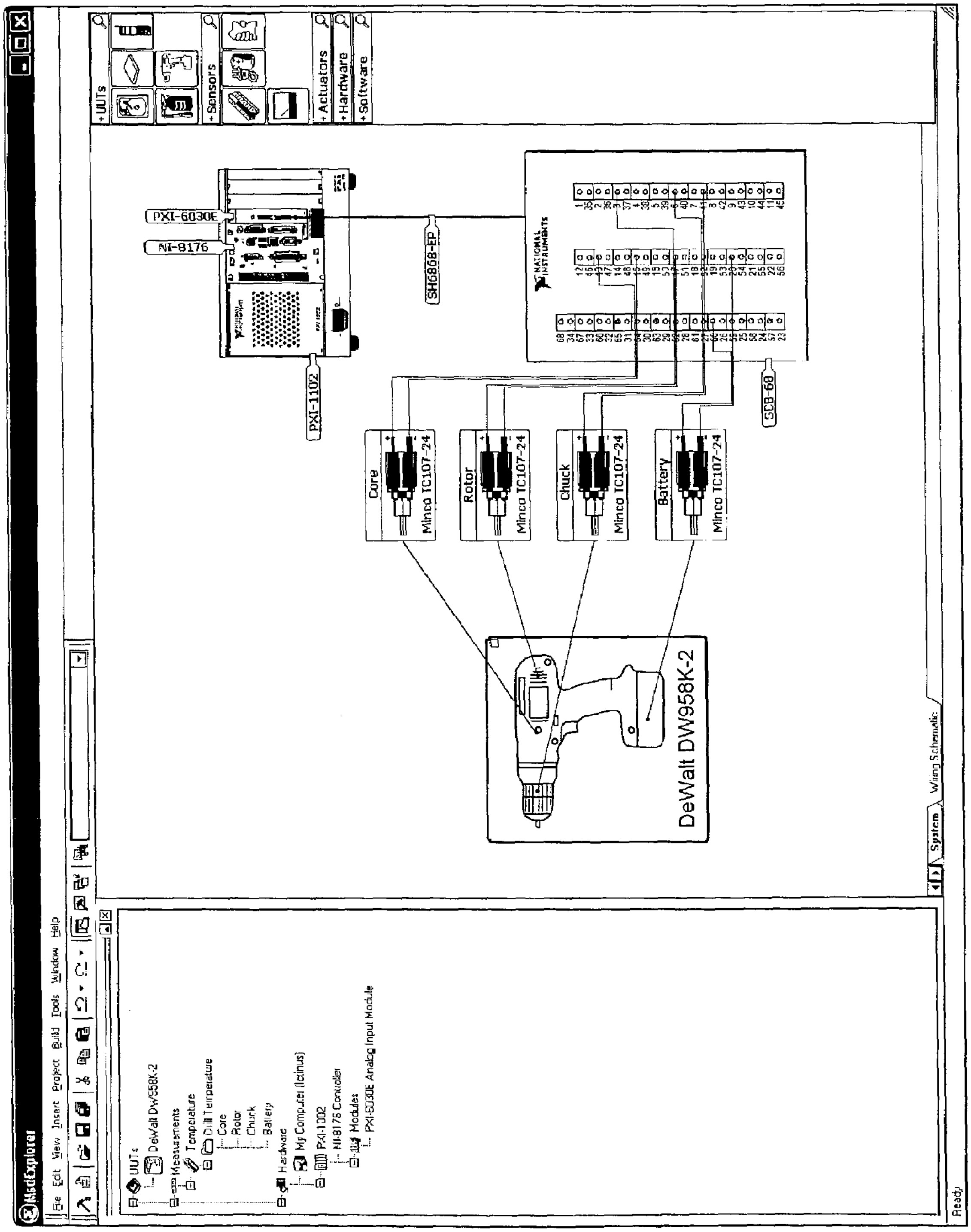

Referring now to FIG. 52, a wiring schematic view of the measurement system has been displayed in response to the user selecting the "Wiring Schematic" tab at the bottom of the MSD workspace. This wiring schematic view may be generated automatically based on the measurement system designed by the user as described above. The wiring schematic illustrates four transducers (in this case, thermocouples) for each of the four measurements made by the measurement system, including the serial numbers of these parts. The wiring schematic also illustrates how the transducers are wired to the connector block for the PXI module, including the specific pin numbers on the connector block. As described above, in the system view, the diagram had one wire representing each measurement. On the other hand, in the wiring schematic view, two wires are drawn for each measurement, representing two physical wires required to use a thermocouple.

The user may be able to interact with the wiring schematic diagram to change the wiring for the measurement system as desired. For example, the user may move a wire from one pin to another pin. The MSD environment may indicate to the user whether the new pin is valid based on the electrical requirements of the wire (or the electrical requirements of a measurement to which the wire corresponds).

The wiring schematic view may also indicate a mapping between the pin numbers displayed on the connector block and the channels on the hardware device. For example, when a cursor is hovered over a pin on the connector block, the MSD environment may temporarily display an indication of which channel the pin is associated with. For example, the mapping between connector block pins and hardware device channels may vary for different hardware devices.

As shown in FIG. 52, various components of the measurement system are labeled with wiring tips having the appearance of electrical tape. For example, the PXI chassis is labeled with its model number, "PXI-1102", the controller is labeled with its model number, "NI-8176", etc. These wiring tips may help in understanding the wiring schematic, especially in more complex measurement systems.

Figure 53:
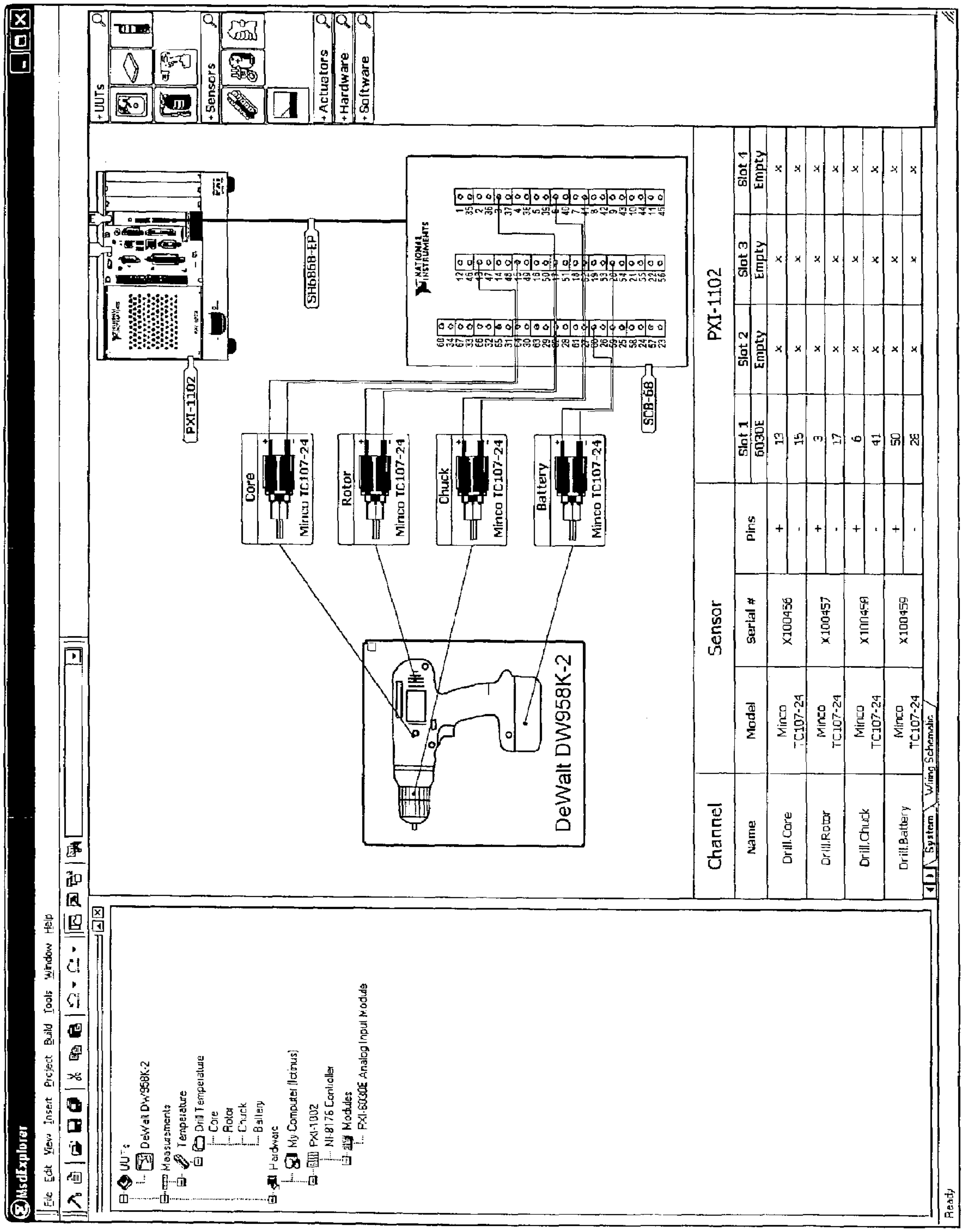

In addition to the graphical wiring schematic view shown in FIG. 52, the MSD environment may also be operable to generate a tablet view indicating in a table format the information required to wire the measurement system, as shown in FIG. 53. For example, the table view indicates that the positive pin of the transducer for the drill core measurement needs to be connected to pin 13 of the connector block, and the negative pin of this transducer needs to be connected to pin 15. The graphical view of FIG. 52 may be very useful for a simple measurement system having one PXI module as in this example. However, for more complex measurement systems having many different hardware modules and many more connections, it may be easier for a technician to read the wiring information in a table format as shown in FIG. 53.

Figure 54:
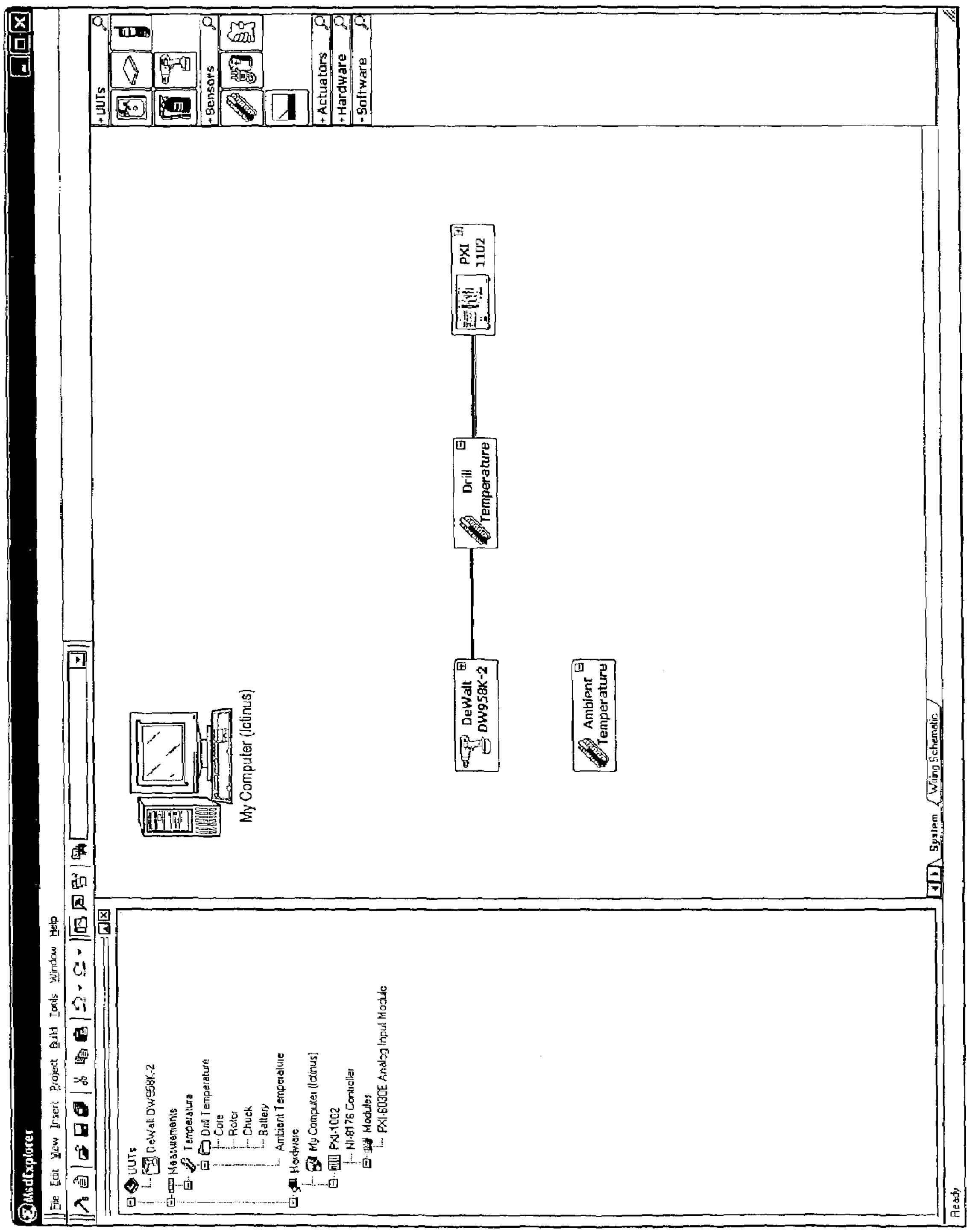

Referring now to FIG. 54, the user has returned to the system view of the measurement system and has added a new measurement, represented by the icon labeled "Ambient Temperature" and the "Ambient Temperature" item now displayed in the tree view. The user may now select a hardware device to make this measurement. However, unlike the example described above where the user utilized the Add Hardware wizard which guided the user in selecting the hardware devices, in this example the user may select the hardware by interacting directly with a "Hardware" palette.

Figure 55:
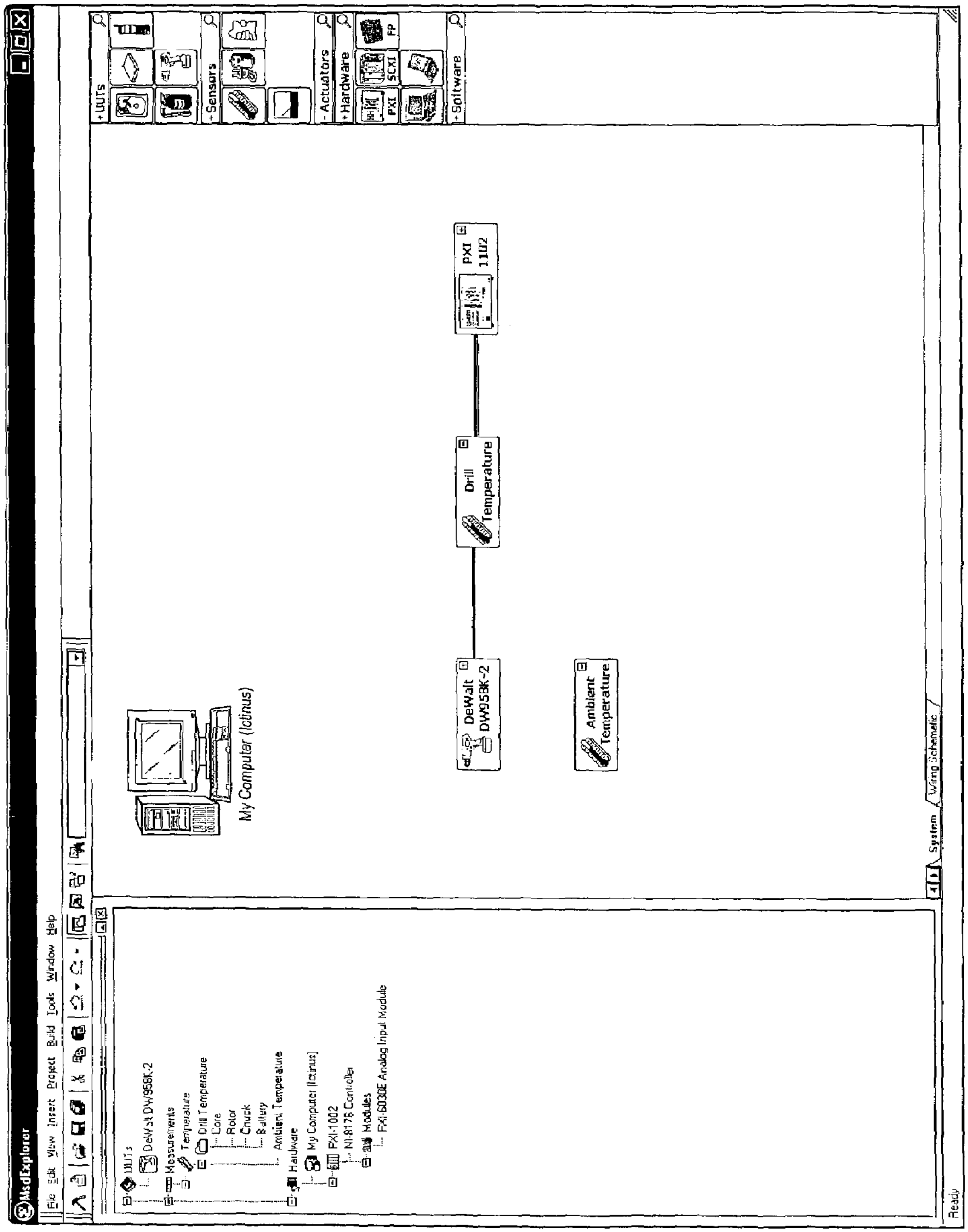
Figure 56:
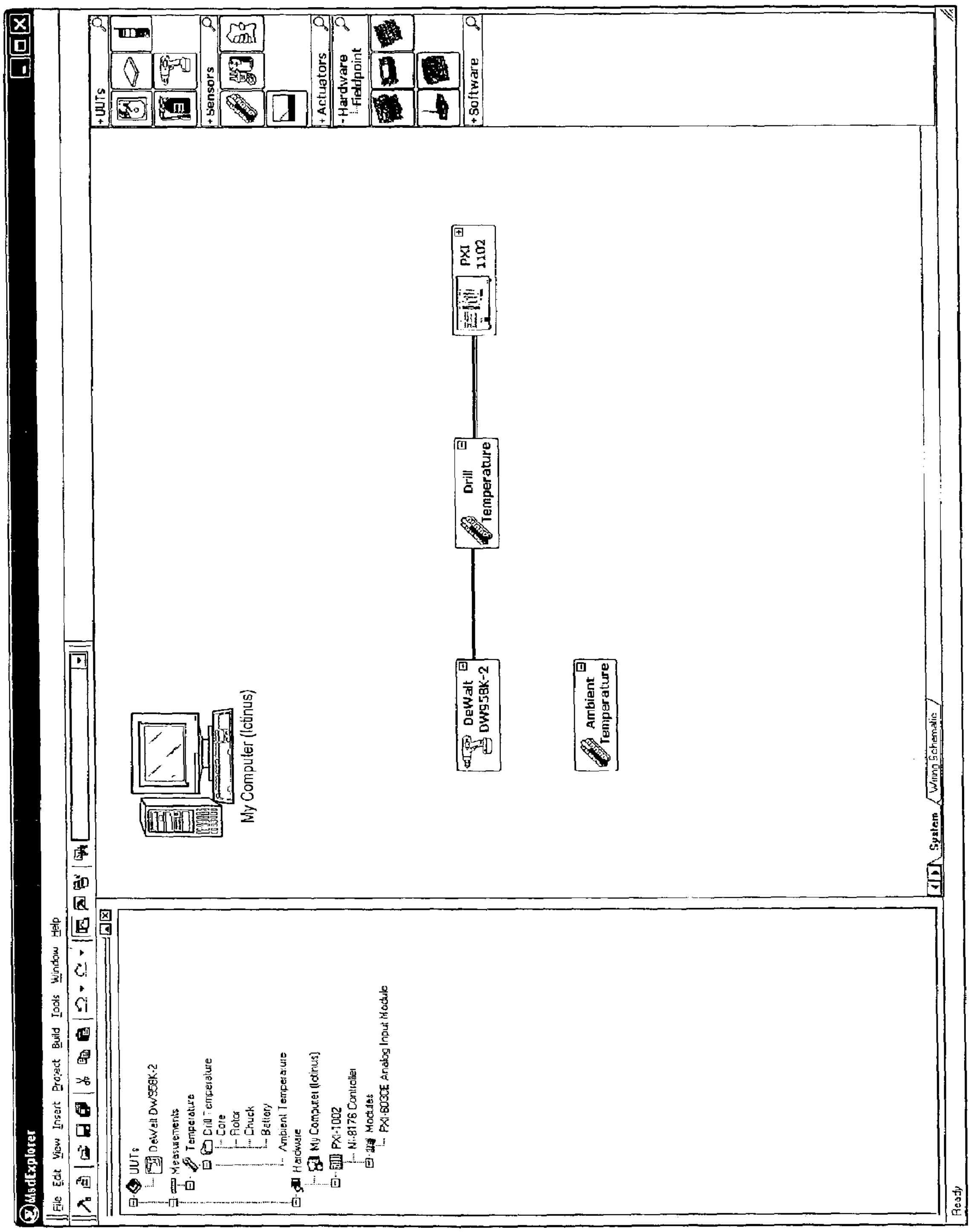

FIG. 55 illustrates the state of the MSD workspace after the user has expanded the "Hardware" palette, as shown on the right side of the workspace. In this example, the user desires to utilize Fieldpoint hardware to make the measurement, and thus clicks on the FieldPoint icon (labeled in FIG. 55 as "FP") to access the "Fieldpoint" sub-palette. As shown in FIG. 56, the Fieldpoint sub-palette may then replace the Hardware palette.

Figure 57:
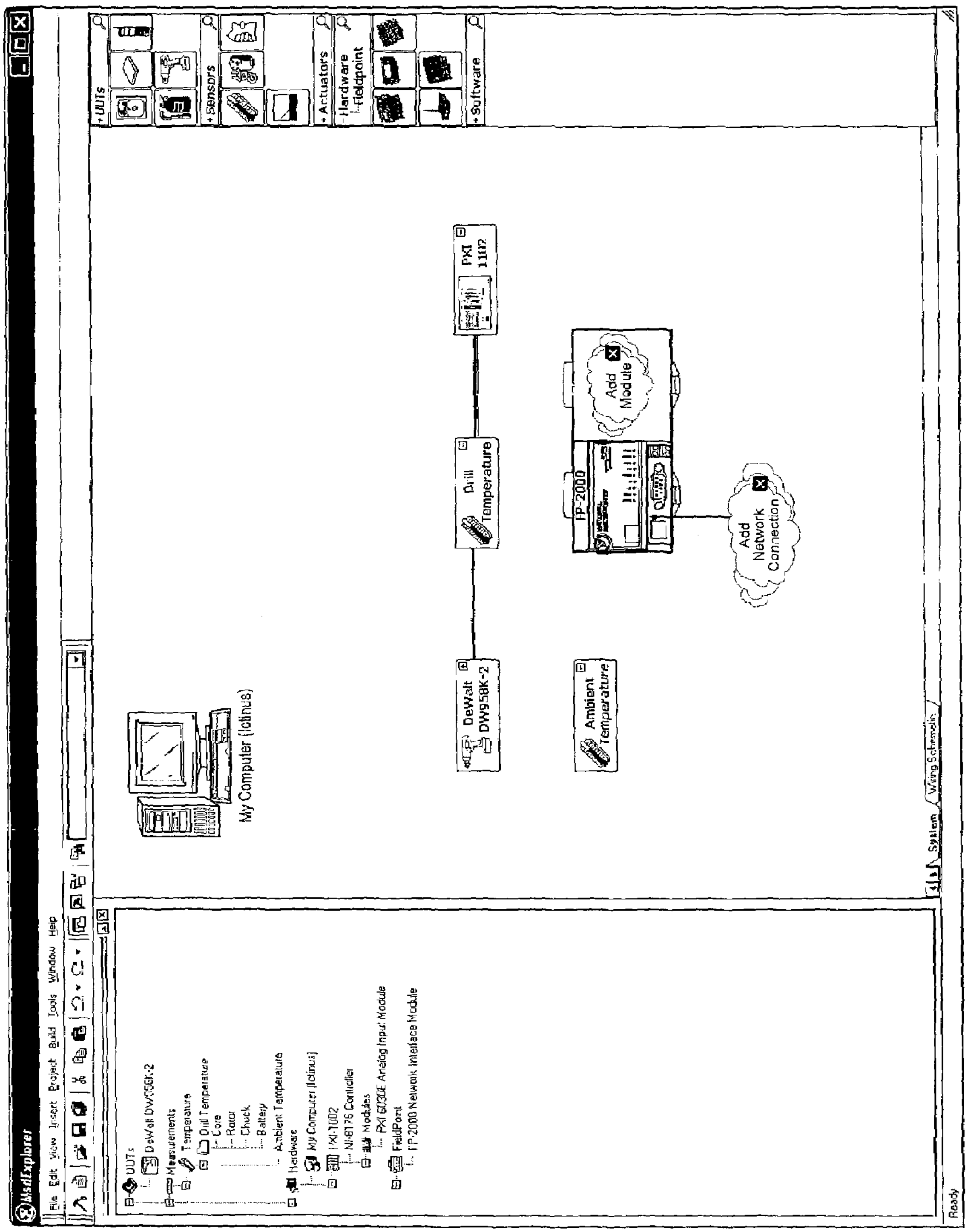

The first icon (the top, left icon) in the Fieldpoint sub-palette represents a Fieldpoint 2000 controller. After the user selects the Fieldpoint 2000 controller for inclusion in the measurement system by clicking on this icon, a new icon representing the Fieldpoint 2000 controller is displayed in the system diagram, as illustrated in FIG. 57. As shown, two new puffy clouds are also displayed in the diagram. The "Add Network Connection" puffy cloud indicates that the Fieldpoint controller module requires a network connection, which has not yet been specified. Similarly, the "Add Module" puffy cloud indicates that the Fieldpoint controller module also needs one or more I/O modules to be useful, which have also not yet been specified.

Since a Fieldpoint controller was selected, the I/O module(s) also need to be Fieldpoint hardware. In one embodiment, information may be displayed within the "Add Module" puffy cloud to indicate to the user that Fieldpoint hardware is required. For example, text or an icon may be displayed within the puffy cloud to indicate this. If the user decides to specify an I/O module for the user using a technique other than clicking on the puffy cloud, this information can help the user, e.g., by indicating which palette the user needs to access to select a valid device. If the user clicks on the "Add Module" puffy cloud, a guidance mechanism may be launched which only allows the user to select from Fieldpoint modules, as described below. In another embodiment, the user may be able to click on different areas within the puffy cloud to invoke different responses. For example, clicking on the puffy cloud in general may cause the guidance mechanism to launch, while clicking on a small icon of a palette displayed within the puffy cloud may display the Fieldpoint hardware palette directly.

Figure 58:
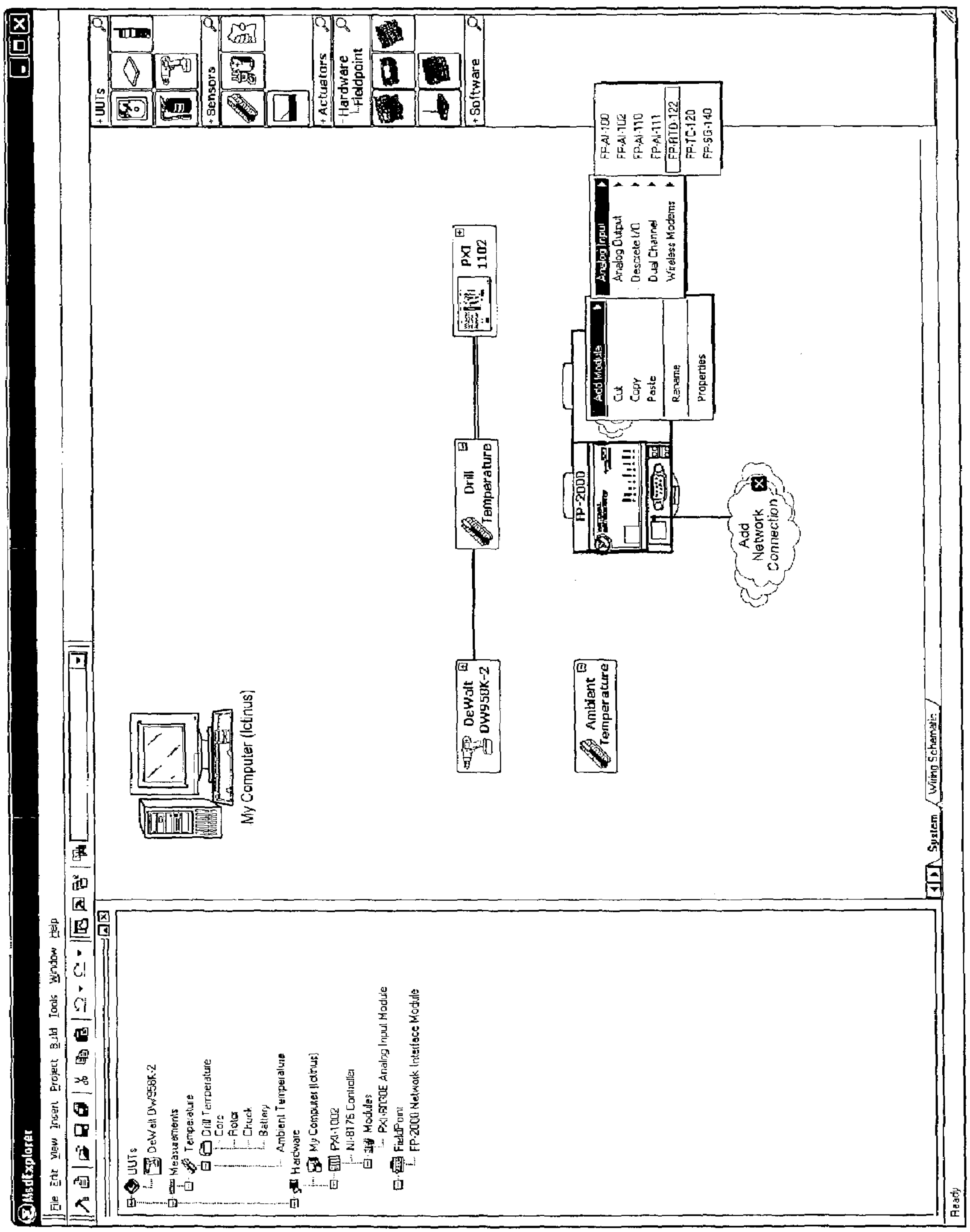
Figure 59:
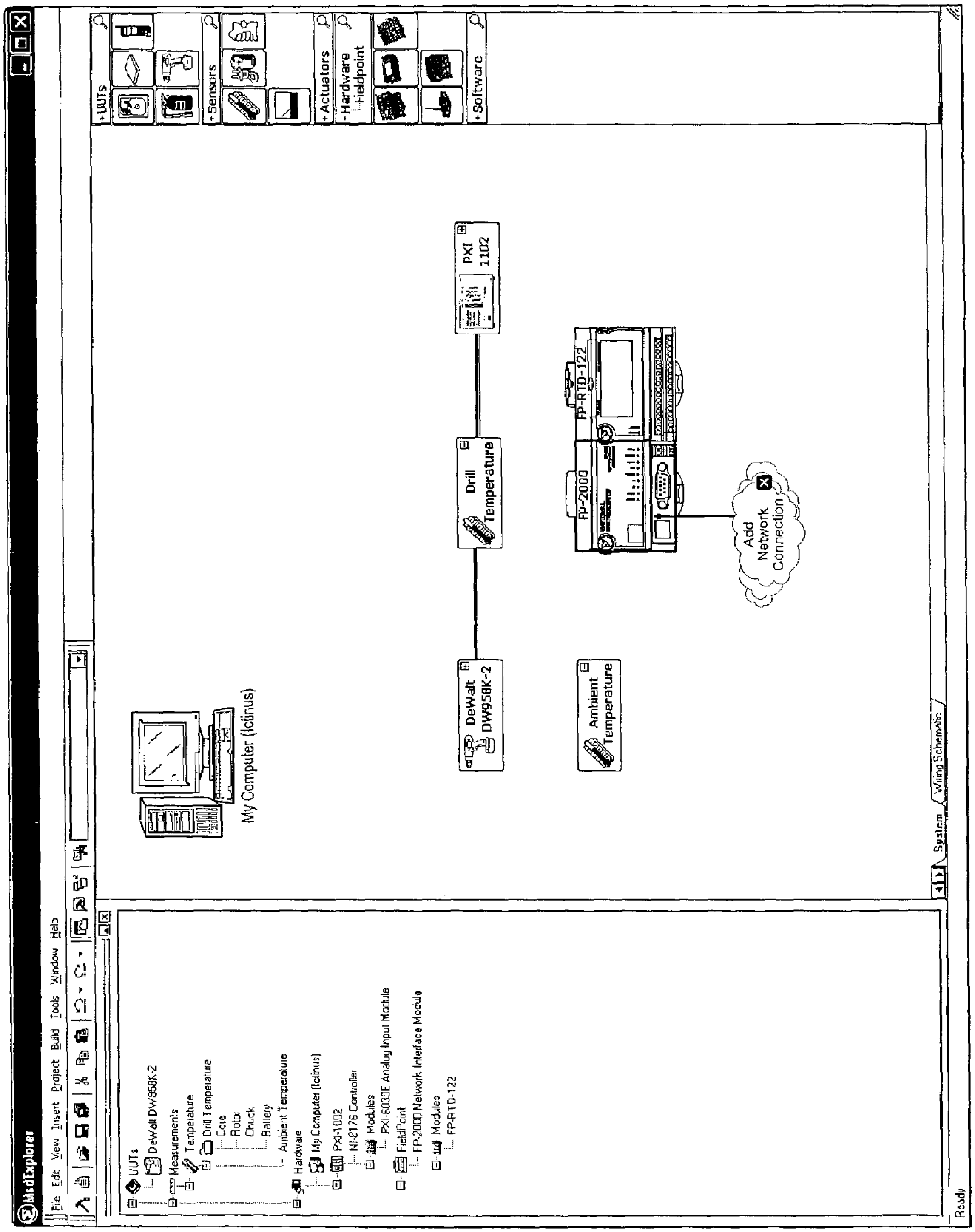

FIG. 58 illustrates a menu hierarchy which appears in response to the user clicking on the "Add Module" puffy cloud. As shown, the user may utilize these menus to view the available Fieldpoint modules and select a desired module to use. In this example the user selects the "FP-RTD-122" analog input module, resulting in the "Add Module" puffy cloud being replaced in the system diagram by a new icon representing the "FP-RTD-122" module, as shown in FIG. 59.

Figure 60:
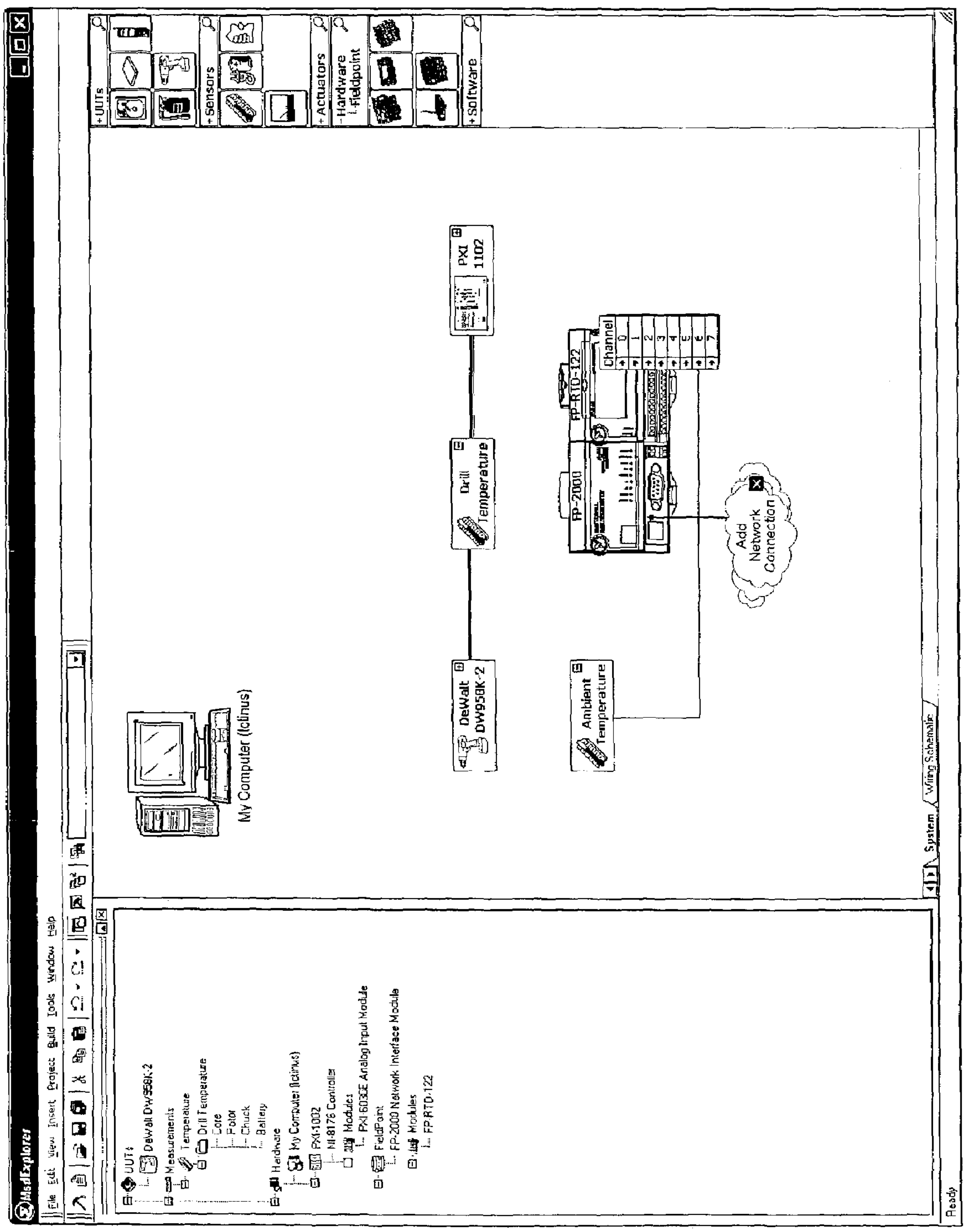

In the example above regarding the drill UUT temperature measurements, the PXI hardware icon was expanded to list analog input lines available for wiring to make the measurements. In another embodiment, the MSD environment may enable the user to perform wiring without expanding a hardware icon. For example, the user may select a wiring tool which causes popup information to be displayed when the cursor is hovered over a hardware icon. For example, as shown in FIG. 60, when the cursor hovers over the "FP-RTD-122" analog input module, the connectable items available on the module may be displayed. The user may then select the desired item (channel) for connection to the Ambient Temperature sensor.

Figure 61:
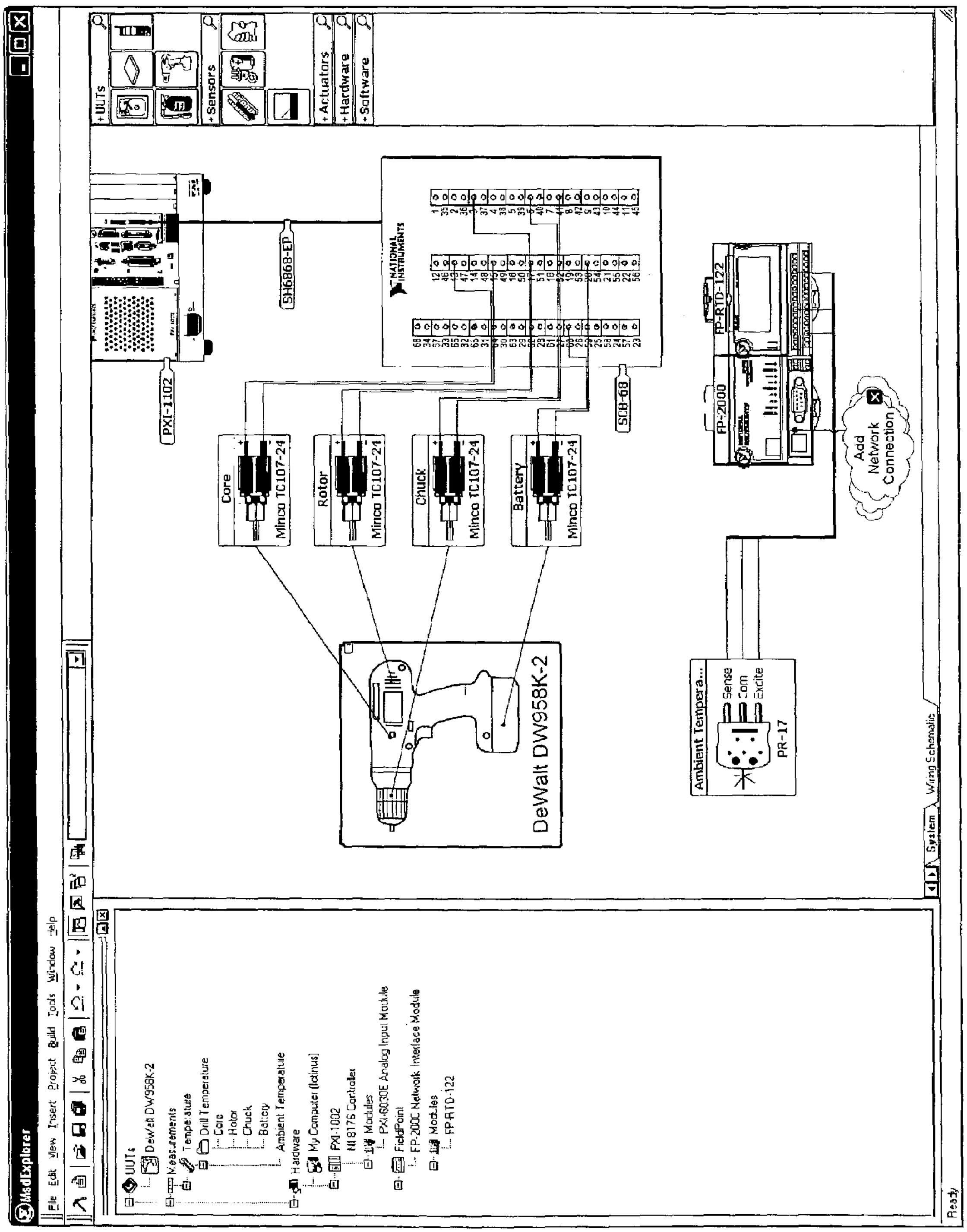

FIG. 61 illustrates a Wiring Schematic view of the measurement system displayed in response to the user selecting the "Wiring Schematic" tab. This view illustrates three physical wires connected to the "FP-RTD-122" module to make the "Ambient Temperature" measurement.

Figure 62:
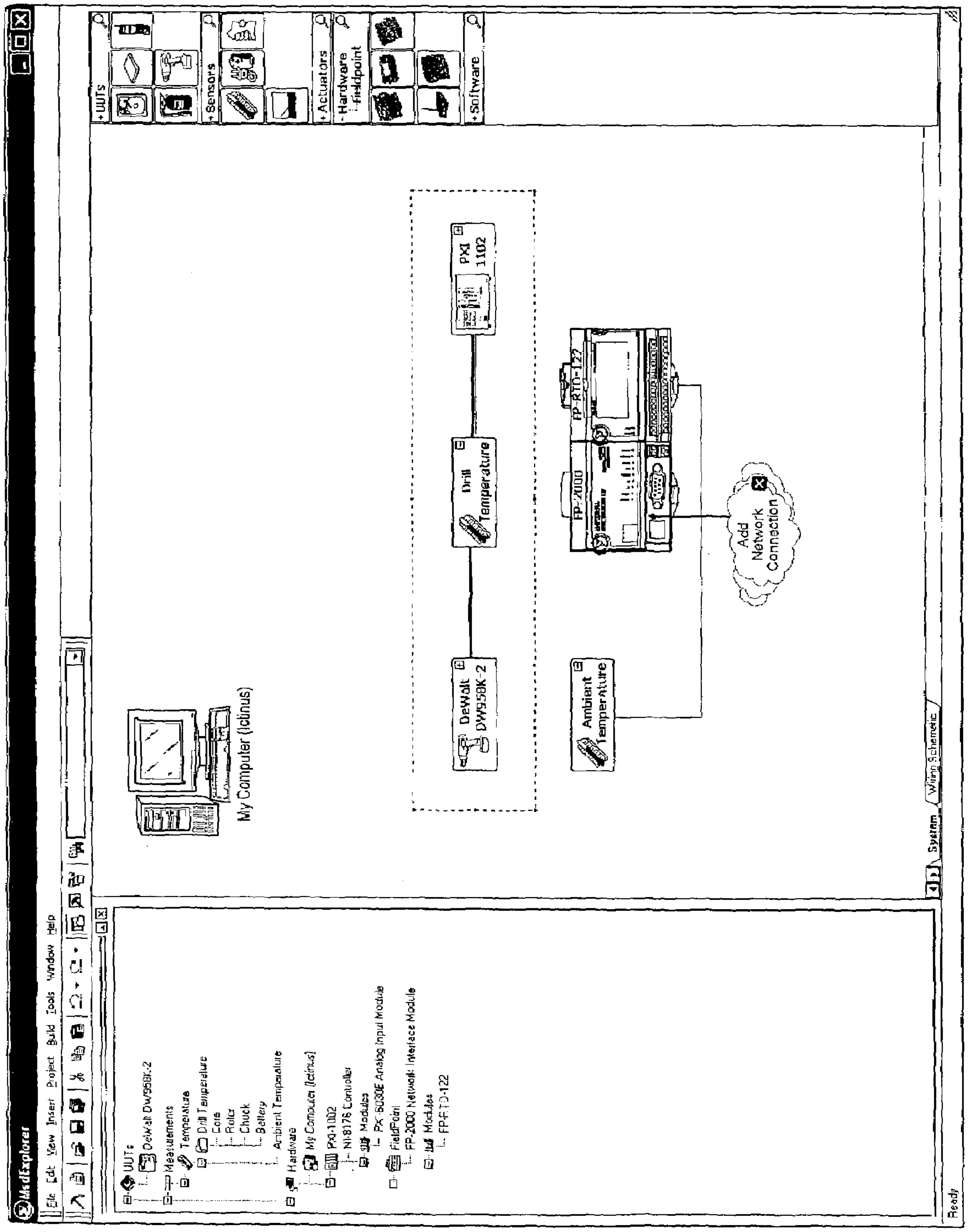
Figure 63:
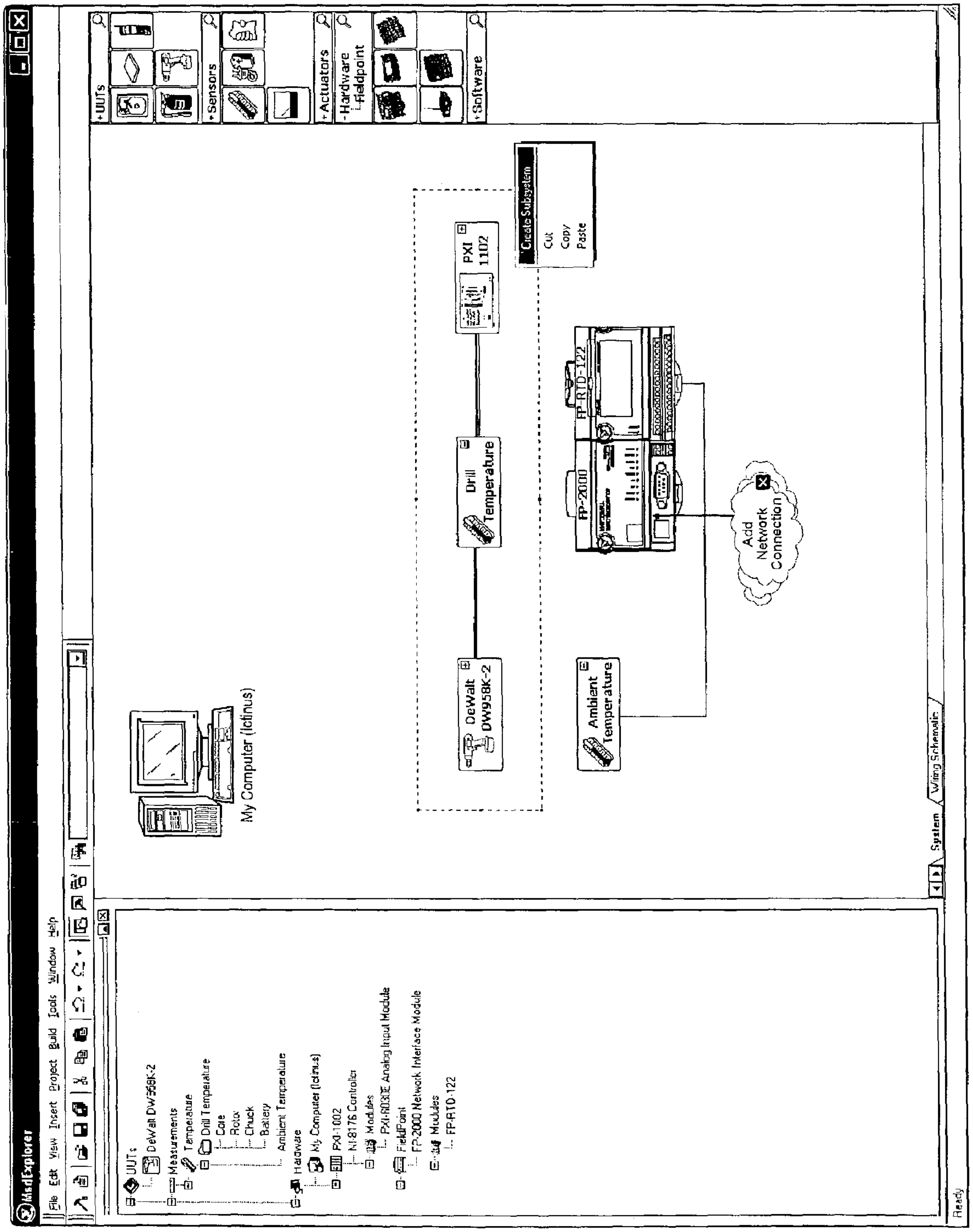

Referring again to the system view, the user may desire the measurement system to be represented even more compactly than is accomplished when all the icons are completely collapsed. The user may thus select a desired portion of the measurement system to be represented as a subsystem. As indicated by the dashed line rectangle in FIG. 62, the user has drawn a region selecting the three icons associated with performing the temperature measurements from the drill UUT. To designate these three components as a subsystem, the user may then invoke a popup menu having a "Create Subsystem" menu option as shown in FIG. 63 and select this menu option, possibly also specifying a name for the subsystem, such as "Drill Test System". In response, the selected components are enclosed by a container icon on the diagram as shown in FIG. 64, indicating that the components are components within a single Drill Test subsystem.

Figure 65:
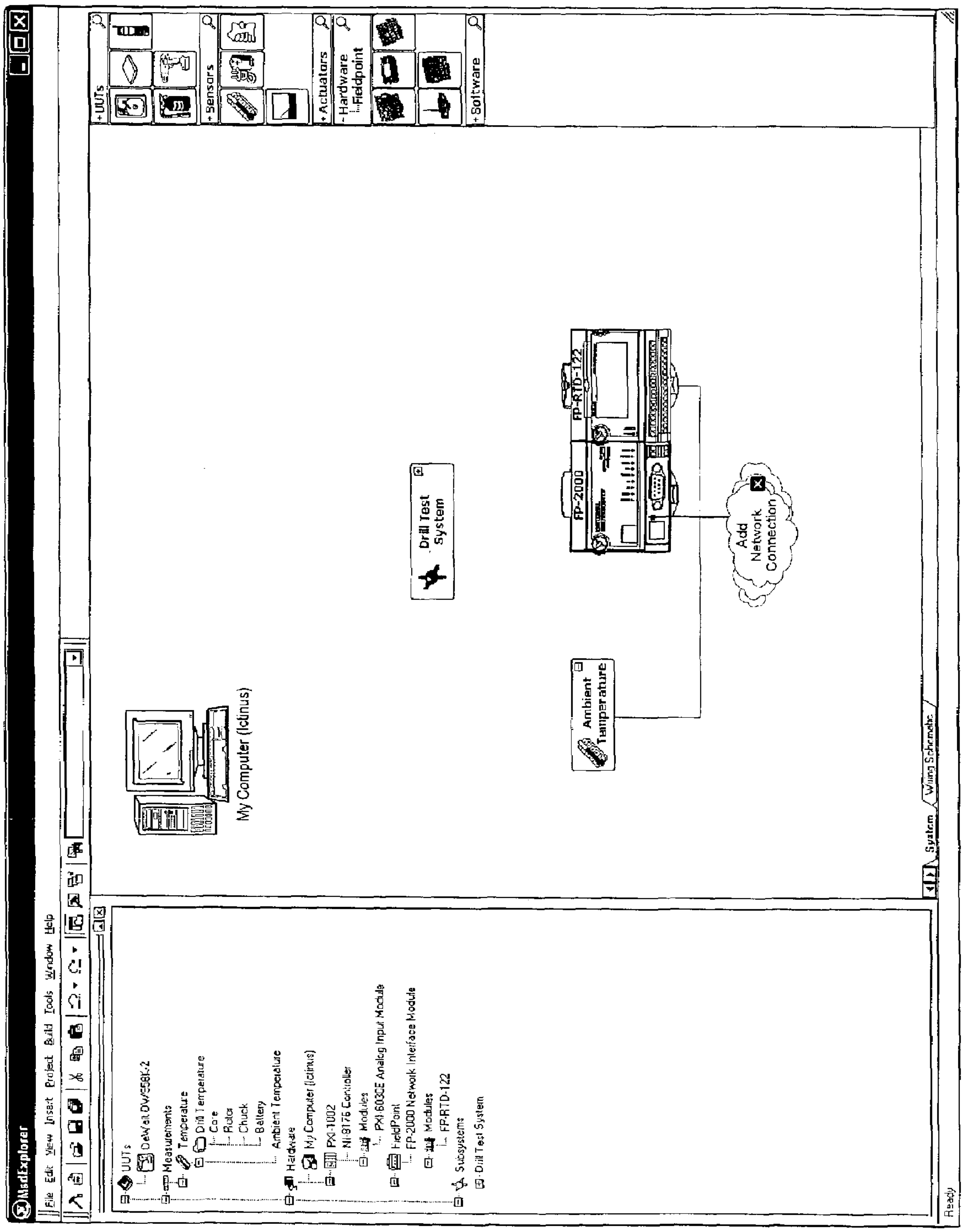
Figure 66:
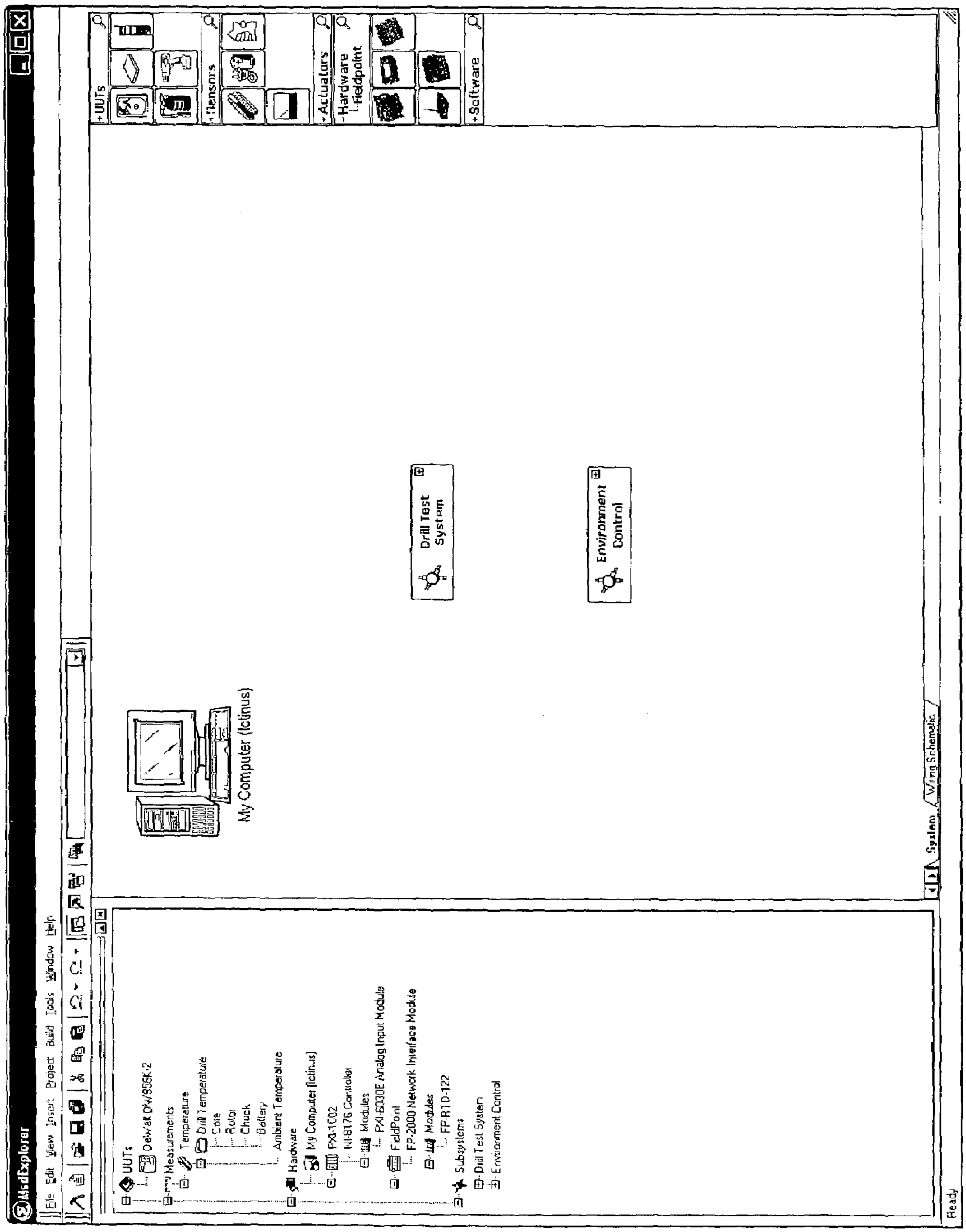

To achieve the desired compaction in the diagram, the user may then collapse the entire Drill Test subsystem into a single icon, as shown in FIG. 65. The user may similarly designate the Fieldpoint system which measures the ambient temperature as an "Environment Control" subsystem and collapse this subsystem into a single icon as well, as shown in FIG. 66.

Figure 64:
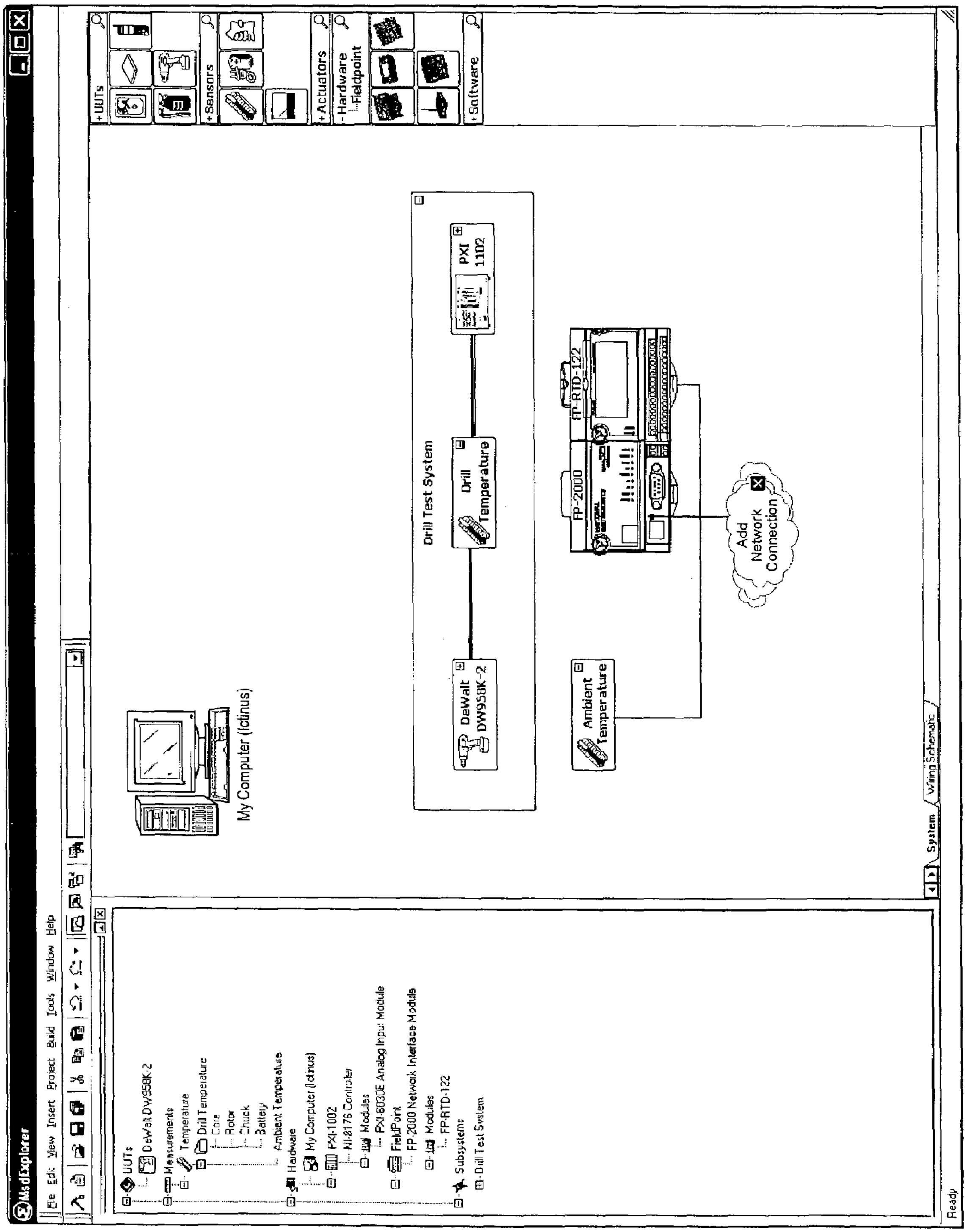

As indicated in FIGS. 64 and 65, the tree view has also been updated to indicate that the measurement system now includes a Drill Test subsystem. The user may expand this item in the tree view to see which components, e.g., which measurements and hardware devices, are included within this subsystem. In FIG. 66, the tree view has been further updated to indicate the Environment Control subsystem.

Figure 67:
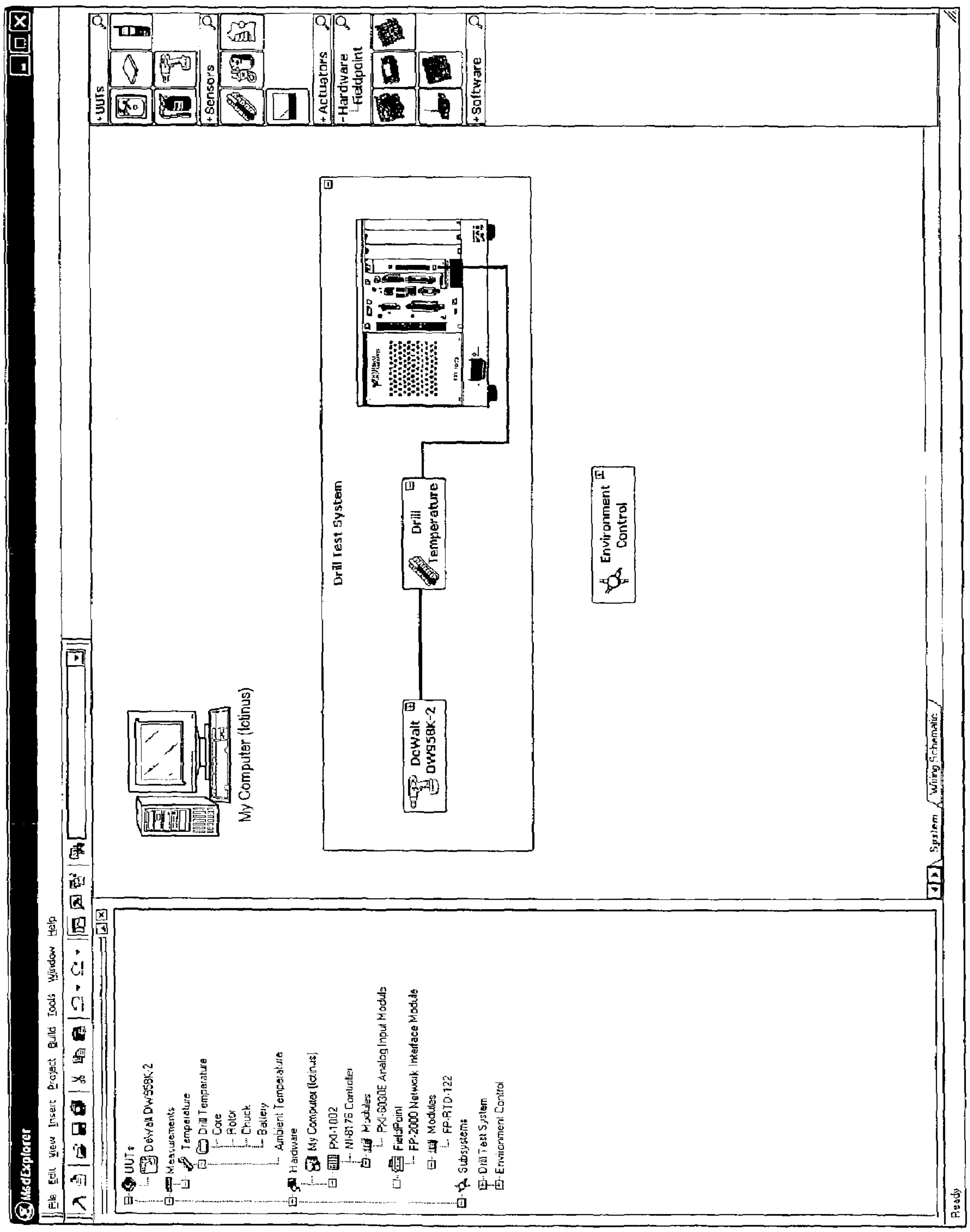
Figure 68:
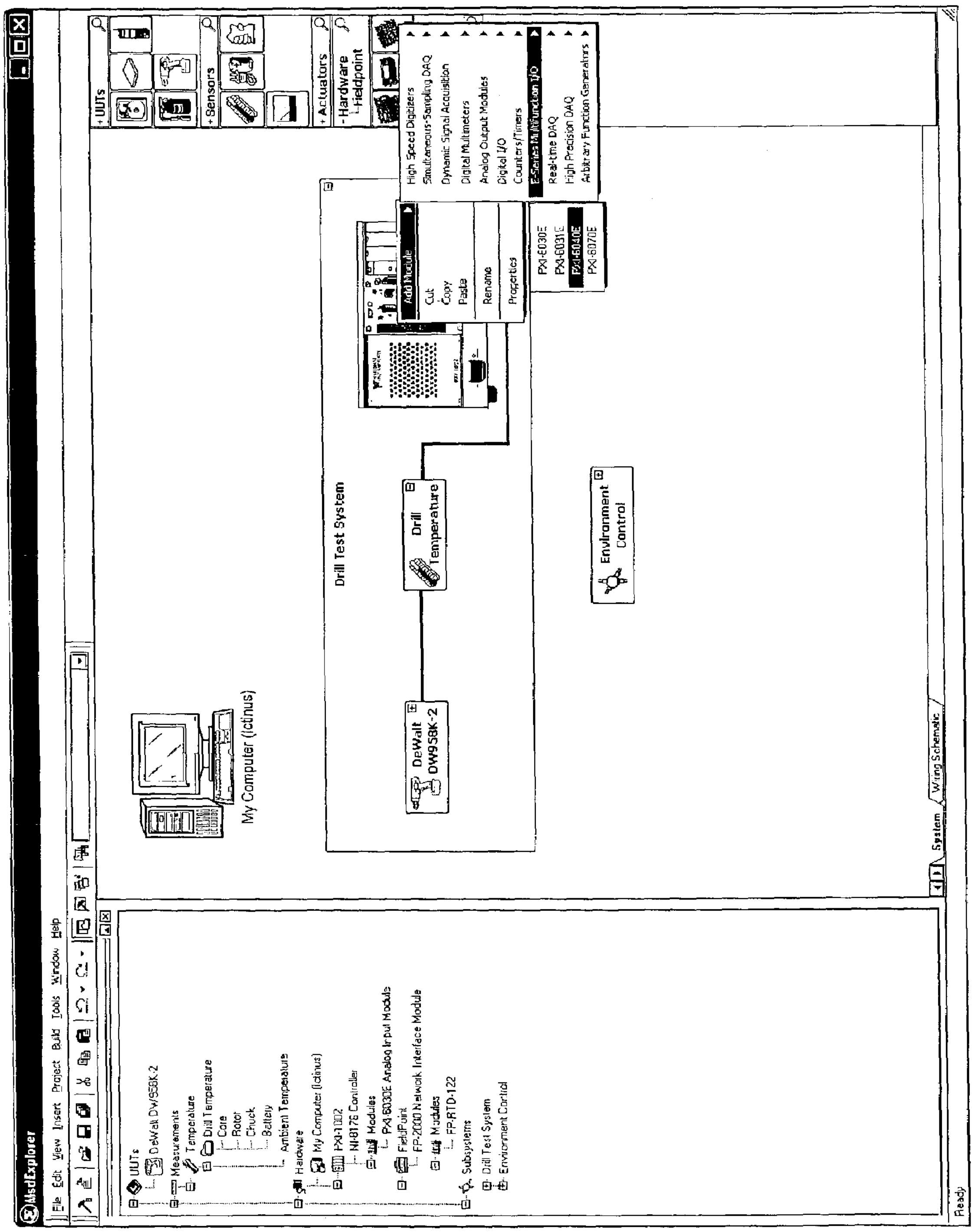
Figure 69:
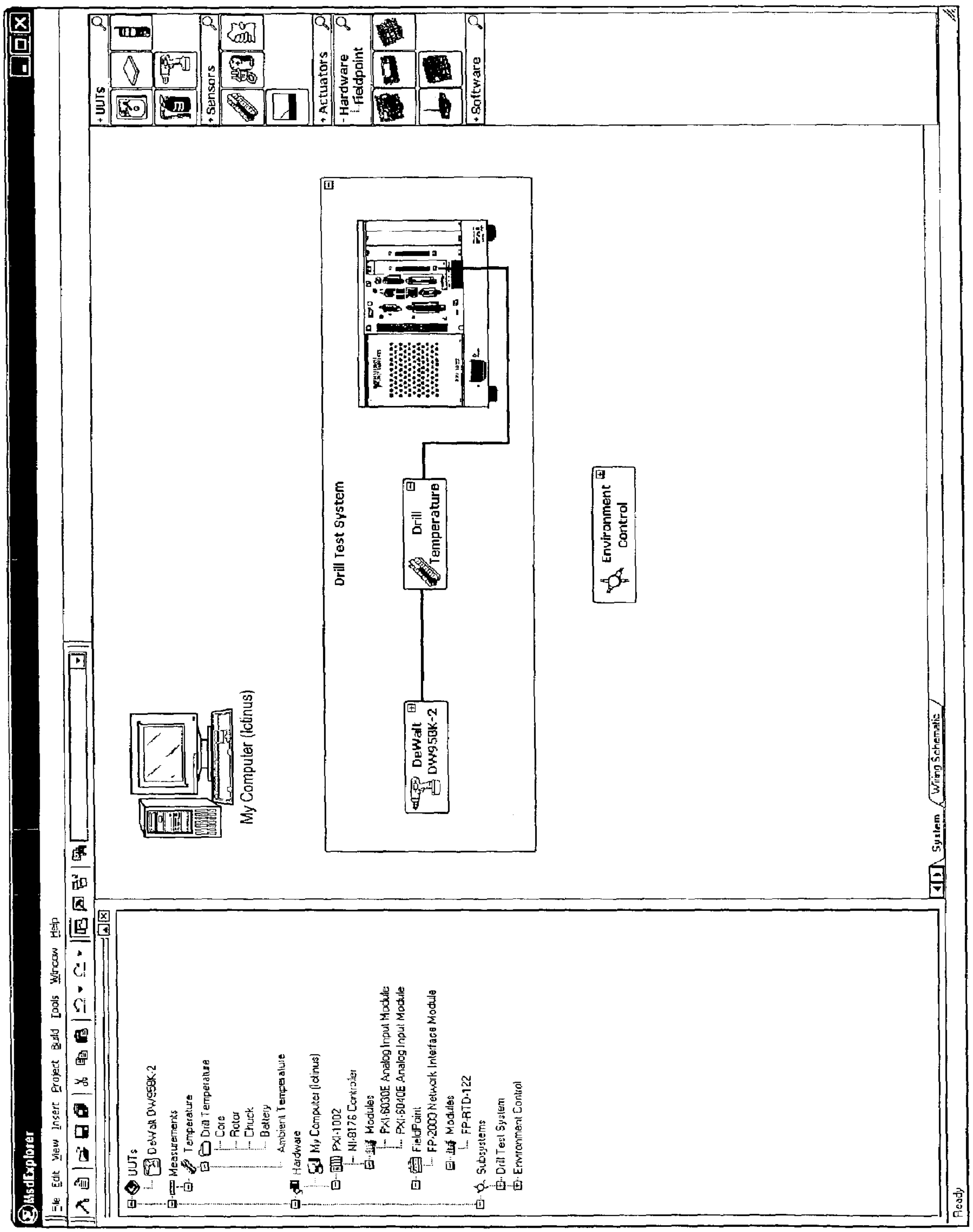

FIG. 67 illustrates the system diagram after the user has re-expanded the Drill Test subsystem and expanded the PXI chassis within the Drill Test subsystem. The user may also add new modules to the PXI chassis using popup context menus, as shown in FIG. 68. In this example, the user selects an "E-Series Multifunction I/O" module. FIG. 69 illustrates that the PXI chassis icon has been updated after the user's selection to show the second module just added.

Figure 70:
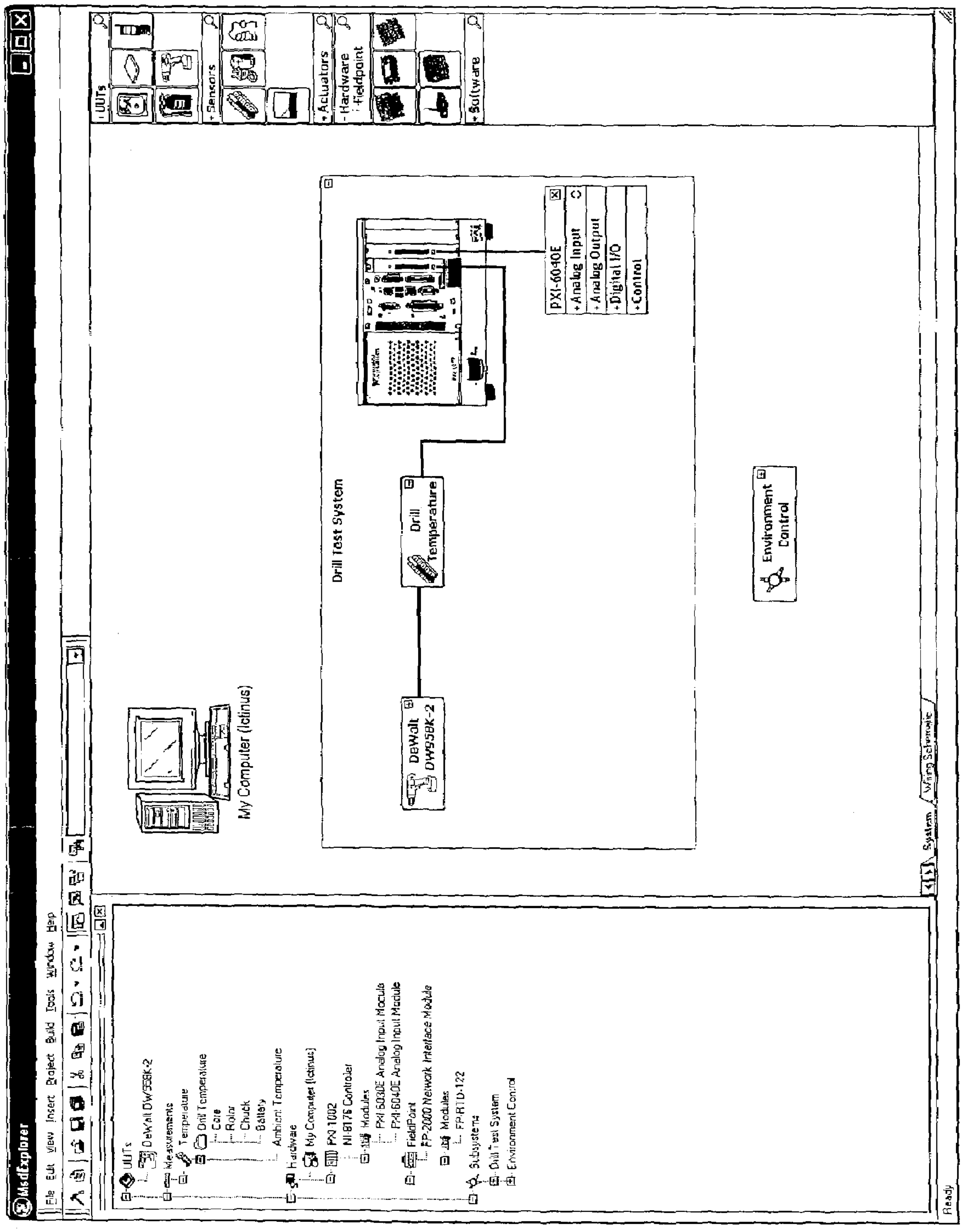
Figure 71:
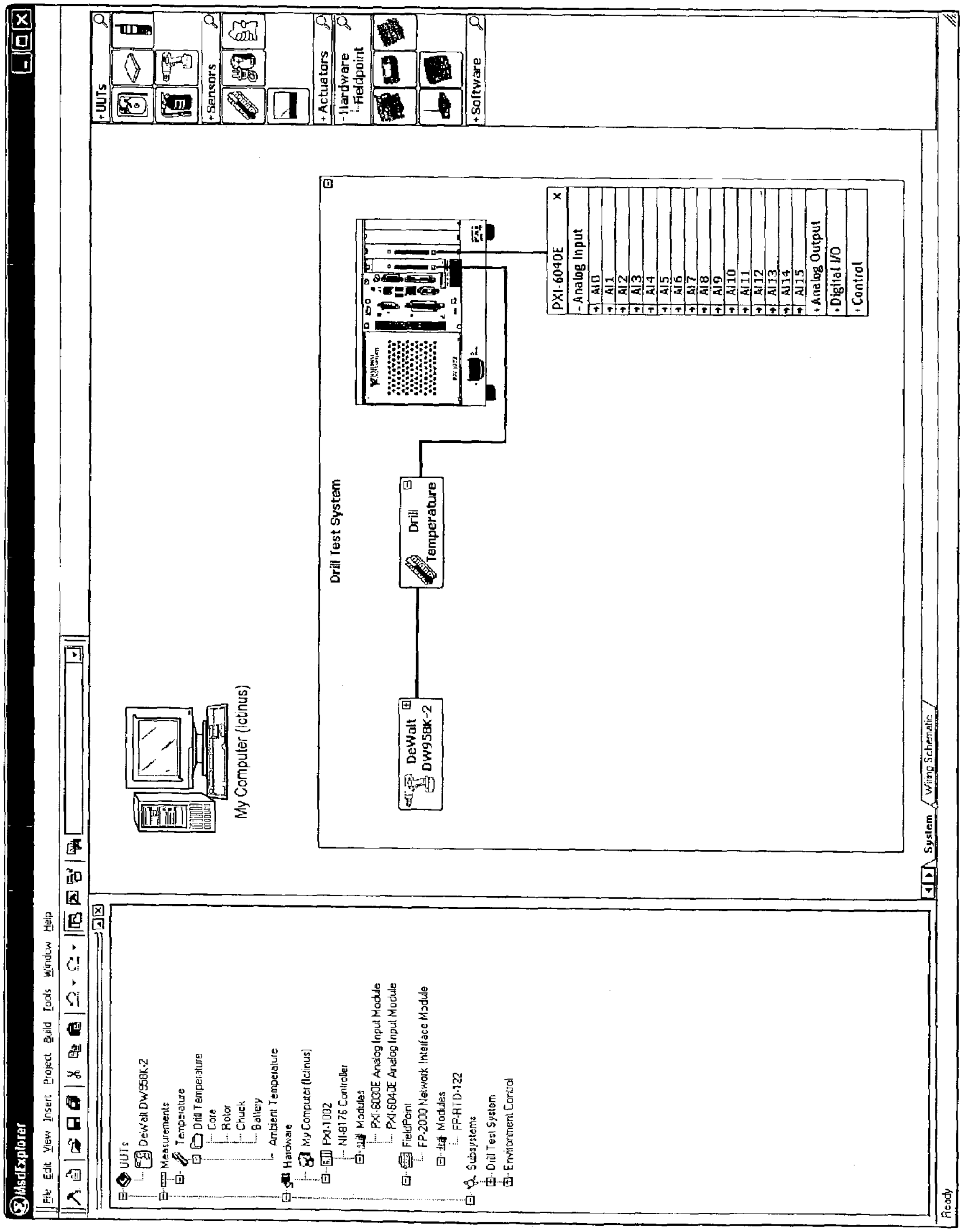
Figure 72:
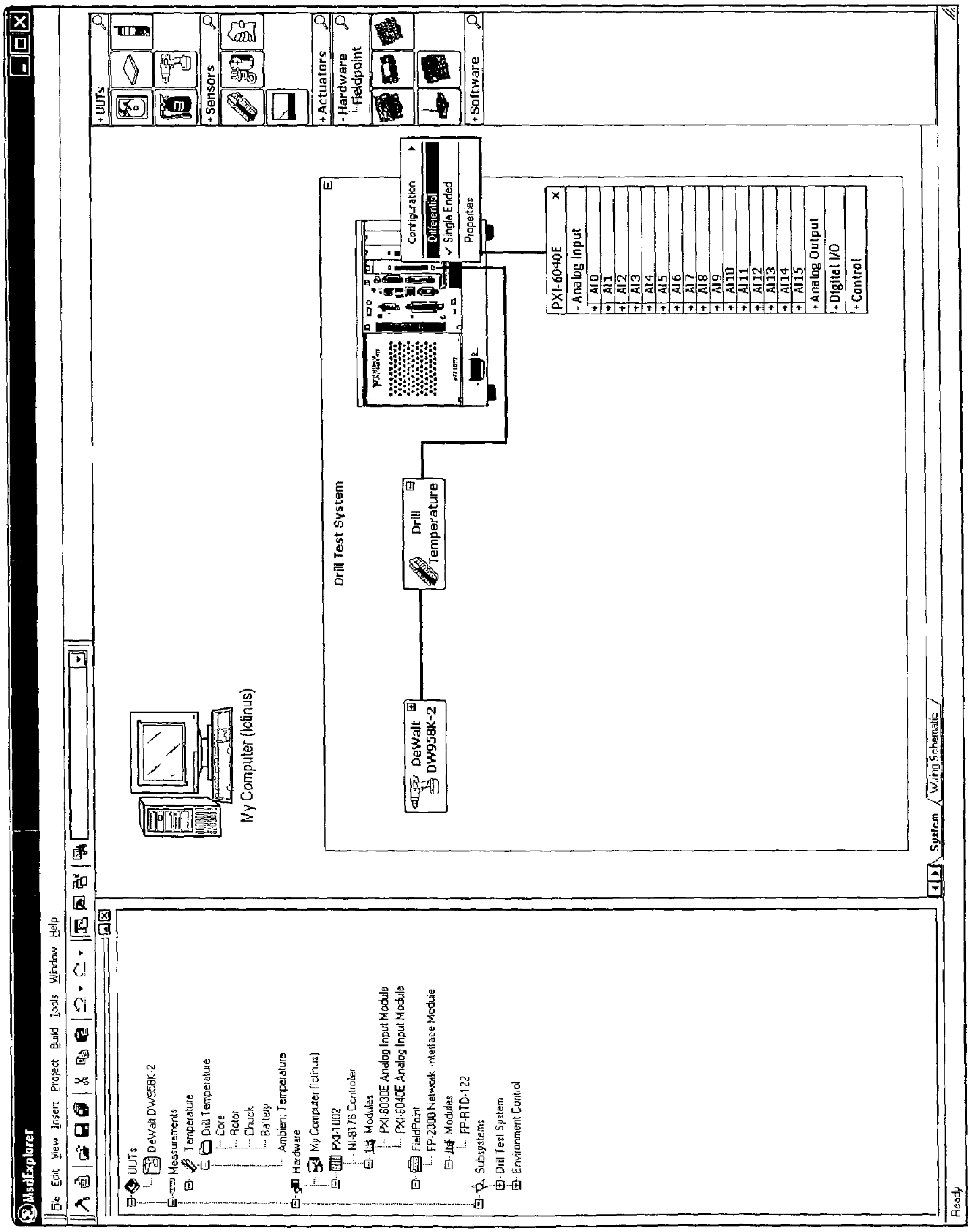
Figure 73:
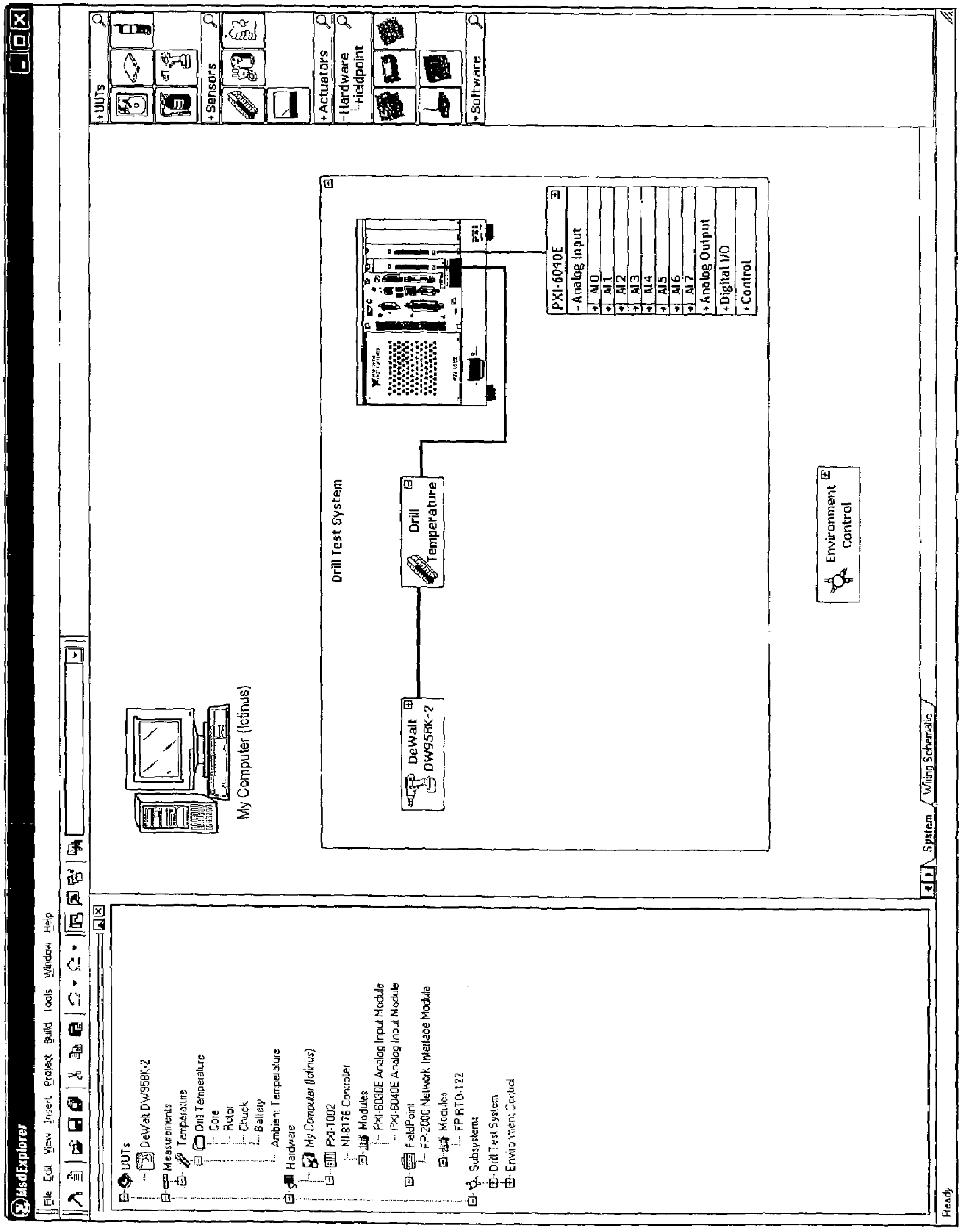

The user may then expand the new module, e.g., by clicking on the module. As shown in FIG. 70, a hardware dongle icon representing functionality of the hardware module may then appear. Similarly as described above, the hardware dongle includes various fields which the user may expand or collapse as desired to view various aspects of the module's functionality. FIG. 71 illustrates the hardware dongle after the user has expanded the "Analog Input" field, thereby displaying 16 channels. In this case, the default mode of the module may be single-ended, making 16 channels available. The MSD environment may also enable the user to switch the module's mode to differential, e.g., using a popup context menu as shown in FIG. 72. As a result, the hardware dongle may be updated to illustrate that the number of channels has been reduced to 8, since in differential mode two wires are required for each measurement.

Figure 74:
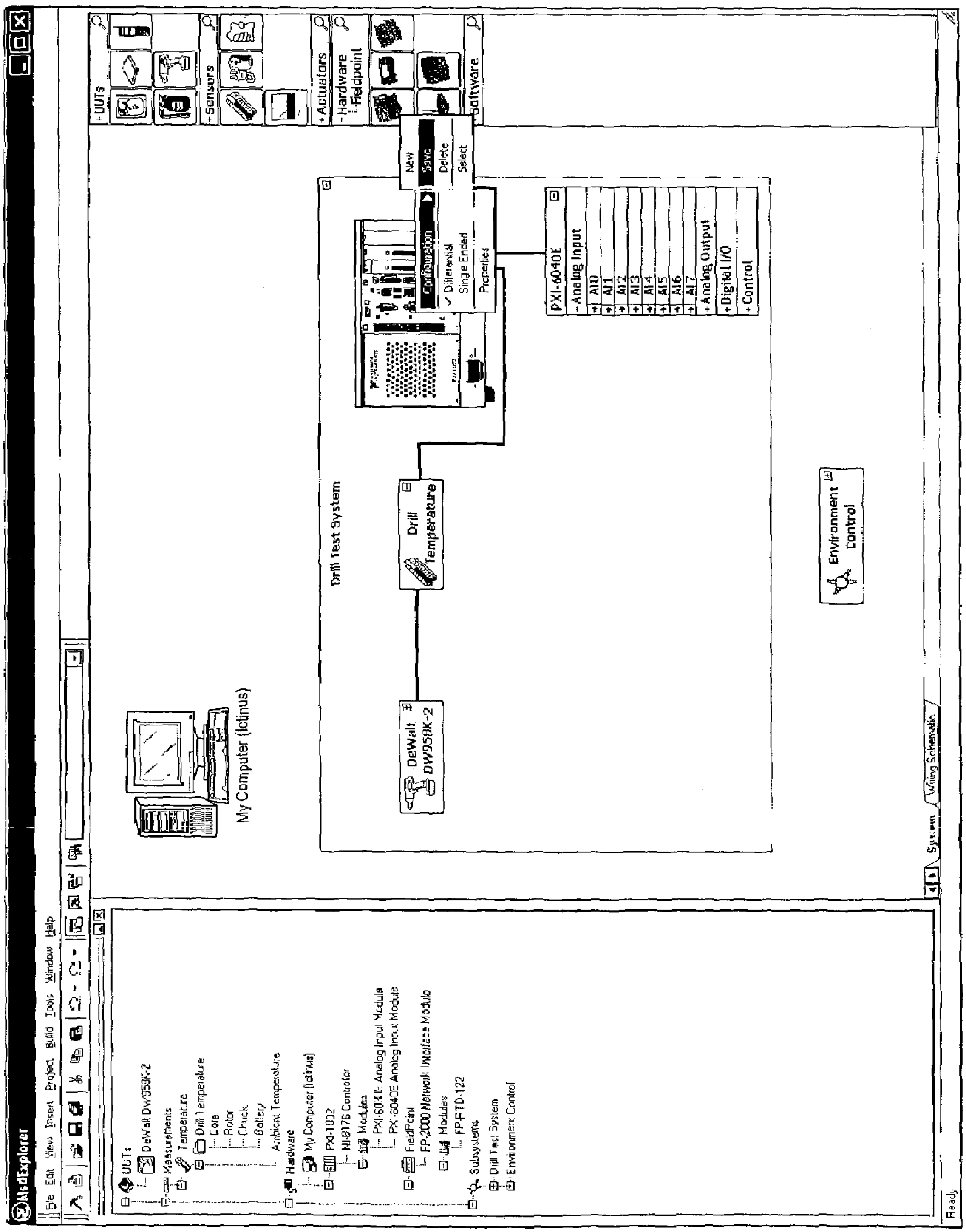
Figure 75:
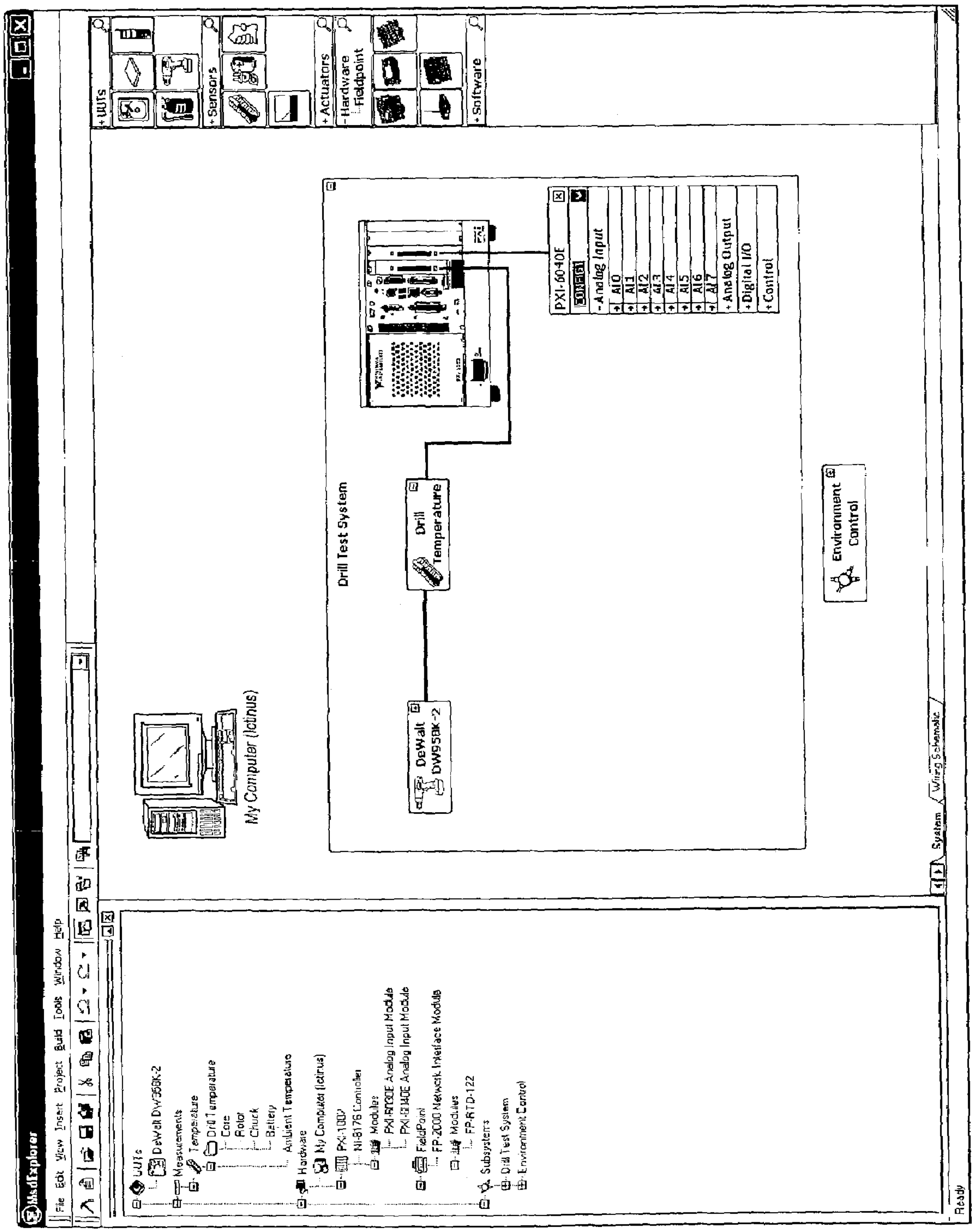
Figure 76:
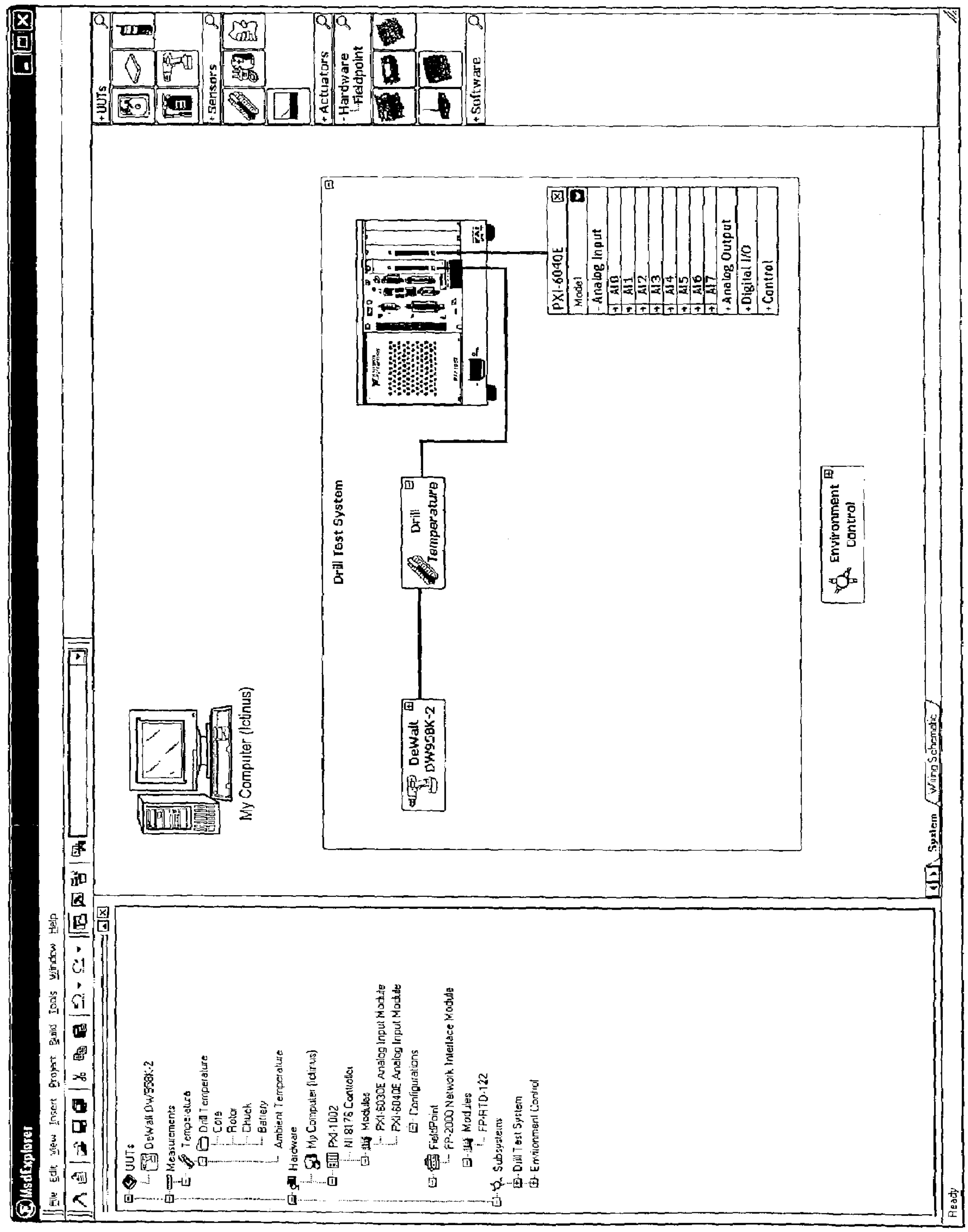

The MSD environment may also allow the user to save the current configuration of the module, e.g., using a popup context menu as shown in FIG. 74. A new field enabling the user to specify a name for the configuration may then appear in the hardware dongle for the module, as illustrated in FIG. 75, where the default name of "CONFIG1" is shown. FIG. 76 illustrates the hardware dongle after the user has typed over the default name with a new name, "Mode1".

Figure 77:
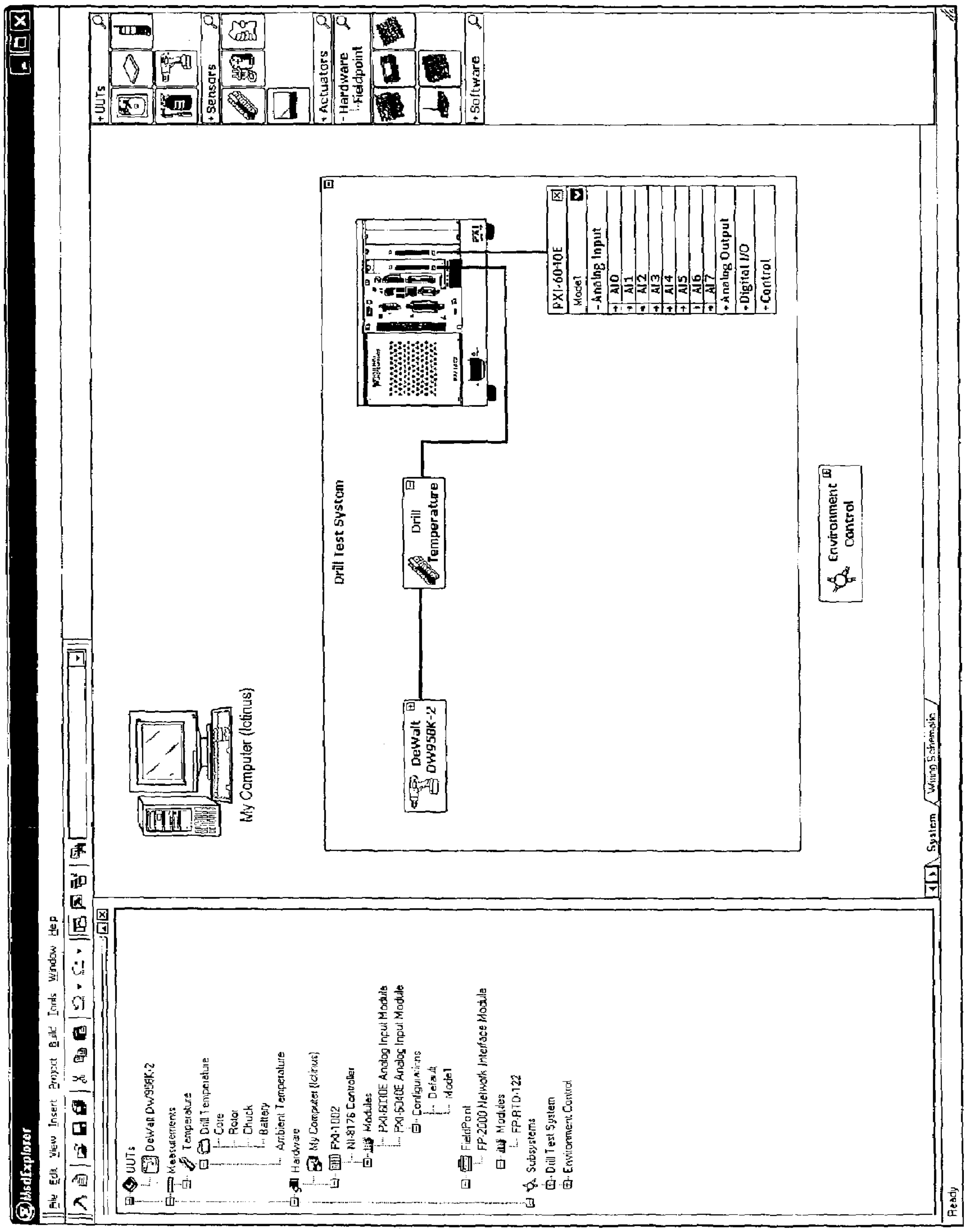
Figure 78:
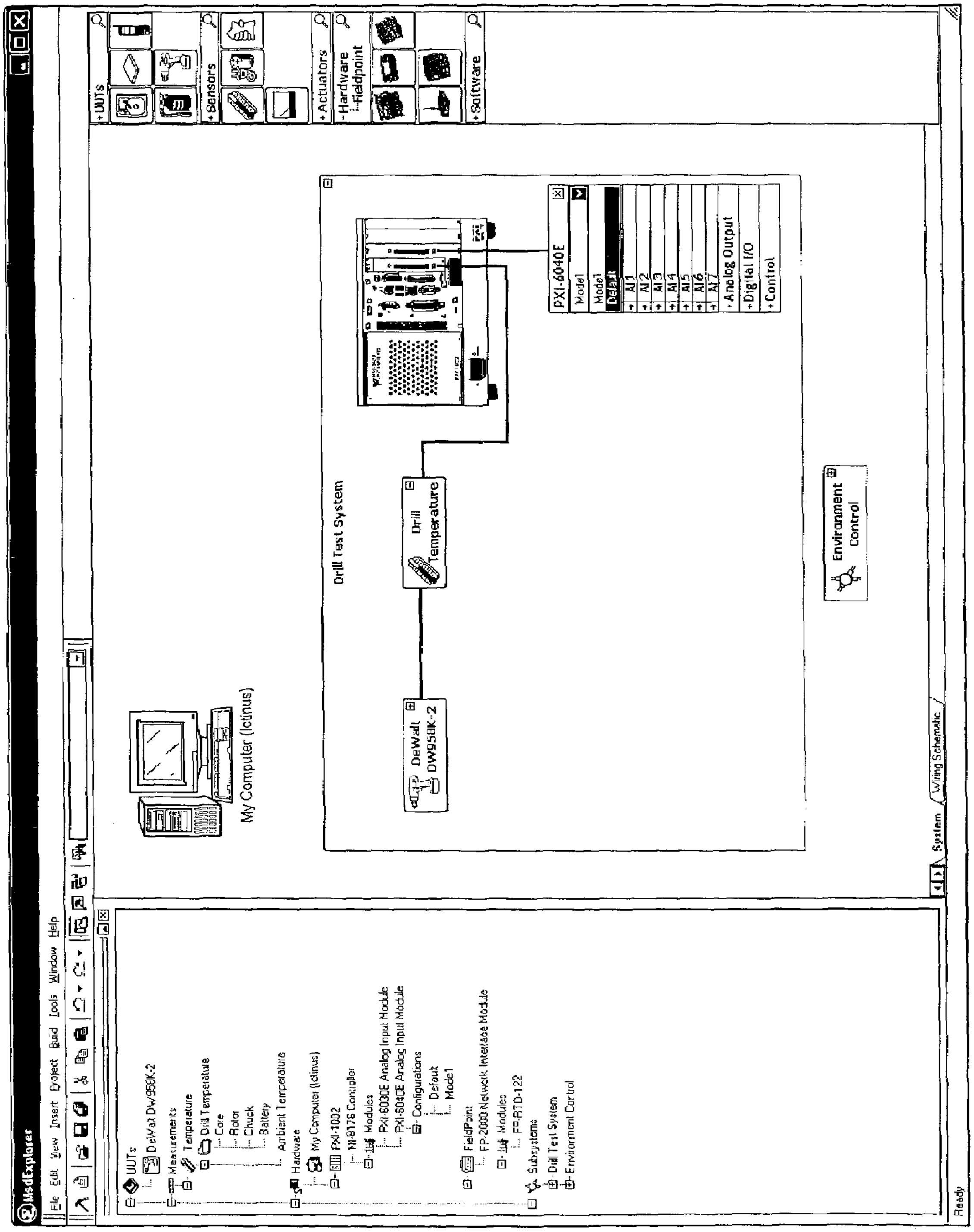
Figure 79:
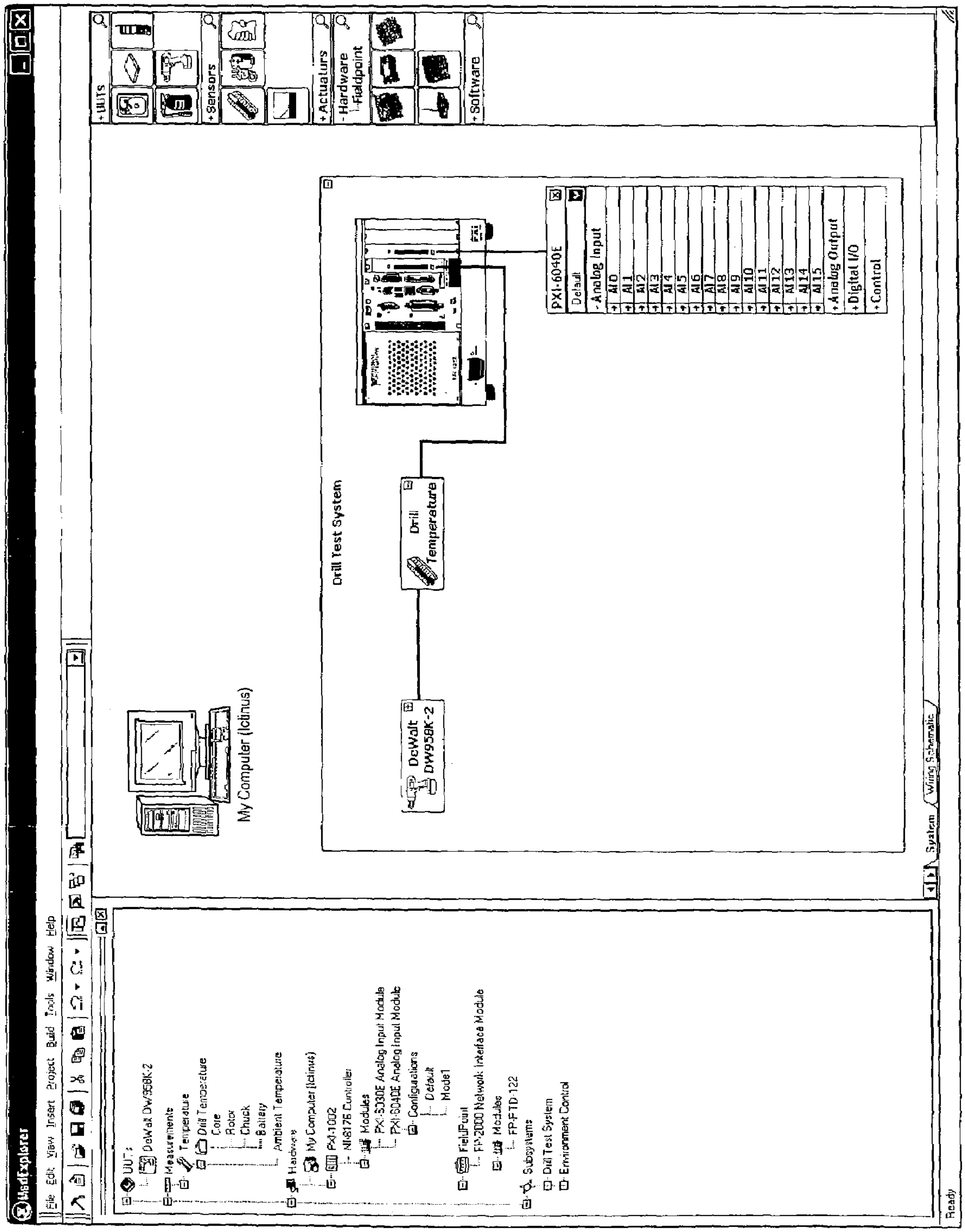

The tree view on the left side of the MSD environment workspace in FIG. 76 also illustrates that a new "Configurations" element has been added under the respective PXI module. The user may click this "Configurations" element to expand it as shown in FIG. 77, thus displaying a default configuration and the "Mode1" configuration which the user saved. As shown in FIG. 78, the user may utilize the drop-down arrow on the hardware dongle for the PXI module to switch the configuration for the module. In this case, the user switches from the "Mode1" configuration to the default configuration, thus returning the mode of the module to single-ended. As a result, the number of channels displayed returns to 16, as shown in FIG. 79.

Figure 80:
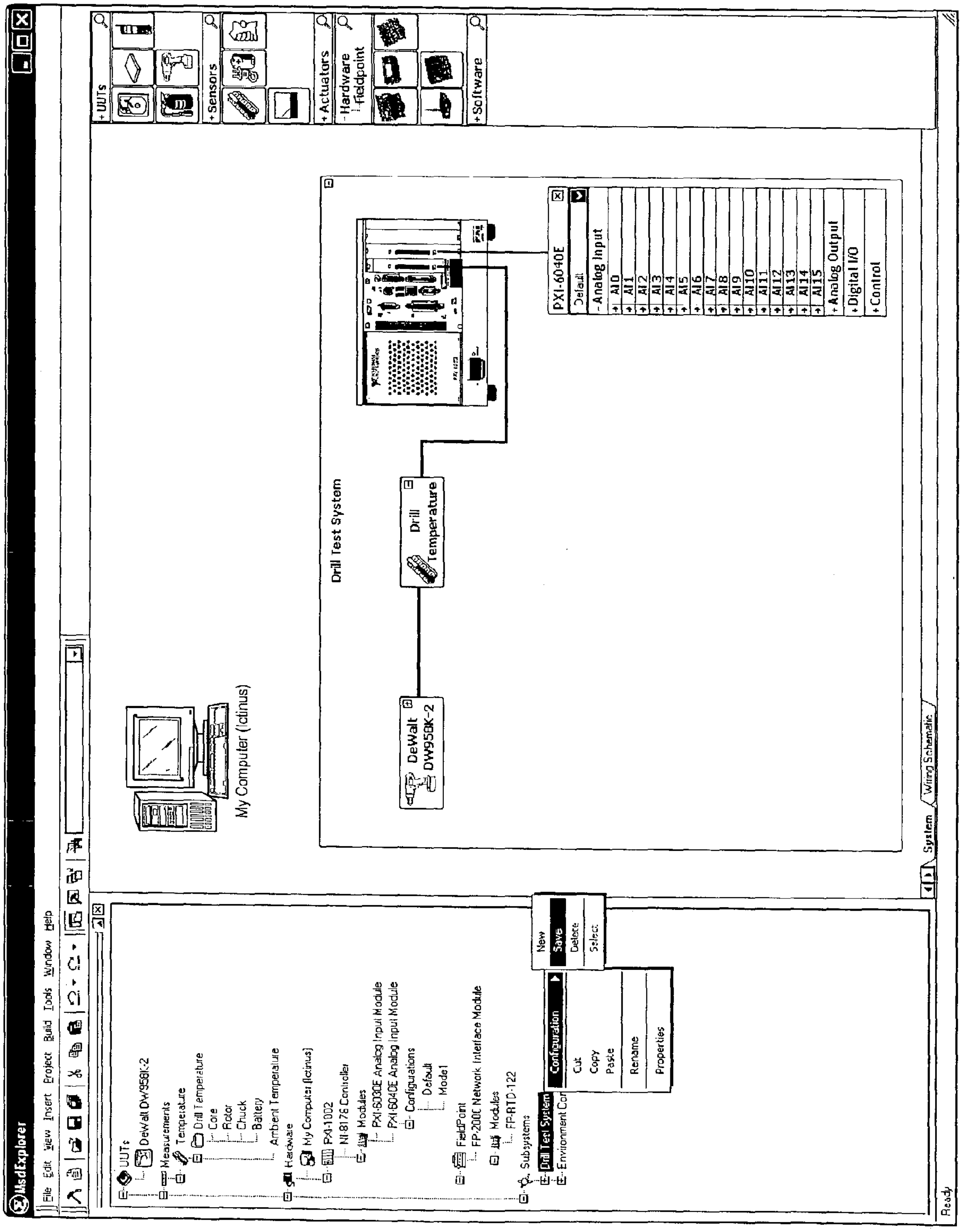
Figure 81:
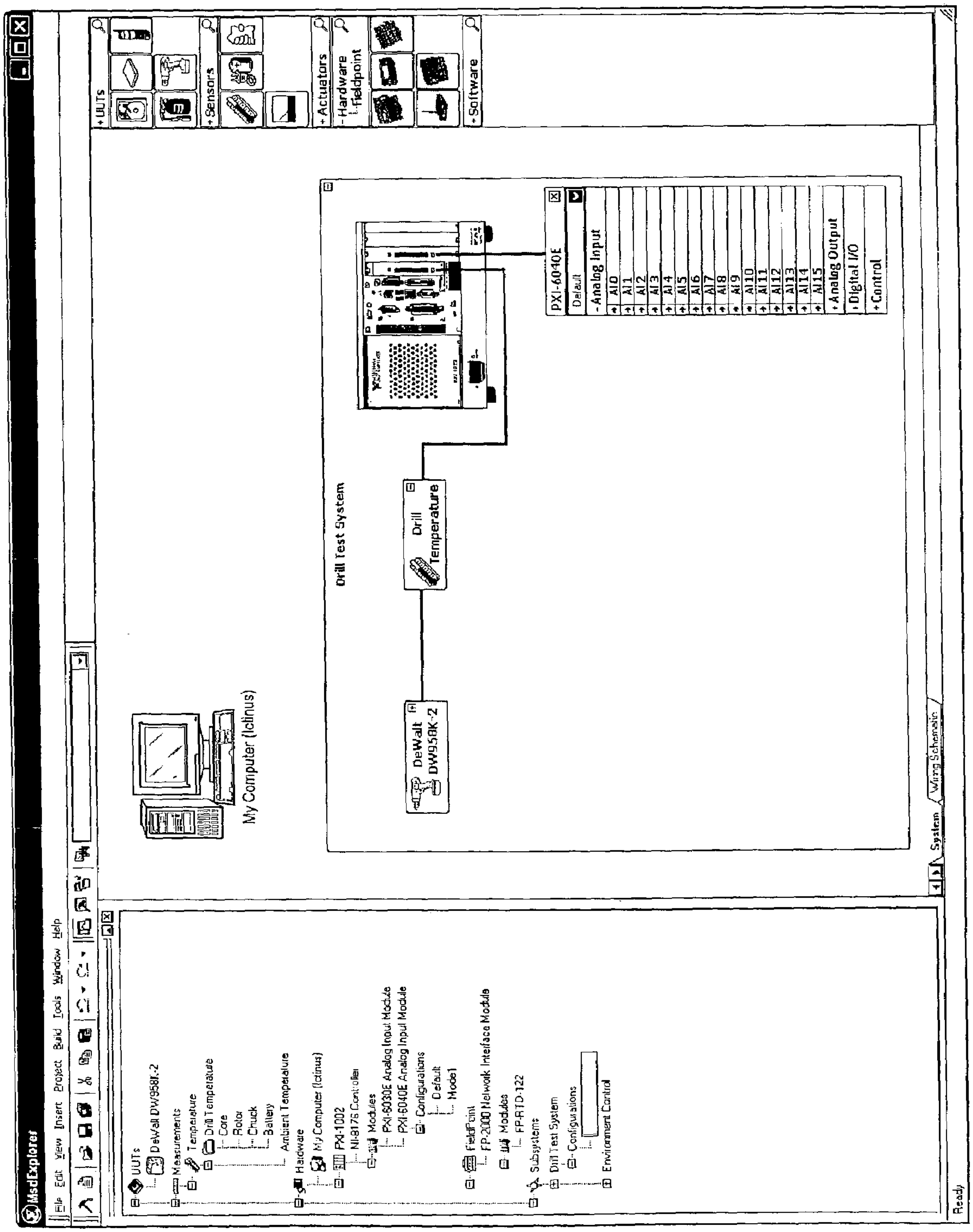
Figure 82:
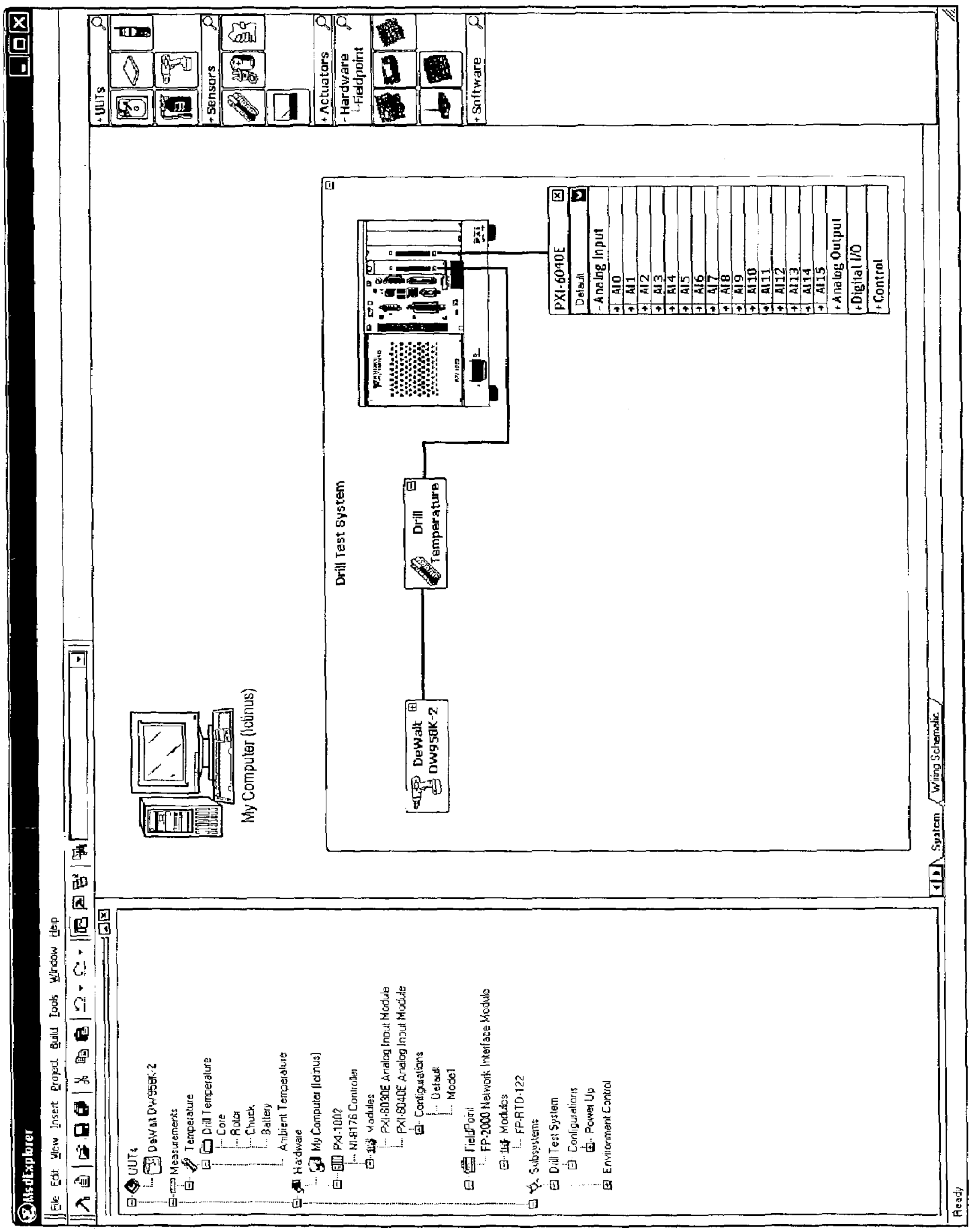

In addition to enabling users to save the configuration of a single module or board as described above, the MSD environment may also enable users to save configuration information at a subsystem level. For example, the user may desire to save the configuration of the Drill Test subsystem he previously defined. As shown in FIG. 80, the user may select an option to save the subsystem's configuration using a popup context menu accessed from the Drill Test subsystem item within the tree view. FIG. 81 illustrates a field that appears after the user selects the "Save" item from this menu, enabling the user to specify a name for the configuration of the Drill Test subsystem. In this case, the user names the configuration, "Power Up", as illustrated in FIG. 82. In saving the "Power Up" configuration, current state information for all hardware modules in the Drill Test subsystem may be saved.

Configurations saved by the user may be usable from within a software program. For example, the user may be able to pass a parameter referencing the "Power Up" configuration to a function or method call (or to a graphical program node) to cause the measurement system (or the portion of the measurement system defined by the Drill Test subsystem) to be configured according to the state defined by the "Power Up" configuration.

At this point in the example under discussion, we assume that the measurement system under design is once again in the state shown in FIG. 66, i.e., before the user has added the second module to the PXI chassis or performed the other actions described with reference to FIGS. 67-82.

Figure 83:
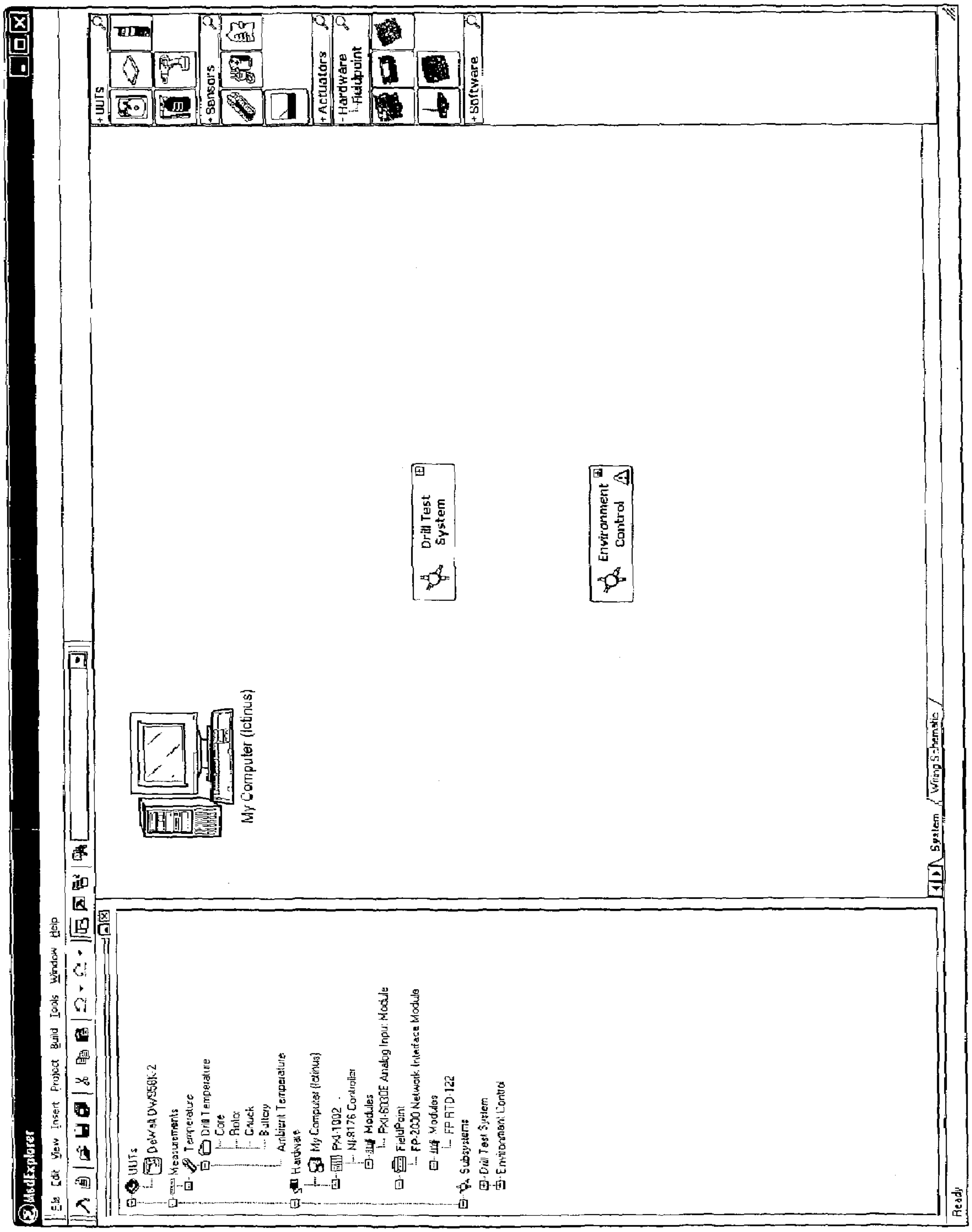

FIG. 83 illustrates another feature which the MSD environment may support for a measurement system diagram. A system diagram of the exemplary measurement system discussed above is shown, where the Drill Test subsystem and the Environment Control subsystem have each been collapsed into a single icon, similarly as shown in FIG. 66. In the embodiment of FIG. 83, however, an additional marking is superimposed on the Environment Control subsystem icon. In this case, the additional marking is a hazard sign. The meaning of the hazard sign is described below. The MSD environment may be operable to display various small markings superimposed on icons representing components of the measurement system, where each such marking conveys a specific meaning regarding the component to the user. Such markings superimposed on component icons are referred to herein as "glyphs".

Figure 84:
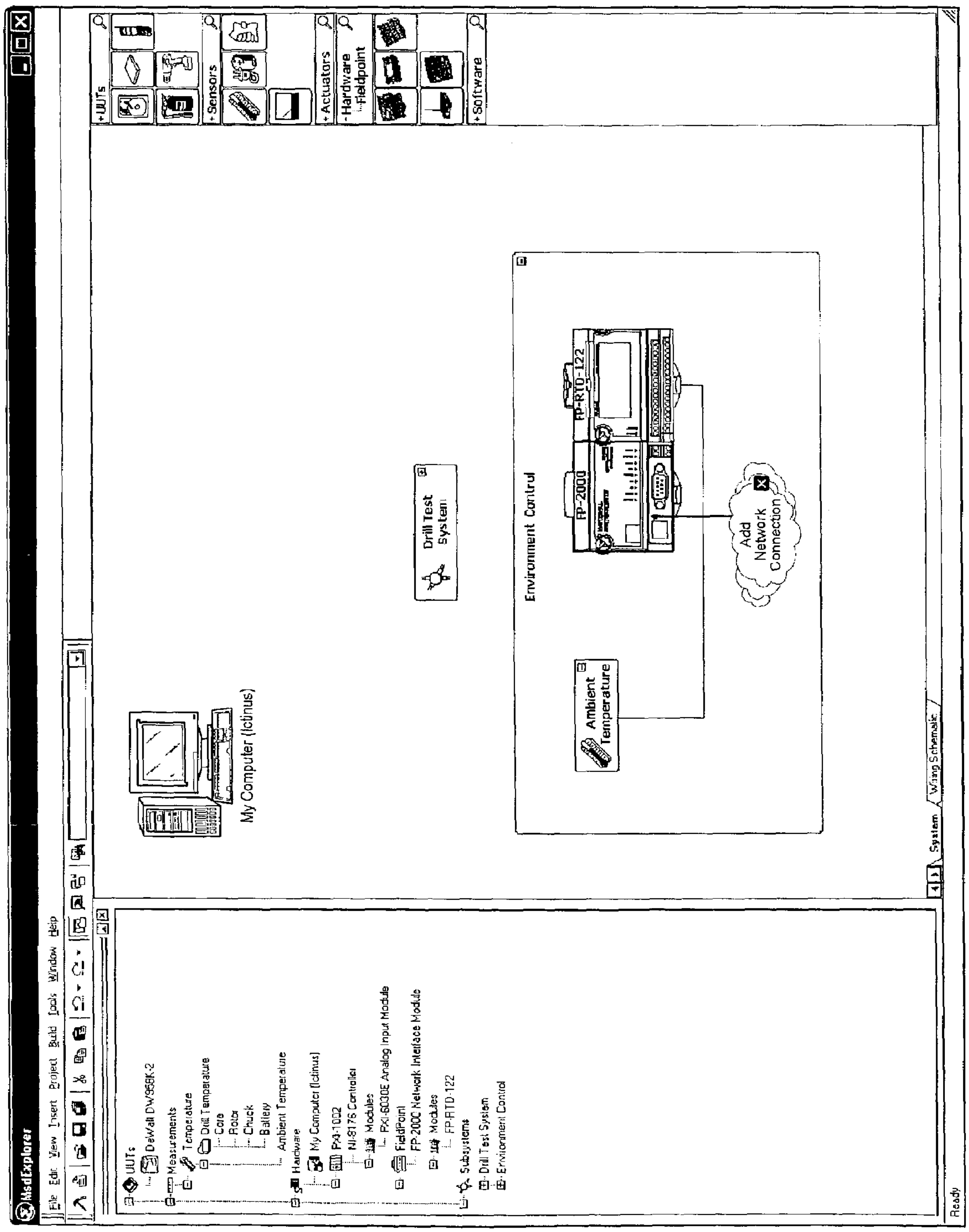

FIG. 84 illustrates the measurement system diagram with the Environment Control subsystem expanded to show its components. As noted above, the "Add Network Connection" puffy cloud icon indicates that the Fieldpoint controller module requires a network connection, which has not yet been specified. Thus, the hazard sign glyph superimposed on the collapsed Environment Control subsystem icon in FIG. 83 visually indicates that the subsystem has one or more elements that have not yet been specified, i.e., a network connection in this instance. As described below, other types of glyphs may convey other meanings to the user.

Figure 85:
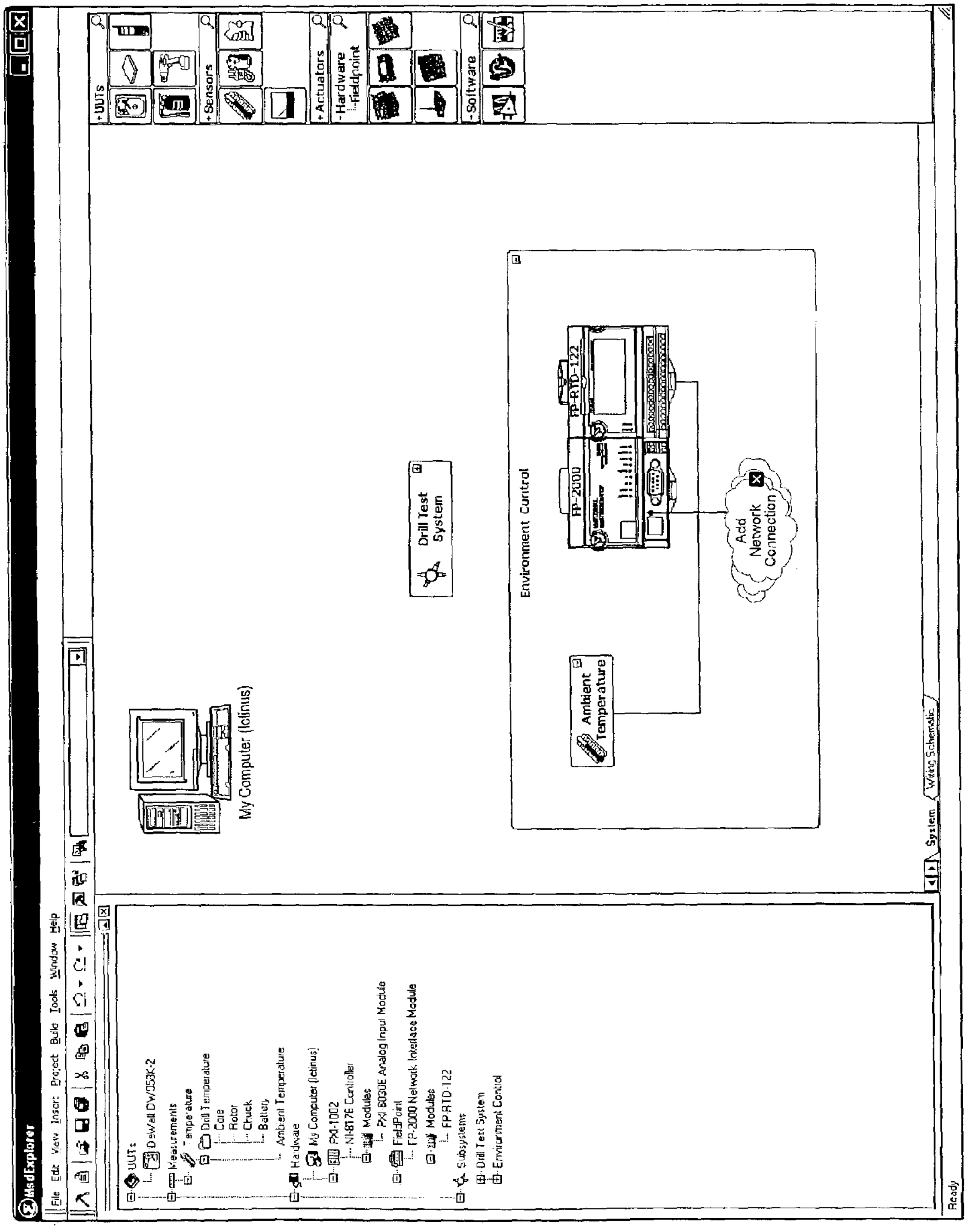

In one embodiment, the MSD environment may assist users in defining software elements for the measurement system, as well as hardware elements such as described above. For example, the user may expand the Software palette shown on the right side of the MSD environment workspace in FIG. 84 to access various software resources. The Software palette is shown expanded in FIG. 85. The leftmost icon in the Software palette represents the LabVIEW graphical programming development environment. The user may click the LabVIEW icon to indicate that he wants to execute one or more LabVIEW graphical programs on the computer system in the measurement system. For example, the graphical program may interact with hardware components of the measurement system to perform a test and measurement, process control, industrial automation, or other measurement function. After clicking on the LabVIEW icon, a LabVIEW glyph is displayed on the computer icon to indicate that the computer executes the LabVIEW graphical program.

Figure 86:
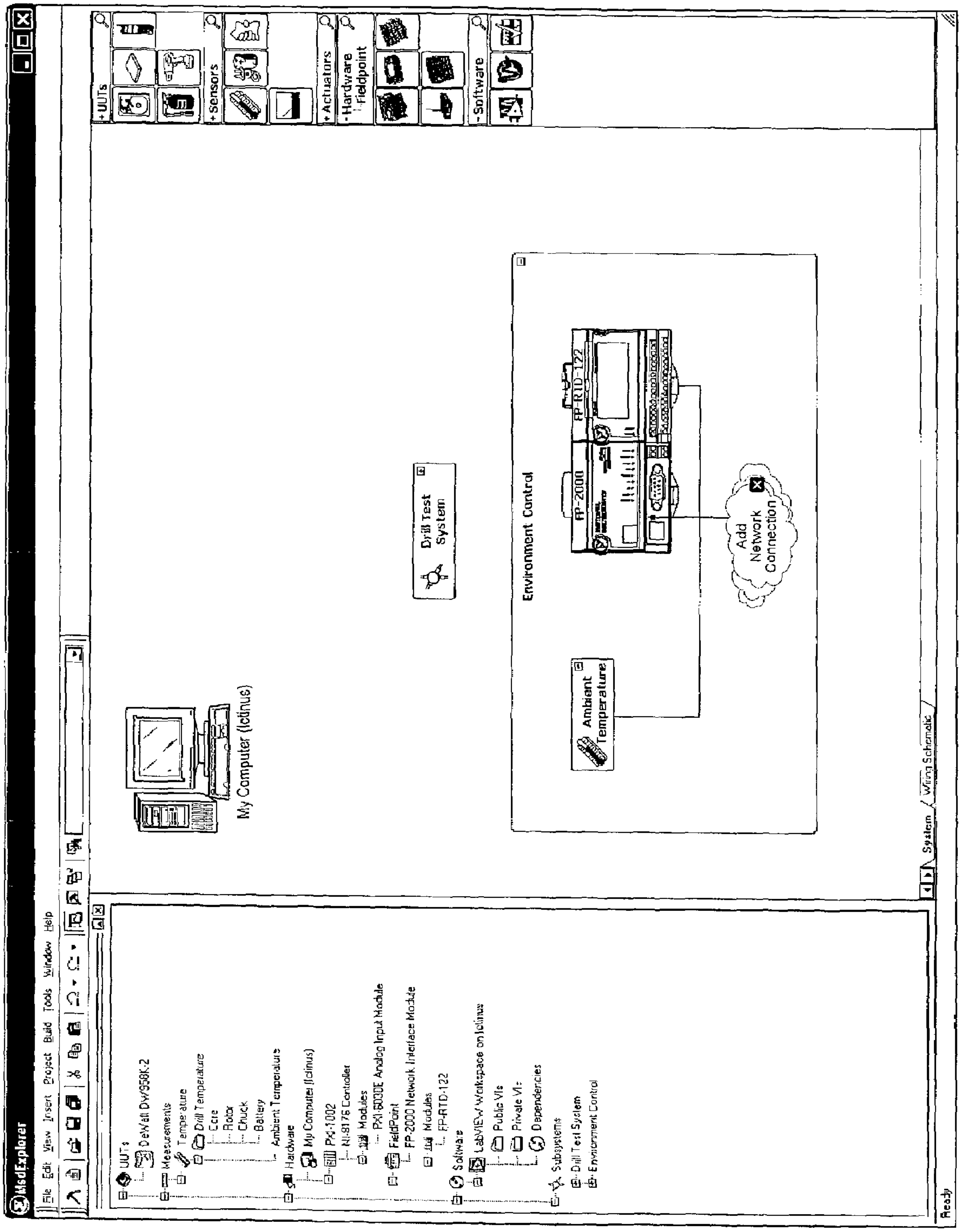
Figure 87:
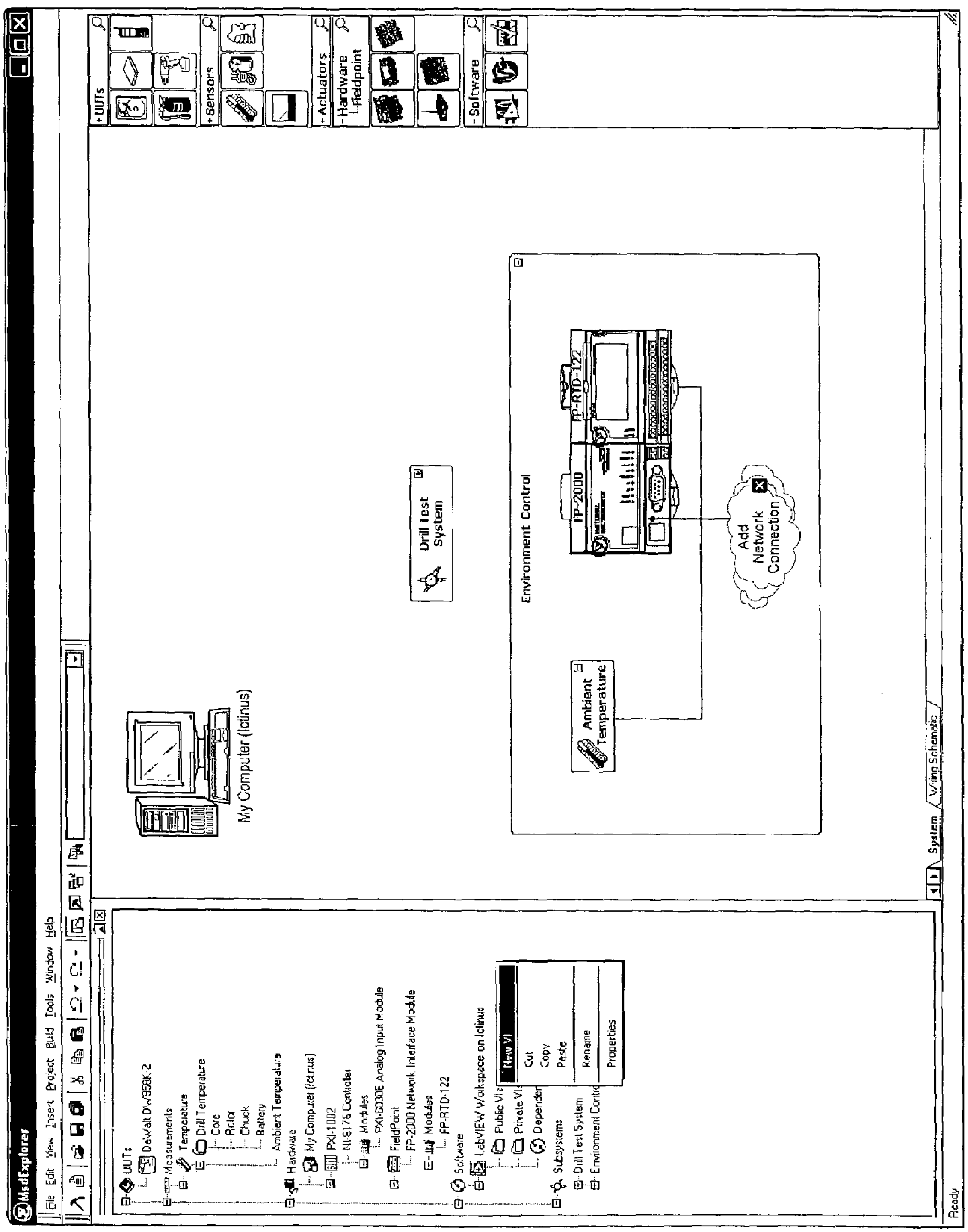

FIG. 86 also illustrates that a "Software" category including a LabVIEW workspace has been added to the tree shown on the left side of the MSD environment workspace. The user may organize LabVIEW graphical programs (referred to as "VI's") within the LabVIEW workspace. For example, as shown in FIG. 87, the user may access a popup context menu from the "Public VIs" item in the LabVIEW workspace to create a new public VI. In this example, the user creates a new public VI named "Environmental Control.vi", as shown in FIG. 88.

One or more hardware components within the measurement system may have the ability to execute computer programs. For example, a hardware component may comprise an embedded system including an embedded CPU and embedded memory. In this case, the computer program may be executed in the embedded system. As another example, a hardware component may include configurable logic, such as an FPGA, on which the program is executed. In one embodiment, the MSD environment may enable the user to graphically manage the deployment of computer programs onto various hardware components within the measurement system.

In one embodiment, the MSD environment may enable the user to drag and drop software elements, e.g., graphical programs or text-based programs, onto various hardware components within the measurement system. Dragging and dropping a software element onto a hardware component may indicate that the user desires the respective software element to execute on the respective hardware component. The user may also associate a software element with a hardware component in any of various other ways besides dragging and dropping, e.g., by using a menu or graphical user interface to specify the association.

Figure 88:
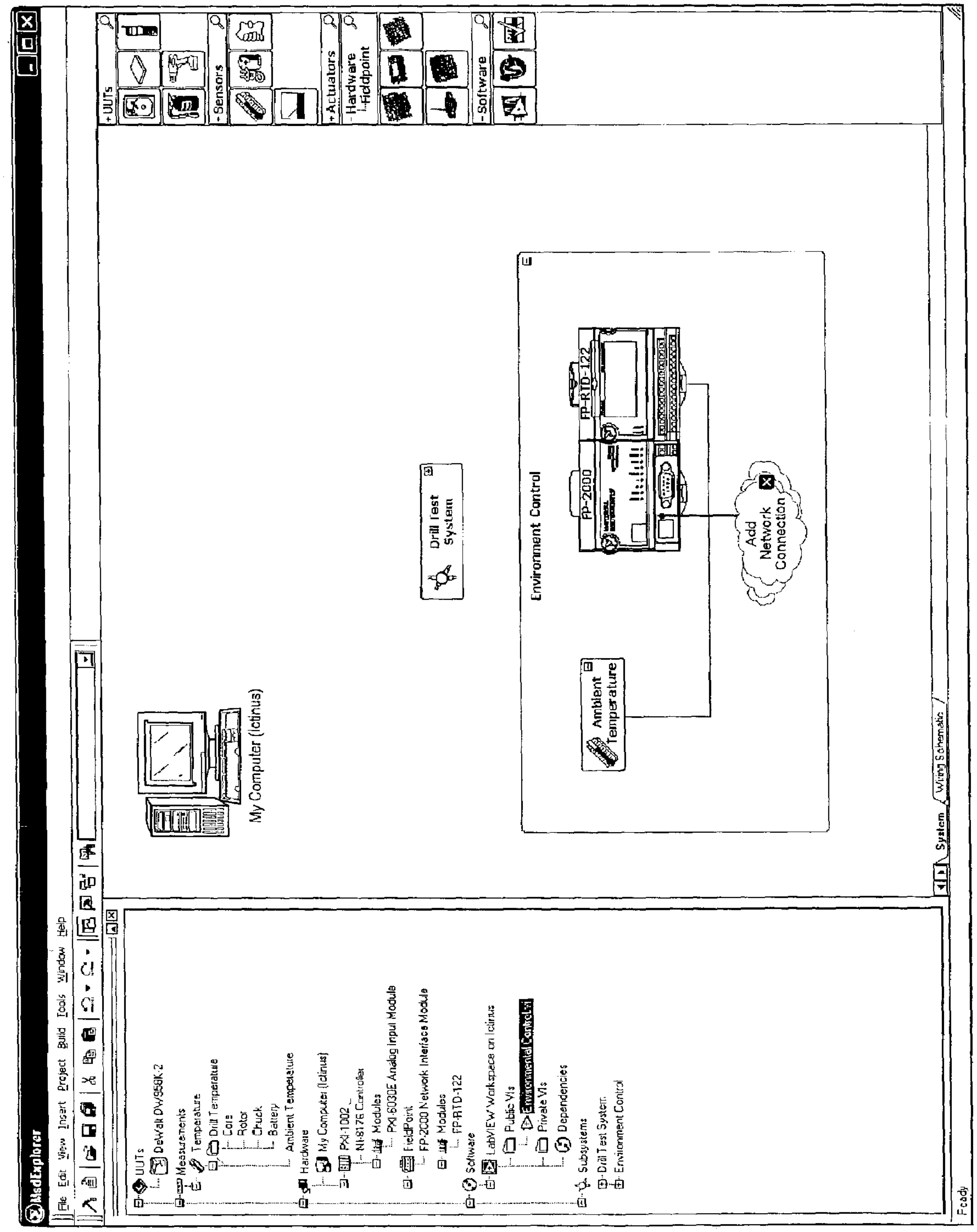
Figure 89:
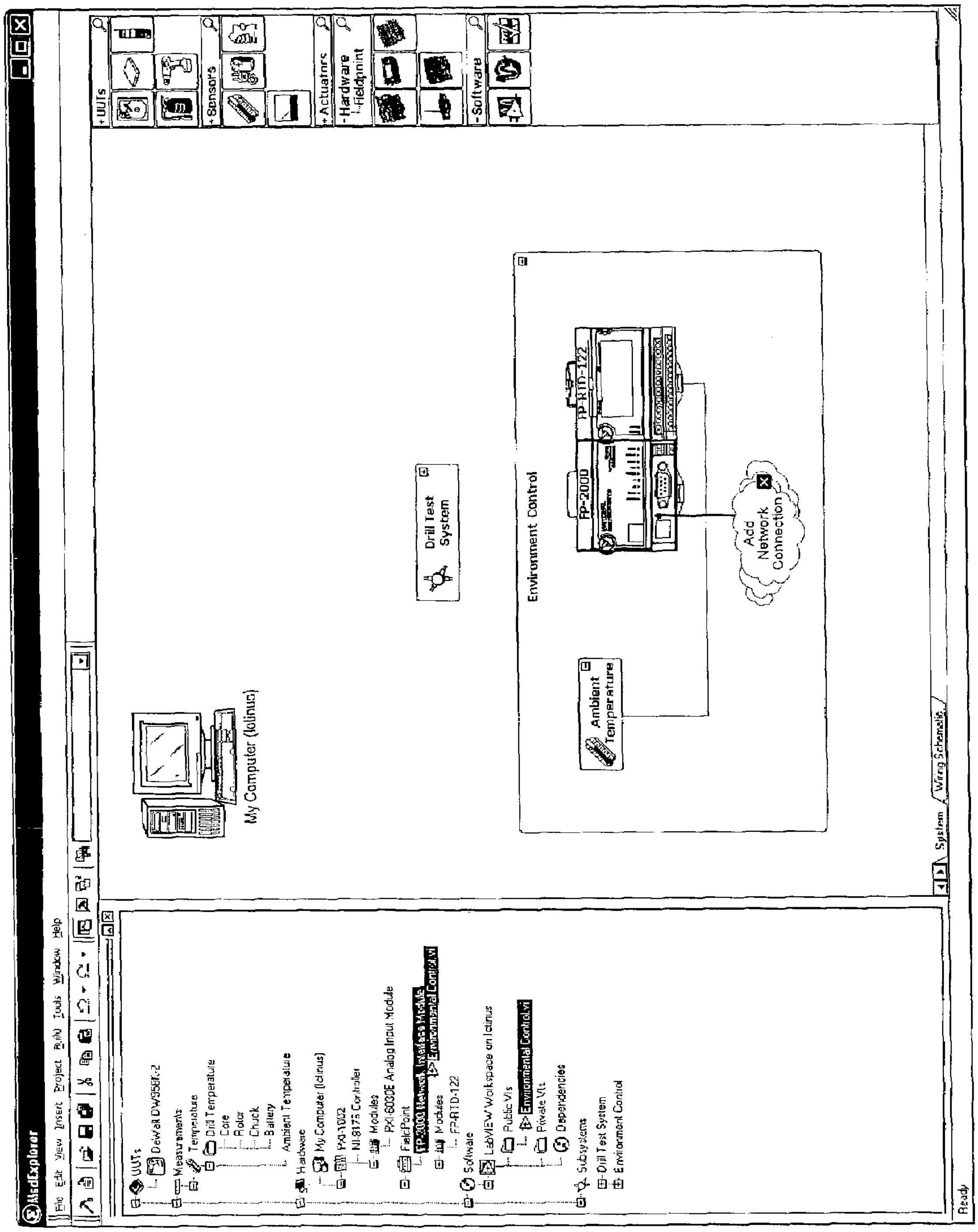

In one embodiment, the user may drag and drop a software element onto a hardware component icon within the system diagram, such as onto the Fieldpoint 2000 controller module displayed in FIG. 88. For example, the user may drag the "Environmental Control.vi" item from the tree view onto the Fieldpoint 2000 controller module icon. In another embodiment, the user may drag and drop the software element onto a hardware component item within the tree view. For example, FIG. 89 illustrates the user dragging and dropping the "Environmental Control.vi" item from the Software category in the tree view onto the "FP 2000 Network Interface Module" item in the Hardware category of the tree view. This indicates that the "Environmental Control.vi" graphical program should be deployed on the Fieldpoint 2000 controller module for execution there.

Figure 90:
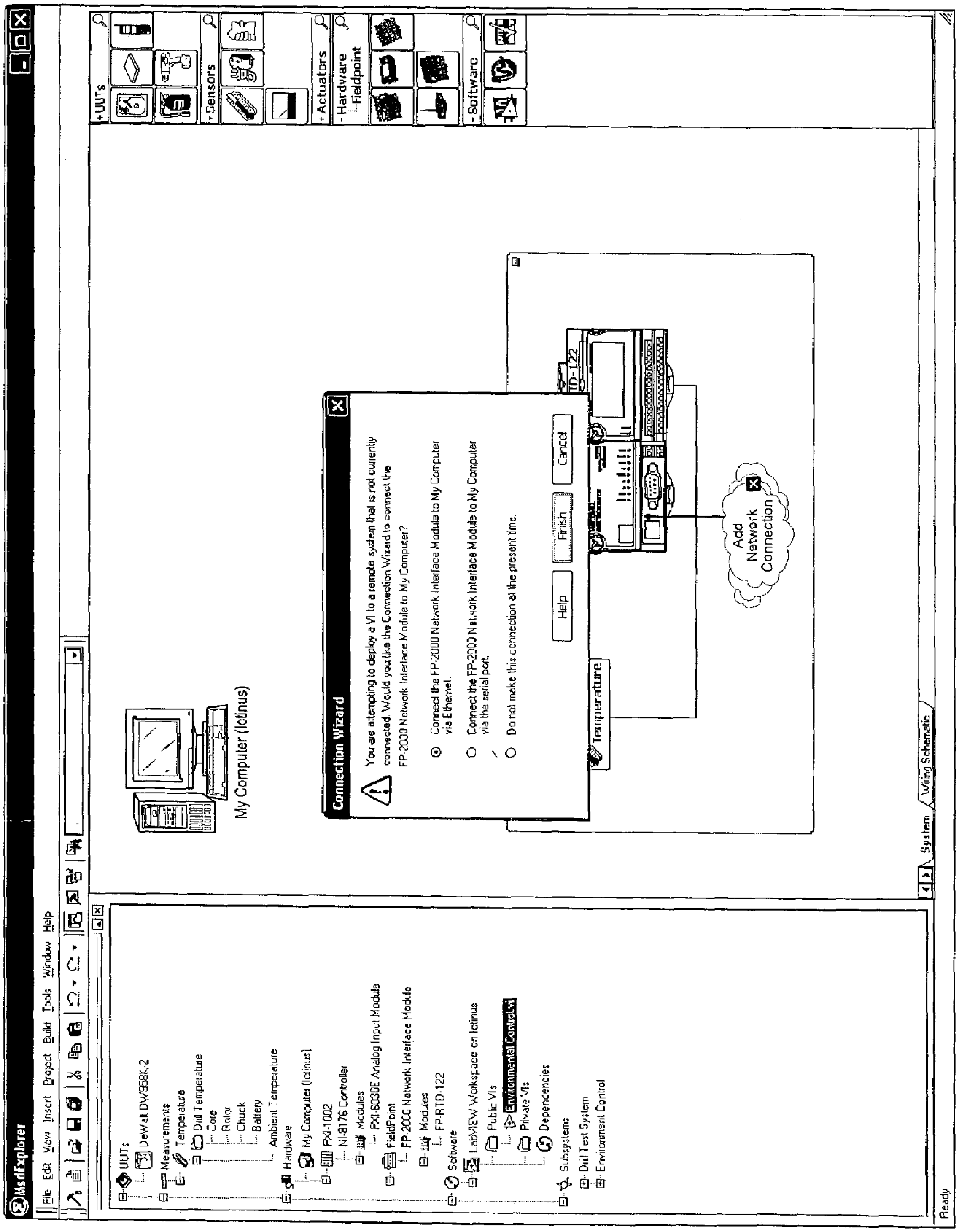

As discussed previously with reference to FIGS. 83 and 84, a network connection has not yet been specified for the Fieldpoint module. Thus, as shown in FIG. 90, the MSD environment may display a warning dialog box in response to the user dragging and dropping the "Environmental Control.vi" item onto the "FP 2000 Network Interface Module" item. This dialog box informs the user that a network connection is required between the Fieldpoint module and the computer system where the graphical program is currently stored. The user is also presented with various options to specify a network connection between the Fieldpoint module and the computer system or to leave the network connection unspecified.

Figure 91:
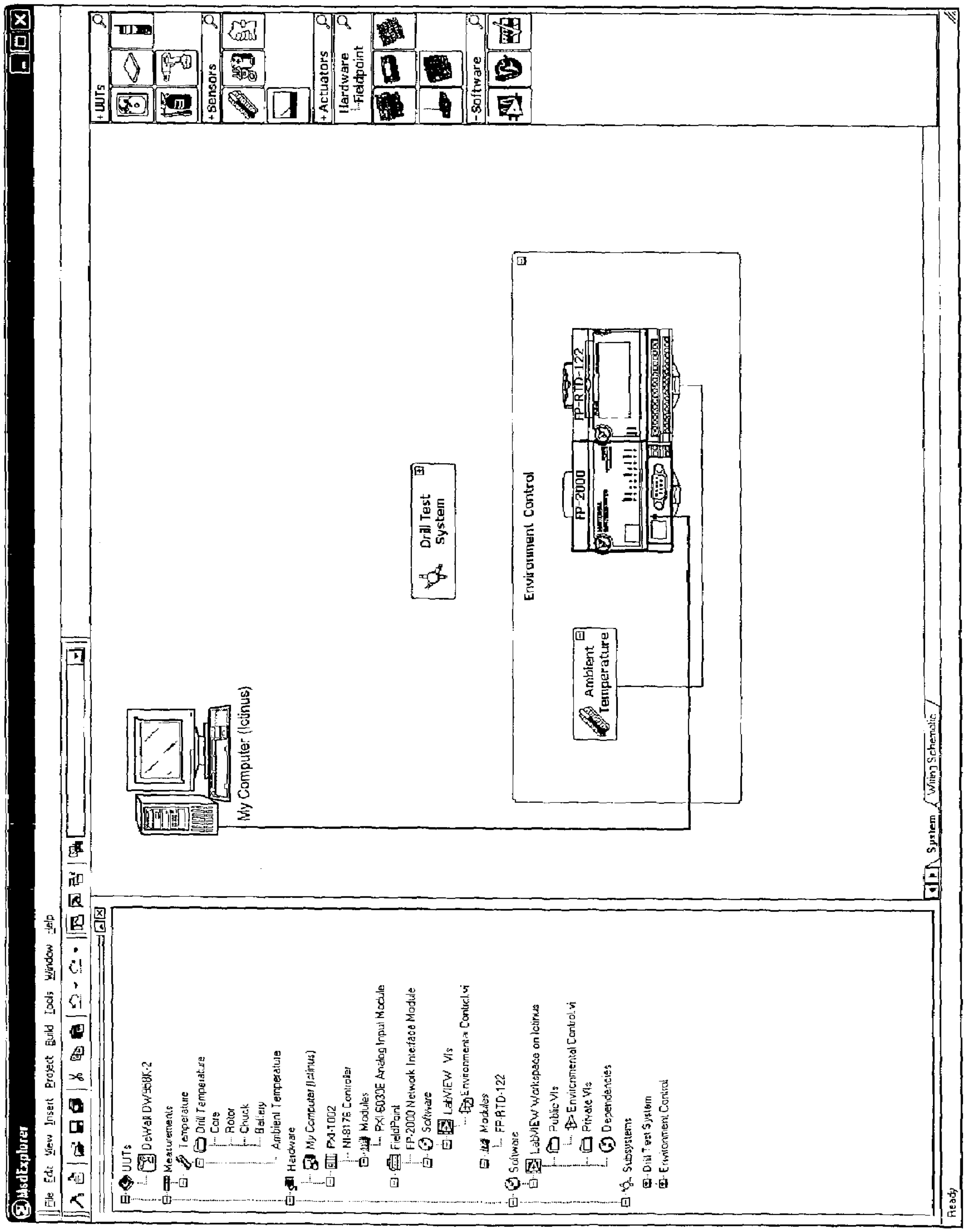

In this case, the user selects the option to connect the Fieldpoint module to the computer system via Ethernet and clicks the "Finish" button. As shown in FIG. 91, the measurement system diagram is then updated to illustrate the network connection between the computer system (i.e., "My Computer (lctinus)") and the Fieldpoint module. FIG. 91 also illustrates that a LabVIEW glyph has now been superimposed on the Fieldpoint module icon to indicate the deployment of a LabVIEW graphical program, i.e., the "Environmental Control.vi" VI, on the Fieldpoint module.

Also, the tree view in FIG. 91 illustrates that a new "Software" category has been added under the "FP 2000 Network Interface Module" item to indicate the specific software elements deployed on the Fieldpoint module, i.e., the "Environmental Control.vi" graphical program in this case. The icon for the new "Environmental Control.vi" item, however, is a link icon, indicated by the arrow superimposed on the icon. The link icon indicates to the user that the "Environmental Control.vi" graphical program is being developed on the user's computer system (i.e., "My Computer (lctinus)") and not on the Fieldpoint module.

In various embodiments, the actual deployment of a software program onto a hardware component within the measurement system, e.g., the actual transfer of the software program from one location to another (such as the transfer of the "Environmental Control.vi" graphical program from the "My Computer (lctinus)" computer system to the Fieldpoint module) may occur at various points during the process of creating the measurement system. In one embodiment, the MSD environment may automatically initiate the deployment at various times. In another embodiment, the user may perform an action to explicitly request the deployment or transfer to be performed.

Figure 92:
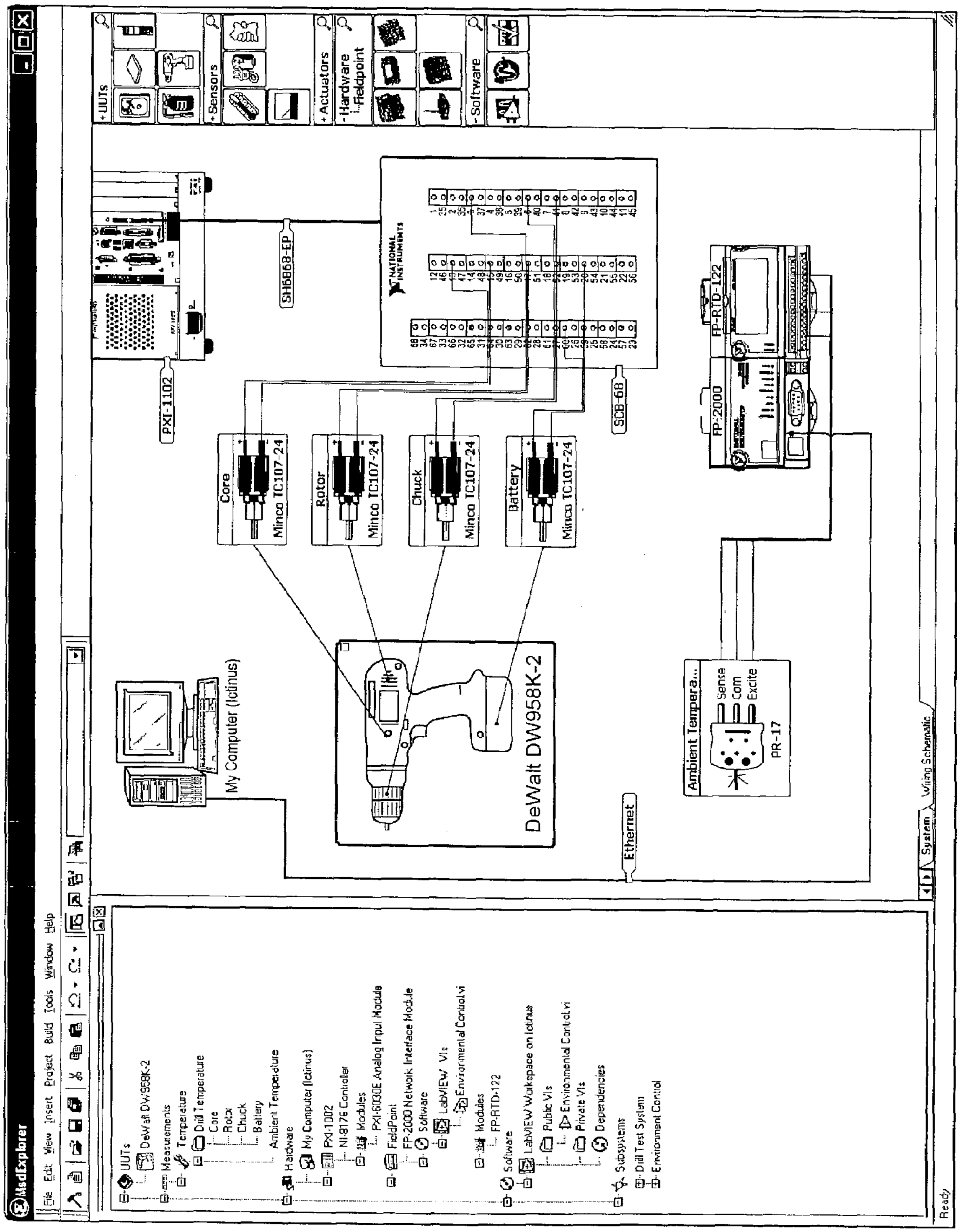
Figure 93:
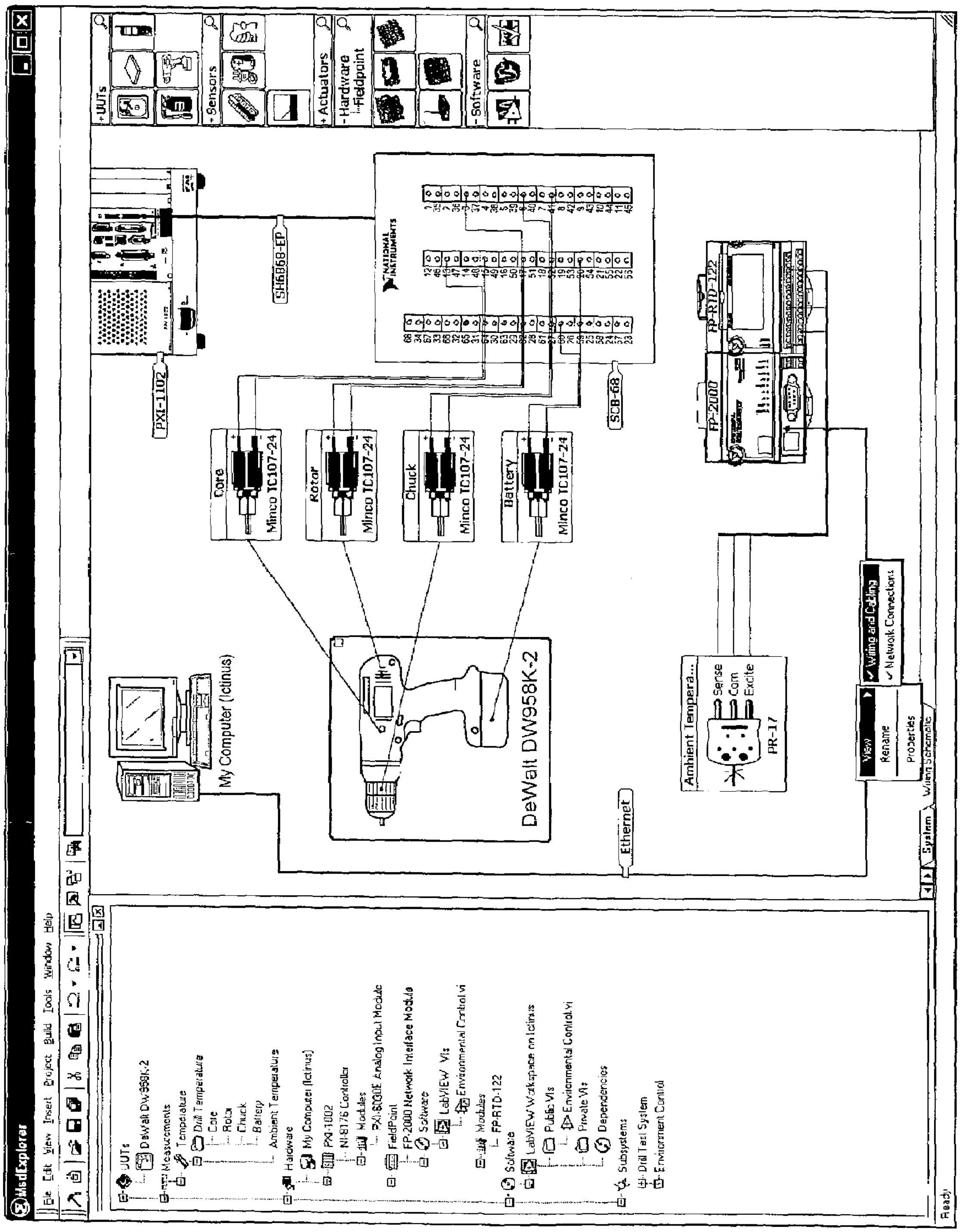
Figure 94:
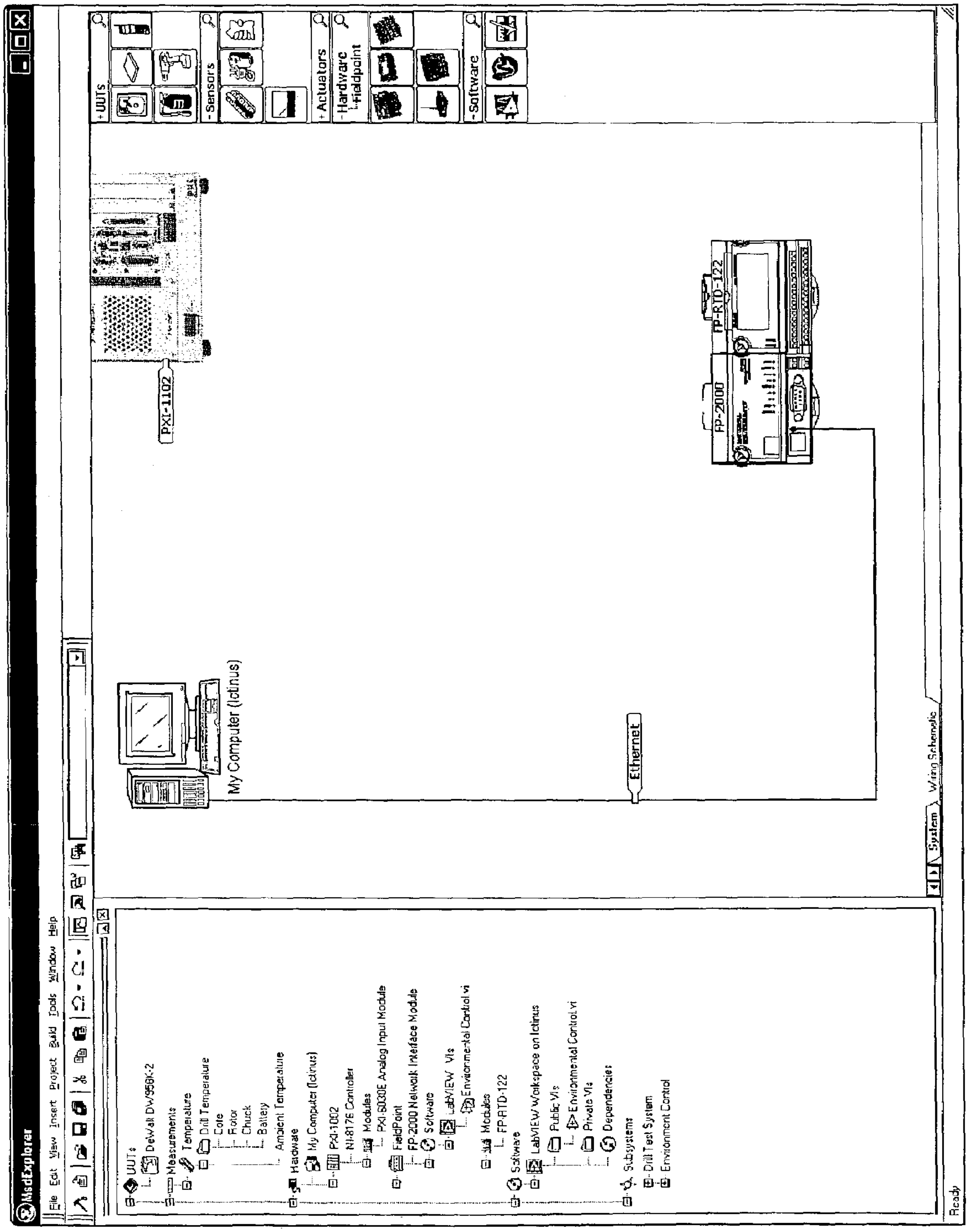

FIG. 92 illustrates a wiring schematic view of the measurement system. As shown a network connection between the "My Computer (lctinus)" computer system and the Fieldpoint module is labeled with an "Ethernet" wiring tip, thus indicating to the user the type of network connection. The MSD environment may enable the user to refine or limit the wiring schematic view in various ways. For example, FIG. 93 illustrates a popup context menu allowing the user to display or un-display various elements in the wiring schematic diagram. For example, by un-checking the "Wiring and Cabling" item, the user is left with a view of only the network connections in the system, as shown in FIG. 94. This view may be useful, for example, in a complex measurement system having many connected hardware components. For example, a network technician may utilize the view to configure the appropriate network connections. In FIG. 94 the PXI chassis icon is dimmed or "grayed out", since this hardware component is not connected via a network to any other hardware component in the measurement system.

Figure 95:
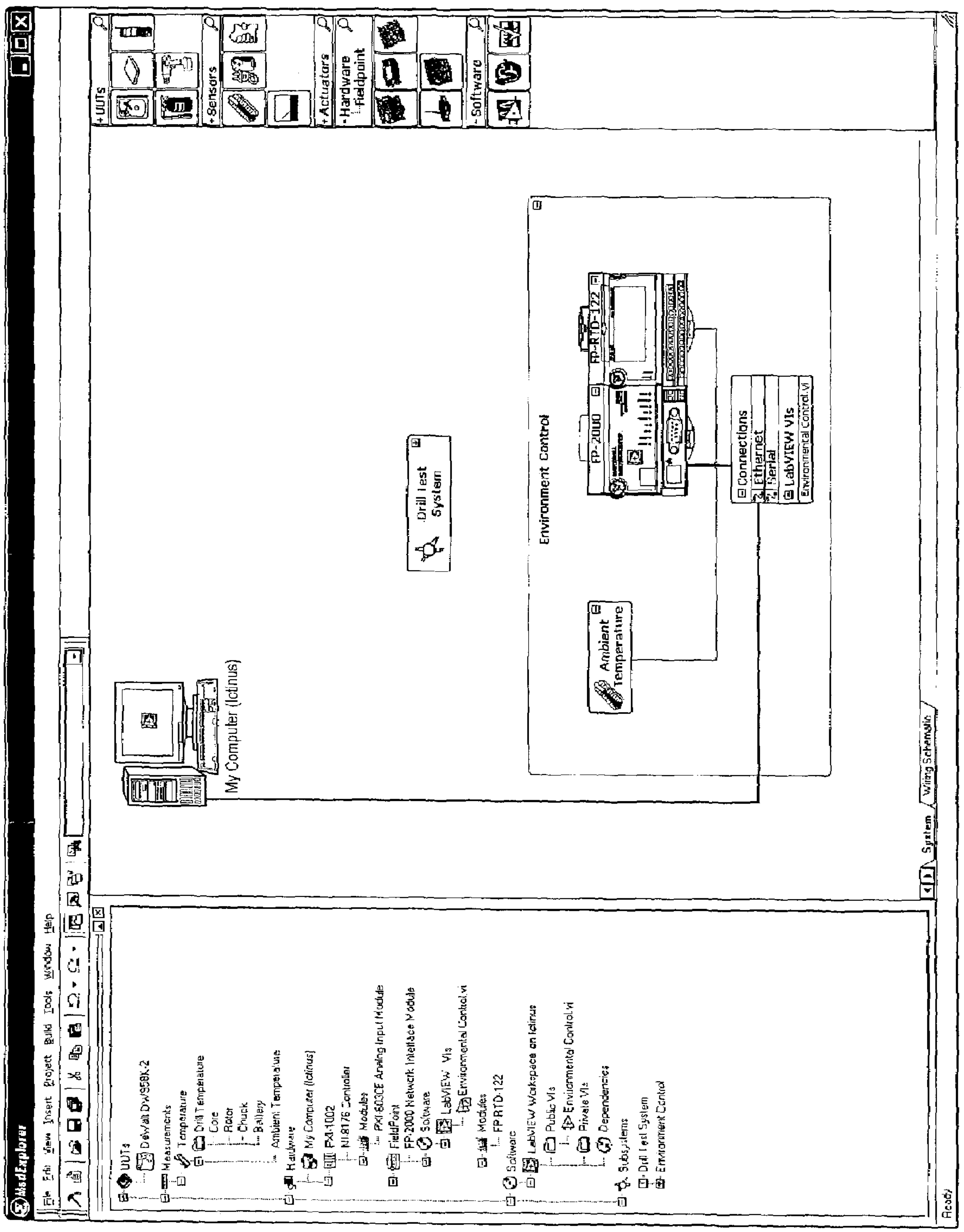

Referring again to the system view of the measurement system, FIG. 95 illustrates the state of the MSD environment workspace after the user has expanded the Fieldpoint 2000 module icon to display a hardware dongle indicating functionality of the Fieldpoint 2000 module. For example, the hardware dongle indicates the different connection protocols available, as well as the graphical program deployed on the module.

In one embodiment, the MSD environment may enable the user to create or edit software programs within the MSD environment workspace. For example, in one embodiment, the user may be able to create or edit a text-based program. In another embodiment, the user may be able to create or edit a graphical program.

Figure 96:
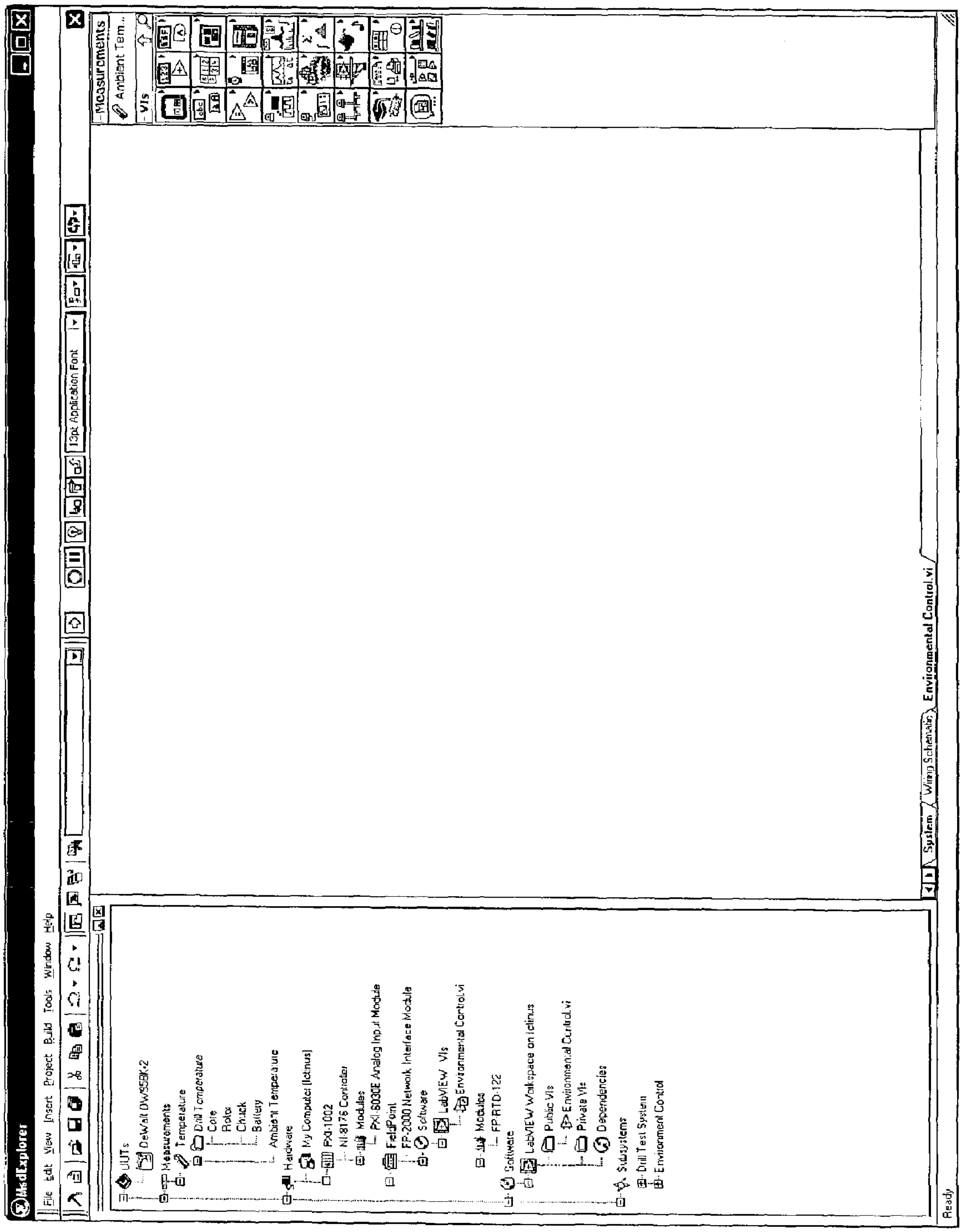

As one example, the user may choose to edit the "Environmental Control.vi" graphical program configured for deployment on the Fieldpoint module. Creating or editing a graphical program may involve creating or editing a block diagram for the graphical program. Thus, the MSD environment may provide access to a block diagram editor. In FIG. 96, the user has double-clicked on one of the "Environmental Control.vi" items in the tree view to edit the respective graphical program. In this embodiment, the LabVIEW graphical programming development environment has been integrated into the MSD environment workspace, allowing the "Environmental Control.vi" LabVIEW graphical program to be edited (created) within the same environment used to define the measurement system in which the program is utilized. In this example, the "Environmental Control.vi" is a new graphical program. Thus, the block diagram is simply blank, without any nodes.

In FIG. 96, the palette displayed on the right side of the MSD environment workspace has also changed. The palette no longer includes the "UUTs", "Sensors", "Actuators", "Hardware", and "Software" sub-palettes shown previously. Instead, a "VIs" sub-palette is displayed. The "VIs" sub-palette provides access to various nodes which the user may include in the block diagram to define the operation of the graphical program.

A "Measurements" sub-palette is also displayed. As described above, during the process of defining the measurements made by the measurement system, programmatic entities, e.g., virtual channels, through which the measurements can be referenced were automatically created by the MSD environment. Thus, the user may utilize the "Measurements" sub-palette to include a reference to the desired measurement/virtual channels in the graphical program, e.g., by dragging and dropping the desired measurement/virtual channel onto the block diagram or by clicking on the desired measurement/virtual channel. Although the user defined multiple measurements made by the measurement system, only the "Ambient Temperature" measurement appears in the "Measurements" sub-palette in FIG. 96. This is because only the "Ambient Temperature" measurement is associated with the Fieldpoint controller module. The other measurements are associated with the PXI hardware in the Drill Test subsystem. Since the user specified that the "Environmental Control.vi" graphical program executes on the Fieldpoint module, the MSD environment may filter the items displayed in the "Measurements" sub-palette so that only those measurements/virtual channels associated with and available on the Fieldpoint module are displayed.

Figure 97:
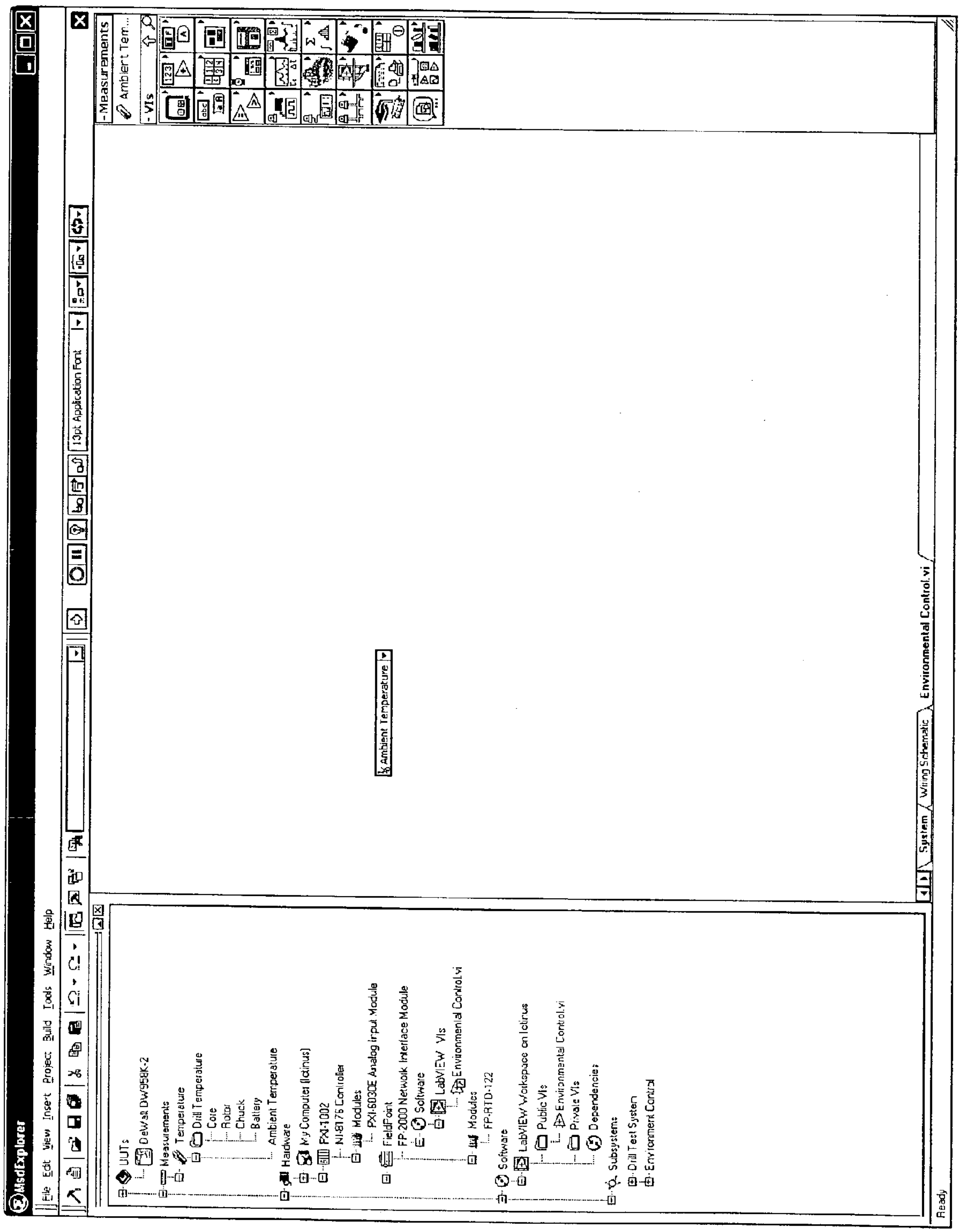
Figure 98:
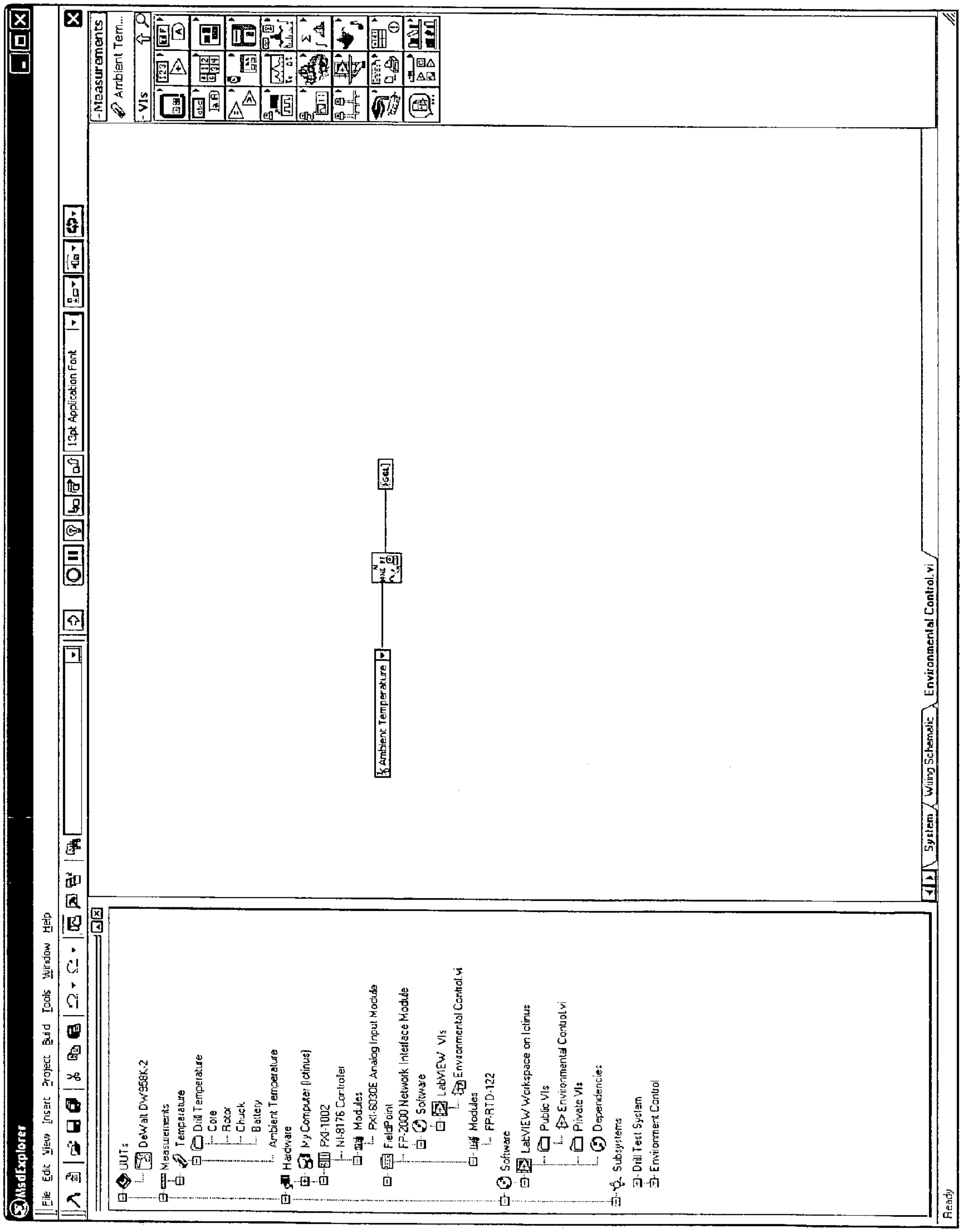

FIG. 97 illustrates the block diagram of the graphical program after the user has included the "Ambient Temperature" measurement/virtual channel from the "Measurements" sub-palette. The user may then include additional nodes in the block diagram and interconnect the nodes to achieve the desired functionality for the graphical program, as shown in FIG. 98. In this simple example, the "Ambient Temperature" measurement/virtual channel is simply wired as an input parameter to an analog input node which is operable to acquire the measurement. The output of the analog input node is then wired to a user interface node which displays the measured temperature.

Figure 99:
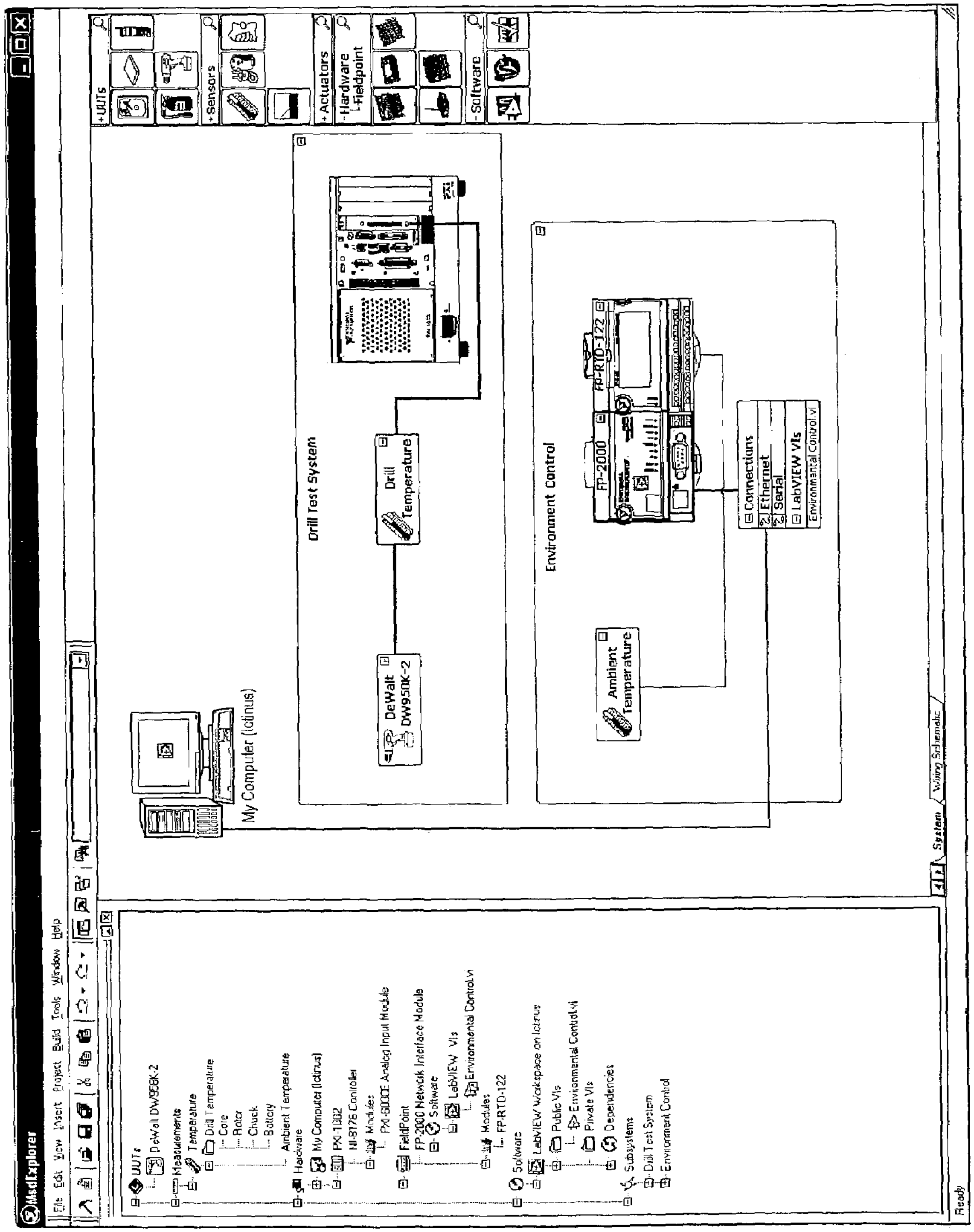
Figure 100:
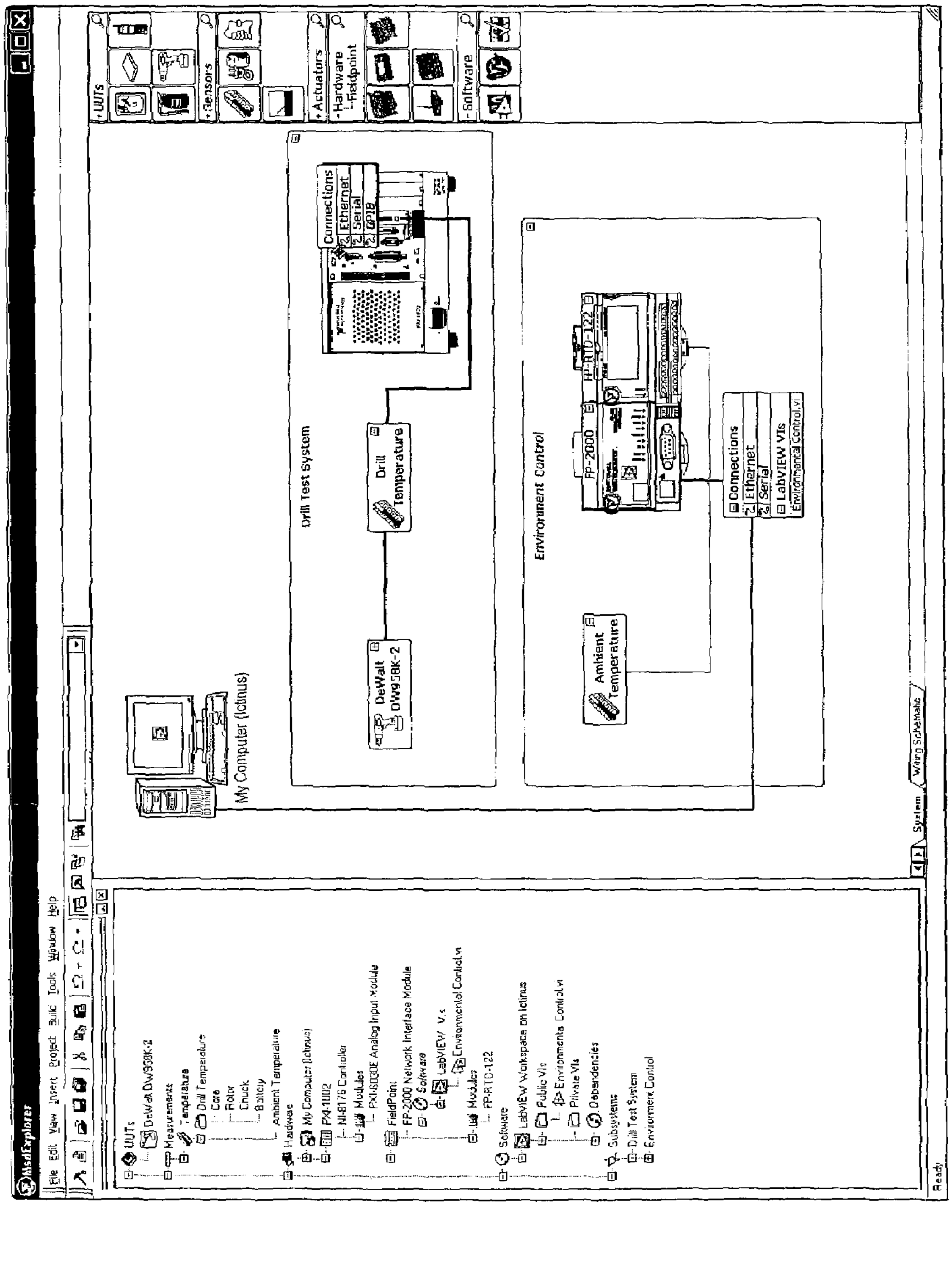
Figure 101:
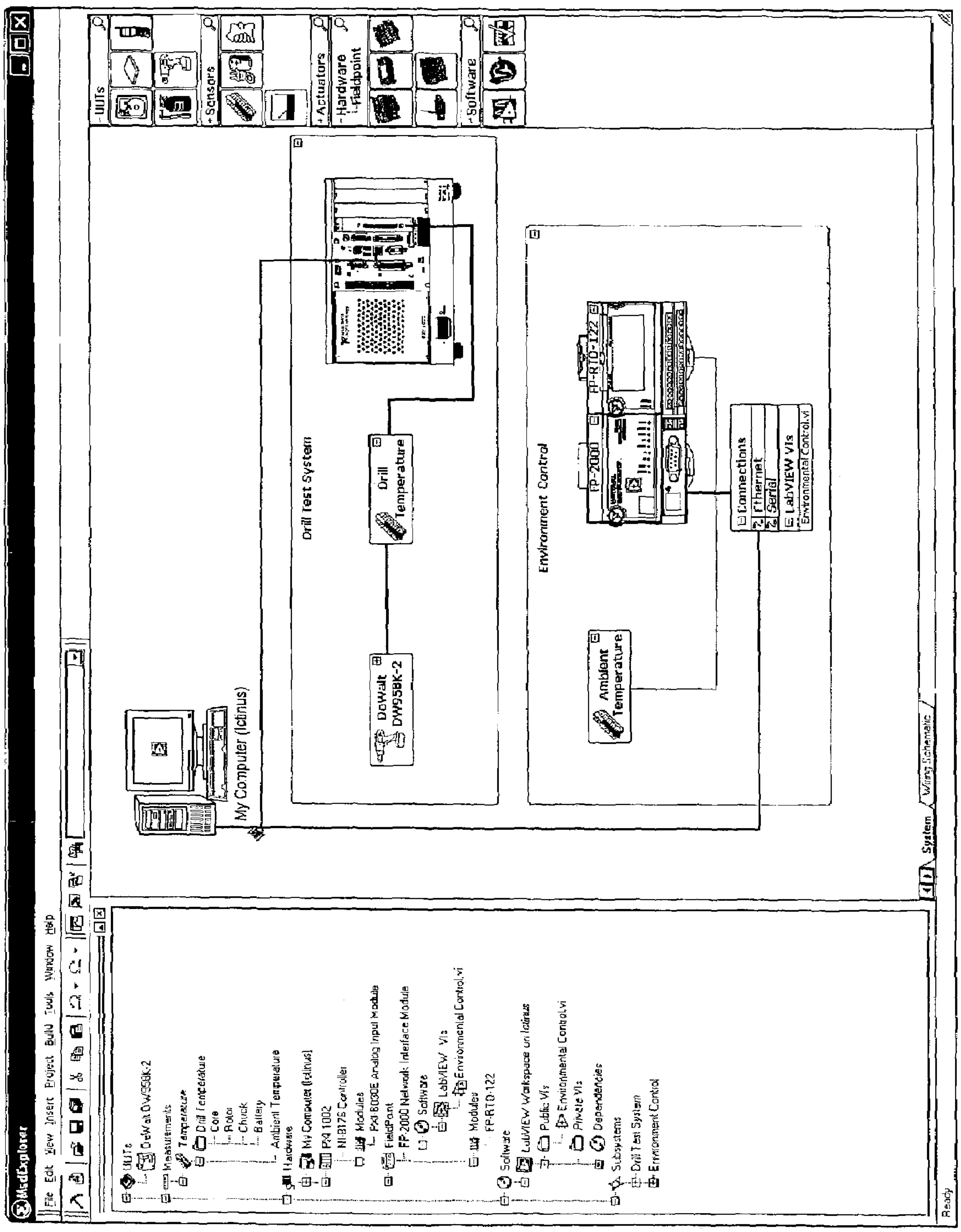

Referring now to FIG. 99, the system view of the measurement system is illustrated once again. The Drill Test subsystem icon has been expanded and the PXI chassis icon within this subsystem has also been expanded to illustrate the PXI chassis. The user may desire to connect the PXI controller to the "My Computer (lctinus)" computer system. To accomplish this, the user may invoke a wiring tool. The wiring tool may allow the user to specify various types of connections between the PXI controller and the computer system, e.g., an Ethernet, serial, or GPIB connection, as shown in FIG. 100. FIG. 101 illustrates the connection after the user has specified its second endpoint at the "My Computer (lctinus)" computer system.

Figure 102:
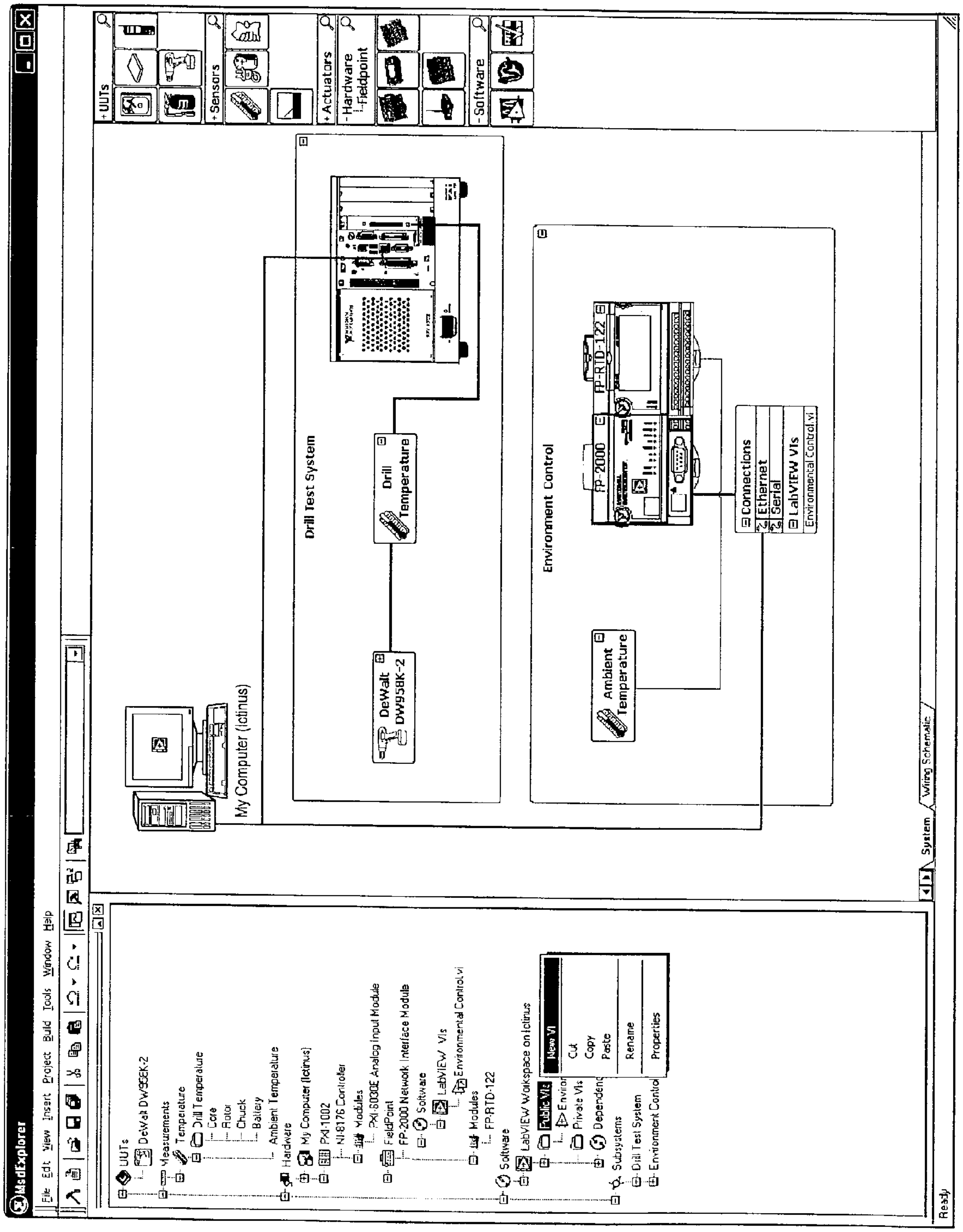
Figure 103:
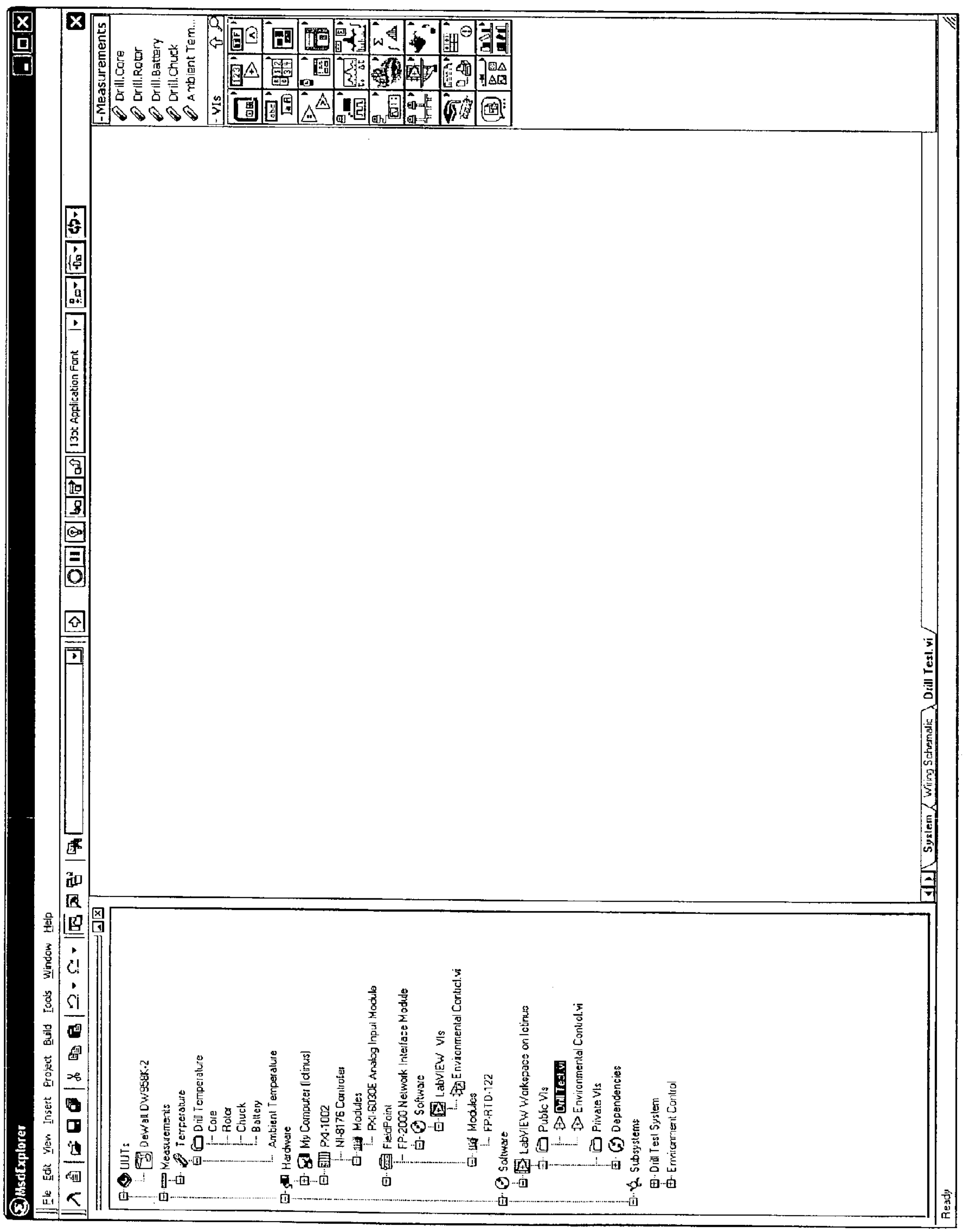

As shown in FIG. 102, the user may then desire to create another graphical program (VI) and may name it "Drill Test.vi". The user may then edit this graphical program. FIG. 103 illustrates the block diagram editor for editing the "Drill Test.vi" graphical program, similarly as described above with reference to FIG. 96. Unlike FIG. 96, however in this case the "Measurements" sub-palette includes all five measurements previously defined by the user. This is because the "Drill Test.vi" graphical program has not been associated with any particular hardware device in the measurement system.

Figure 104:
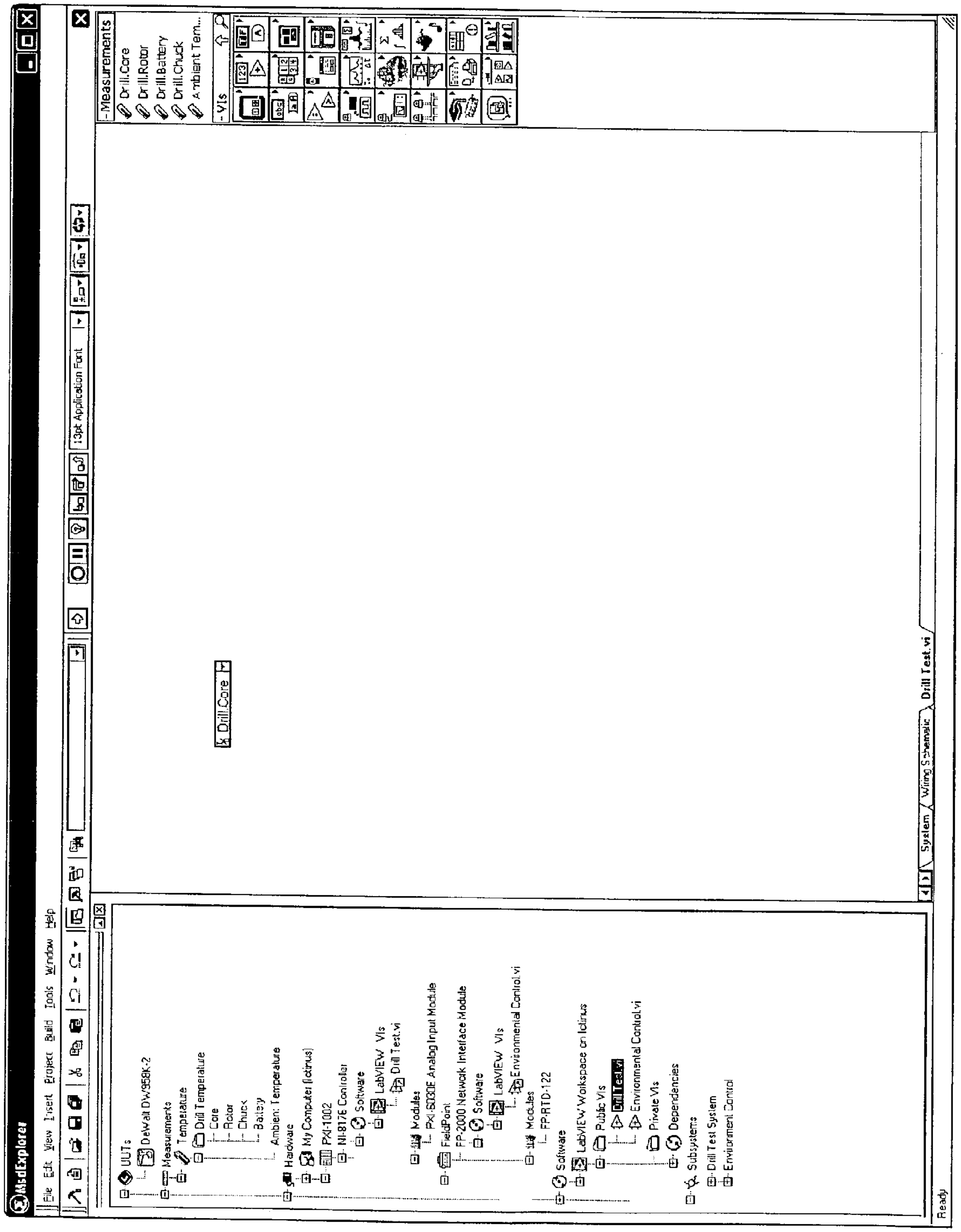

The user may desire to include the "Drill.Core" measurement/virtual channel in the "Drill Test.vi" graphical program. In response, the MSD environment may automatically associate the "Drill Test.vi" graphical program with the PXI controller, since the PXI controller is the hardware device that acquires the "Drill.Core" measurement. The tree view in FIG. 104 illustrates this association by the newly added "Software" category under the "NI-8176 Controller" item and the "Drill Test.vi" item under a "LabVIEW VIs" category within this "Software" category.

Figure 105:
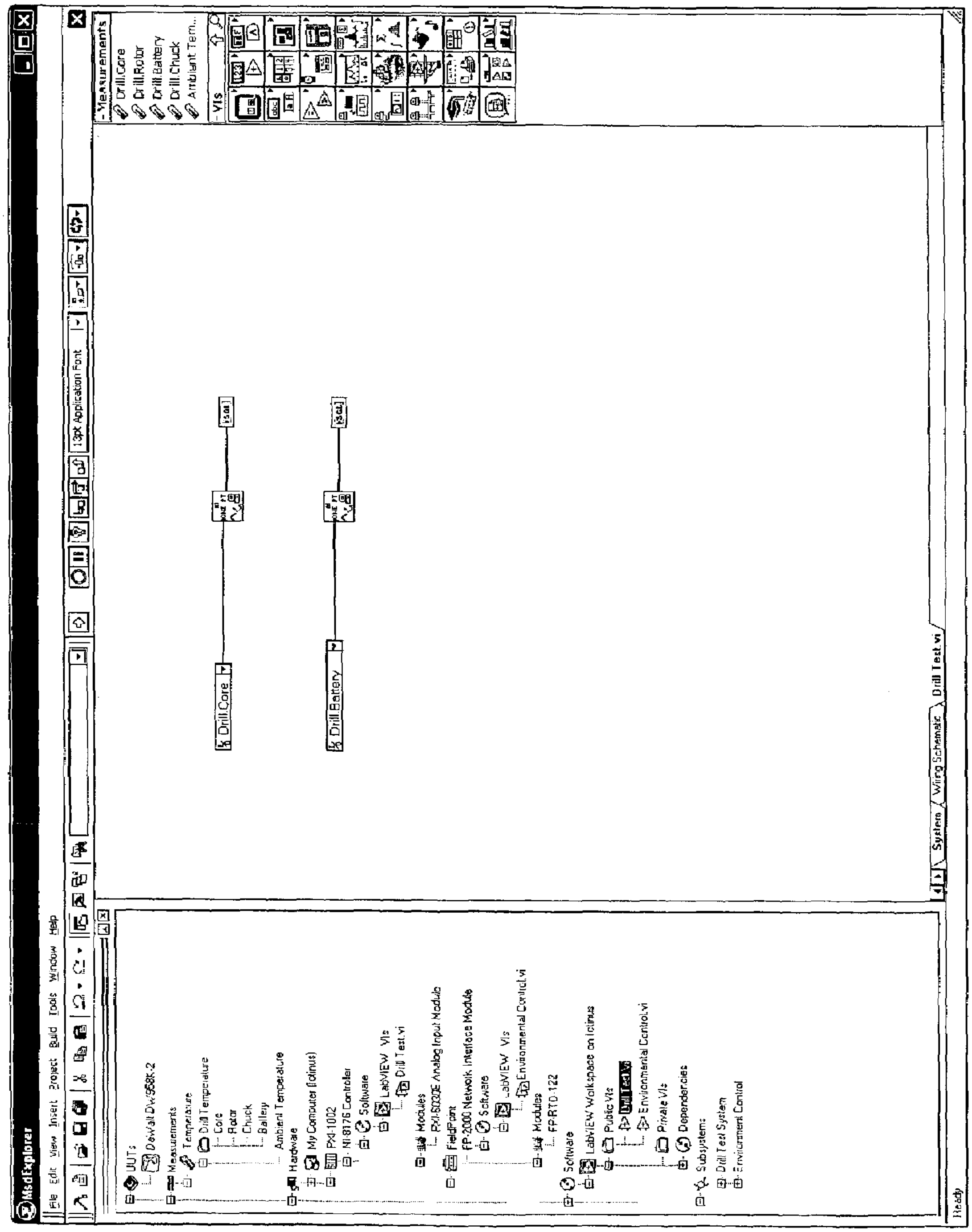

FIG. 105 illustrates the block diagram of the "Drill Test.vi" graphical program after the user has added additional nodes connected to the "Drill.Core" measurement/virtual channel, similarly as described above with reference to FIG. 98. The user has also added the "Drill.Battery" measurement/virtual channel and has added nodes to operate on this measurement/virtual channel as well.

Figure 106:
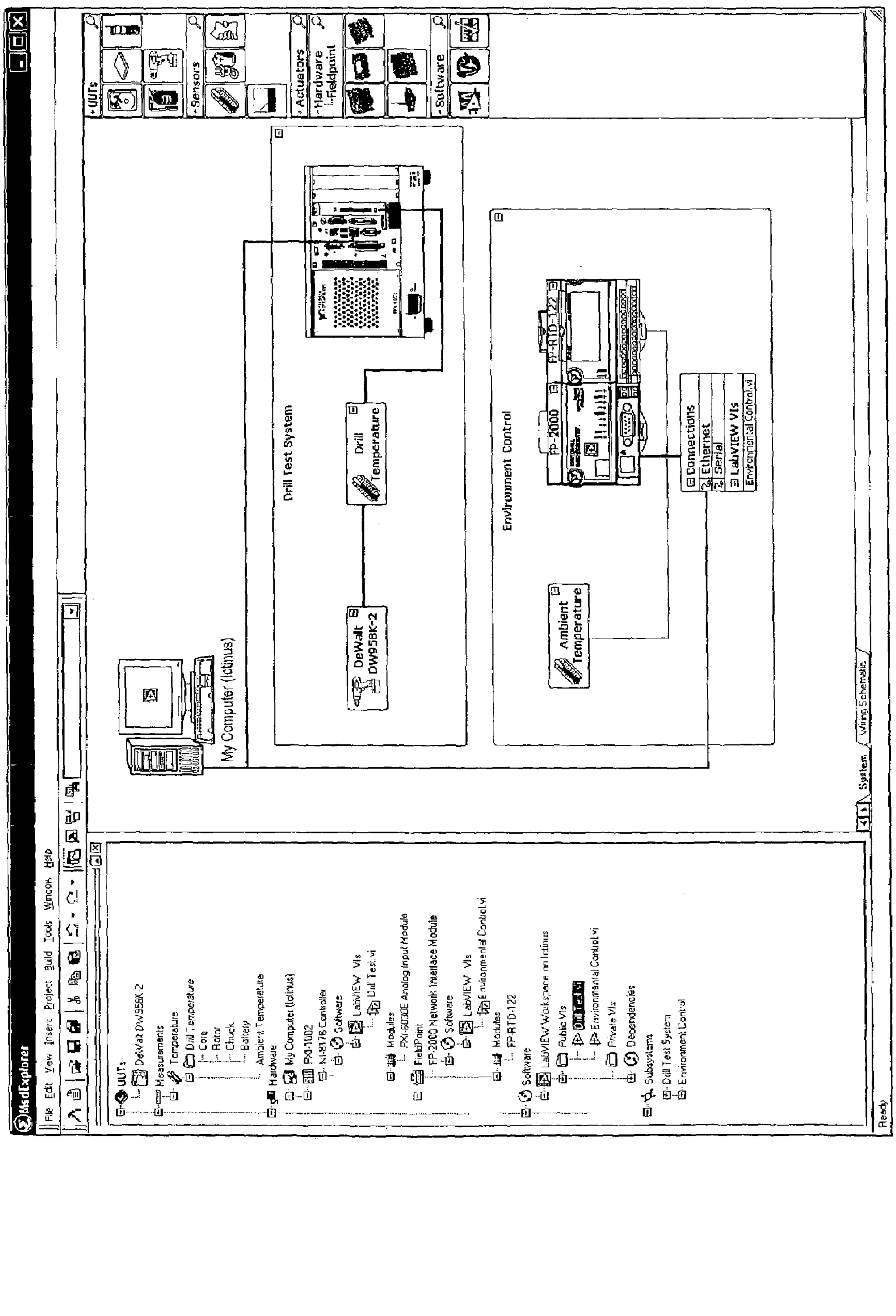
Figure 107:
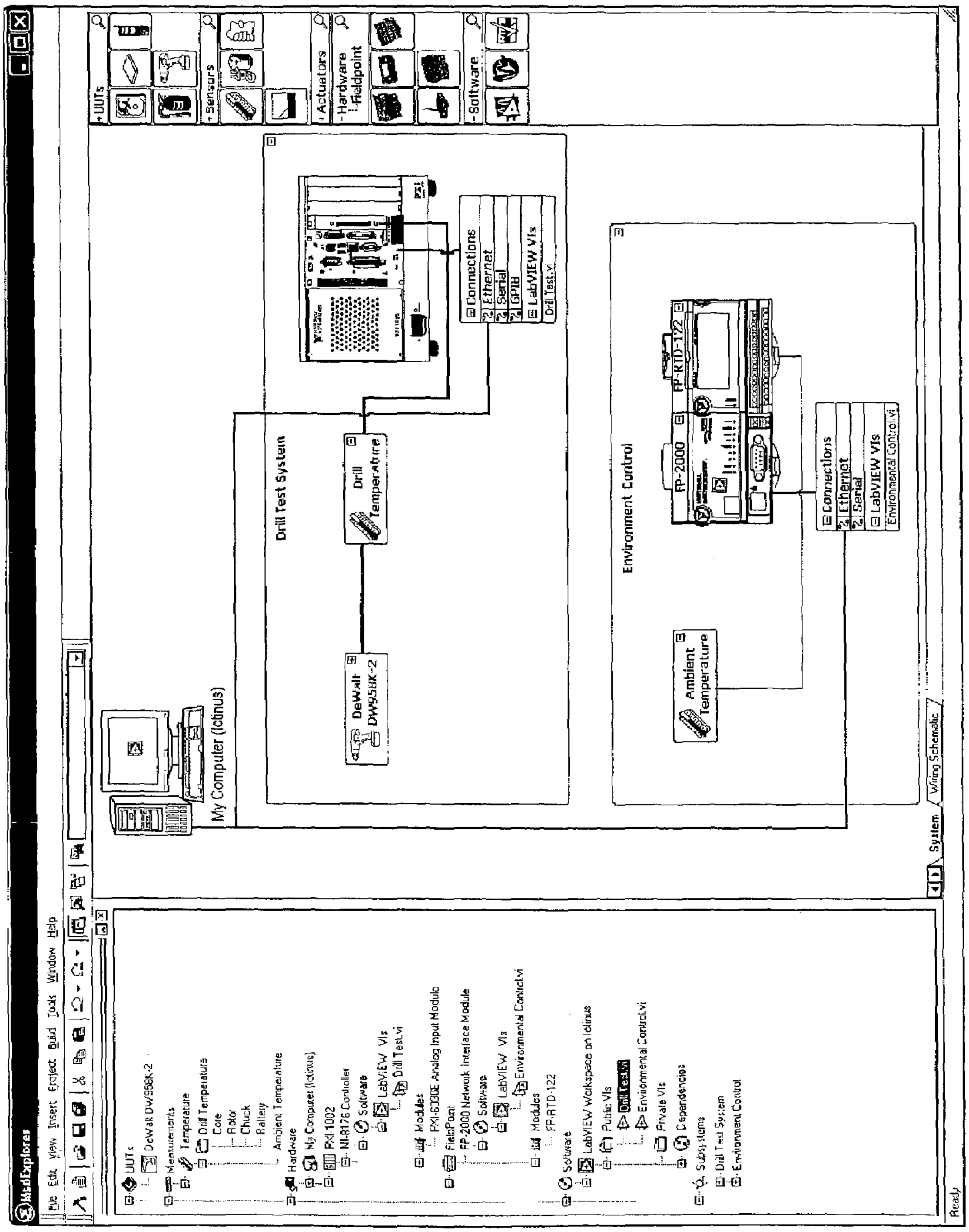

Referring now to FIG. 106, the system view of the measurement system is illustrated once again. As shown, a LabVIEW glyph has now been superimposed on the PXI controller to indicate that the PXI controller executes a LabVIEW graphical program, i.e., the "Drill Test.vi" VI. The user may then expand the PXI controller to display a hardware dongle visually indicating functionality of the PXI controller, as shown in FIG. 107. The hardware dongle illustrates the LabVIEW graphical program associated with the PXI controller, as well as functionality of the PXI controller related to connectivity to other devices.

Figure 108:
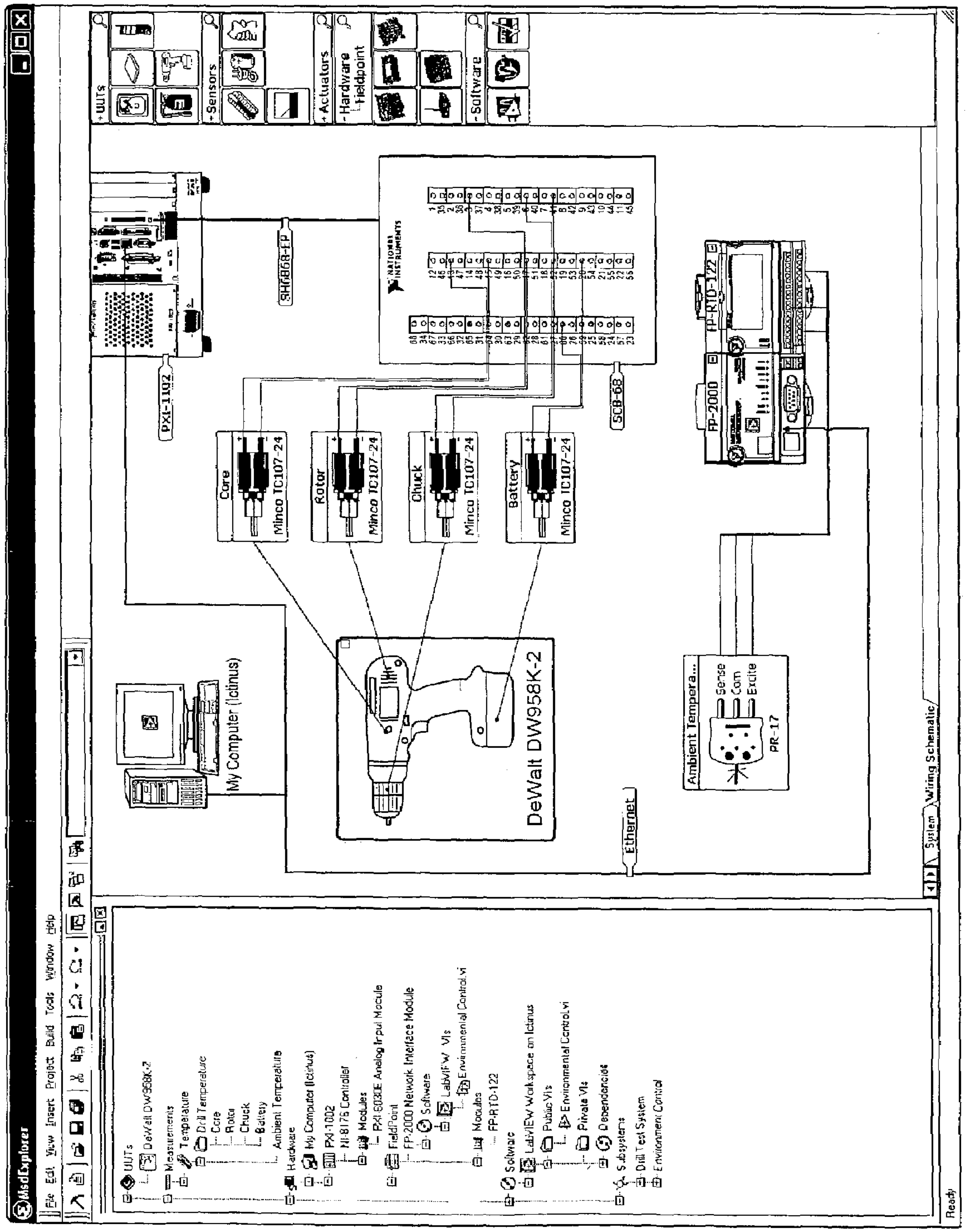

FIG. 108 illustrates a wiring schematic view for the measurement system. An Ethernet cable connecting the "My Computer (lctinus)" computer system to the PXI controller is now shown, since the user previously specified this connection, as described above.

At this point in the example under discussion, we assume that the measurement system under design is once again in the state shown in FIG. 66, i.e., before the user has created any software elements or performed the other actions described with reference to FIGS. 67-108. As shown in FIG. 66, the Drill Test subsystem and the Environment Control subsystem have each been collapsed into a single icon. The user may now wish to expand the Drill Test subsystem.

Figure 109:
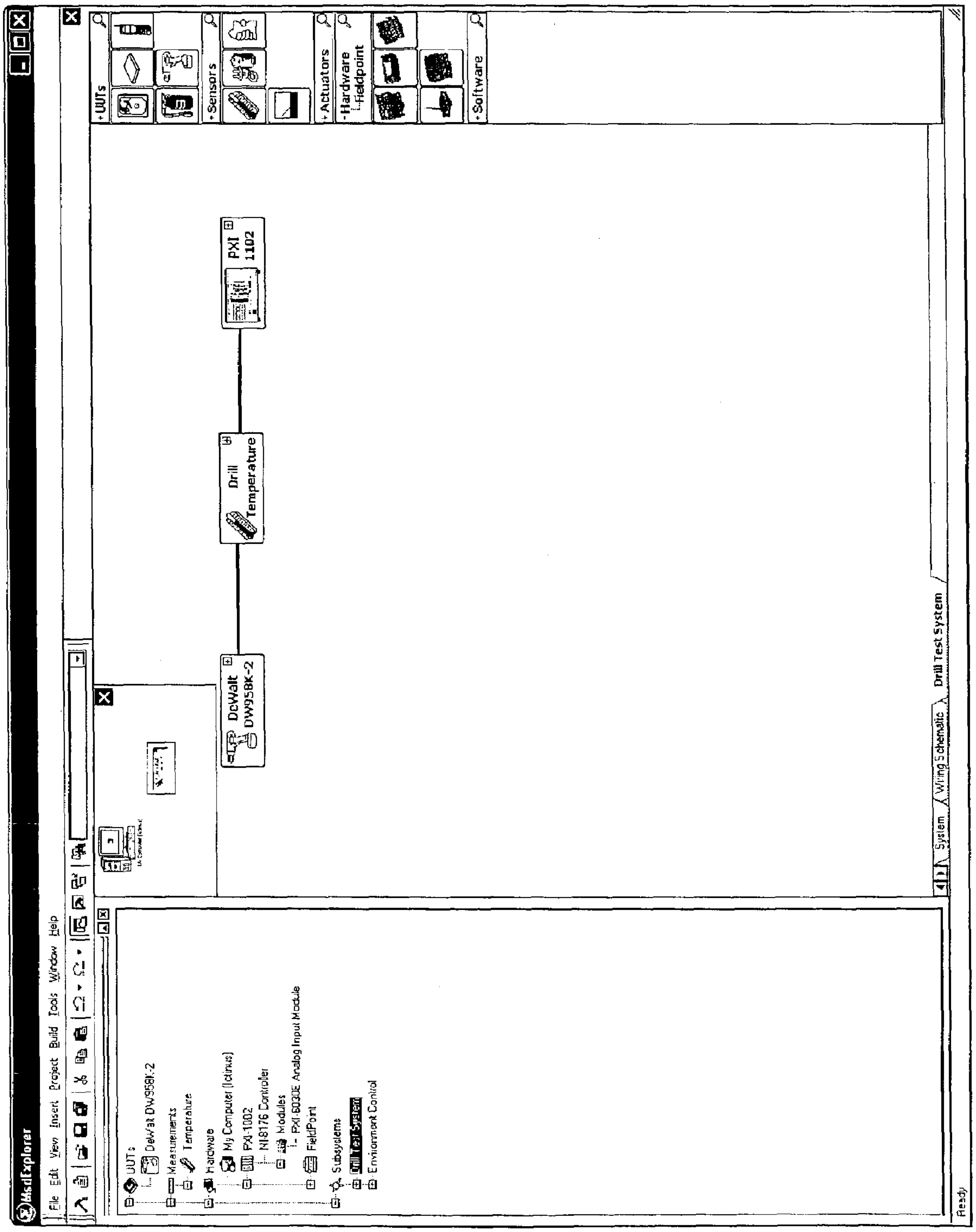

FIG. 109 illustrates another feature supported by one embodiment of the MSD environment. FIG. 109 illustrates a "radar view" of the measurement system, located within the rectangle at the upper left corner of the diagram. This radar view displays a "zoomed out" view of the measurement system, i.e., displays the entire measurement system diagram. Only the components of the Drill Test subsystem are displayed at full size within the main portion of the diagram. This may allow the user to concentrate only on the portion of the measurement system in which he is currently interested, i.e., the Drill Test subsystem in this case. Within the small radar view, the portion of the measurement system which is currently displayed at full size, i.e., the Drill Test subsystem, is surrounded or highlighted by a gray box. This allows the user to easily identify where the currently displayed components fit into the measurement system as a whole. In one embodiment, the user may also utilize the small radar view to quickly navigate between various portions of the measurement system. For example, the user may click on a position within the radar view that he desired to "zoom in" to or view at full size, or the user may re-position the gray box to surround a portion of the measurement system which he desires to zoom in to.

In one embodiment, the MSD environment may be operable to scale the display size of the component icons so that the user can see as much or as little of the measurement system within the main portion of the diagram as he desires. For example, the user may be able increase the size of the gray box within the radar view to surround a large portion of the measurement system. In response, the MSD environment may display the selected portion of the measurement system within the main portion of the diagram. To do so, however, it may be necessary for the MSD environment to decrease the display size of the component icons so that the entire selected portion of the measurement system can be shown at once.

Figure 110:
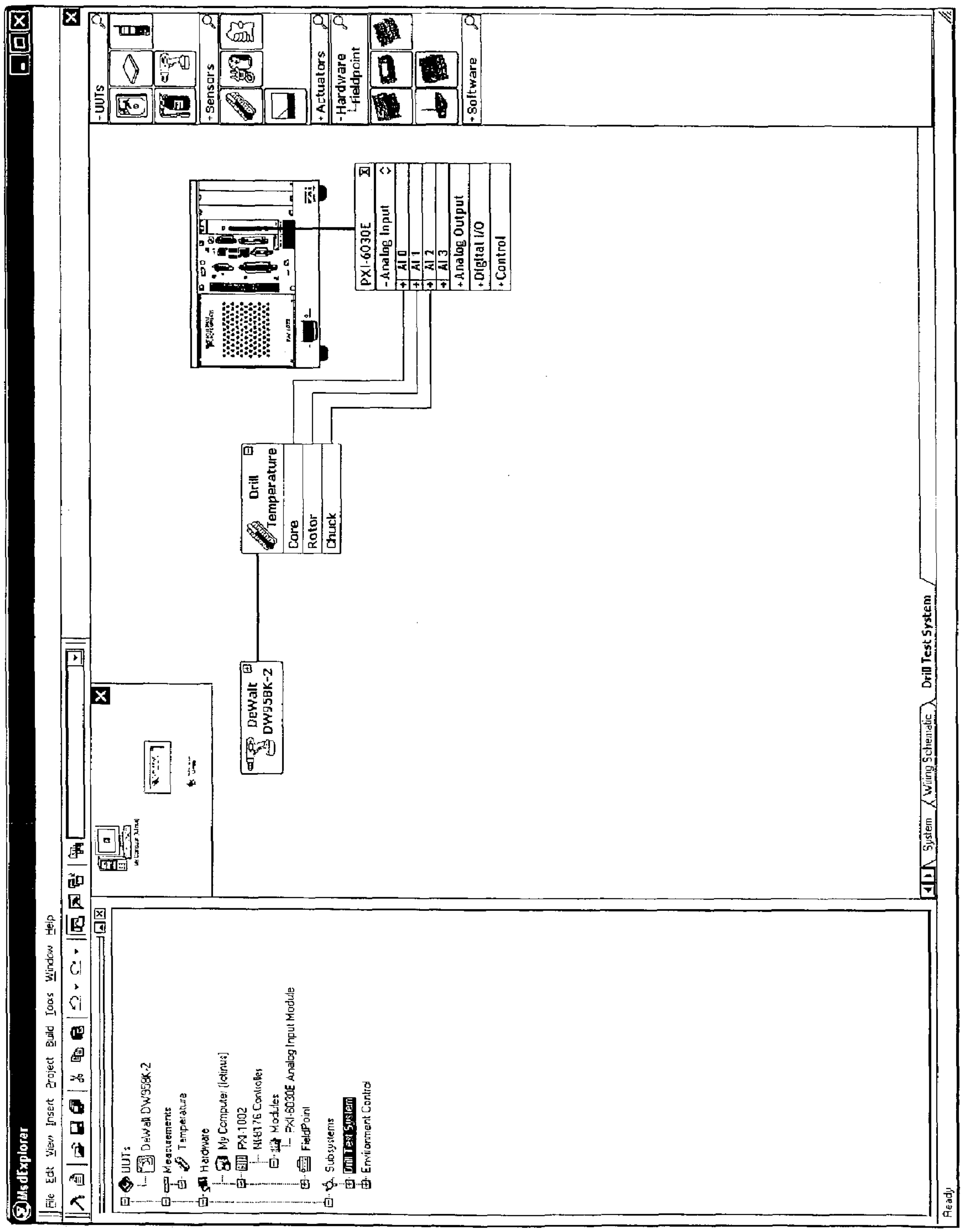

FIG. 110 illustrates the state of the MSD environment workspace after the user has expanded the PXI chassis and expanded the PXI module within the chassis to display a hardware dongle indicating functionality of the PXI module. The "Analog Input" field of the hardware dongle has also been expanded to display analog input channels. The user has also expanded the "Drill Temperature" measurements icon to display the "Core", "Rotor", and "Chuck" temperature measurements. The connections from these measurements to their respective analog input channels on the PXI module are also shown.

Figure 111:
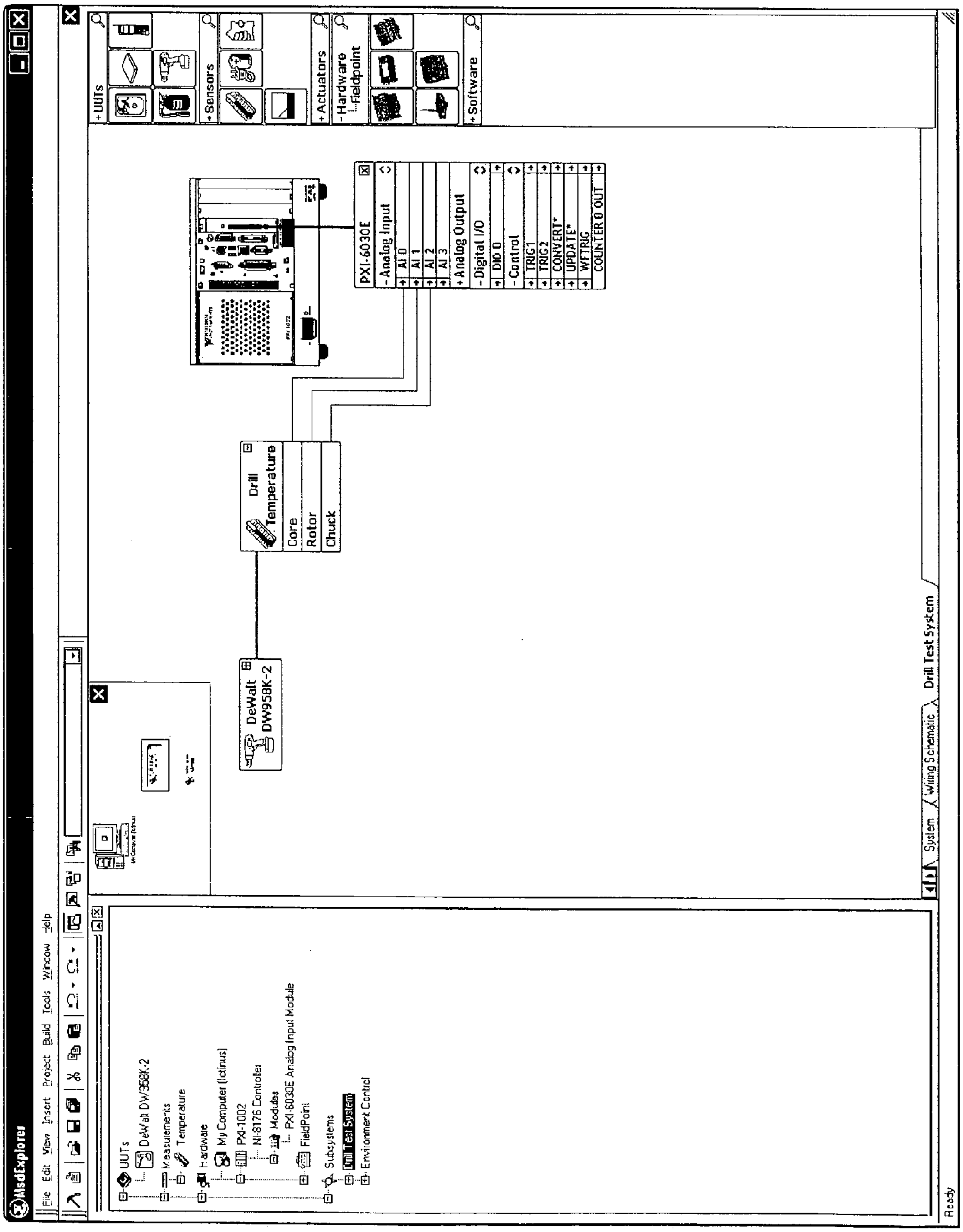
Figure 112:
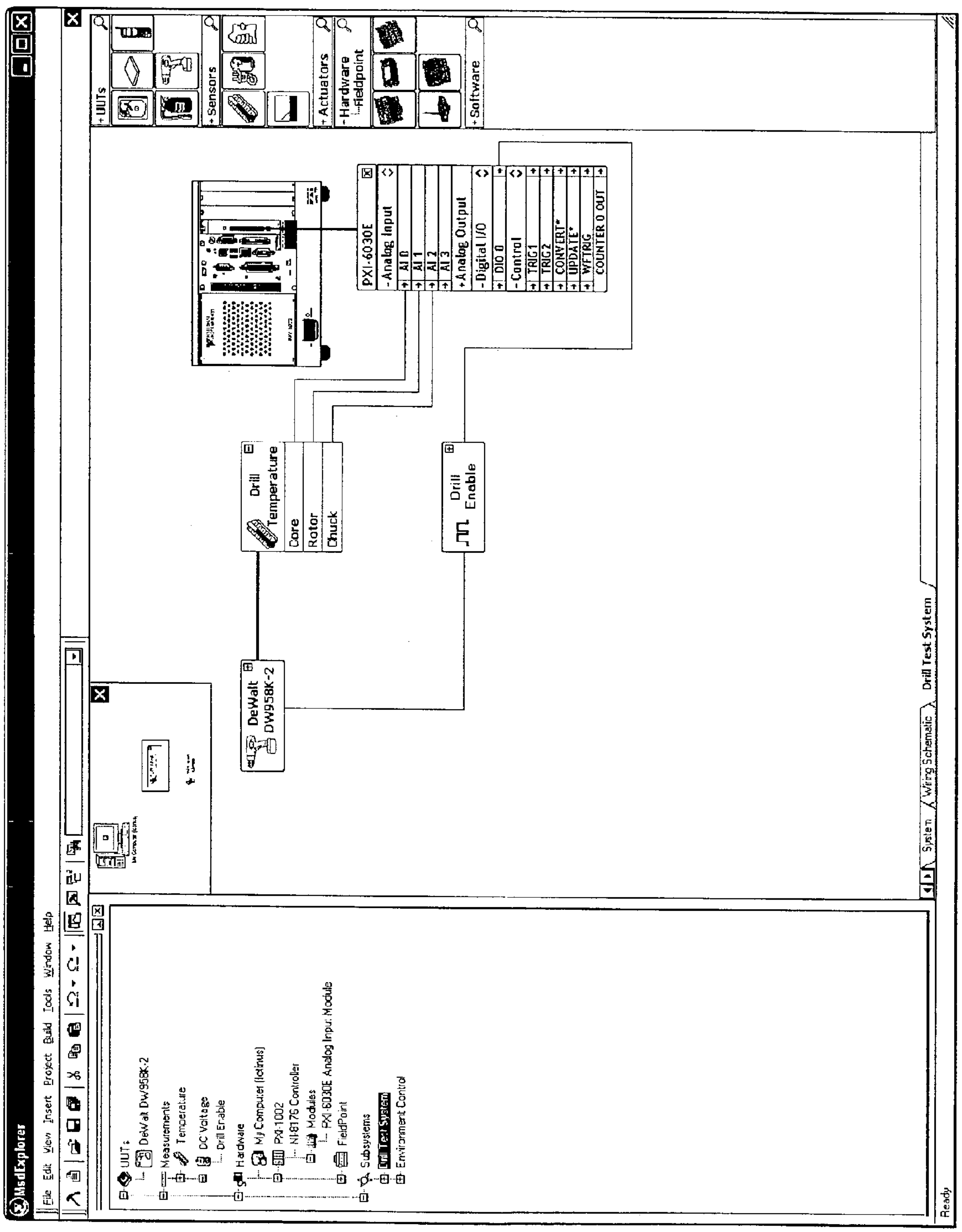

The user may also desire to stimulate the drill unit under test (UUT) through a pulse train. Thus, the user may expand the "Digital I/O" and "Control" fields of the hardware dongle for the PXI module, as shown in FIG. 111. The MSD Environment may enable the user to add a "Drill Enable" signal from the "DIO 0" digital channel to the drill UUT, as shown in FIG. 112. The tree view on the left side of the MSD environment workspace in FIG. 112 also illustrates that a "DC Voltage" category and a "Drill Enable" item have been added under the "Measurements" category.

Figure 113:
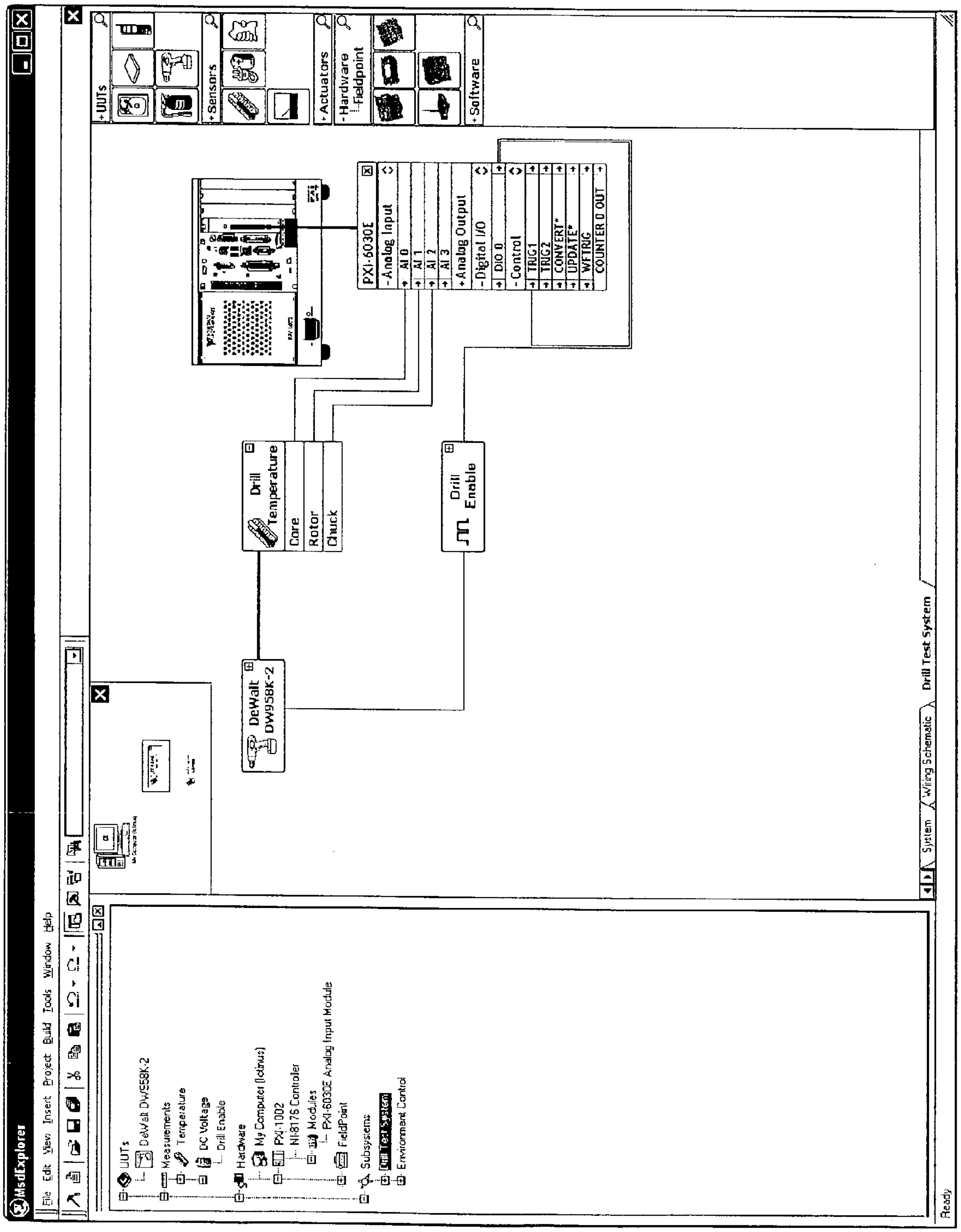

The user may desire to use the same line being used to stimulate the drill UUT to drive other components as well. Thus, for example, the user may wire the "Drill Enable" signal wire to the "TRIG 1" trigger indicated in the "Control" field of the hardware dongle for the PXI module, as illustrated in FIG. 113. In a case where the user attempts to connect a wire which could either be cabled by the connector block or routed internally, the MSD environment may prompt the user with information indicating the relative benefits of each of these choices and may enable the user to choose which option to use. In the FIG. 113 example, the user has selected to route the signal internally. This is indicated by a different color (blue) for the wire to the "TRIG 1" trigger.

Figure 114:
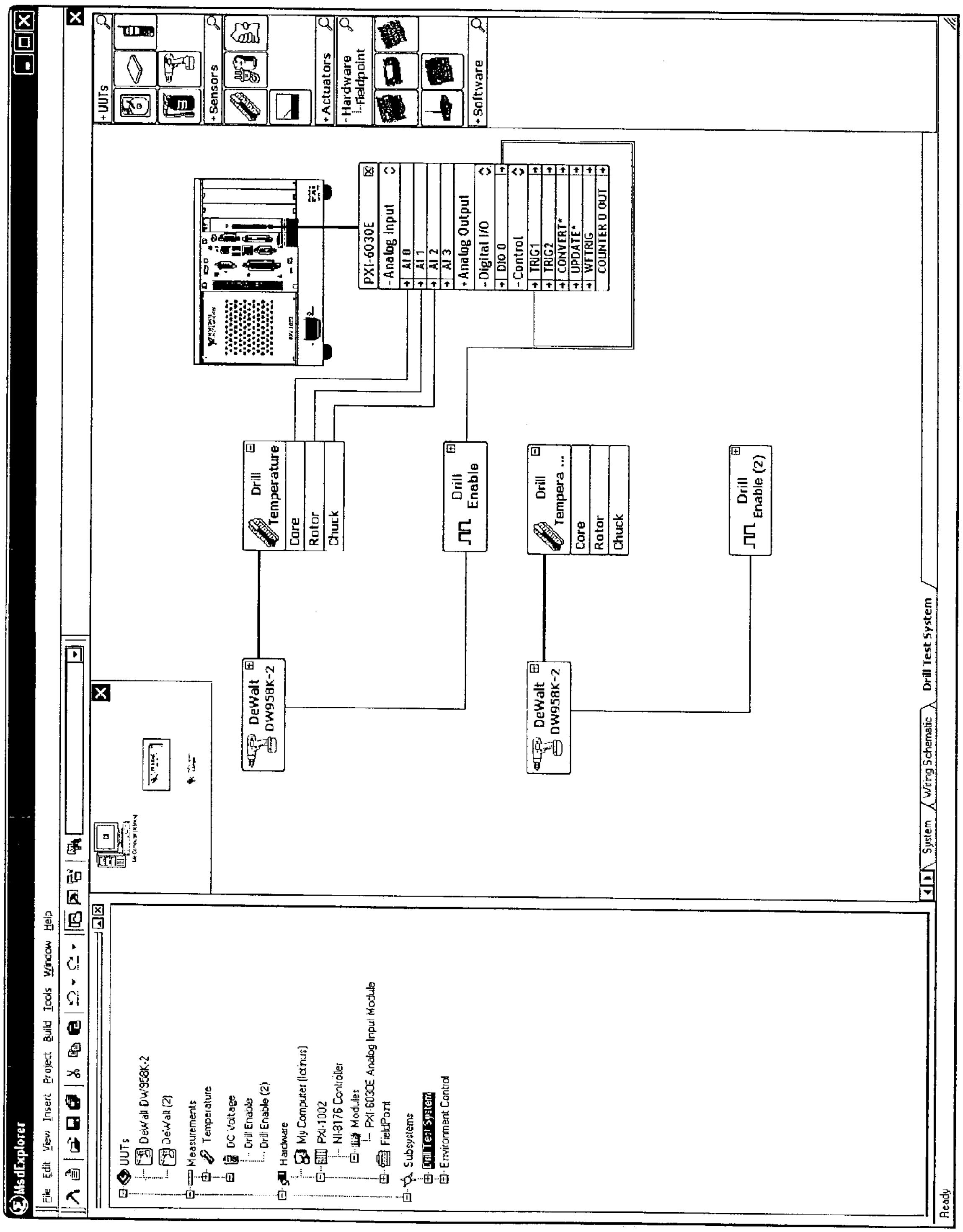
Figure 115:
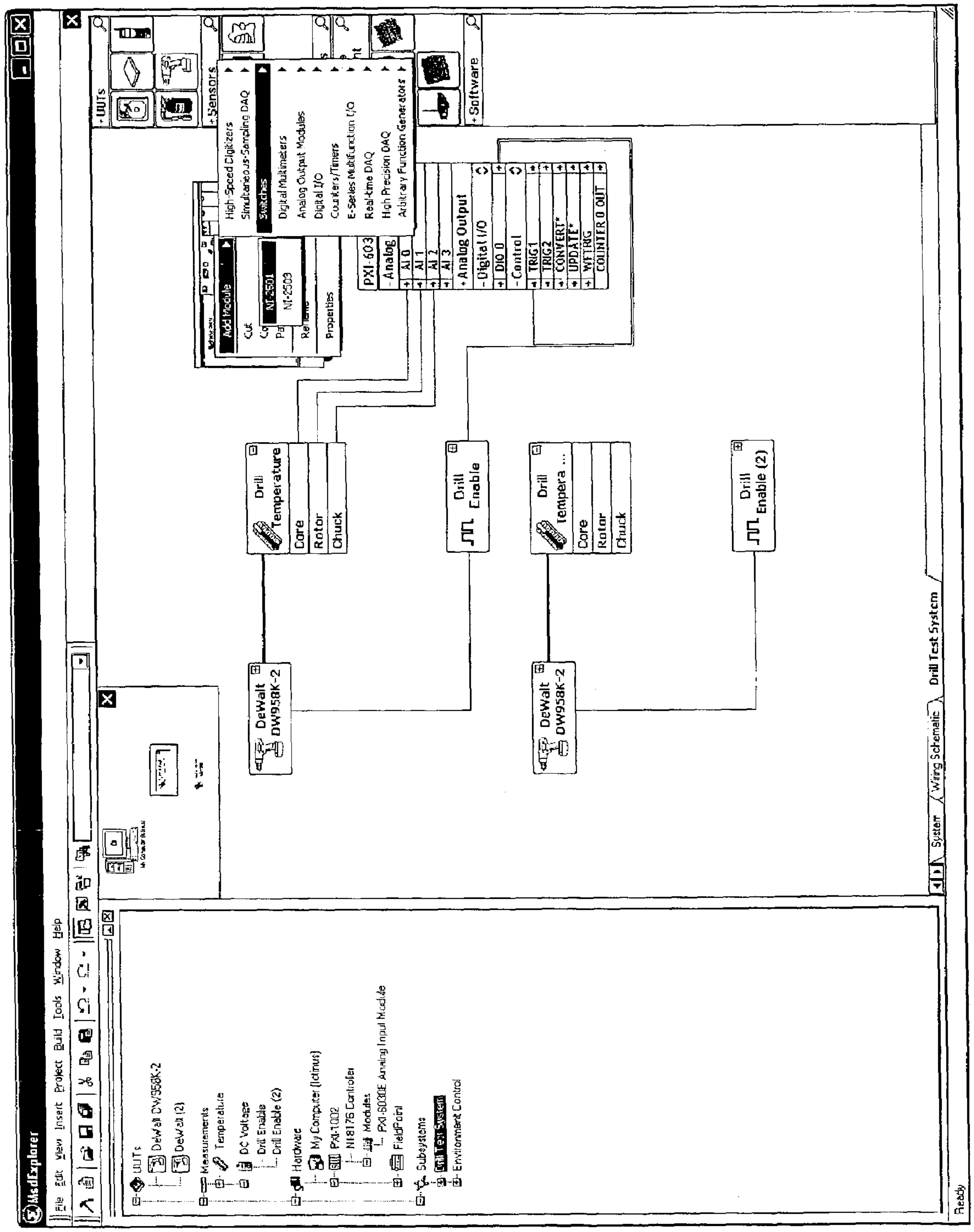
Figure 116:
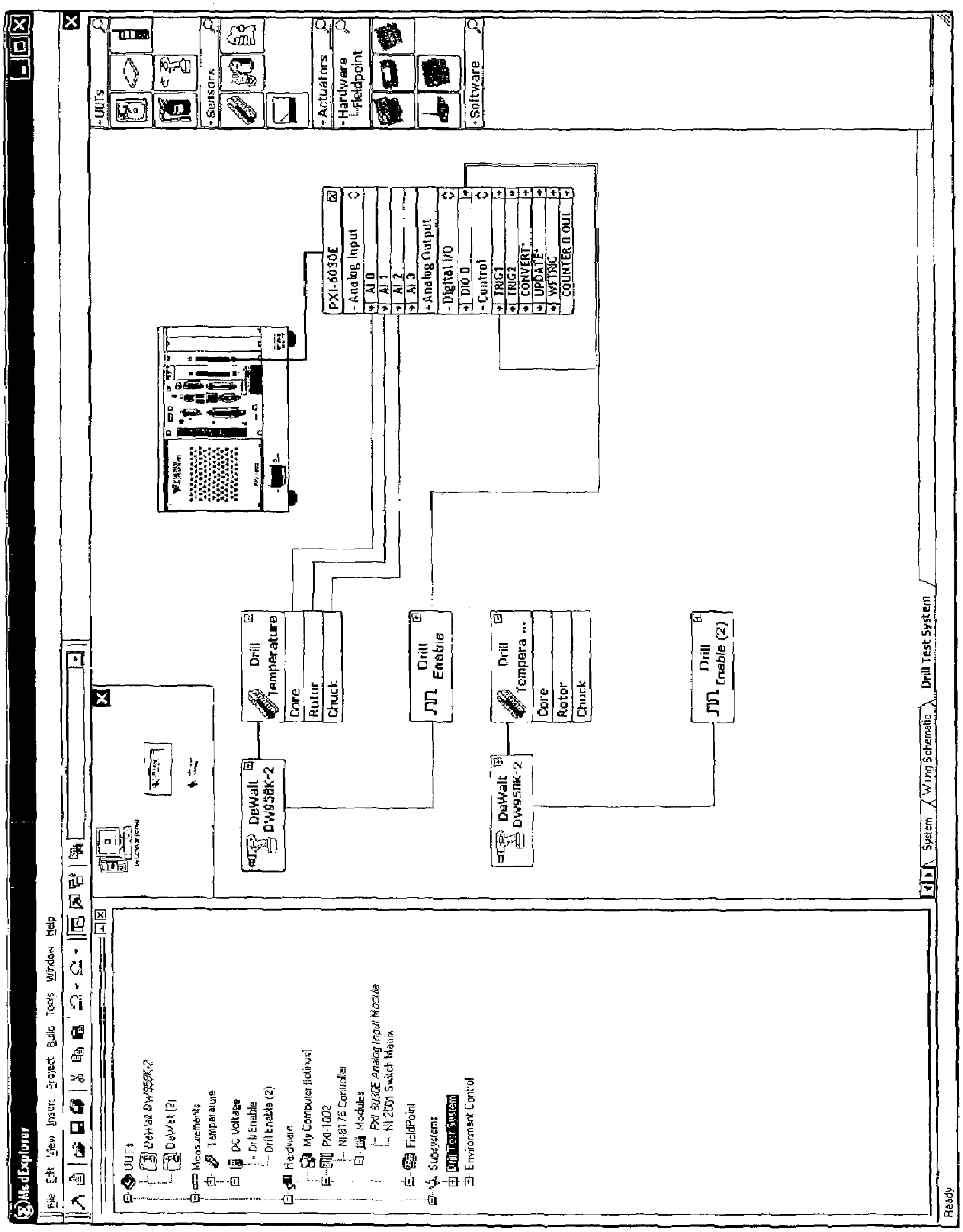
Figure 117:
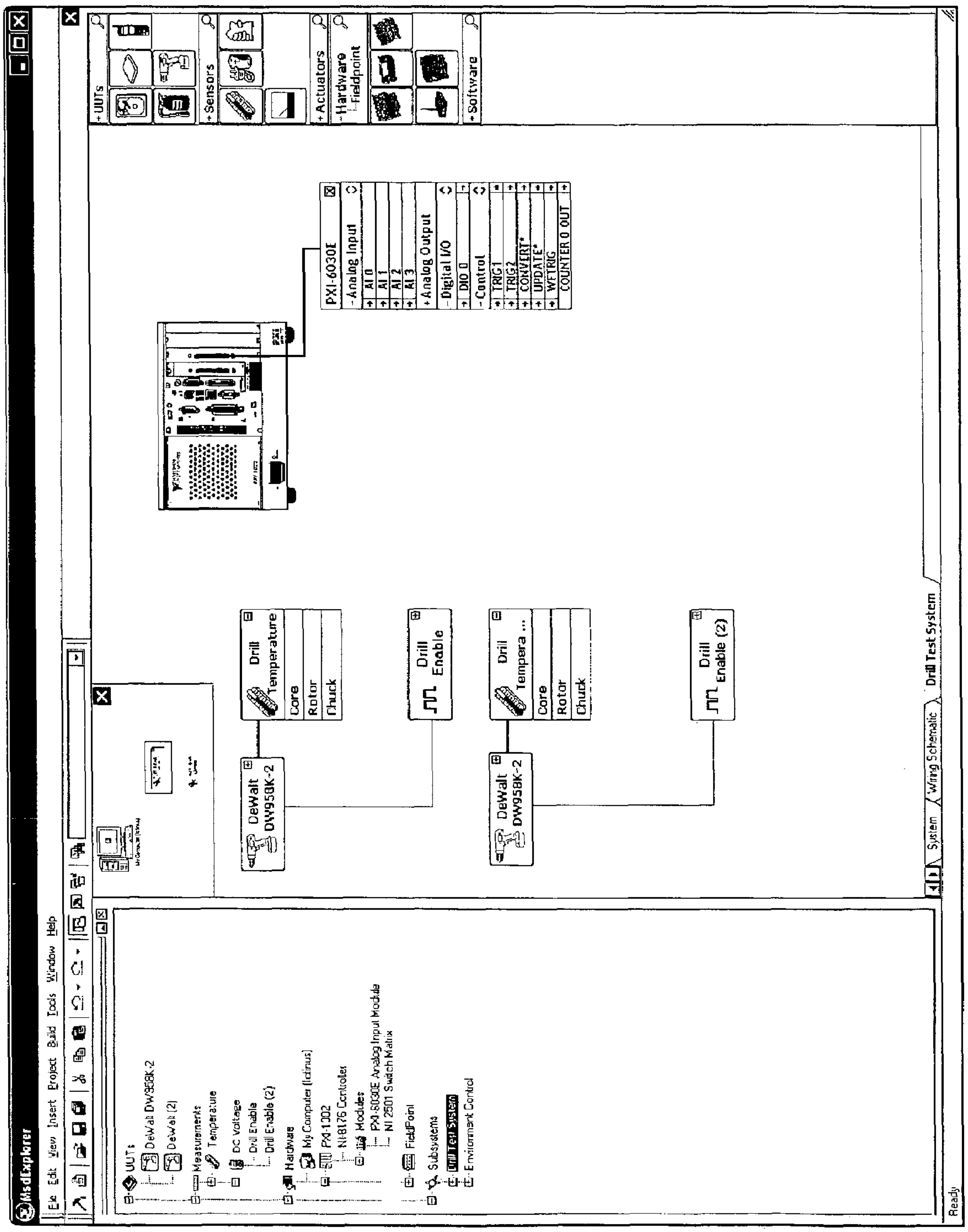

In some cases the user may have a multi-head test system, e.g., for testing multiple UUT's. As shown in FIG. 114, the user may create a copy of the drill UUT, the measurements, and the enabling signal. The user may wish to utilize a switch device for performing a switched operation in which each of the drill UUT's can be measured one at a time. FIG. 115 illustrates a popup context menu the user may use to add a switch module to the PXI chassis. FIG. 116 illustrates an updated icon for the PXI chassis, showing the new switch module which the user added. Since the PXI I/O module may be connected to the sensors via the switch device, the user may delete the direct connections he previously created between the PXI I/O module and the measurements, as shown in FIG. 117.

Figure 118:
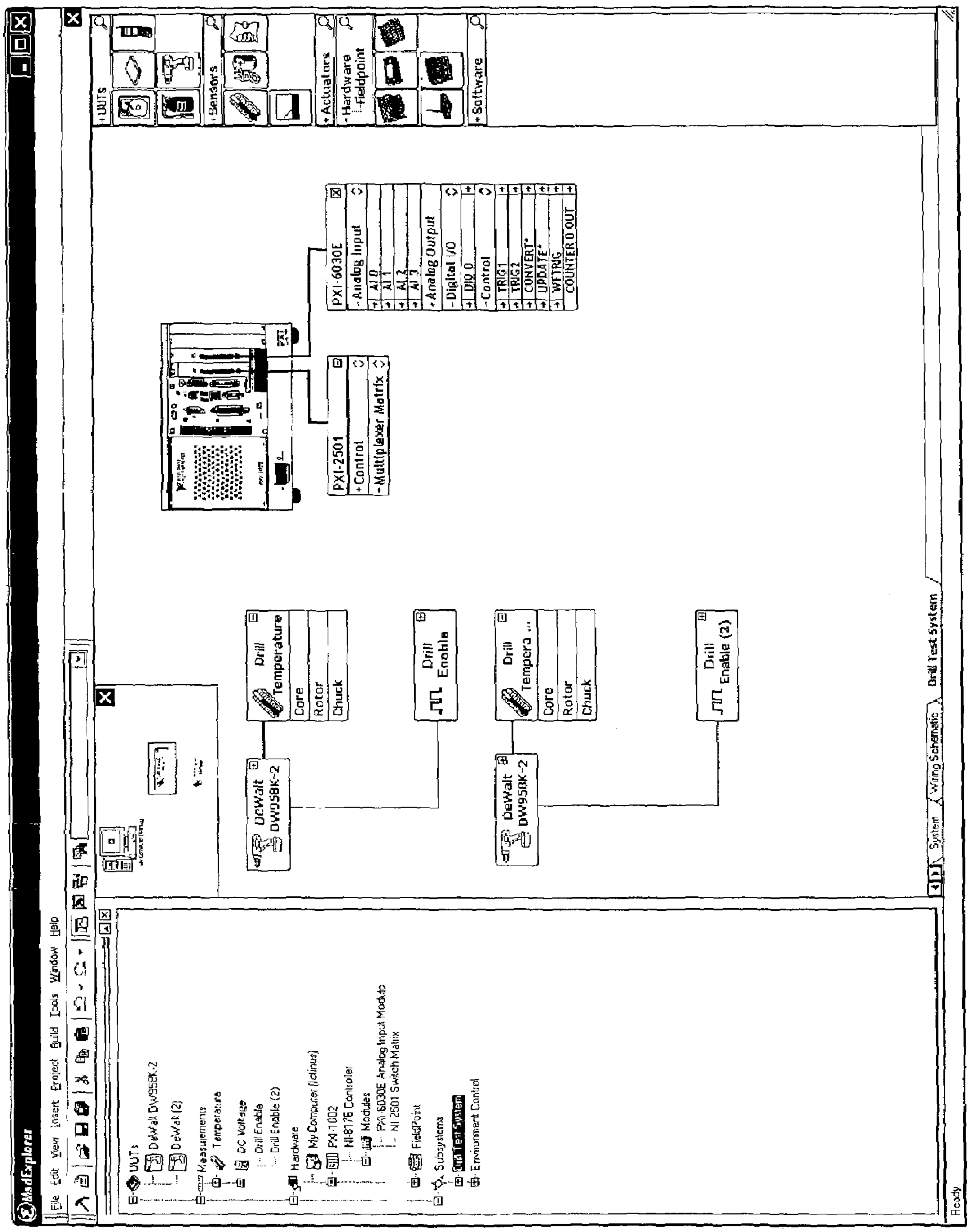
Figure 119:
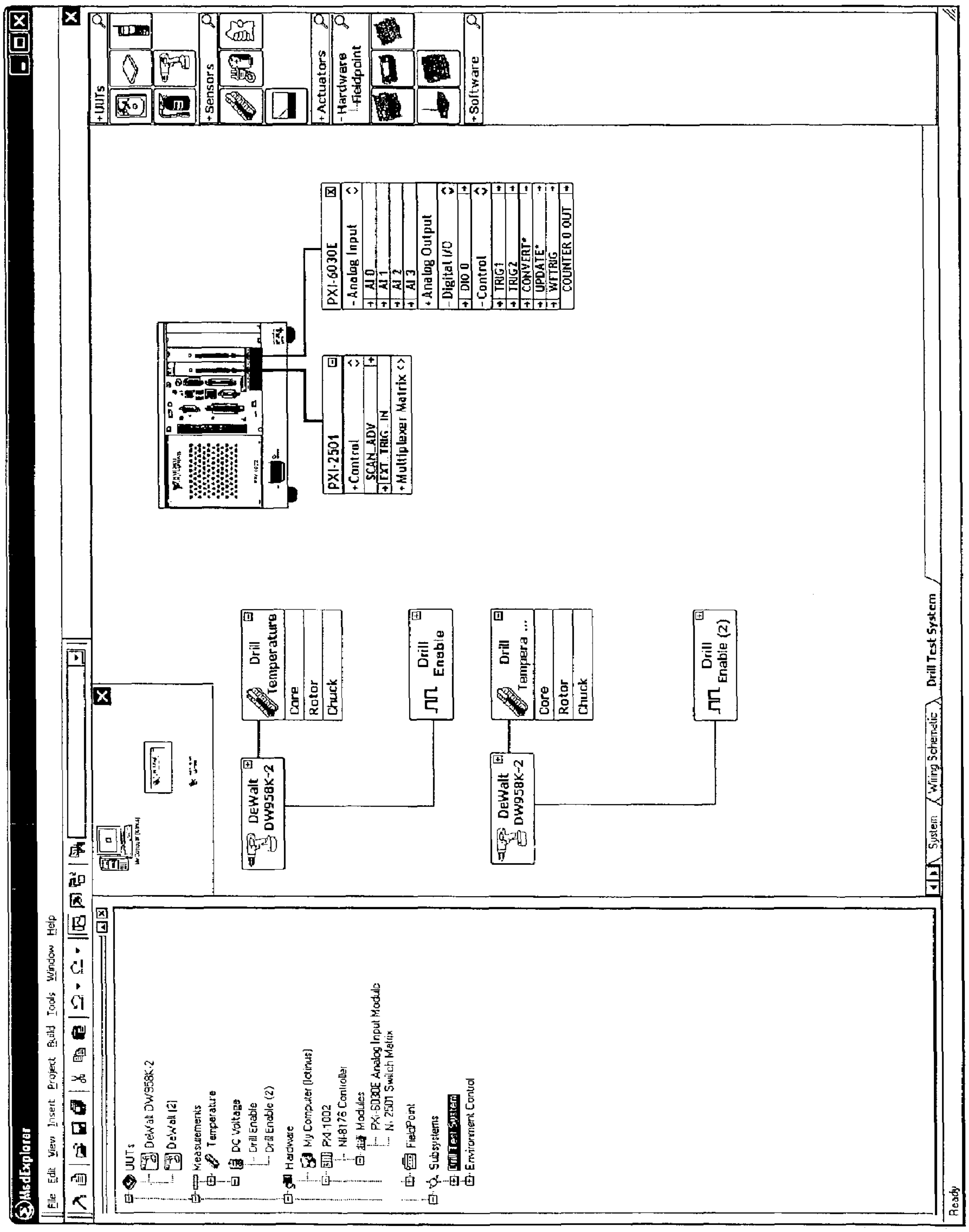

Similarly as described above, the user may expand the switch module to display a hardware dongle icon visually indicating functionality of the switch module, as illustrated in FIG. 118. The user may expand the "Control" field of the hardware dongle to view the control lines of the switch module, as illustrated in FIG. 119. The "SCAN_ADV" (scan advance) line is a digital line that is pulsed whenever a configuration operation is completed.

Figure 120:
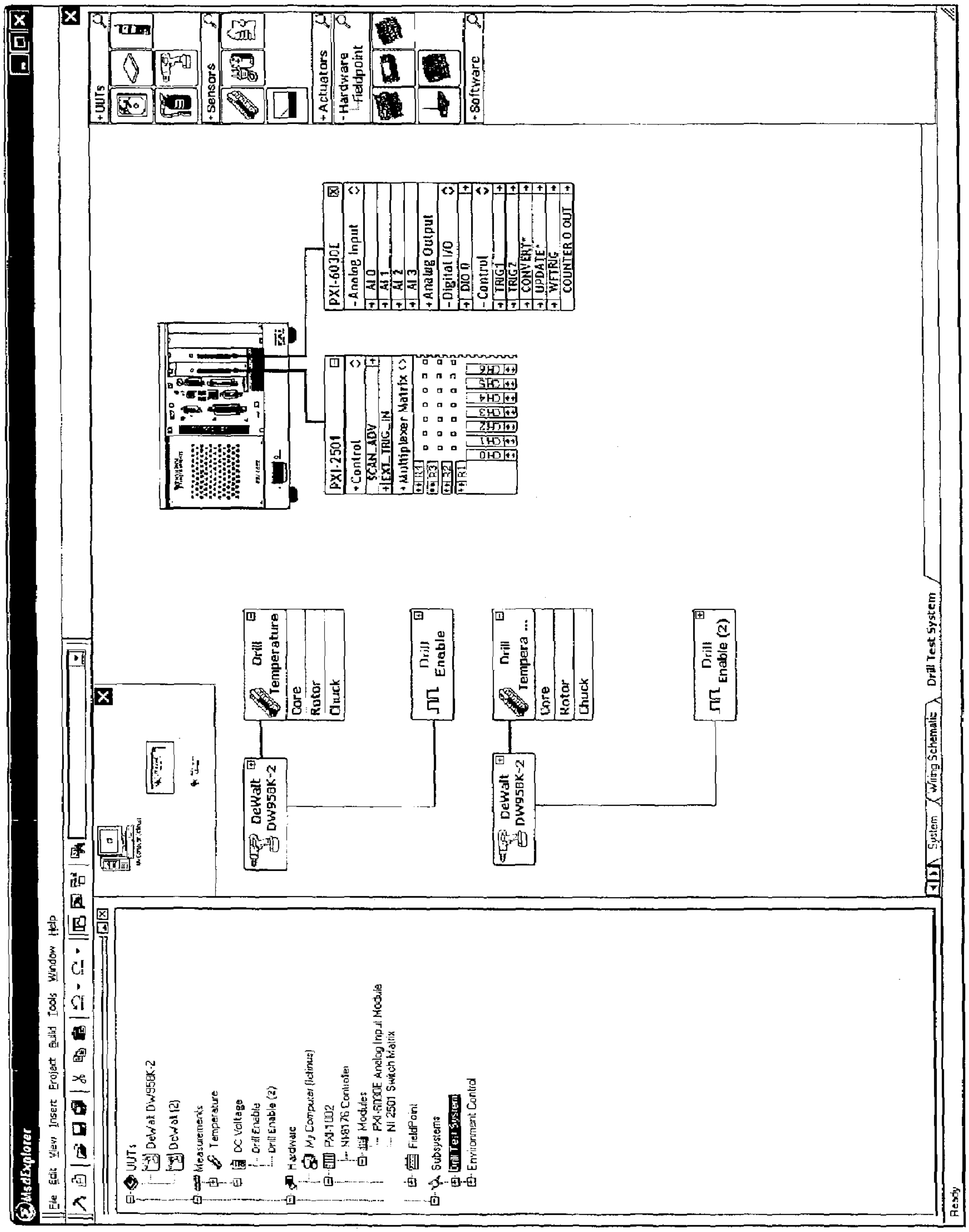
Figure 121:
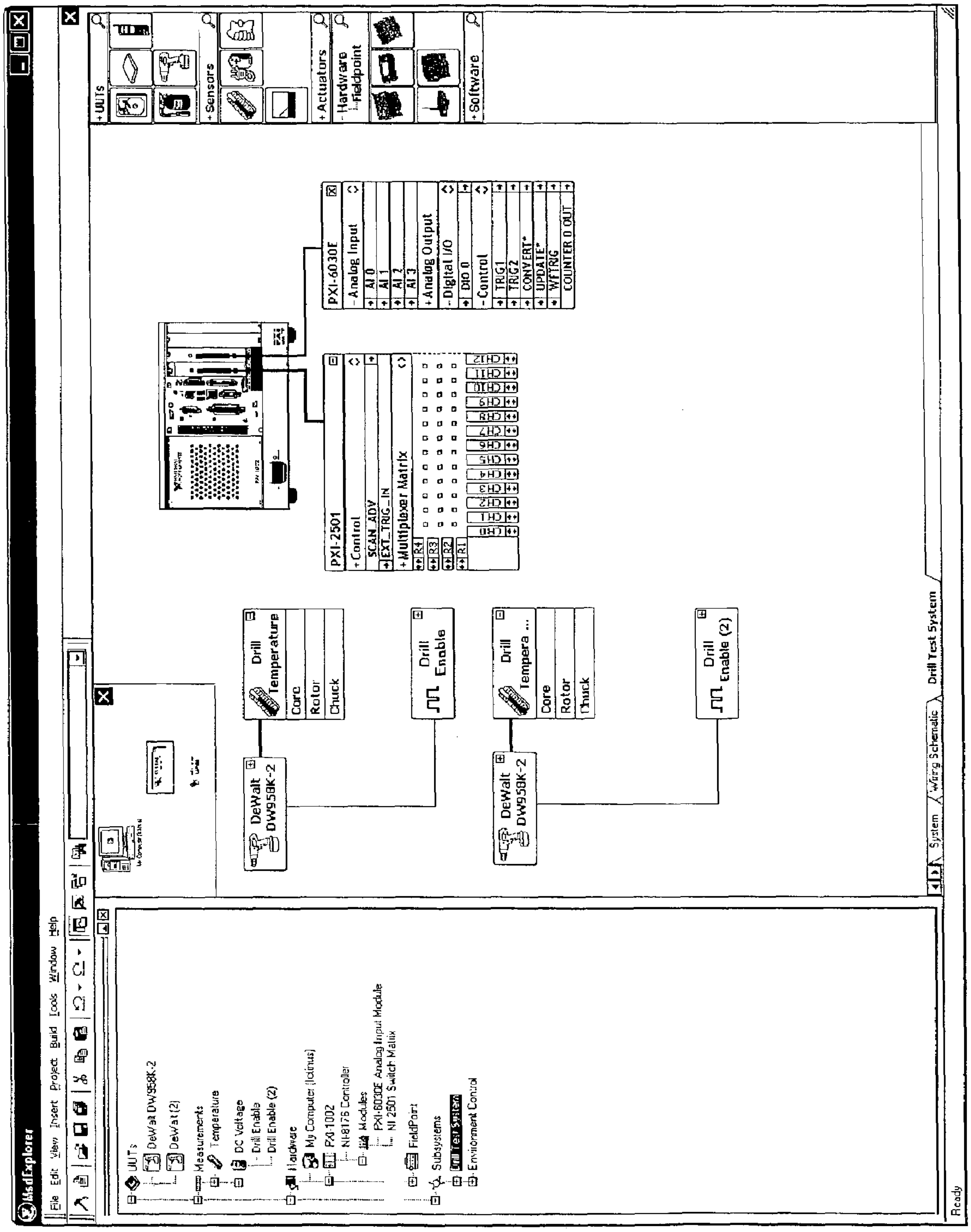

The user can also expand the "Multiplexer Matrix" field, as shown in FIG. 120. In this case a subset of the available functionality for the matrix is displayed. In a multiplexer matrix, the lines are bi-directional. The two arrows pictured beside each line indicate the two different directions available. As shown in FIG. 121, the user can further expand the multiplexer matrix to see additional channels of the switch device, e.g., by utilizing the "< >" symbols in the "Multiplexer Matrix" heading. Even more channels may be viewed if the user desires to do so.

Figure 122:
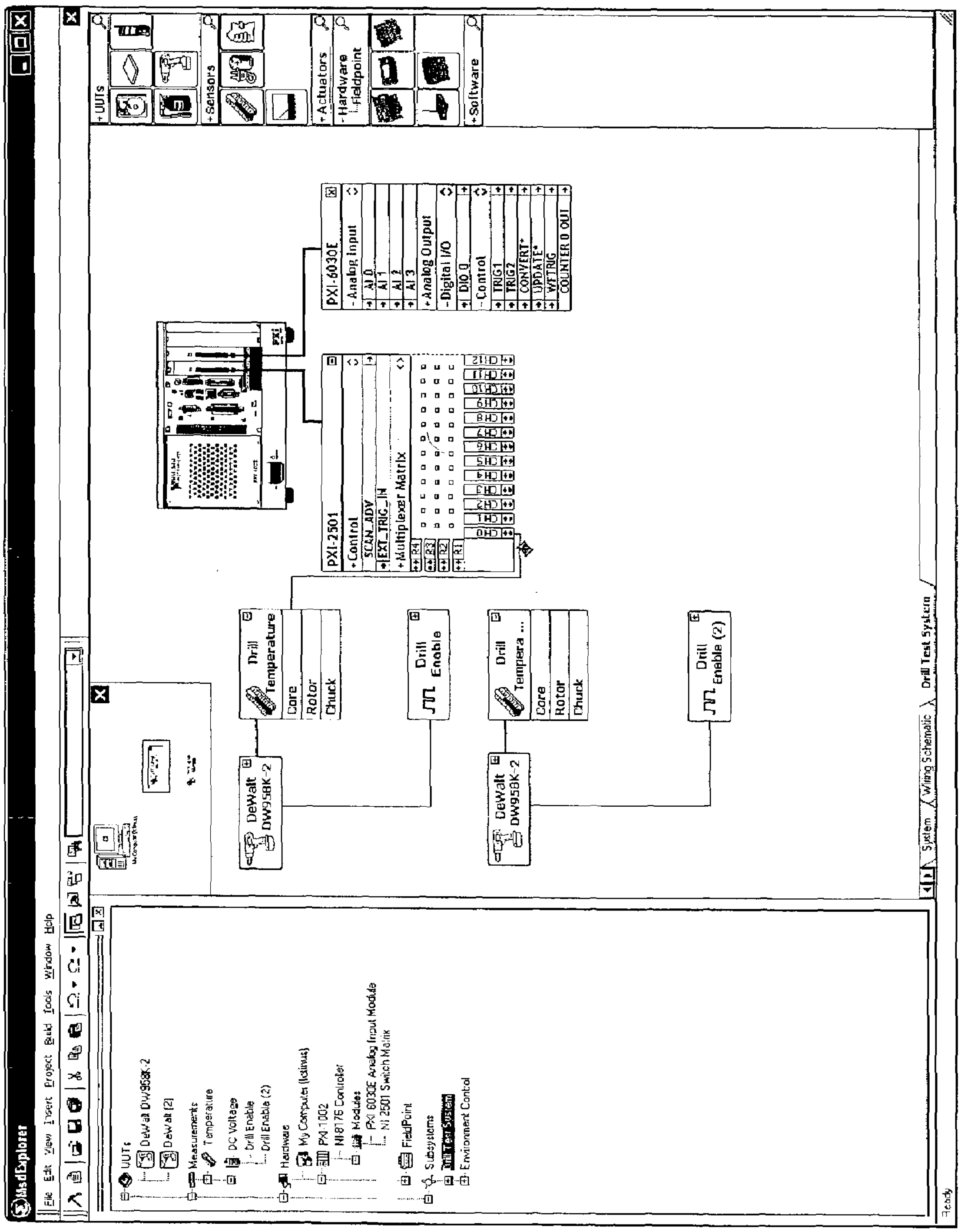
Figure 123:
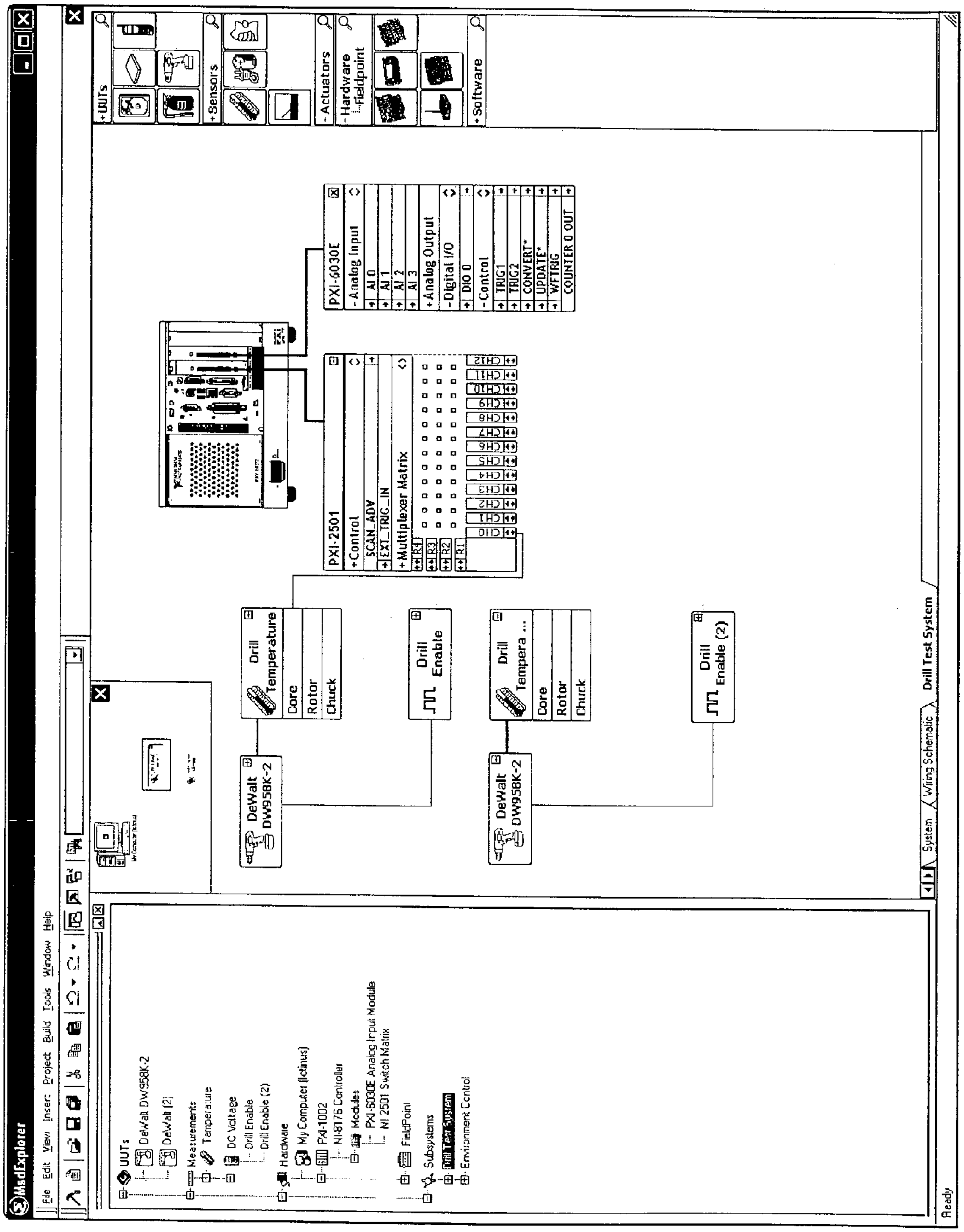
Figure 124:
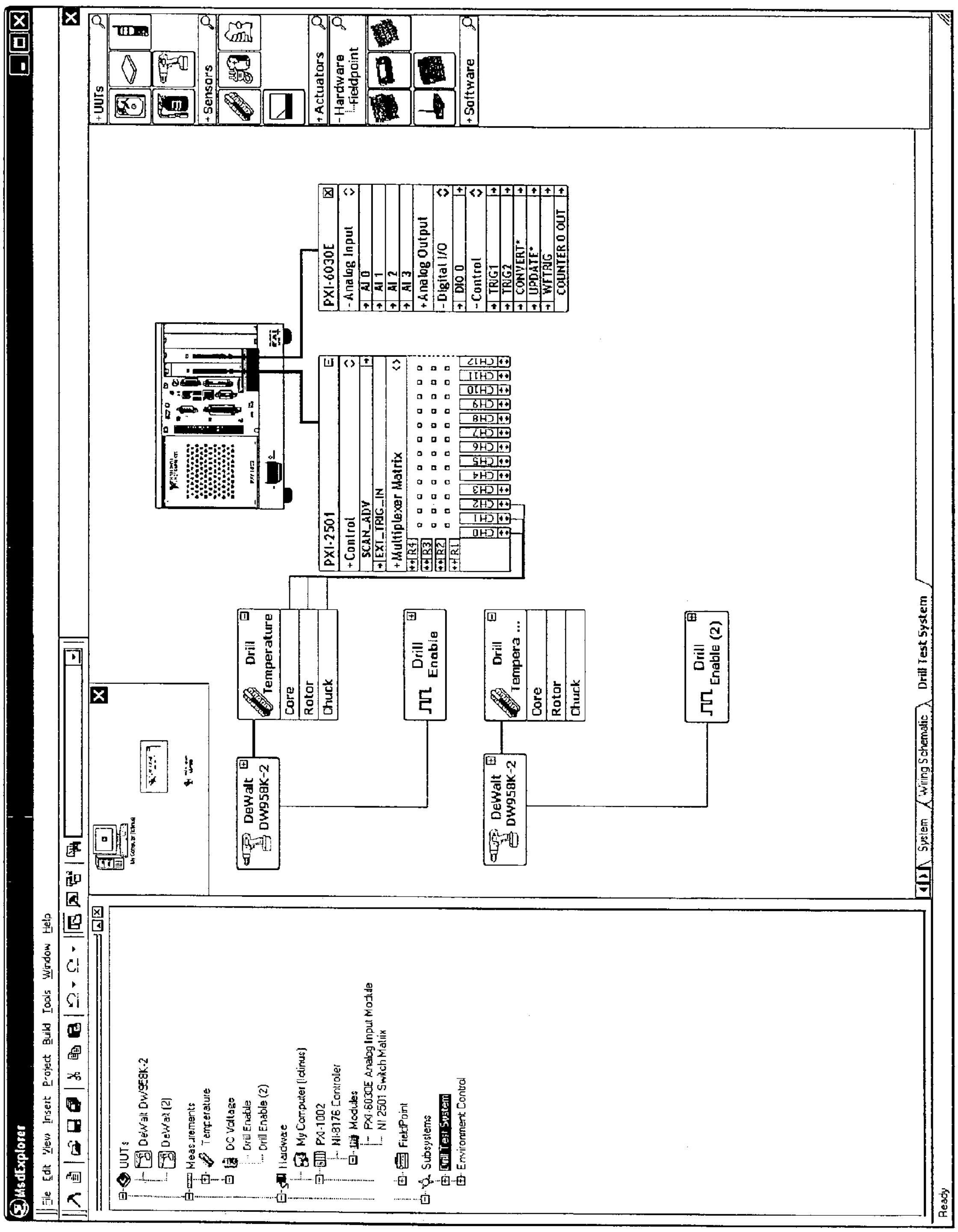

The user may now desire to wire the "Core" drill temperature measurement from the first drill UUT to channel 0, as illustrated in FIG. 122. A visual change may be caused by wiring this measurement to channel 0, such as a color change, iconic change, or other change. For example, as shown in FIG. 123, the appearance of the output arrow (i.e., the bottom arrow pointing downward) of channel 0 is changed to indicate that it is inapplicable, because channel 0 is now used for input as opposed to output. The user may similarly wire the "Rotor" and "Chuck" drill temperature measurements from the first drill UUT to channels 1 and 2 respectively, as illustrated in FIG. 124.

Figure 125:
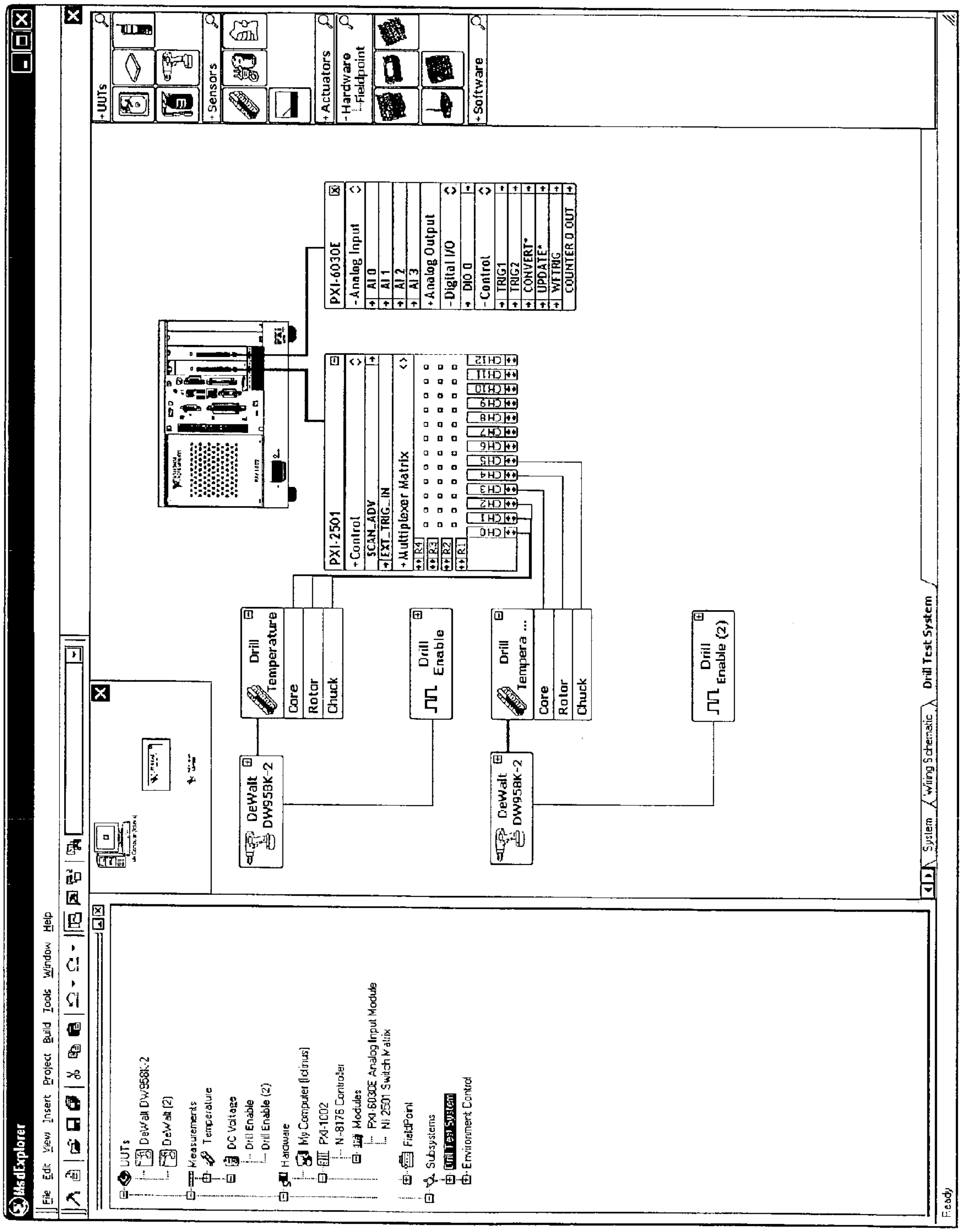

The MSD environment may also be able to auto-wire measurements to the switch device for the user. For example, the user may select all three of the drill temperature measurements from the second drill UUT and request them to be auto-wired to the switch device, resulting in the configuration illustrated in FIG. 125.

Figure 126:
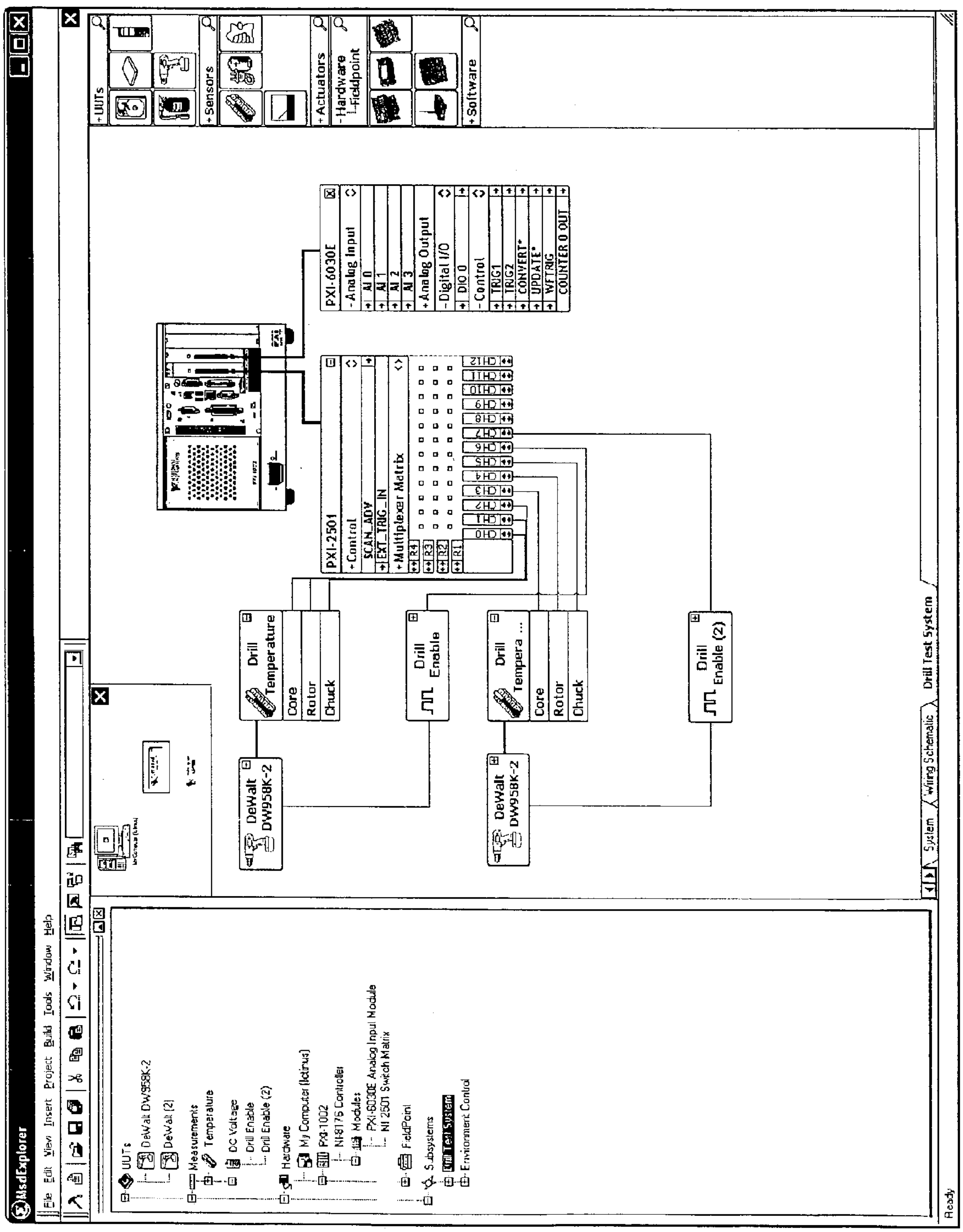
Figure 127:
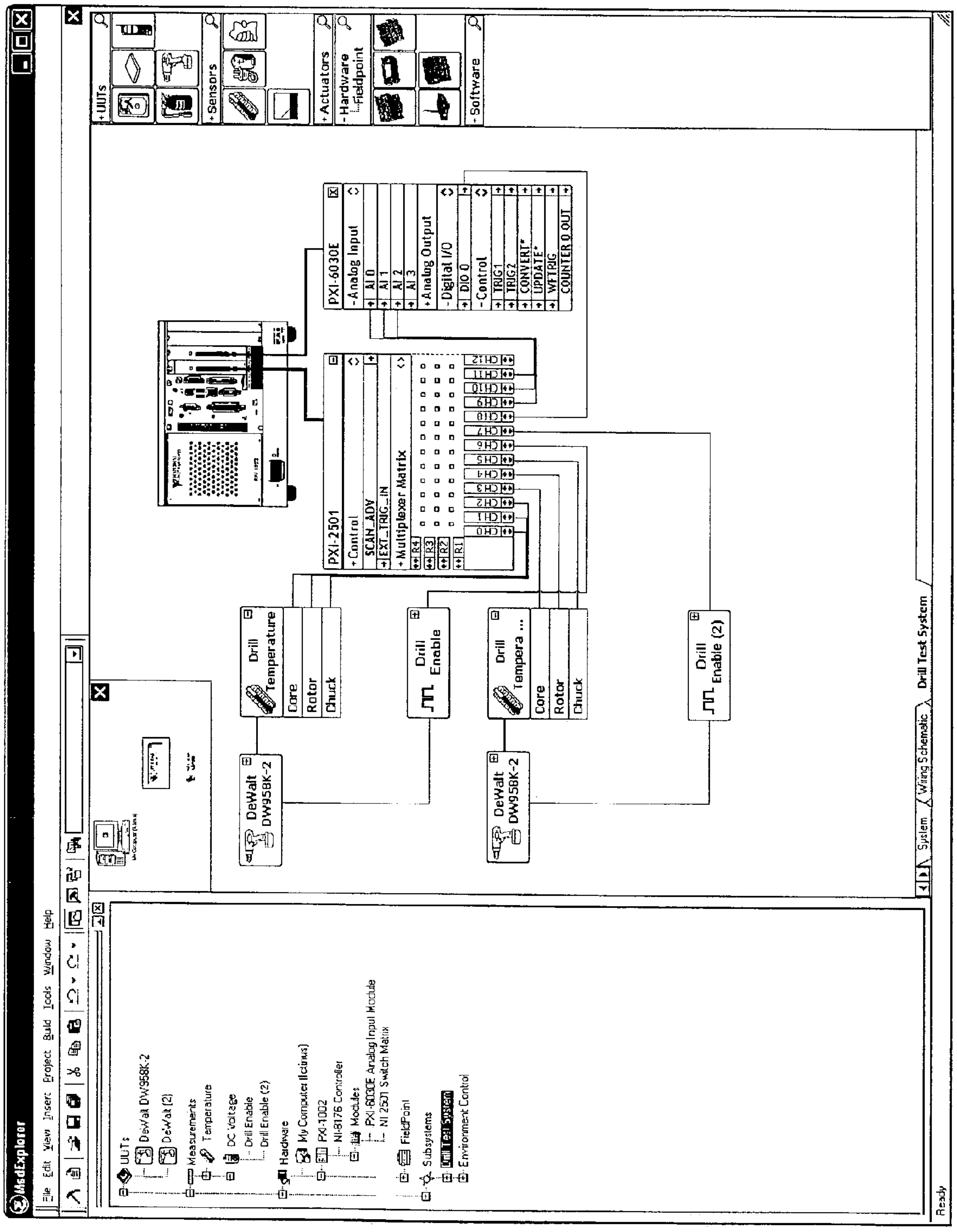

Drill enable output signals may also need to be connected from the switch device to the two "Drill Enable" icons. In FIG. 126, the user has used channels 6 and 7 of the switch device for these connections. In FIG. 126, the output arrows for channels 6 and 7 (i.e., the bottom arrows pointing downward) are colored red. This indicates that these outputs are floating. Additionally, the user may wire the "DIO 0" digital line for initiating the drill enable signals as an input to channel 8 and may connect output wires from channels 9, 10, and 11 to analog input channels of the PXI I/O module, representing each of the three measurements being made, as illustrated in FIG. 127. This may complete the wiring necessary to perform a switched operation in which each of the drill UUT's can be measured one at a time.

Figure 128:
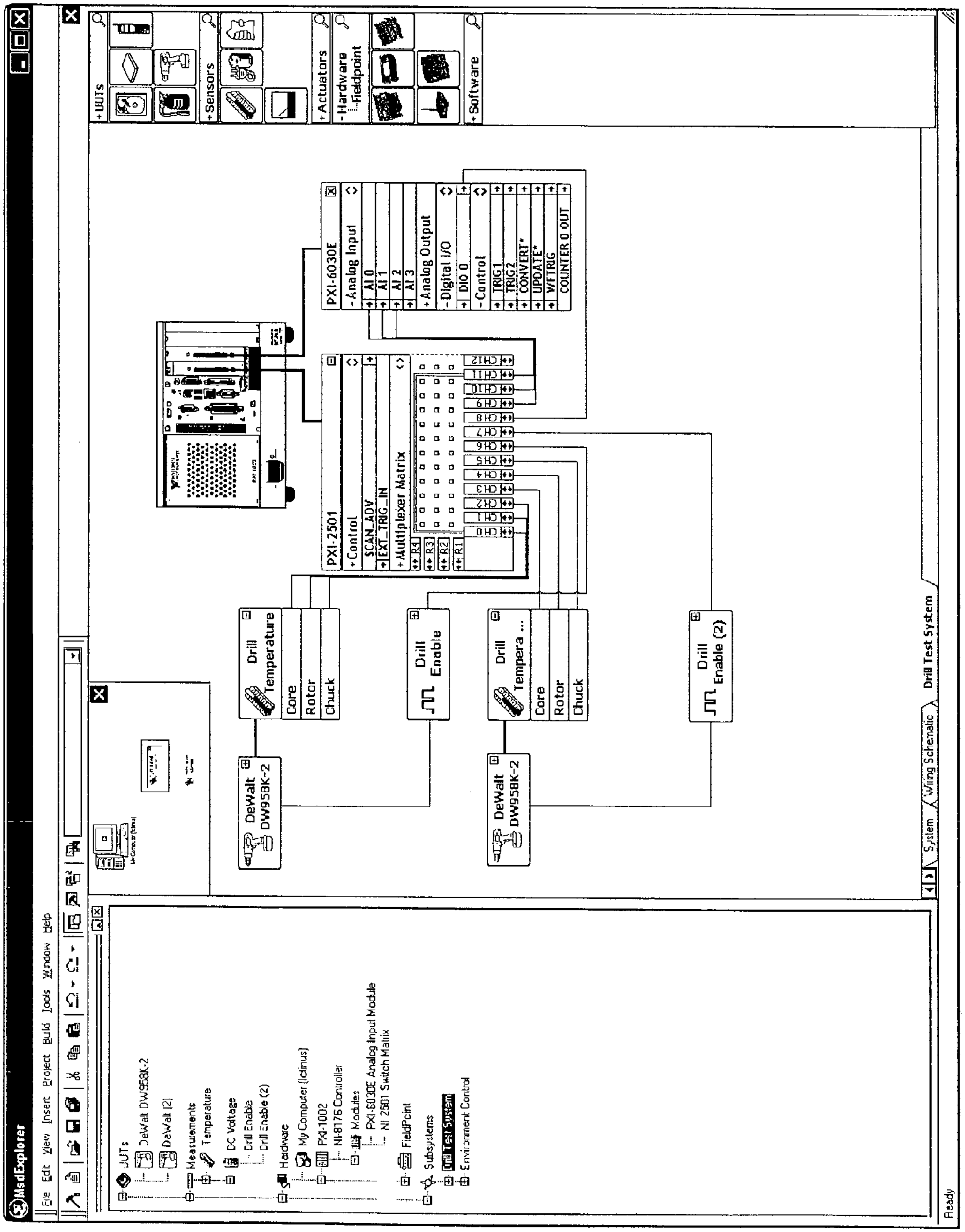

The MSD environment may also be operable to automatically route signals within the switch device. For example, the user may select channel 0 (associated with the "Core" drill temperature measurement for the first drill UUT) and channel 11 (associated with the "AI 0" analog input channel on the PXI I/O module) and may request the MSD environment to auto-route a path for this signal. FIG. 128 illustrates a route automatically determined by the MSD environment. In designing switched systems, many users plan routes by highlighting the desired routes on a schematic diagram of the switch device. Thus, the MSD environment may mimic this behavior in a graphical software environment. The user may also manually create routes if desired, such as the route between channels 1 and 10 for the "Rotor" drill temperature measurement, illustrated in FIG. 129.

Figure 129:
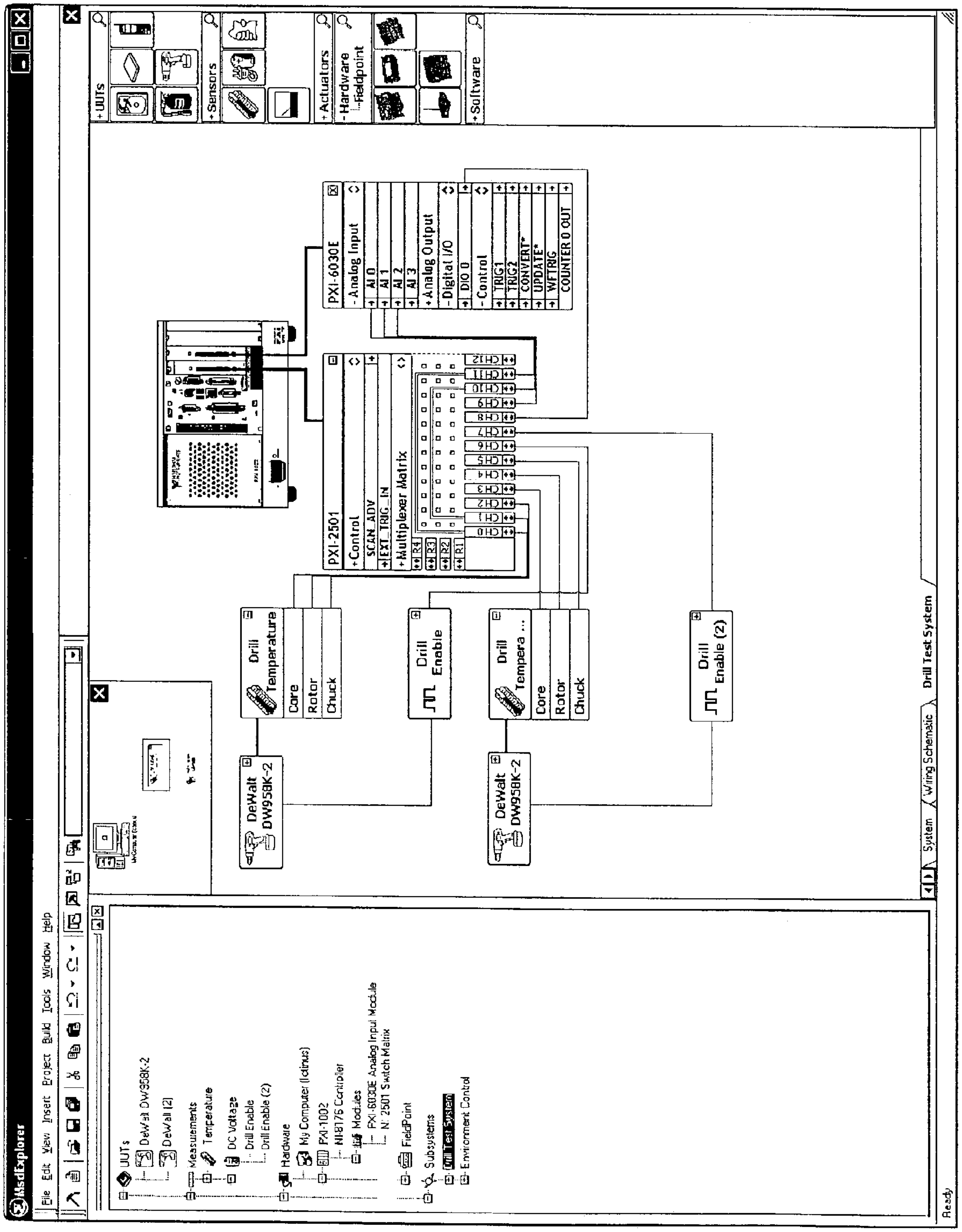

FIG. 128 also illustrates a change in the color of the output arrow for channel 11 from red to green. FIG. 129 illustrates a similar color change in the output arrow for channel 10. The color change from red to green indicates that these outputs are no longer floating, since they are now associated with specific routes.

Figure 130:
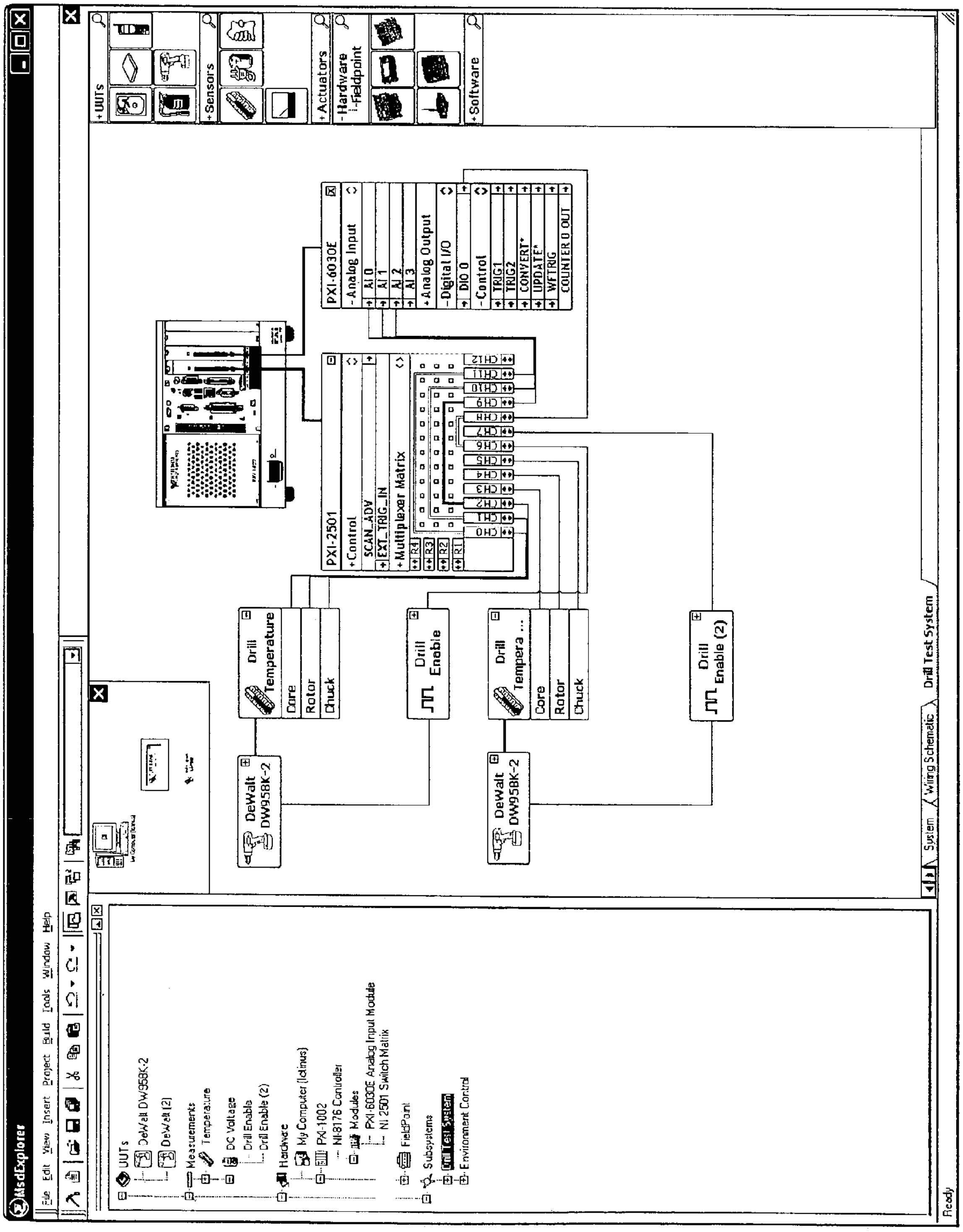

The user may continue by routing the "Chuck" drill temperature measurement (channel 2 to channel 9) and routing the "DIO 0" line drill enable signal from channel 8 to channel 6, as illustrated in FIG. 130. This may complete the routing necessary for testing the first drill UUT.

Figure 131:
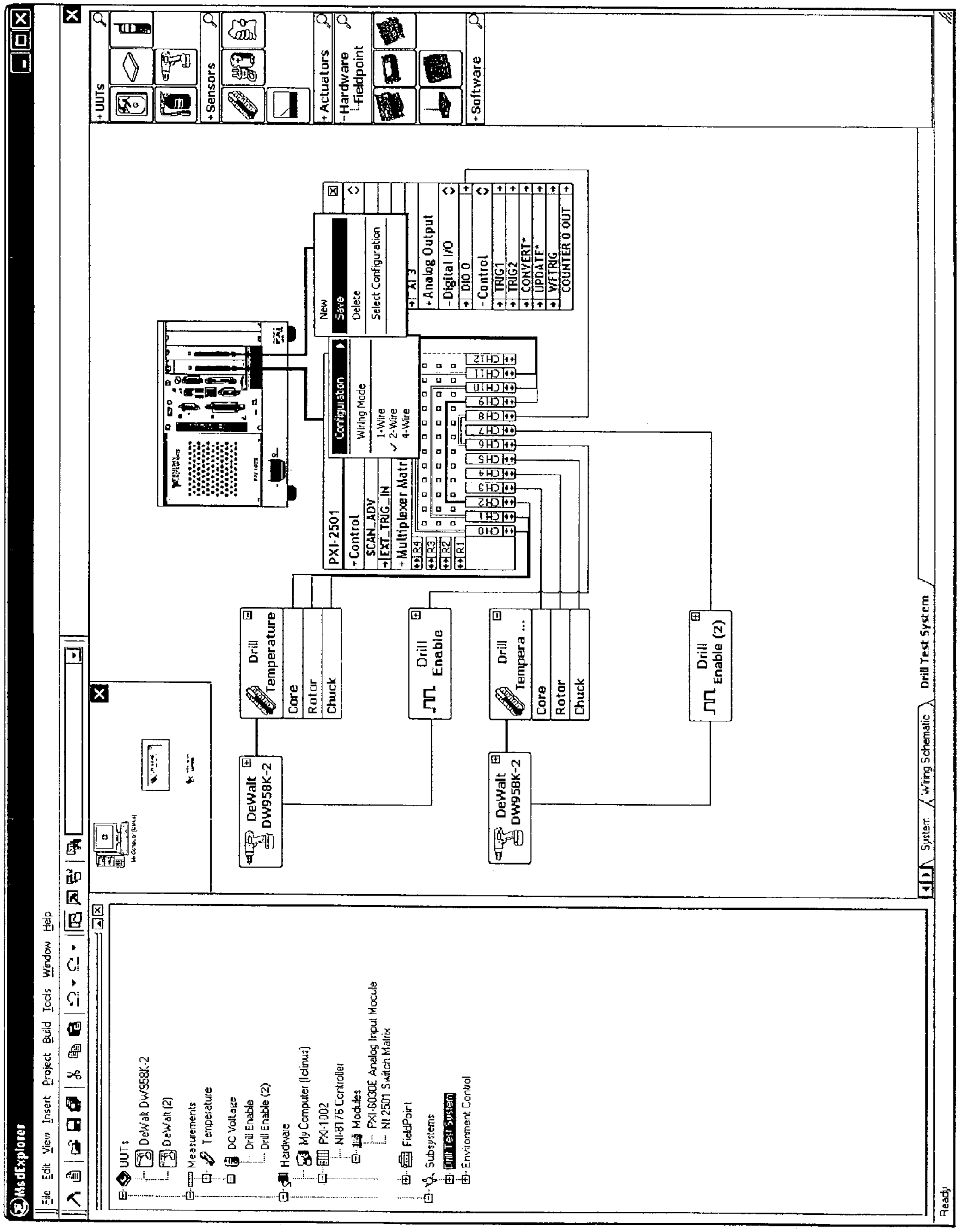
Figure 132:
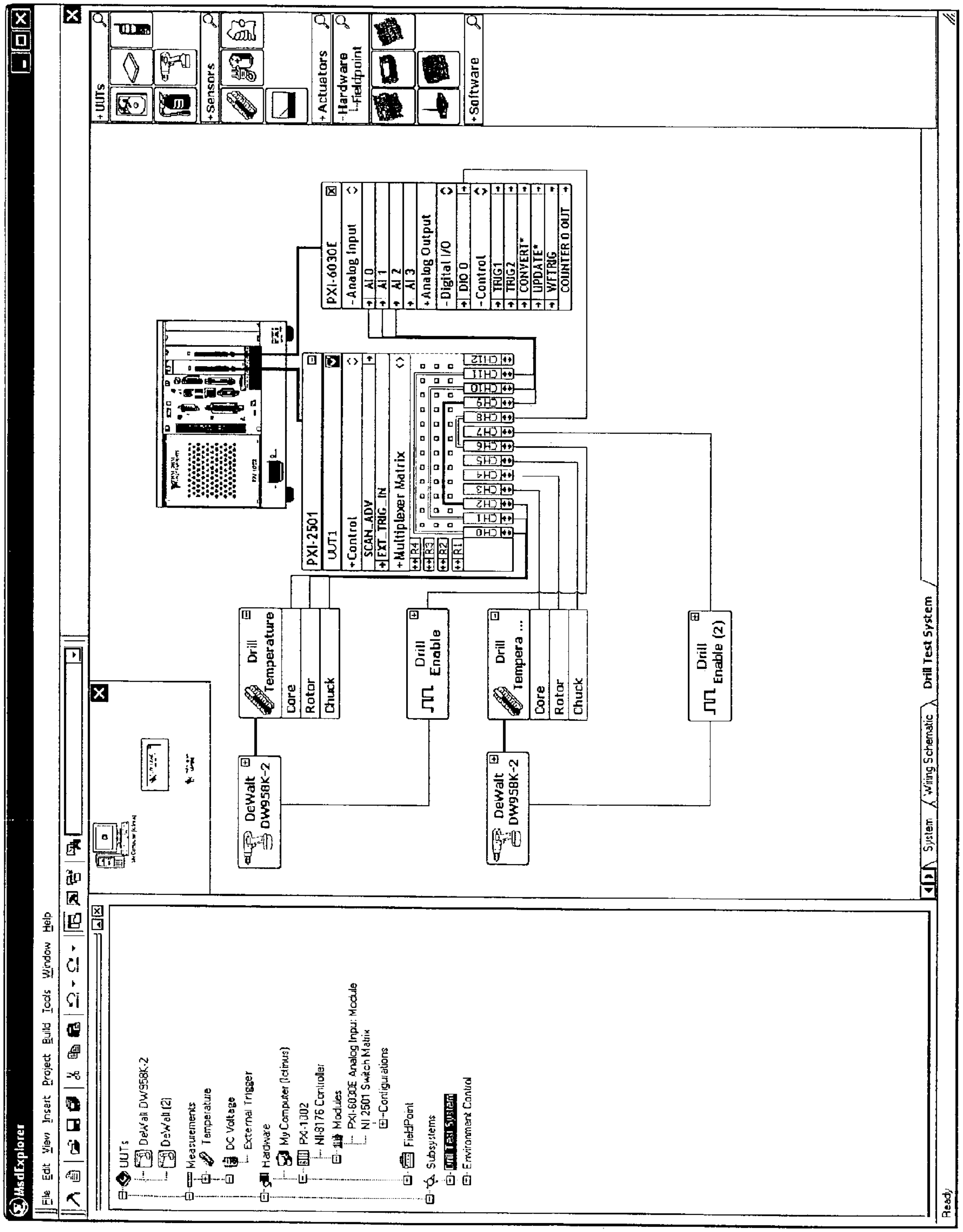

The user may then save the current configuration of the switch device module, e.g., utilizing a popup context menu as shown in FIG. 131. When saving the configuration, the user may specify a name for the configuration. In this example, the user chooses the name "UUT1", which then appears in the hardware dongle for the switch device module, as shown in FIG. 132 and similarly as described above with reference to FIGS. 74- 76.

Figure 133:
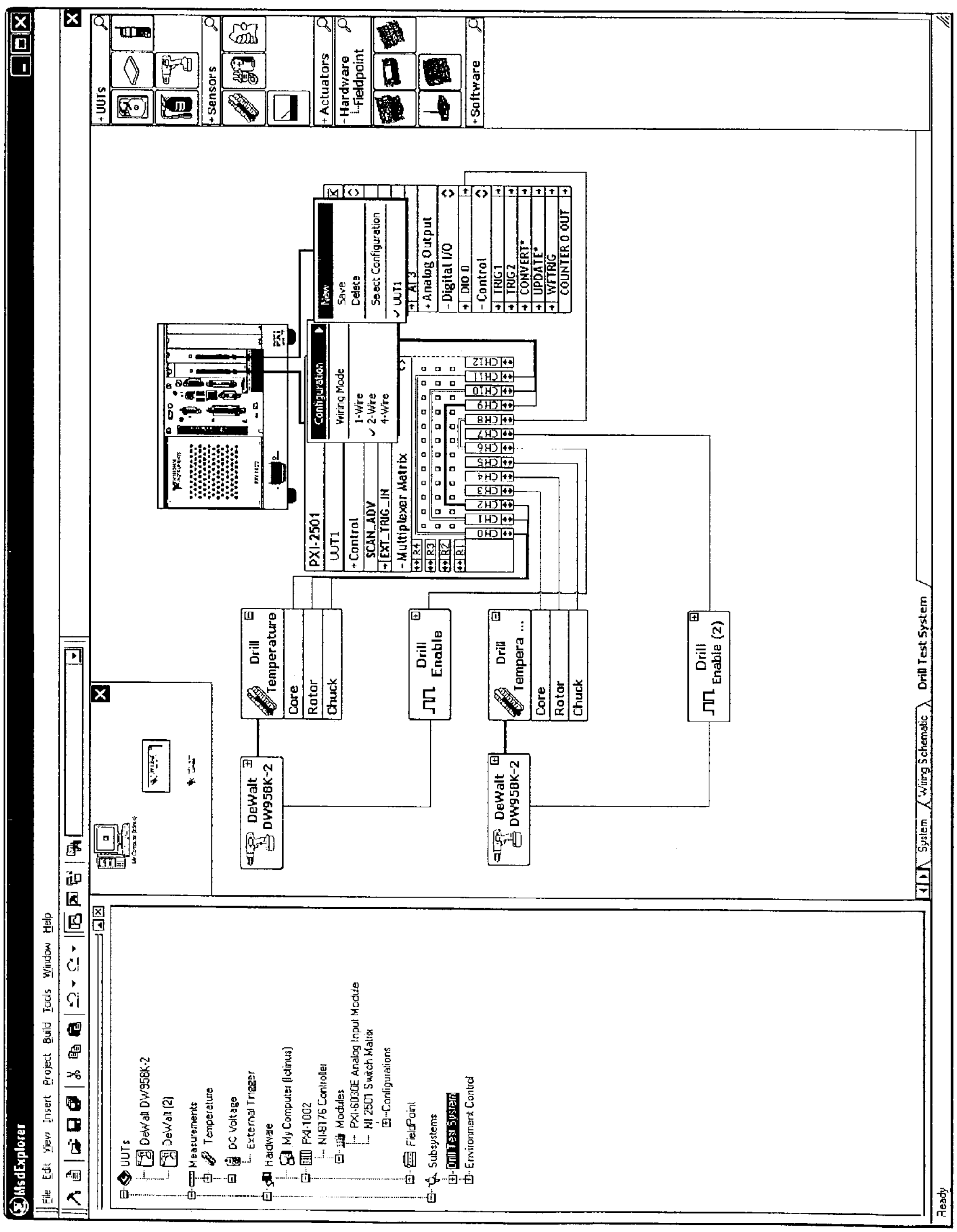
Figure 134:
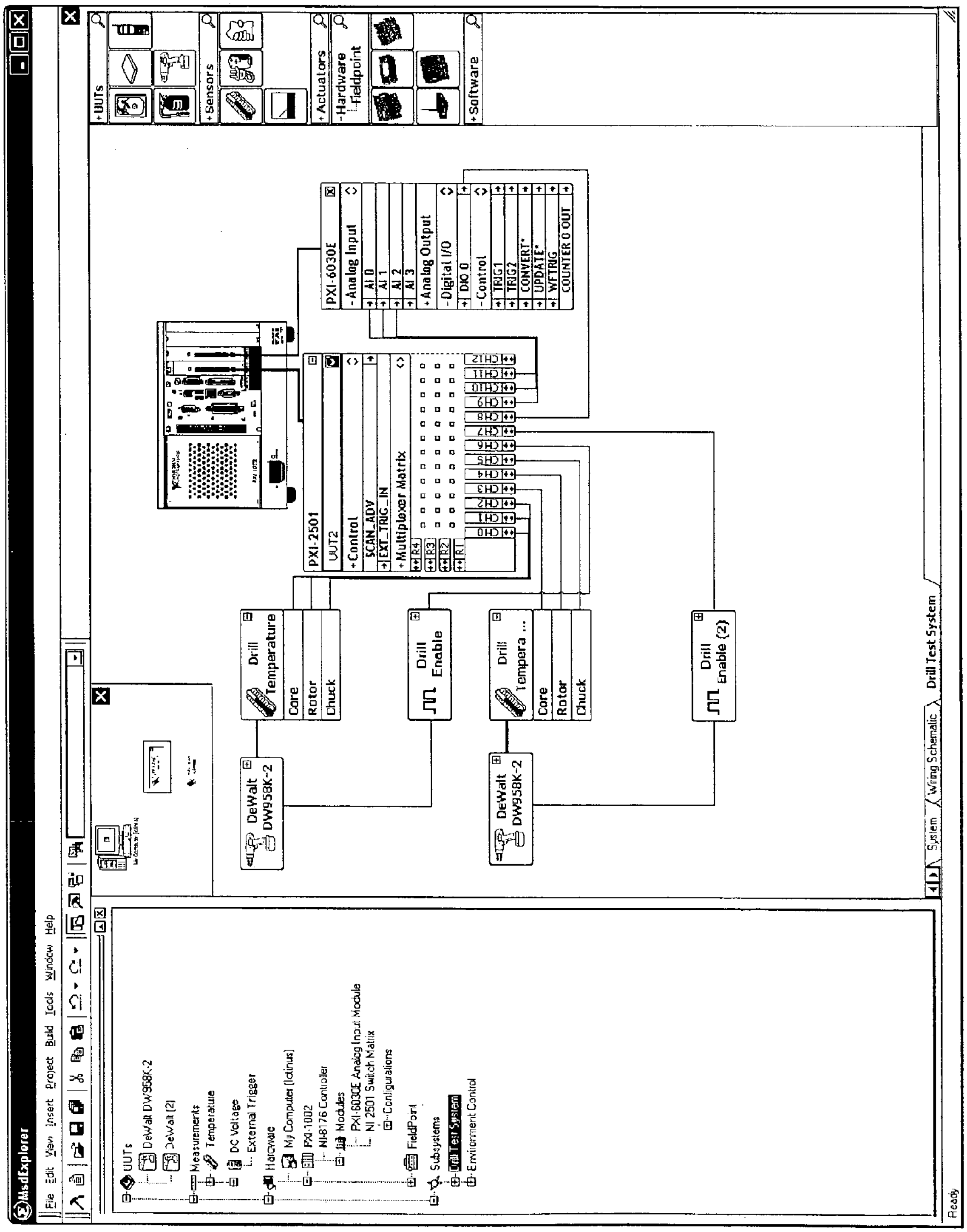
Figure 135:
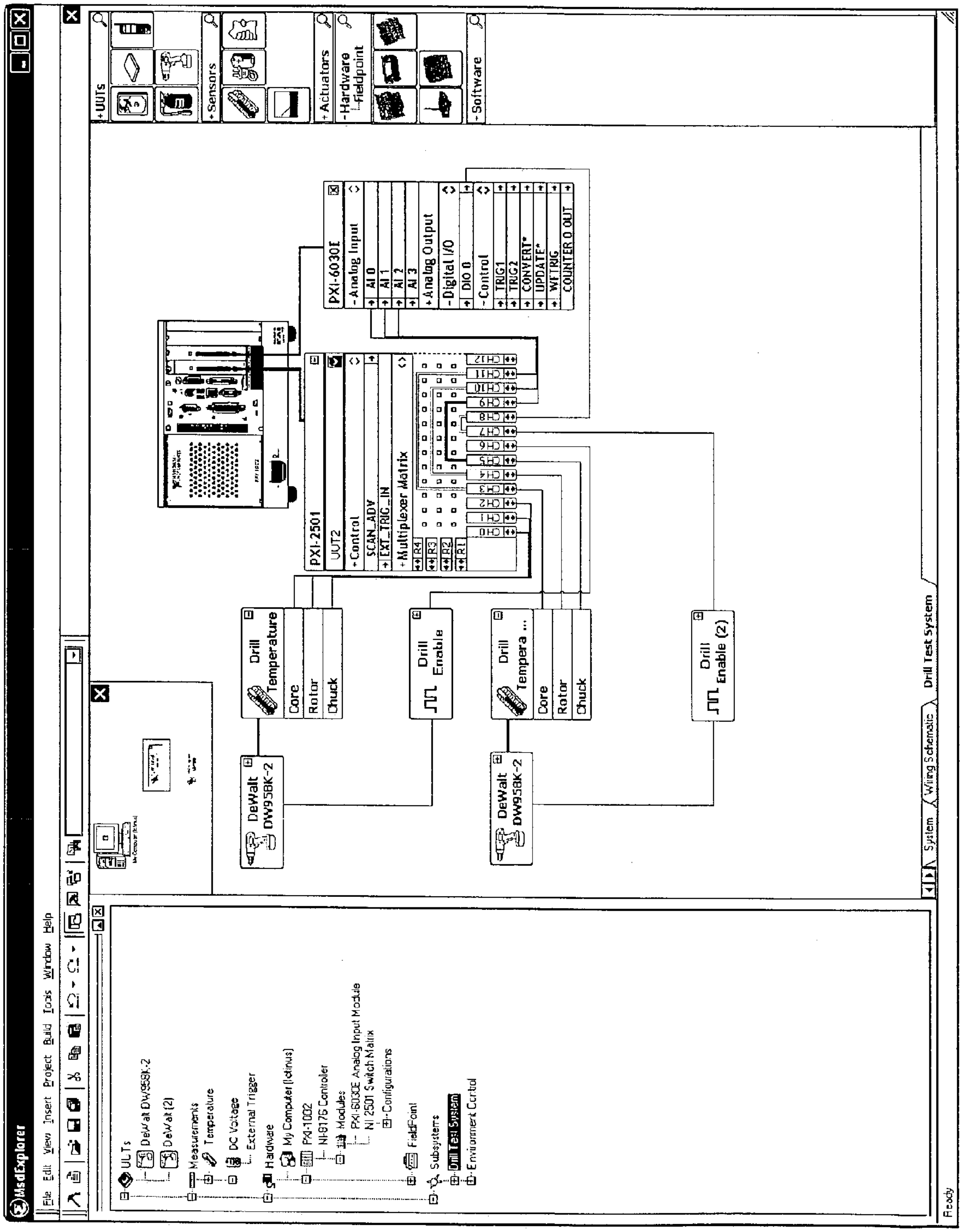

The user may also create a new "UUT2" configuration for the second drill UUT, as shown in FIG. 133. As illustrated in FIG. 134, no routes are initially configured for the new "UUT2" configuration. The user may proceed to configure routes for testing the second drill UUT similarly as described above, e.g., resulting in the configuration illustrated in FIG. 135. The user may utilize the drop-down arrow on the hardware dongle for the switch device module to switch between the "UUT1" and "UUT2" configurations, and the diagram may be updated accordingly to show the respective routes defined in each configuration.

Figure 136:
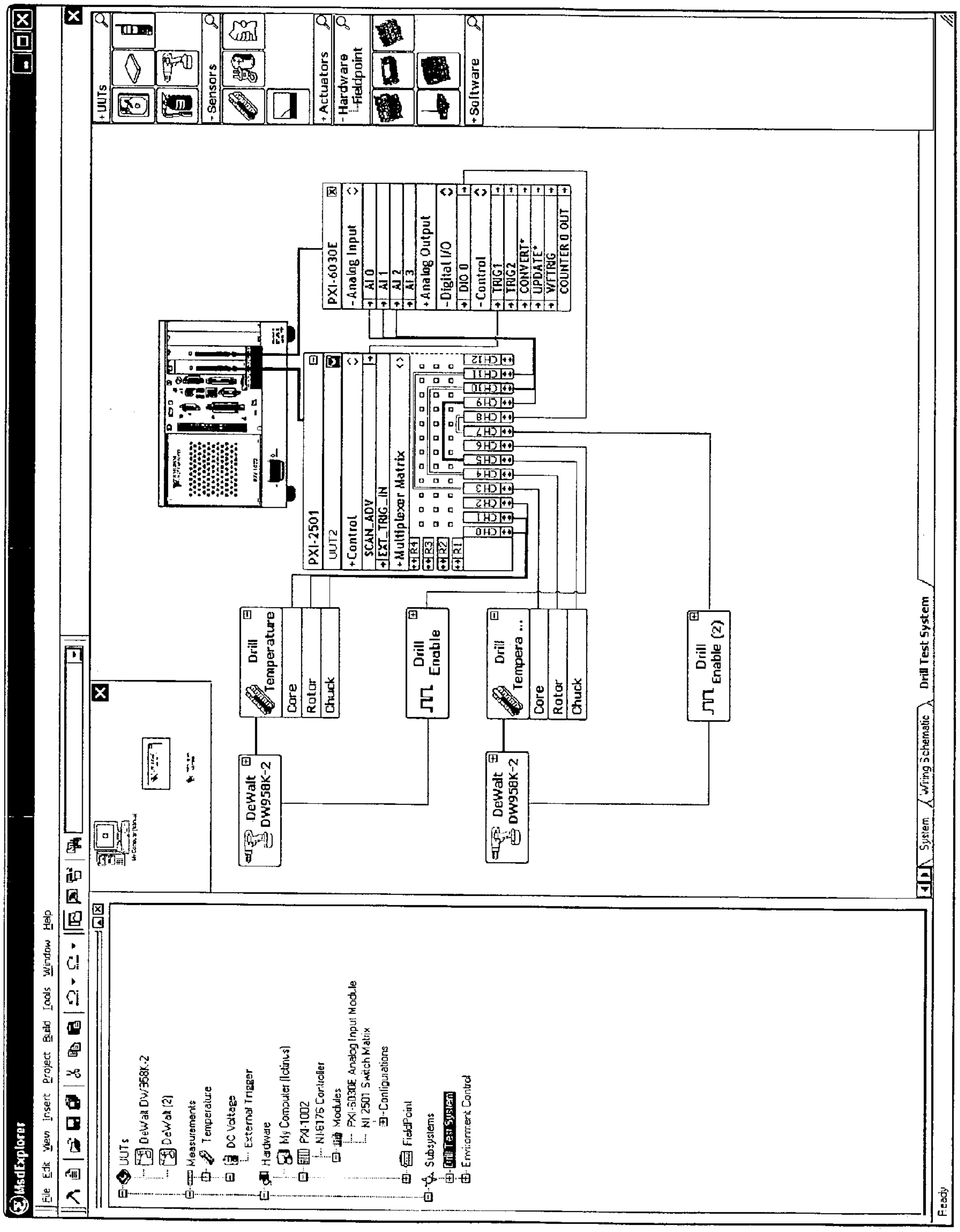

The user would typically want the measurement operations for measuring the drill temperatures to be performed after the switching operation has been completed. This can be accomplished by wiring the "SCAN_ADV" scan advance line to the "TRIG 1" trigger, as shown in FIG. 136. As described above with reference to FIG. 113, the MSD environment may prompt the user to inform him that this signal could be wired via the connector block or routed internally, where each option has different performance tradeoffs. In this example, the user selects to route the signal internally.

As FIGS. 132-136 illustrate, a "Configurations" category has been created under the "NI 2501 Switch Matrix" item in the tree view on the left side of the MSD environment workspace. The user may view the configurations he created for the switch device module by expanding the "Configurations" category.

It is noted that the created switch device configurations may be accessible programmatically. For example, a software program may reference the "UUT1" and "UUT2" configurations, e.g., to configure the switch device according to the routes defined by the respective configurations. Thus, when the switch device configurations are saved, the MSD environment may also create or save information allowing this programmatic access. For example, when editing a program, the MSD environment may display a "Switch Configurations" sub-palette which the user can access to include "UUT1" and "UUT2" configuration references in the program.

Figure 137:
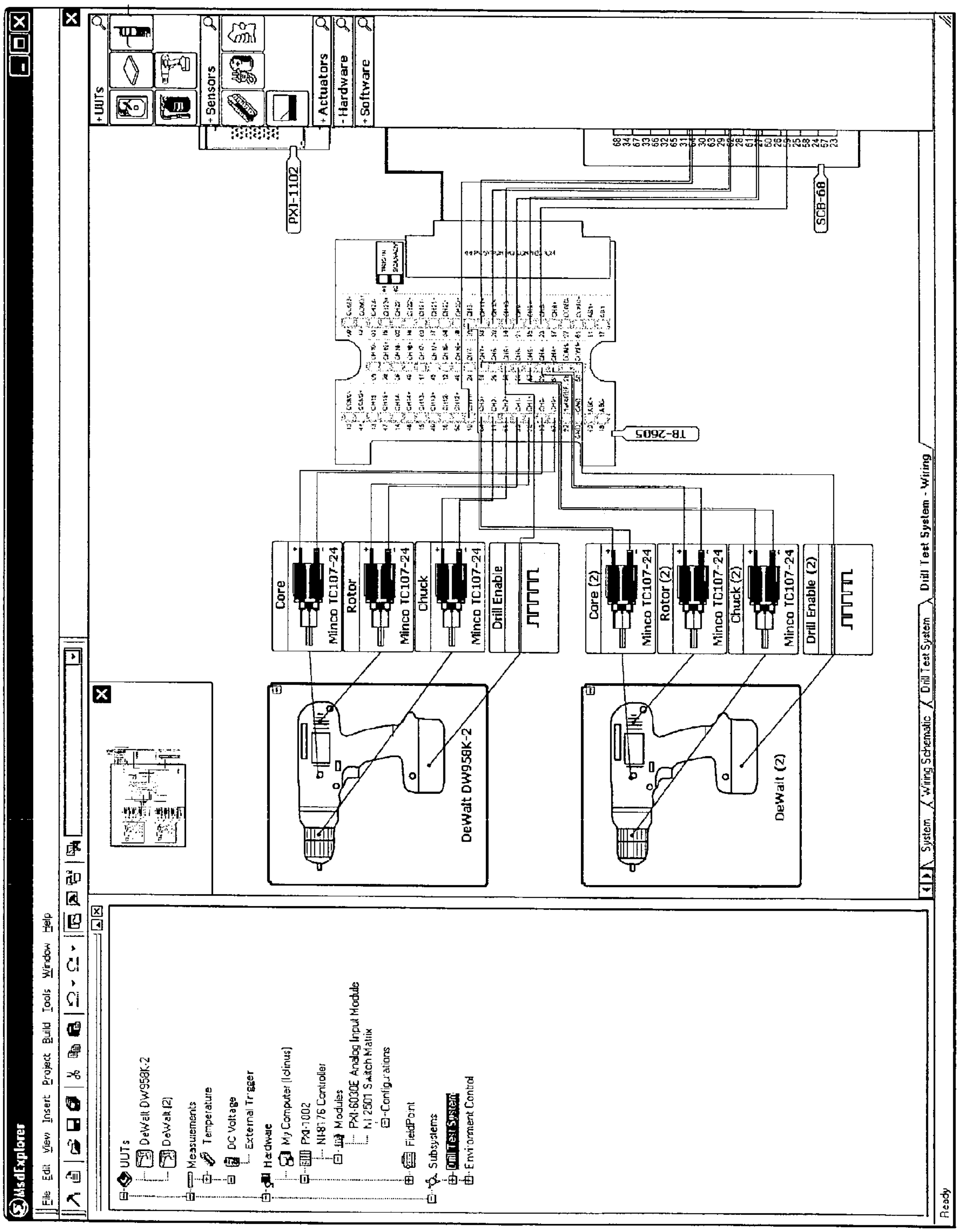

Referring now to FIG. 137, a wiring schematic view of the measurement system is shown. This view illustrates the two drill UUT's, two sets of four transducers, and a connector block. The wiring diagram is too large for the entire wiring diagram to be illustrated at once. Similarly as described above, a radar view in the upper left corner of the diagram indicates the portion of the wiring diagram currently in view, i.e., the leftmost portion. FIG. 138 illustrates the rightmost portion of the wiring diagram, again indicated by the radar view.

The connector block is associated with the switch device module. Thus, the connector block illustrates how the transducers need to be connected to the switch device and how the switch device needs to be connected to the PXI I/O module.

Although the embodiments above have been described in considerable detail, numerous variations and modifications will become apparent to those skilled in the art once the above disclosure is fully appreciated. It is intended that the following claims be interpreted to embrace all such variations and modifications.

We claim:

1. A computer accessible memory medium that stores program instructions for viewing a measurement system, wherein the program instructions are executable by a processor to perform:

displaying a diagram on a display, wherein the diagram includes a plurality of device icons representing hardware devices in the measurement system, and one or more wires between the device icons representing physical connections between the hardware devices;

receiving first user input requesting creation of a subsystem comprising a subset of the plurality of hardware devices;

grouping the subset of hardware devices into the sub-system in response to the first user input; and updating the diagram to visually indicate that the subset of hardware devices are grouped together in the sub-system in response to the first user input, wherein updating the diagram comprises collapsing the device icons of the subset of hardware devices to a sub-system icon that visually indicates the sub-system but not the subset of hardware devices in the sub-system;

wherein before the diagram is updated, the diagram includes a plurality of wires illustrating a plurality of physical connections to one or more hardware devices in the subset of hardware devices, wherein updating the diagram further comprises updating the diagram to illustrate a single wire to the sub-system icon.

2. The memory medium of claim 1, wherein said updating the diagram to visually indicate that the subset of hardware devices are grouped together in the sub-system comprises one or more of:

drawing a border around the subset of hardware devices in response to the first user input; and/or changing an appearance of one or more of the device icons representing hardware devices in the sub-system in response to the first user input.

3. The memory medium of claim 2, wherein the program instructions are further executable to perform:

collapsing the device icons of the subset of hardware devices to a sub-system icon in response to second user input, wherein said collapsing the sub-system comprises updating the diagram to visually indicate the sub-system but not the subset of hardware devices in the sub-system.

4. The memory medium of claim 1, wherein the diagram further comprises one or more software icons representing software components in the measurement system.

5. The memory medium of claim 1, wherein the program instructions are further executable to perform:

selecting the subset of hardware devices to be included in the sub-system in response to user input.

6. The memory medium of claim 5, wherein said selecting the subset of hardware devices to be included in the sub-system in response to user input comprises one or more of:

receiving user input from a pointing device to select each hardware device to be included in the sub-system;

receiving user input to draw a border around the hardware devices to be included in the sub-system; and/or receiving user input to a graphical user interface specialized for specifying hardware devices of a sub-system.

7. The memory medium of claim 1, wherein the program instructions are further executable to perform:

adding a new hardware device to the sub-system in response to user input; and updating the diagram to visually indicate that the new hardware device was added to the sub-system.

8. The memory medium of claim 1, wherein the program instructions are further executable to perform:

removing a hardware device from the sub-system in response to user input; and updating the diagram to visually indicate that the hardware device was removed from the sub-system.

9. The memory medium of claim 1, wherein the program instructions are further executable to perform:

displaying a plurality of text items corresponding to hardware devices of the measurement system;

wherein said displaying the text items includes displaying a text item corresponding to the sub-system;

wherein said displaying the text items comprises displaying a hierarchical view of the text items to indicate a hierarchical relationship among hardware devices of the measurement system;

wherein the hierarchical view indicates the subset of hardware devices in the sub-system.

10. The memory medium of claim 9, wherein the program instructions are further executable to perform:

receiving user input to the displayed hierarchical view of text items to change the sub-system.

11. The memory medium of claim 1, wherein the program instructions are further executable to perform:

saving configuration information for the sub-system, wherein said saving the configuration information for the sub-system comprises storing configuration information for hardware devices in the sub-system as a single configuration unit.

12. The memory medium of claim 11, wherein said storing configuration information for hardware devices in the sub-system comprises storing information specifying a current state of one or more hardware devices in the sub-system.

13. The memory medium of claim 11, wherein the program instructions are further executable to perform:

receiving second user input requesting to save the configuration information for the sub-system;

wherein said saving the configuration information for the sub-system is performed in response to the second user input.

14. The memory medium of claim 13, wherein the program instructions are further executable to perform:

prompting for a name for the configuration information for the sub-system; and receiving third user input specifying the name for the configuration information;

wherein said storing the configuration information for hardware devices in the sub-system as a single configuration unit comprises associating the name with the configuration unit.

15. The memory medium of claim 11, wherein the program instructions are further executable to perform:

retrieving the configuration information from the configuration unit; and configuring one or more of the hardware devices in the sub-system using the configuration information.

16. The memory medium of claim 1, wherein the hardware devices included in the sub-system include one or more of:

a unit under test (UUT);

a sensor; and/or a device to acquire measurements from the UUT.

17. The memory medium of claim 1, wherein the measurement system farther comprises one or more virtual components comprising one or more of:

one or more physical devices that are not physically present or that have not yet been defined; and/or one or more measurements; and/or one or more logical components;

wherein the diagram includes corresponding icons representing the one or more virtual components; and wherein the sub-system further comprises at least one virtual component.

18. The memory medium of claim 1, wherein at least a portion of the device icons in the diagram visually resemble physical devices in the measurement system.

19. The memory medium of claim 1, wherein the diagram illustrates a computer-controlled measurement system operable to acquire measurement information from a unit under test (UUT).

20. A computer-implemented method for viewing a measurement system, wherein the method operates in a computer system including a display device and one or more input devices, wherein the method comprises:

displaying a diagram on the display device, wherein the diagram includes a plurality of device icons representing hardware devices in the measurement system and one or more wires between the device icons representing physical connections between the hardware devices;

receiving first user input via the one or more input devices requesting creation of a sub-system comprising a subset of the plurality of hardware devices;

grouping the subset of hardware devices into the sub-system in response to the first user input; and updating the diagram to visually indicate that the subset of hardware devices are grouped together in the sub-system in response to the first user input, wherein updating the diagram comprises collapsing the device icons of the subset of hardware devices to a sub-system icon that visually indicates the sub-system but not the subset of hardware devices in the sub-system;

wherein before the diagram is updated, the diagram includes a plurality of wires illustrating a plurality of physical connections to one or more hardware devices in the subset of hardware devices, wherein updating the diagram further comprises updating the diagram to illustrate a single wire to the sub-system icon.

* * * * *